(12) United States Patent
Kang et al.

(10) Patent No.: US 11,810,918 B2
(45) Date of Patent: Nov. 7, 2023

(54) STACKED VERTICAL TRANSPORT FIELD-EFFECT TRANSISTOR LOGIC GATE STRUCTURES WITH SHARED EPITAXIAL LAYERS

(71) Applicant: International Business Machines Corporation, Armonk, NY (US)

(72) Inventors: Tsung-Sheng Kang, Ballston Lake, NY (US); Ardasheir Rahman, Schenectady, NY (US); Tao Li, Albany, NY (US); Su Chen Fan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 310 days.

(21) Appl. No.: 17/113,674

(22) Filed: Dec. 7, 2020

(65) Prior Publication Data
US 2022/0181321 A1    Jun. 9, 2022

(51) Int. Cl.
*H01L 27/092* (2006.01)
*H01L 21/8238* (2006.01)
(Continued)

(52) U.S. Cl.
CPC .... *H01L 27/092* (2013.01); *H01L 21/823885* (2013.01); *H01L 27/0688* (2013.01);
(Continued)

(58) Field of Classification Search
CPC ............ H01L 27/0688; H01L 27/8221; H01L 21/823885; H01L 21/823871;
(Continued)

(56) References Cited

U.S. PATENT DOCUMENTS

| 5,293,457 A | 3/1994 | Arima et al. |
| 5,506,804 A | 4/1996 | Yanagisawa et al. |

(Continued)

FOREIGN PATENT DOCUMENTS

| CN | 103153992 A | 6/2013 |
| CN | 107799593 A | 3/2018 |

(Continued)

OTHER PUBLICATIONS sccs.swarthmore.edu, "E77 VLSI Design: Lab 3 Laying Out Simple Circuits," https://www.sccs.swarthmore.edu/users/06/adem/engin/e77vlsi/lab3/, Oct. 17, 2005, 7 pages.
(Continued)

*Primary Examiner* — Michael M Trinh
(74) *Attorney, Agent, or Firm* — Samuel Waldbaum; Ryan, Mason & Lewis, LLP

(57) ABSTRACT

A semiconductor structure comprises two or more vertical fins, a bottom epitaxial layer surrounding a bottom portion of a given one of the two or more vertical fins, a top epitaxial layer surrounding a top portion of the given one of the two or more vertical fins, a shared epitaxial layer surrounding a middle portion of the given one of the two or more vertical fins, and a connecting layer contacting the bottom epitaxial layer and the top epitaxial layer, the connecting layer being disposed to a lateral side of the two or more vertical fins.

20 Claims, 90 Drawing Sheets

(51) Int. Cl.
  *H01L 29/66* (2006.01)
  *H03K 19/20* (2006.01)
  *H01L 29/78* (2006.01)
  *H03K 19/173* (2006.01)
  *H01L 27/06* (2006.01)
  *H01L 29/423* (2006.01)

(52) U.S. Cl.
  CPC .... *H01L 29/66666* (2013.01); *H01L 29/7827* (2013.01); *H03K 19/173* (2013.01); *H03K 19/20* (2013.01); *H01L 21/823871* (2013.01); *H01L 29/42376* (2013.01)

(58) Field of Classification Search
  CPC .......... H01L 29/7827; H01L 29/66666; H01L 29/42376; H03K 19/173; H03K 19/20
  See application file for complete search history.

(56) References Cited

U.S. PATENT DOCUMENTS

| | | | |
|---|---|---|---|
| 5,612,563 | A | 3/1997 | Fitch et al. |
| 7,830,189 | B2 | 11/2010 | Abe |
| 8,633,535 | B2 | 1/2014 | Matsuo et al. |
| 9,640,531 | B1 | 5/2017 | Or-Bach et al. |
| 9,680,473 | B1 | 6/2017 | Anderson et al. |
| 9,825,032 | B1 | 11/2017 | Bentley et al. |
| 9,997,413 | B1* | 6/2018 | Leobandung ......... H01L 27/092 |
| 10,014,292 | B2 | 7/2018 | Or-Bach et al. |
| 10,109,637 | B1 | 10/2018 | Zang et al. |
| 10,217,674 | B1 | 2/2019 | Hook et al. |
| 10,283,411 | B1 | 5/2019 | Hook et al. |
| 10,297,513 | B1 | 5/2019 | Yamashita et al. |
| 10,692,768 | B1 | 6/2020 | Rubin et al. |
| 10,777,468 | B1 | 9/2020 | Zhang et al. |
| 2011/0108803 | A1 | 5/2011 | Deligianni et al. |
| 2015/0017767 | A1* | 1/2015 | Masuoka ............... H10B 10/18 438/211 |
| 2016/0043074 | A1 | 2/2016 | Hurley et al. |
| 2016/0211259 | A1* | 7/2016 | Guo ...................... H01L 27/092 |
| 2017/0025412 | A1 | 1/2017 | Jun et al. |
| 2017/0213821 | A1 | 7/2017 | Or-Bach et al. |
| 2018/0277530 | A1 | 9/2018 | Or-Bach et al. |
| 2019/0189641 | A1* | 6/2019 | Kimura ............... H01L 29/7869 |
| 2019/0229117 | A1 | 7/2019 | Zhang et al. |
| 2019/0326175 | A1 | 10/2019 | Lilak et al. |
| 2020/0144260 | A1* | 5/2020 | Do ................. H01L 21/823871 |
| 2020/0328127 | A1* | 10/2020 | Yamashita .......... H01L 21/3086 |

FOREIGN PATENT DOCUMENTS

| | | |
|---|---|---|
| EP | 0476282 A2 | 3/1992 |
| JP | H0380379 A | 4/1991 |
| JP | 2002150783 A | 5/2002 |
| JP | 2011258776 A | 12/2011 |
| KR | 101049385 B1 | 7/2011 |
| WO | 2013018061 A1 | 2/2013 |

OTHER PUBLICATIONS

Y.C. Huang et al., "Characterization of SOG (Spin on Glass) Fully Etch Back Process for Multilevel Interconnection Technology," Proceedings of the SPIE, Microelectronic Device and Multilevel Interconnection Technology, vol. 2636, Sep. 15, 1995, pp. 289-298.
R. Osredkar, "Spin-On-Glass Material Curing and Etching," Microelectronics Reliability, Jul. 1994, vol. 34, No. 7, pp. 1265-1267.
International Search Report and Written Opinion of PCT/CN2021/126449, dated Jan. 27, 2022, 9 pages.

\* cited by examiner

100

125

130

150

200

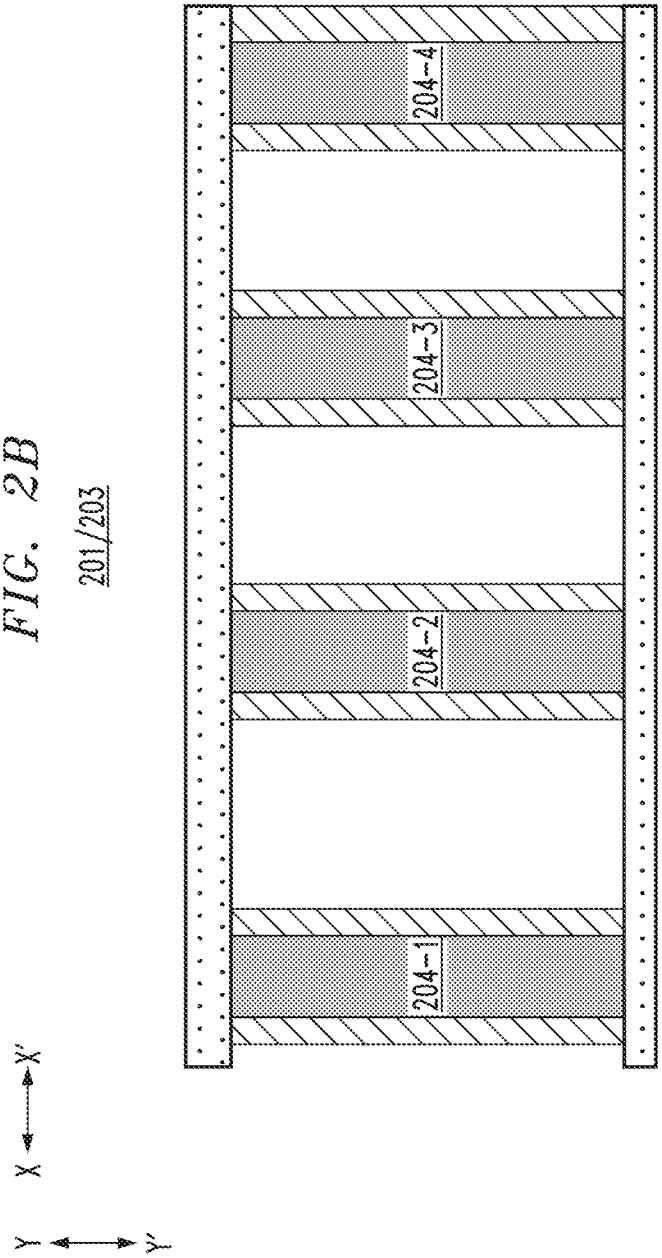

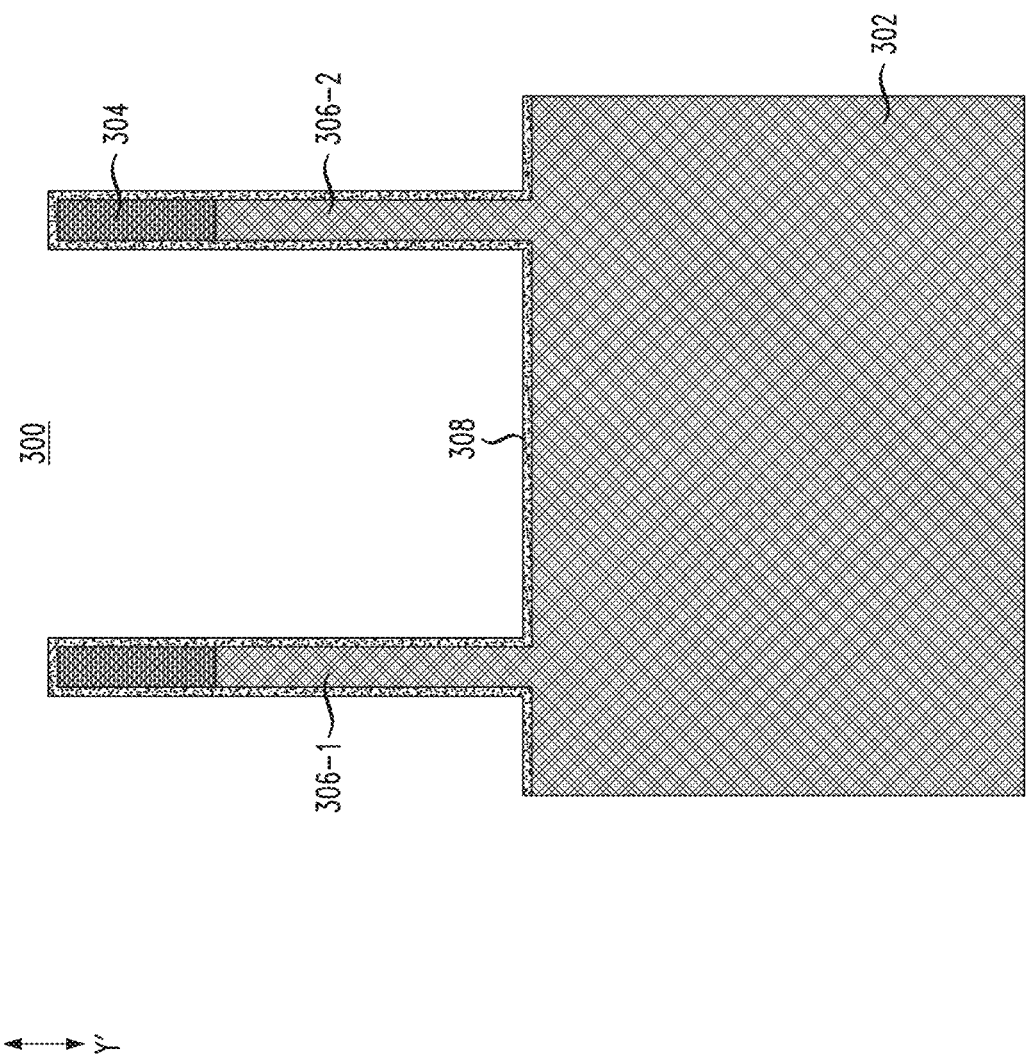

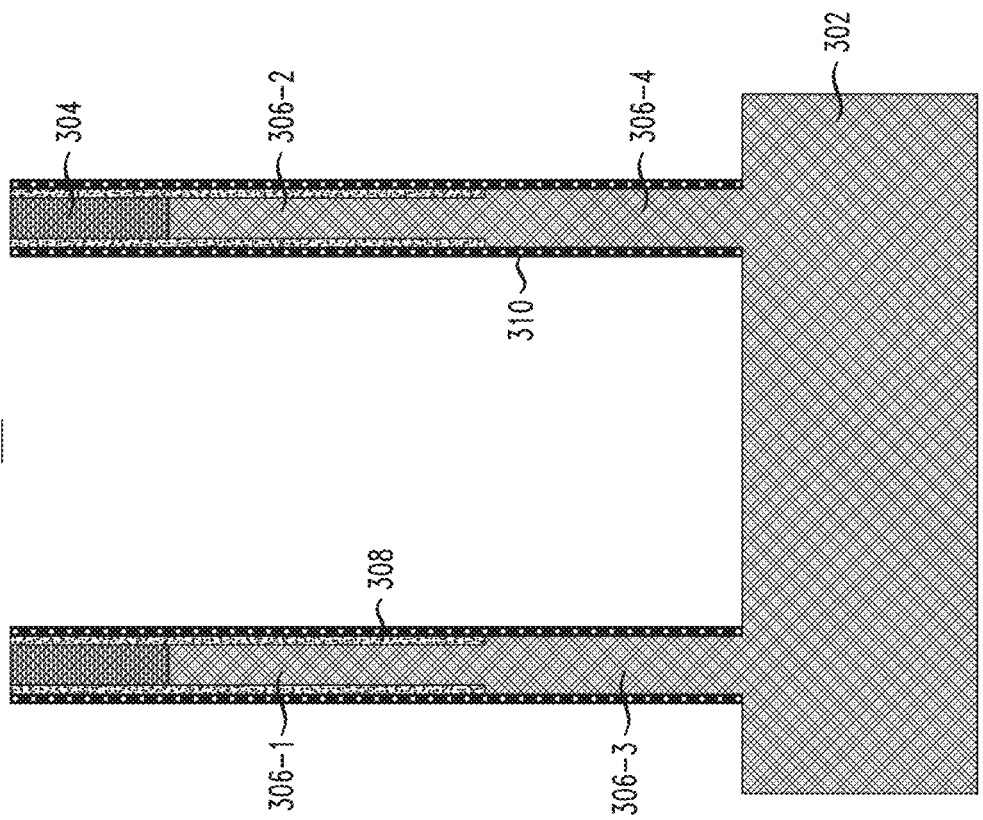

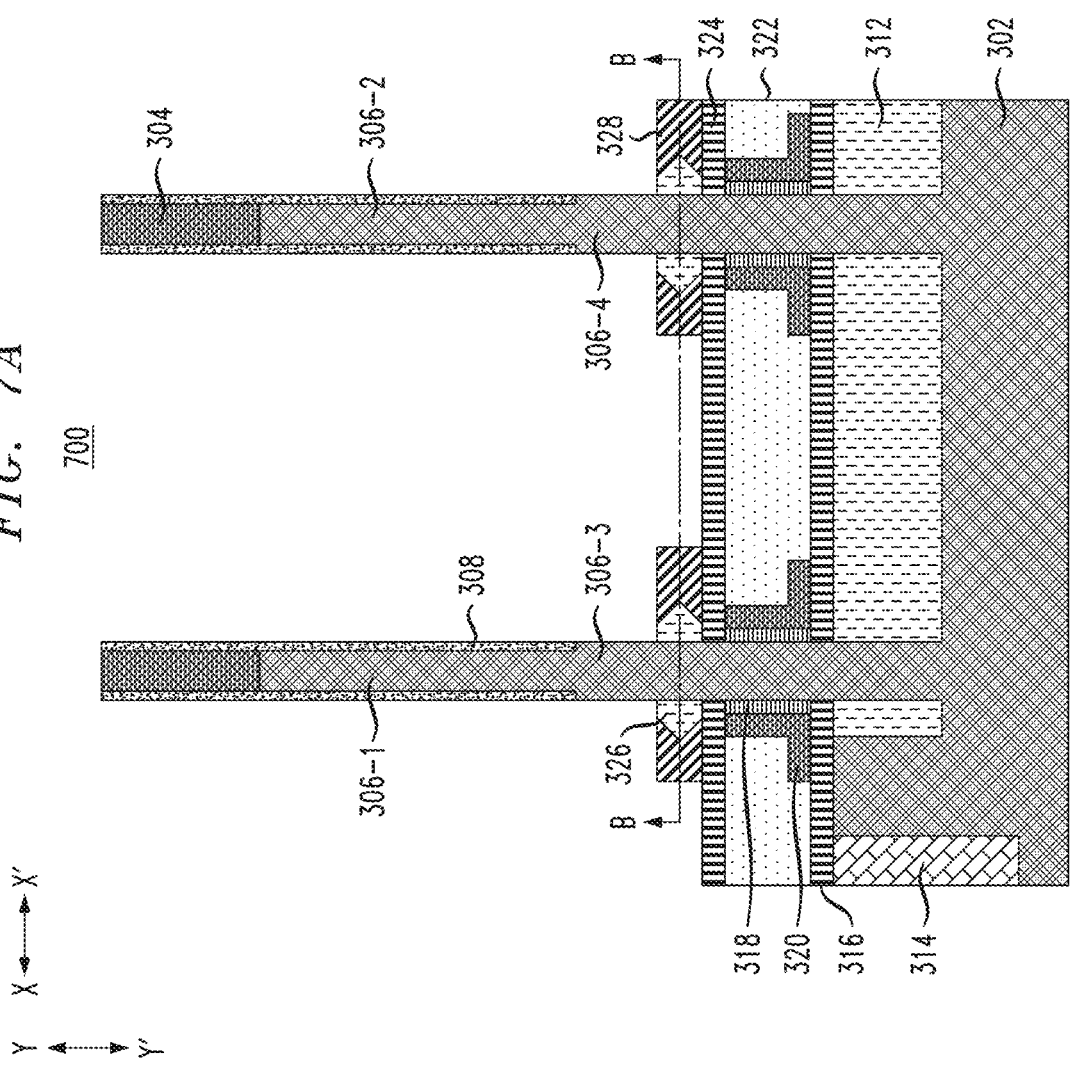

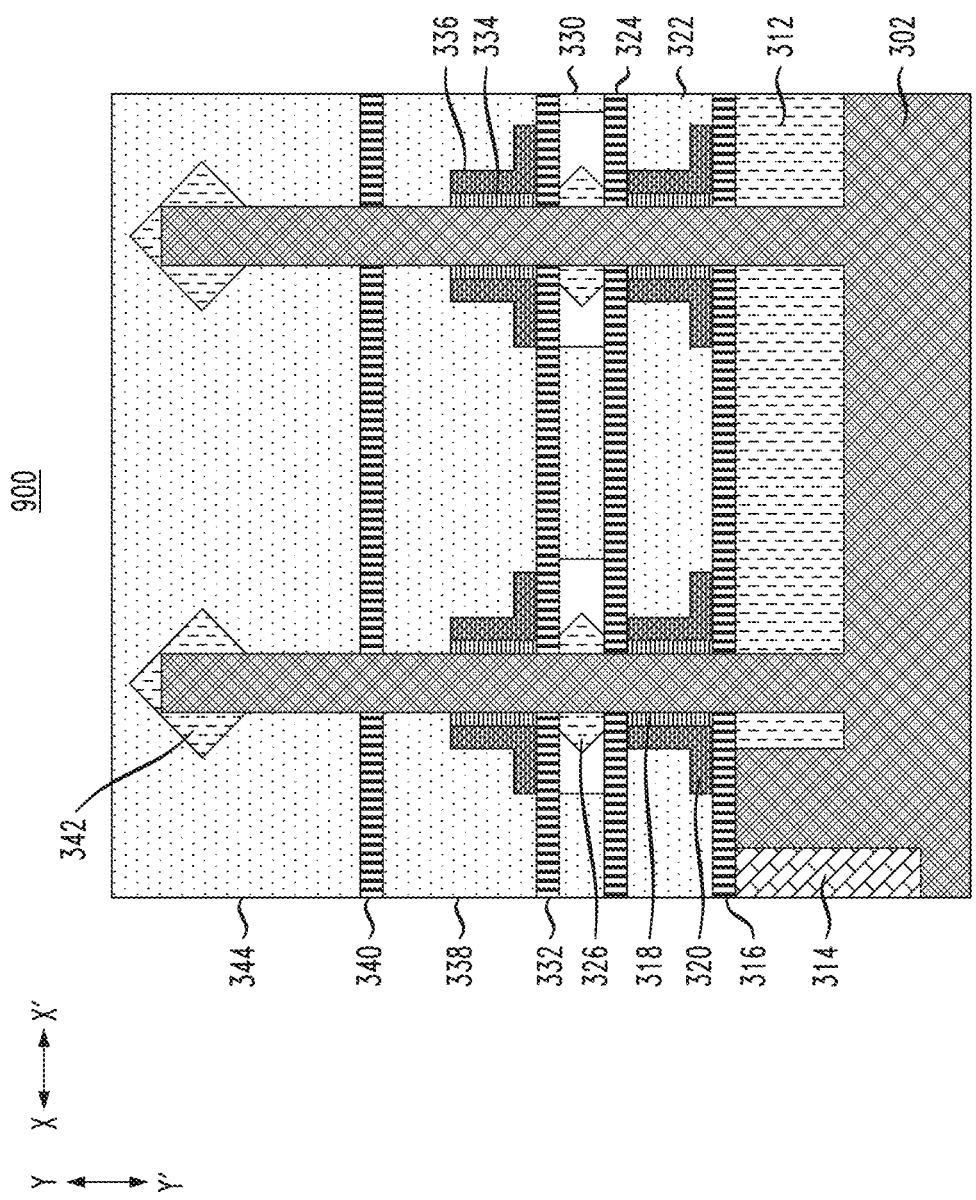

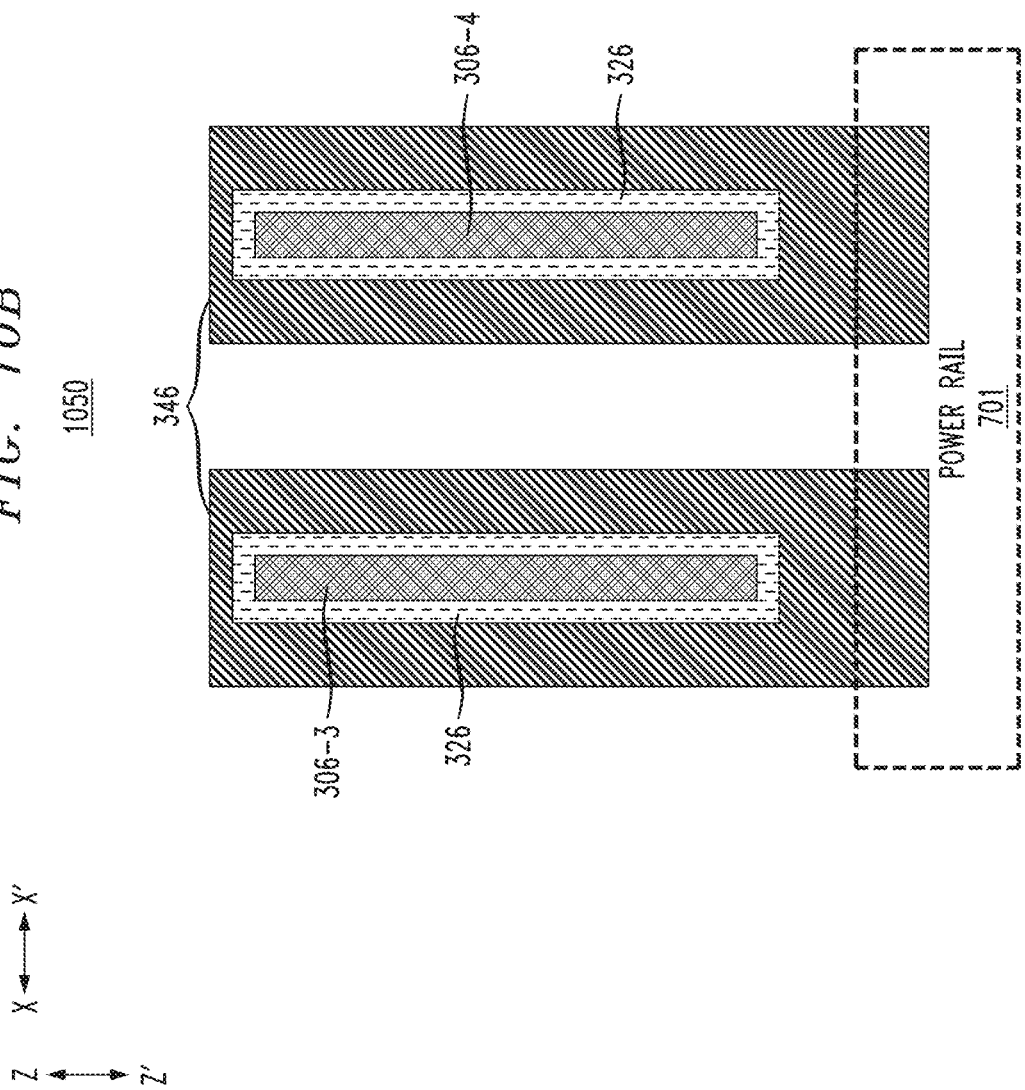

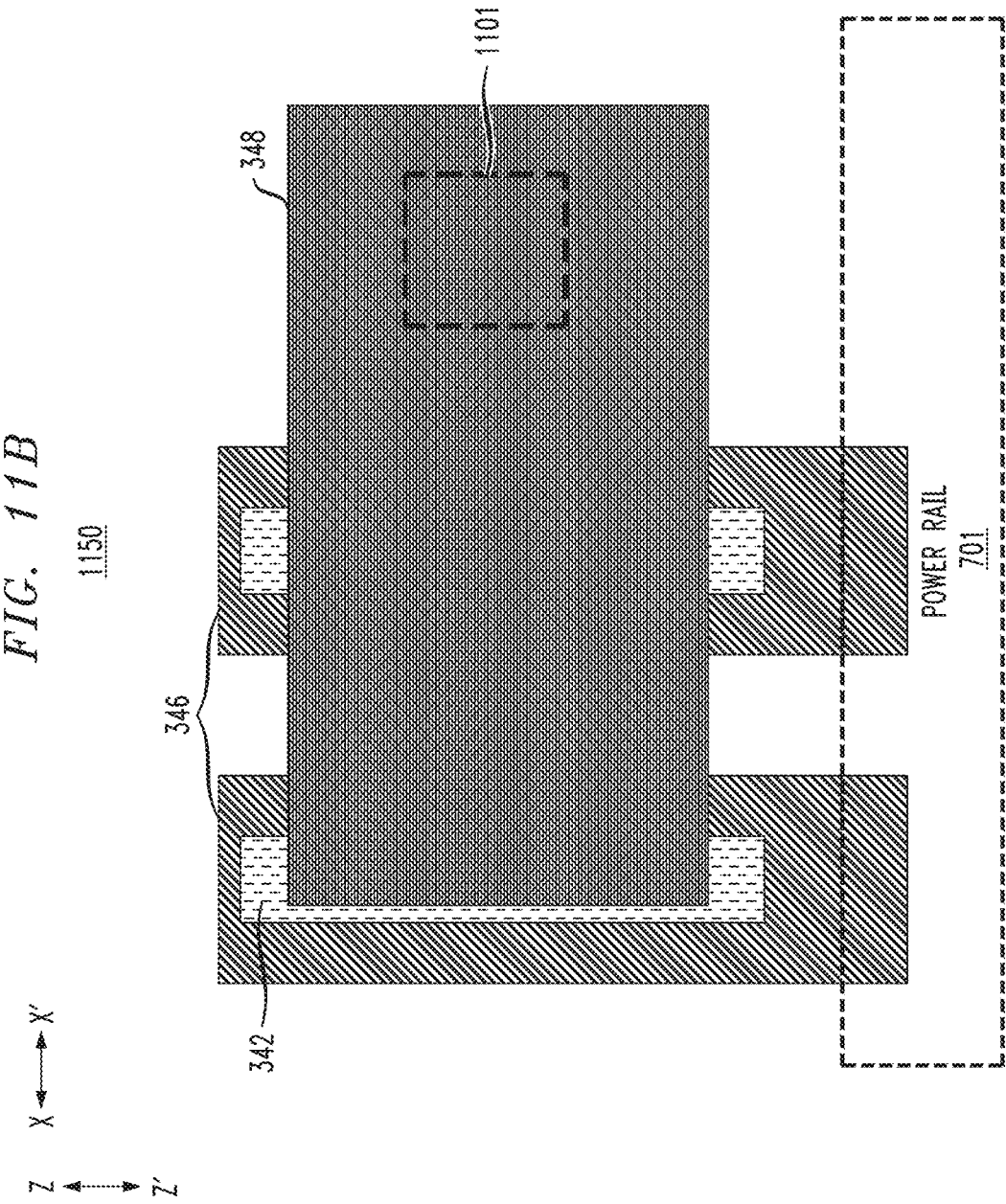

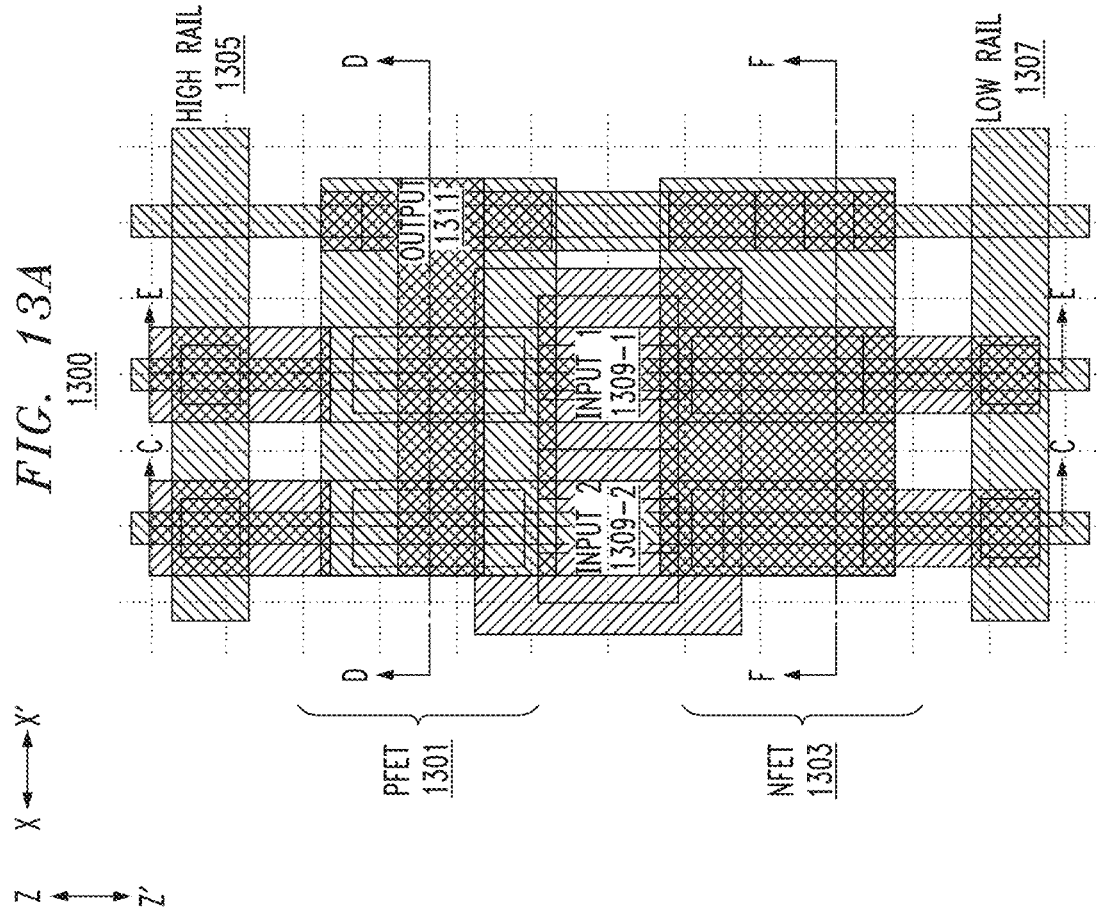

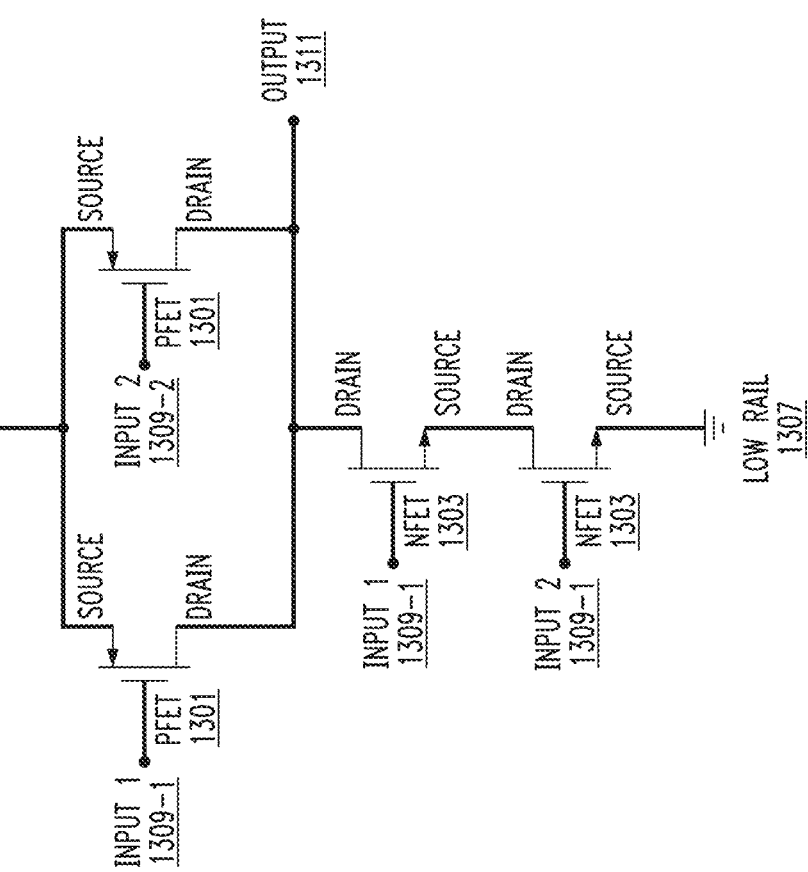

1375

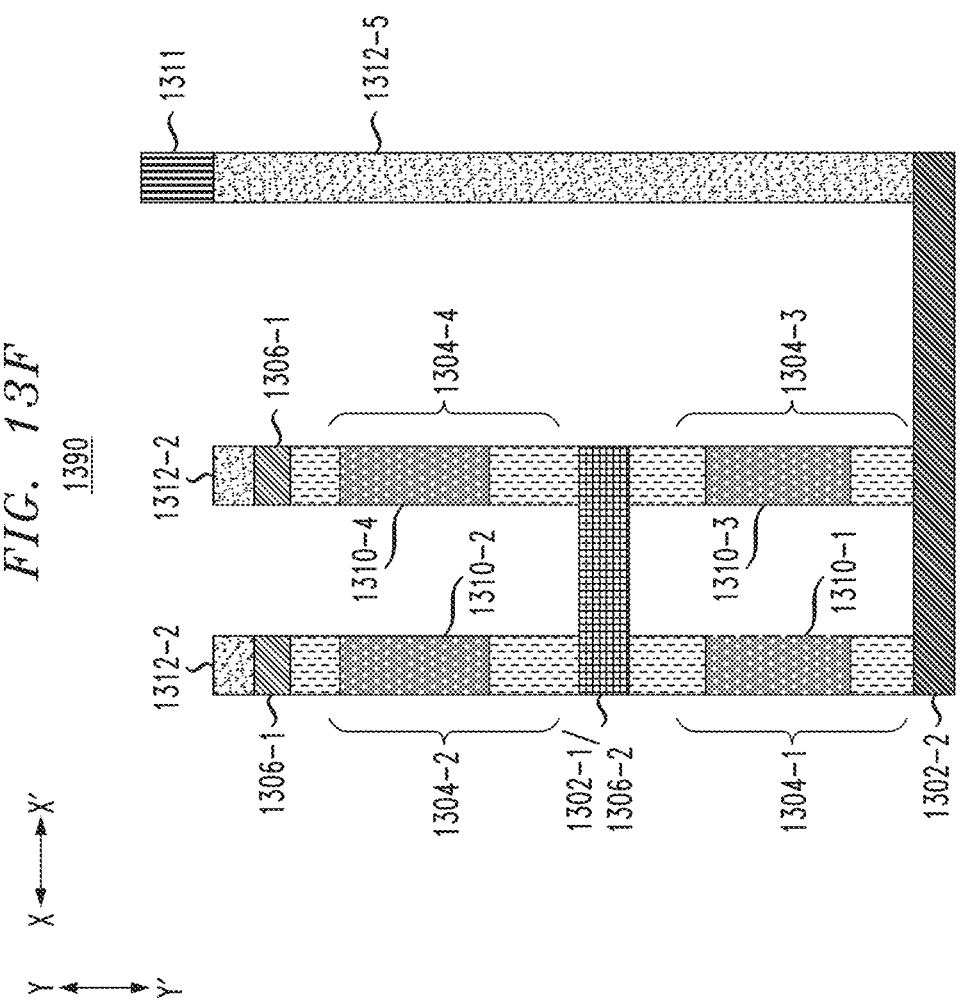

1400

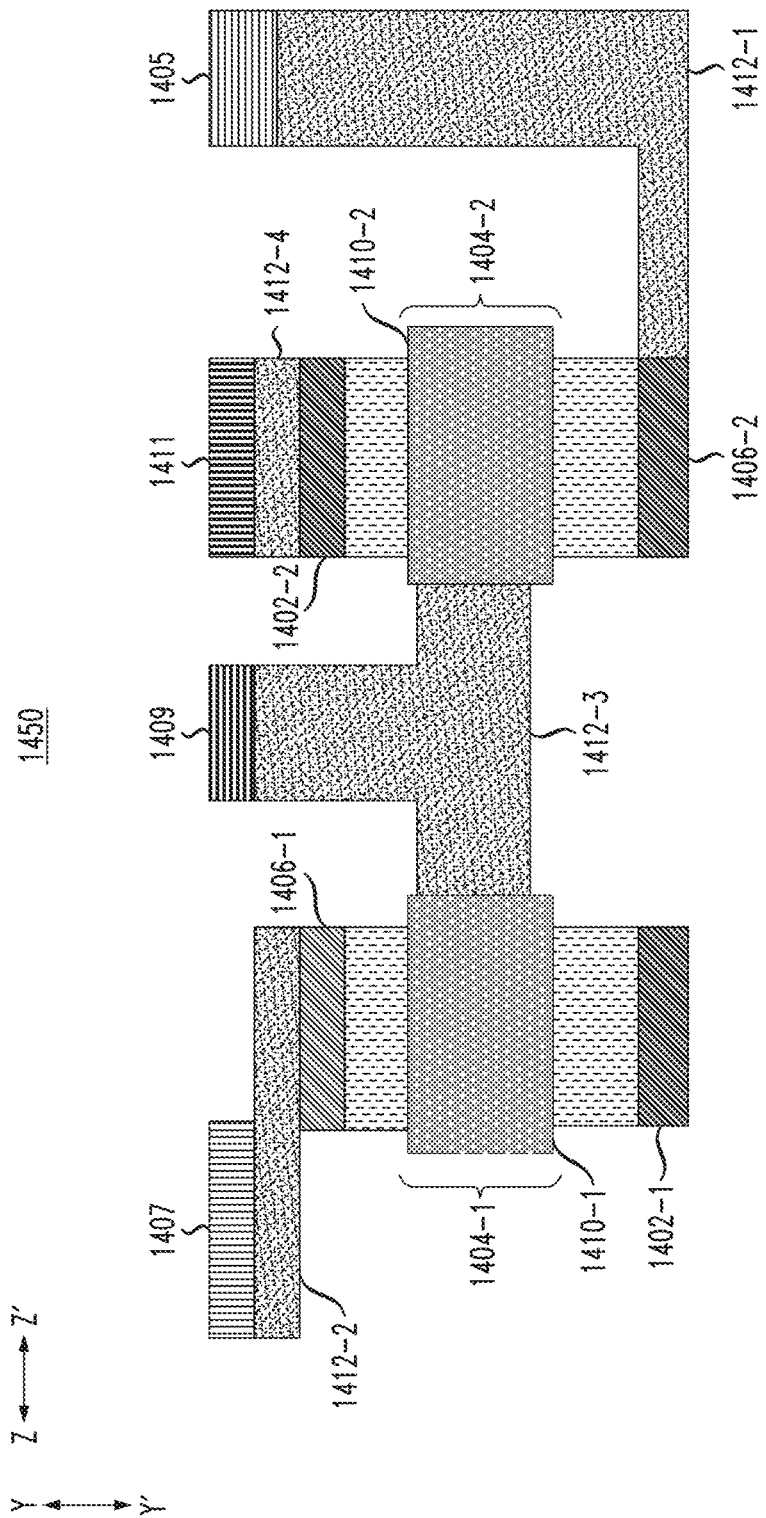

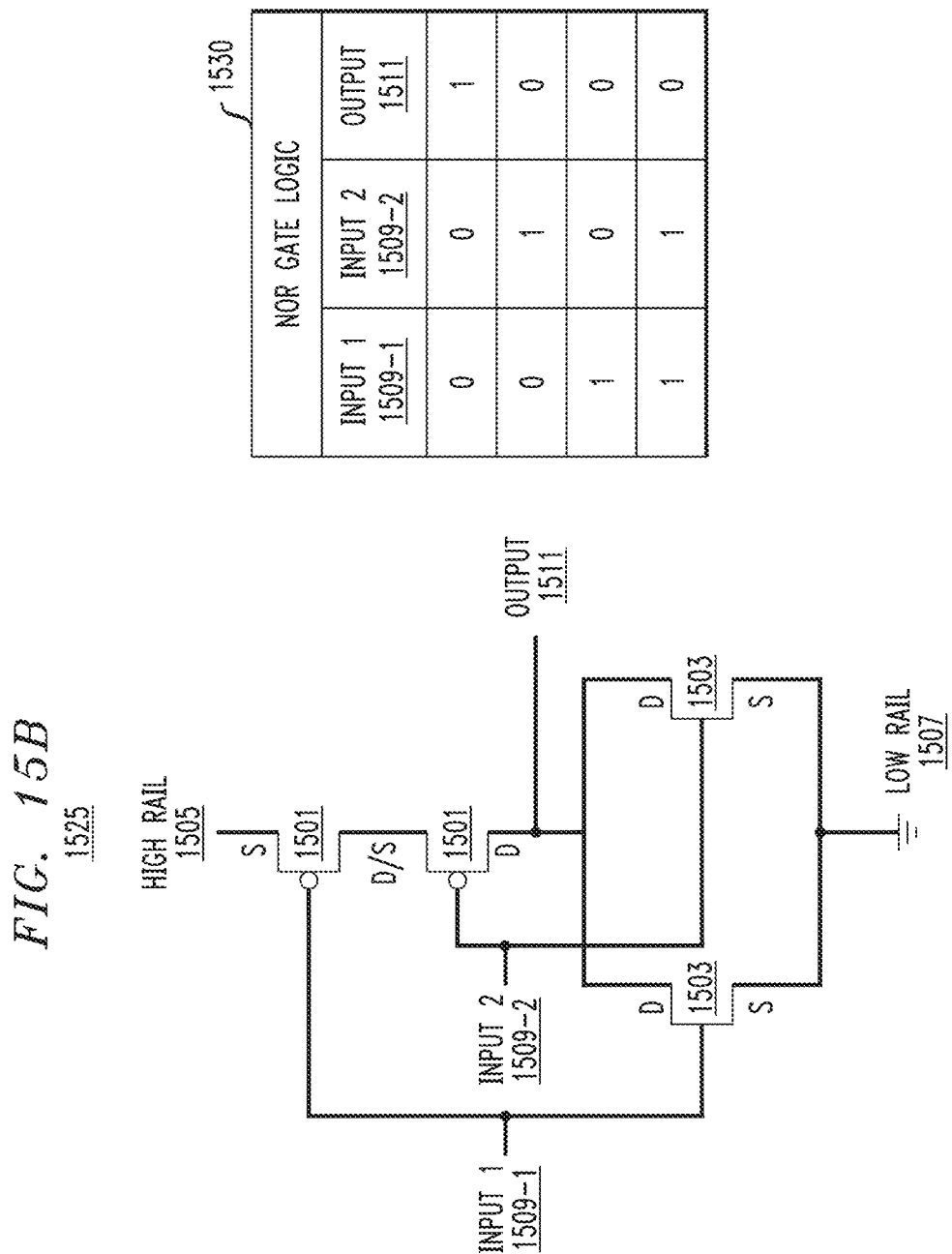

1595

1600

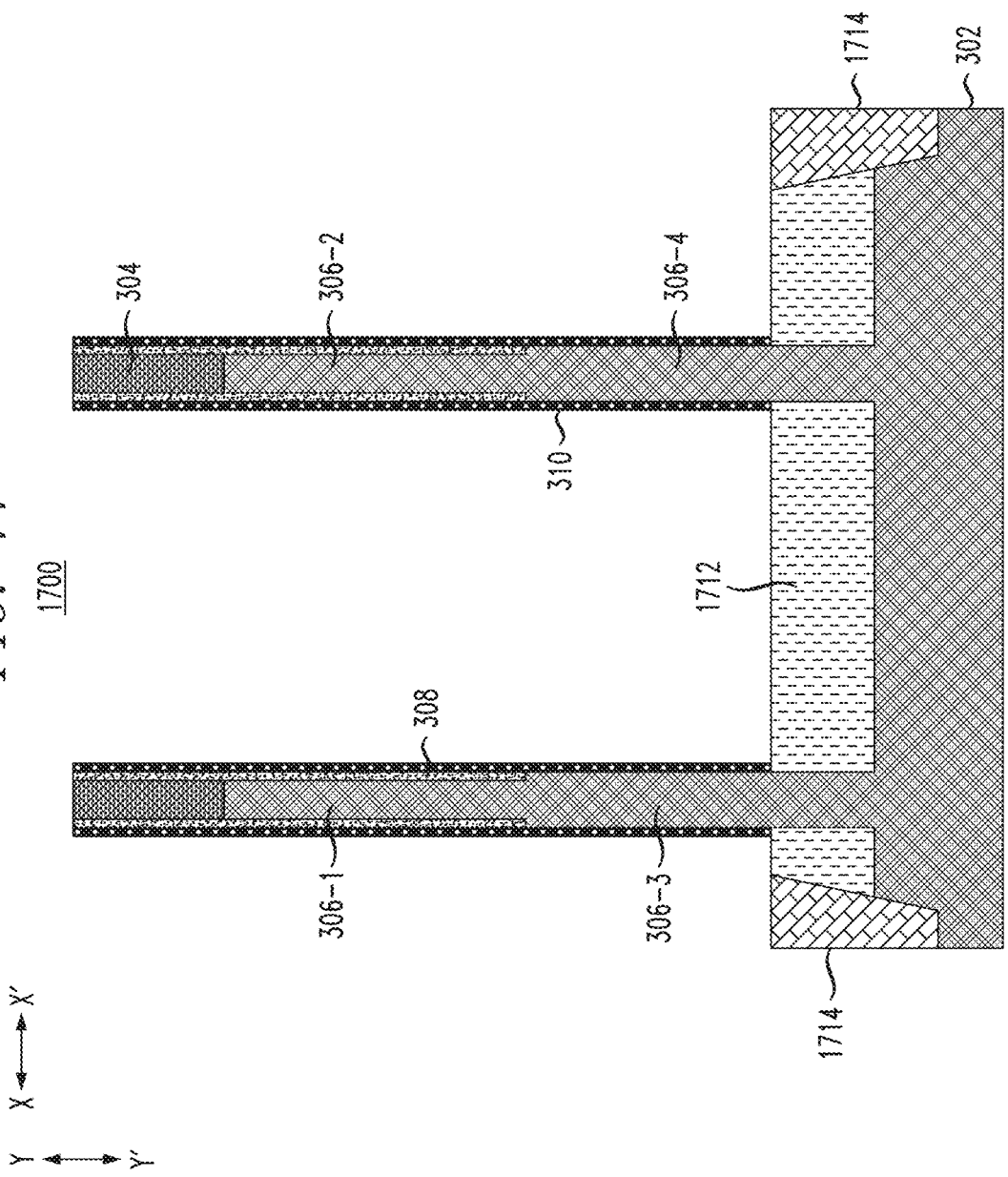

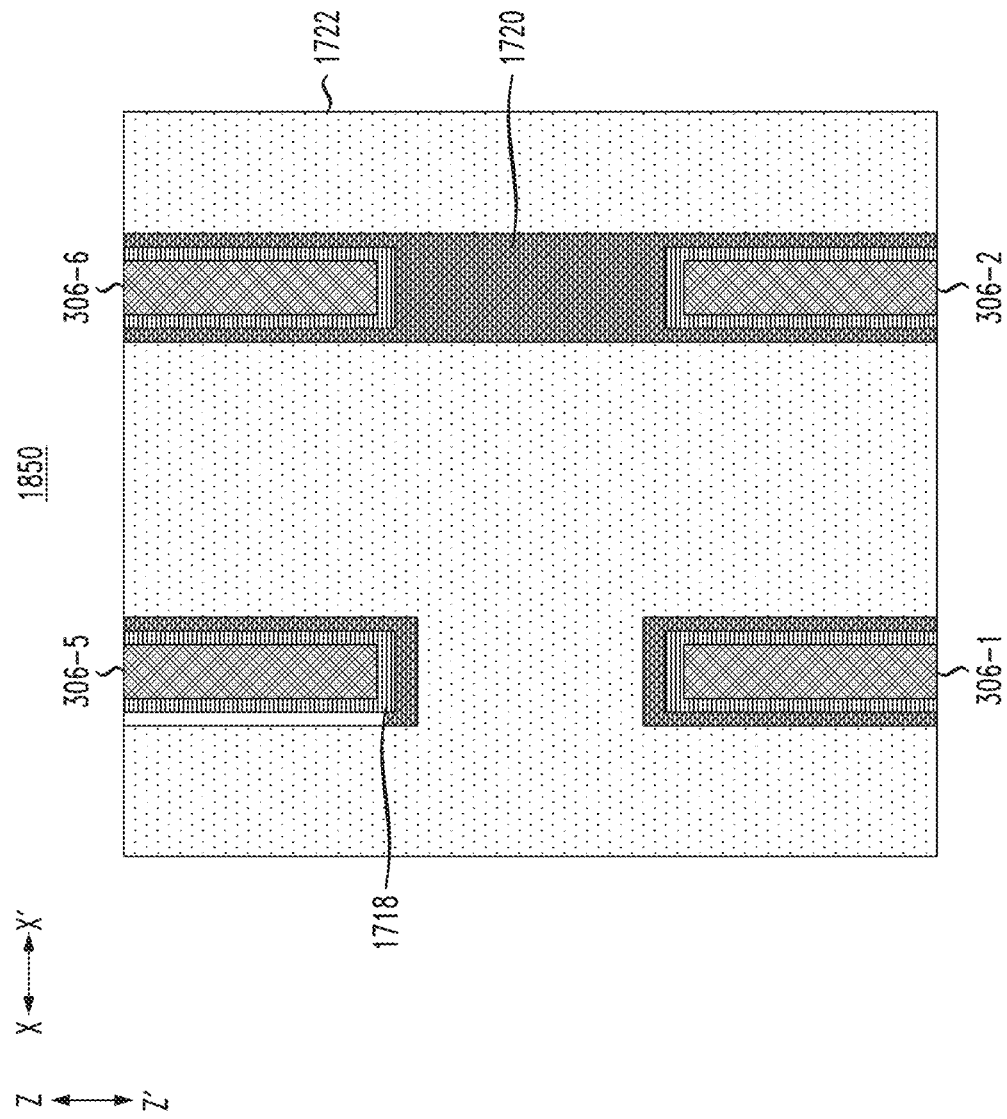

1900

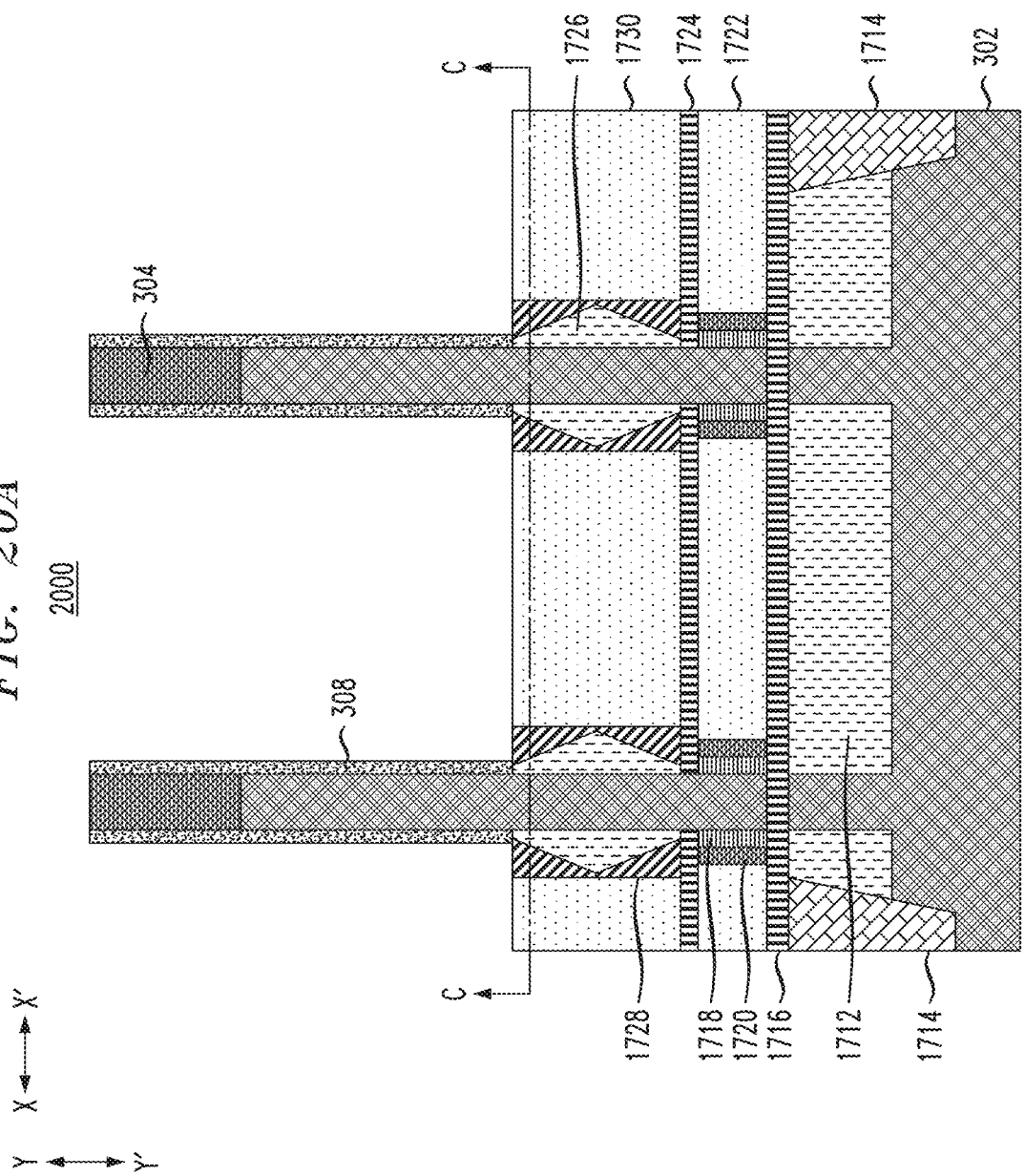

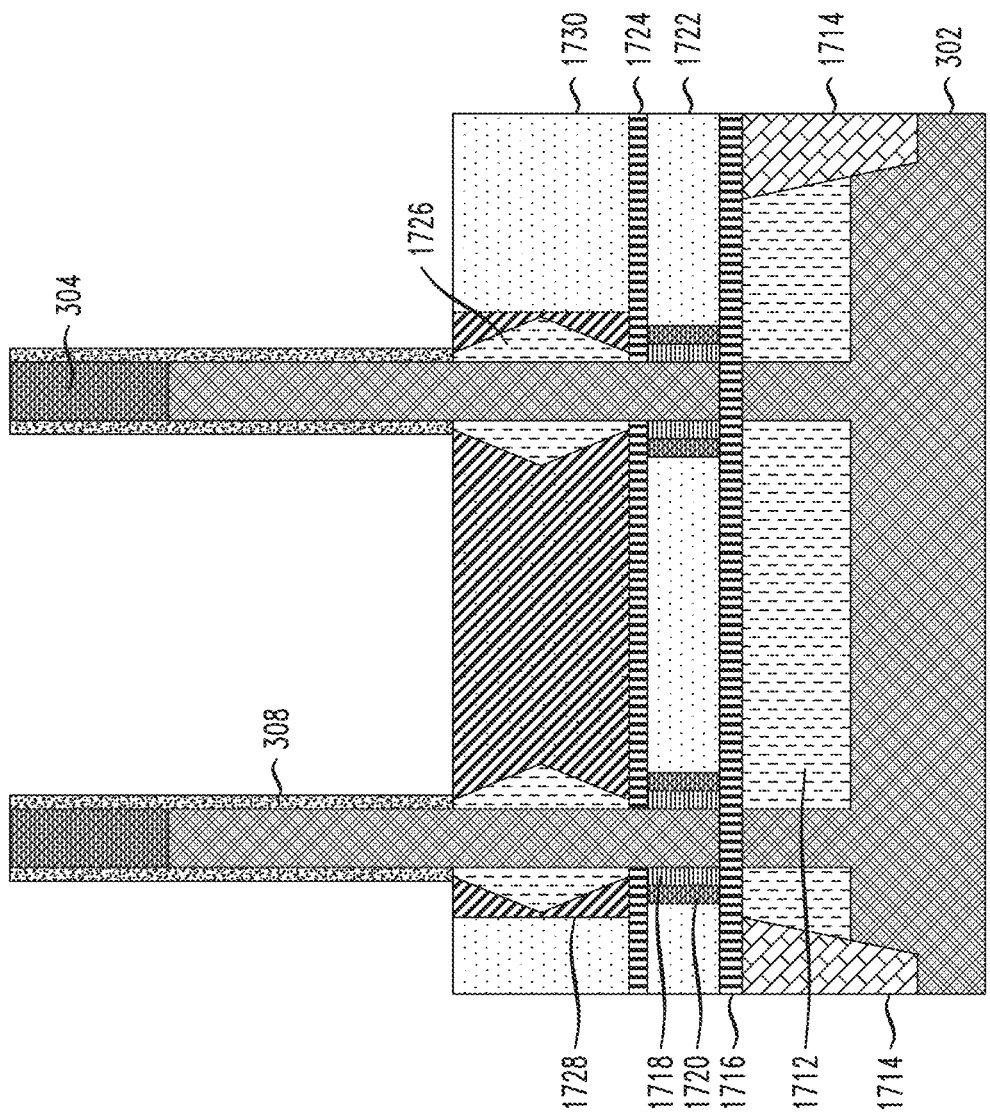

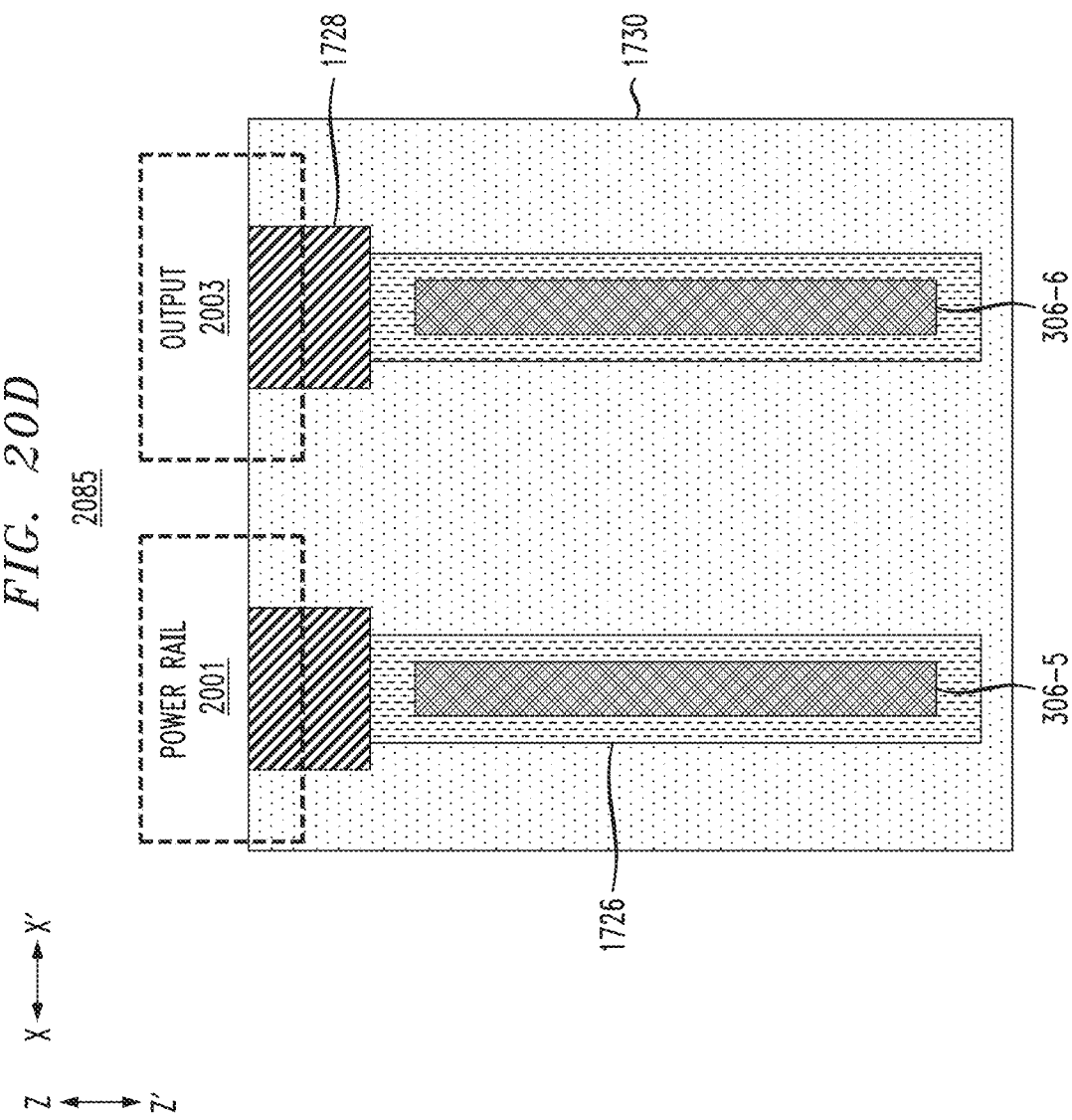

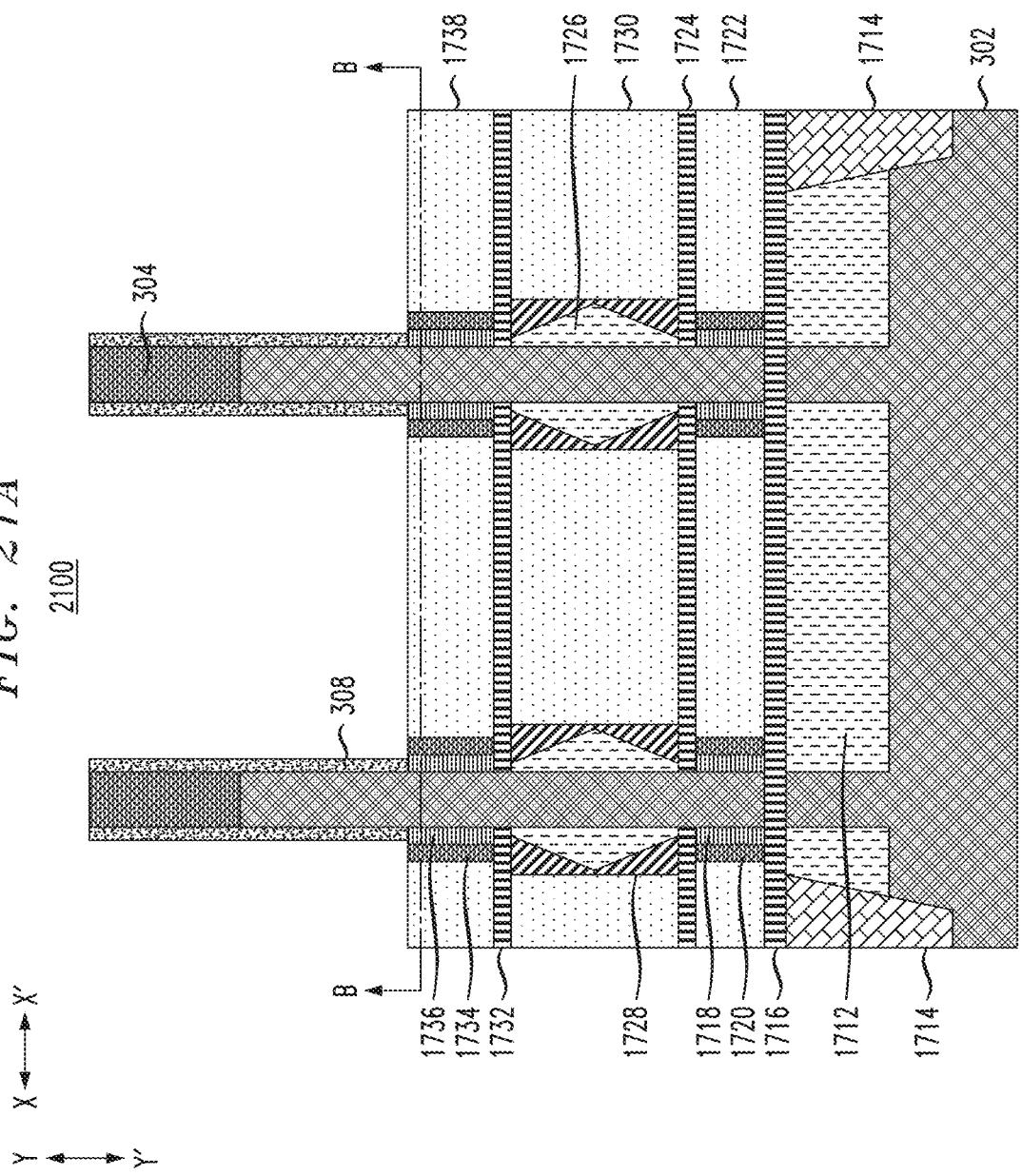

2250

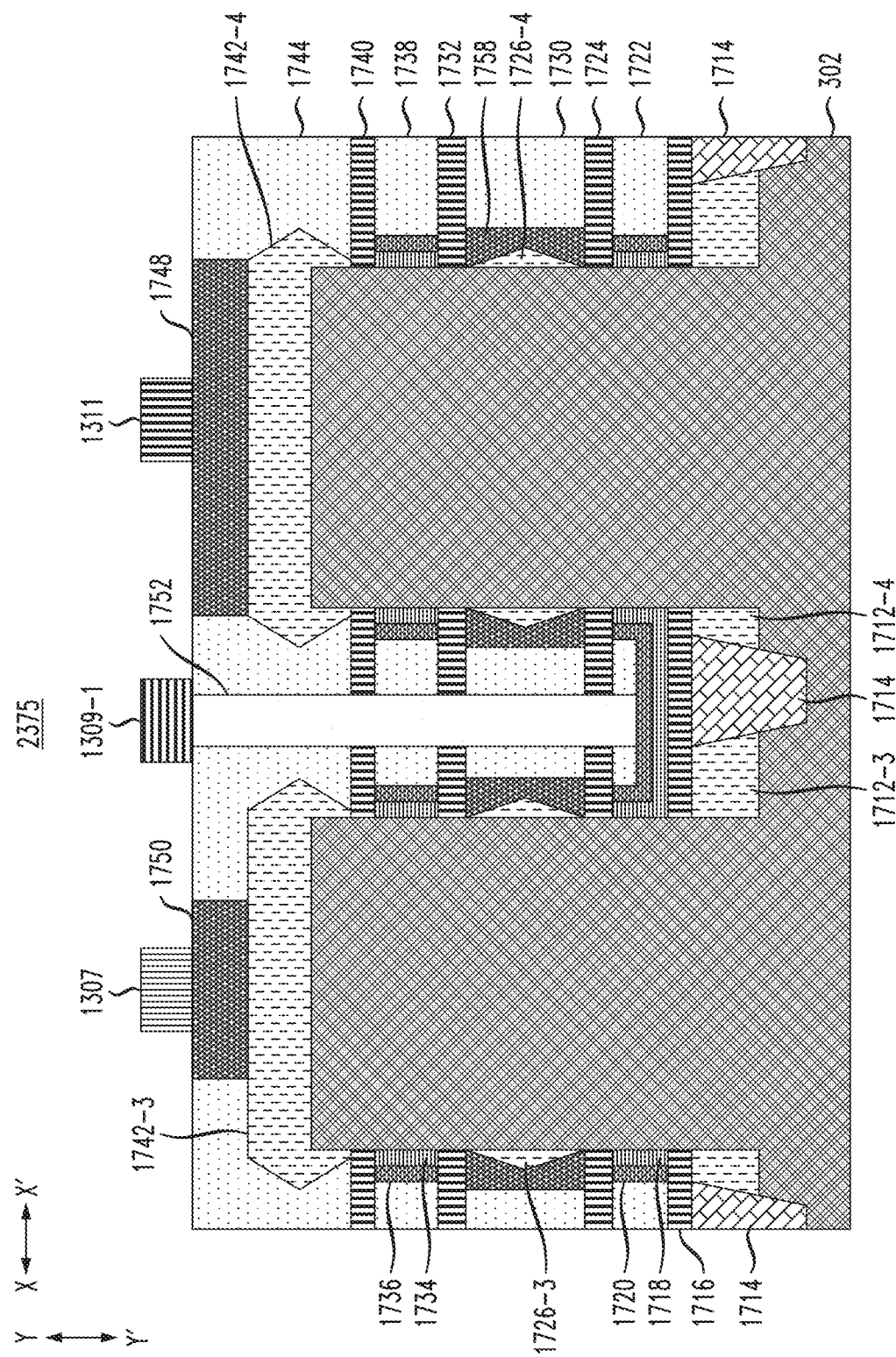

2400

2450

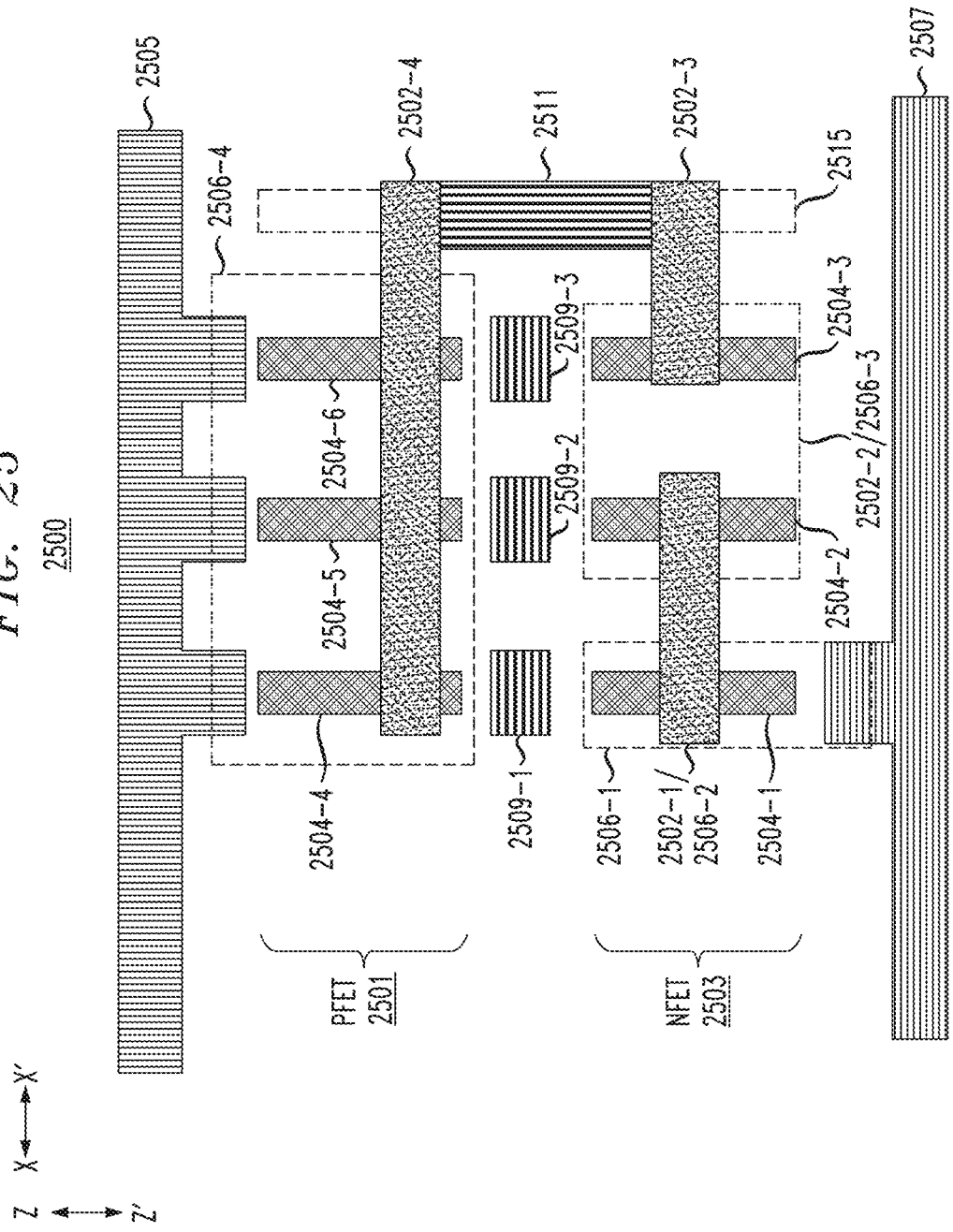

2600

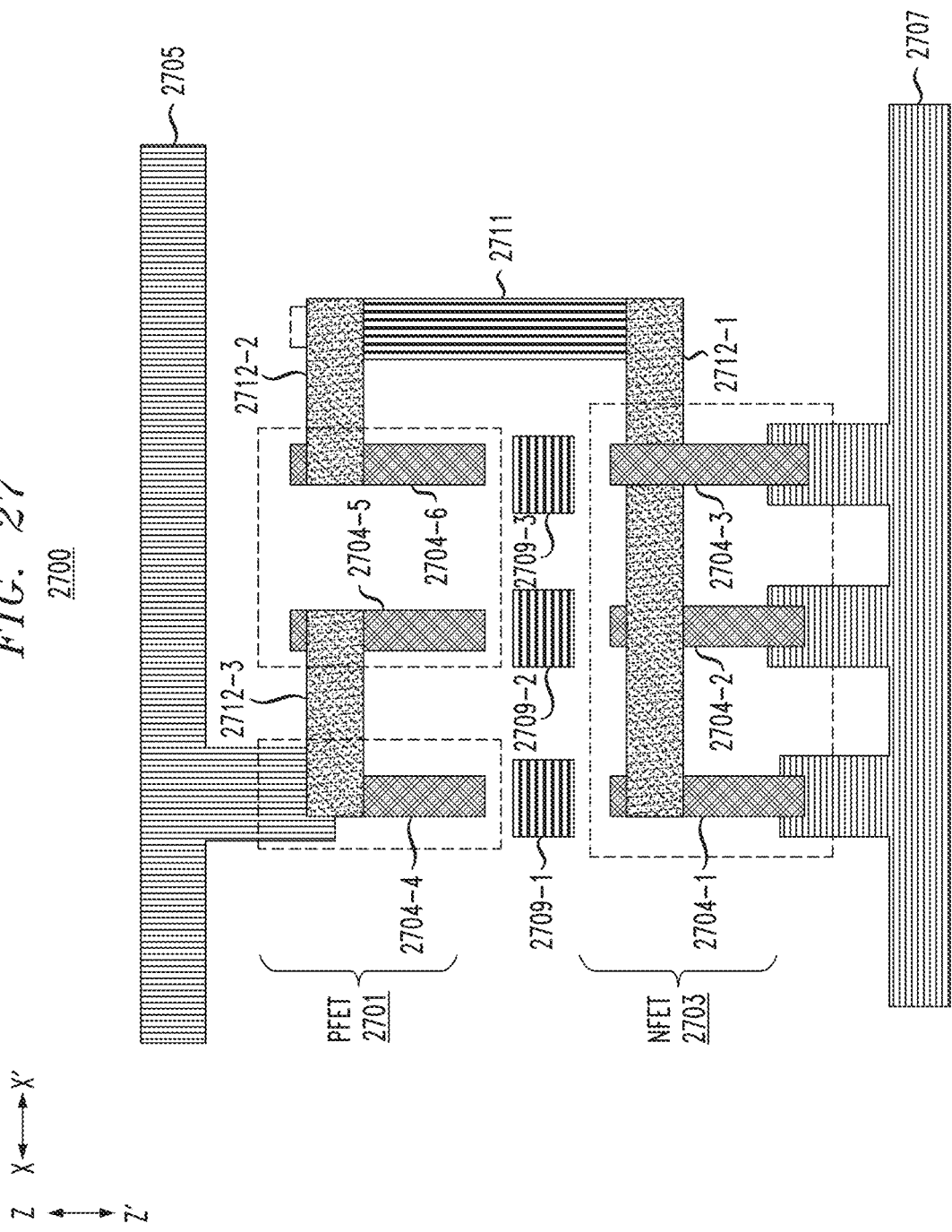

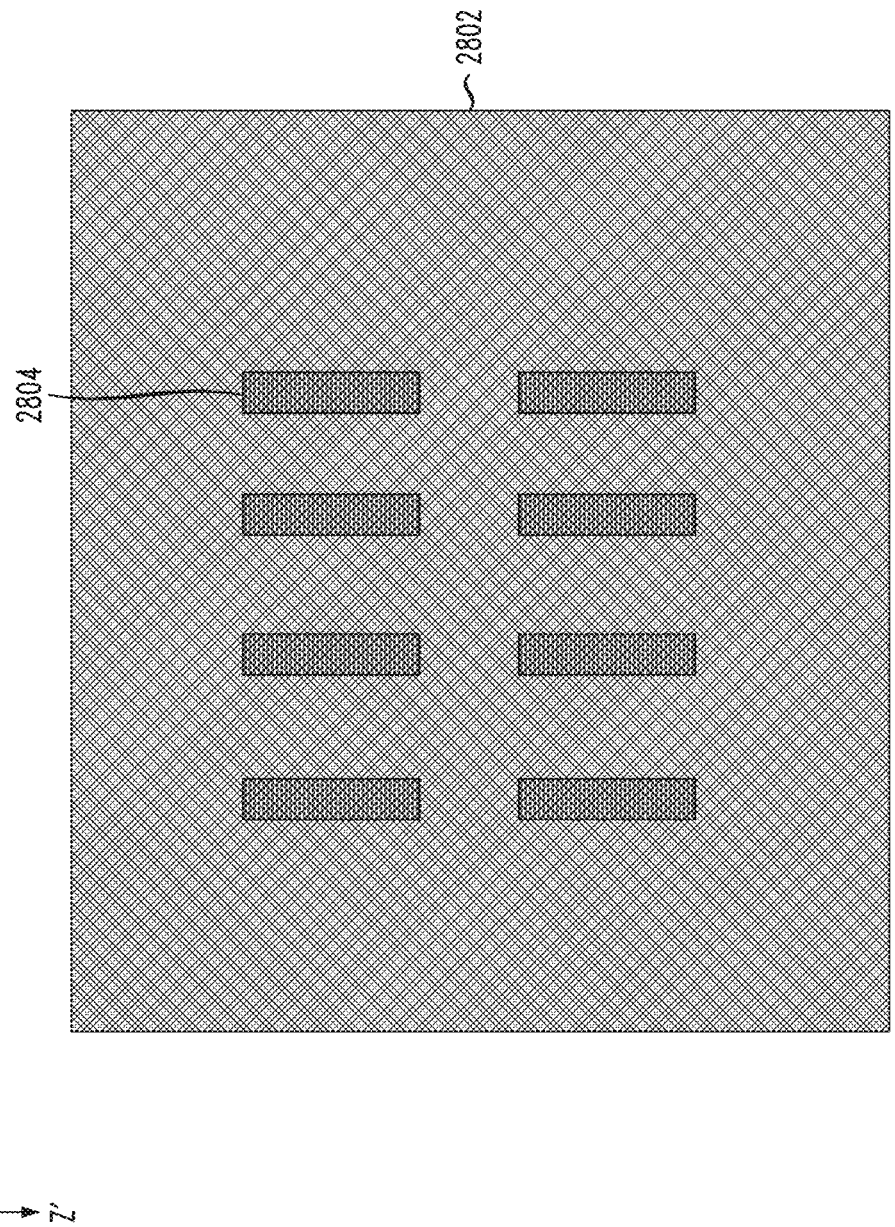

2900

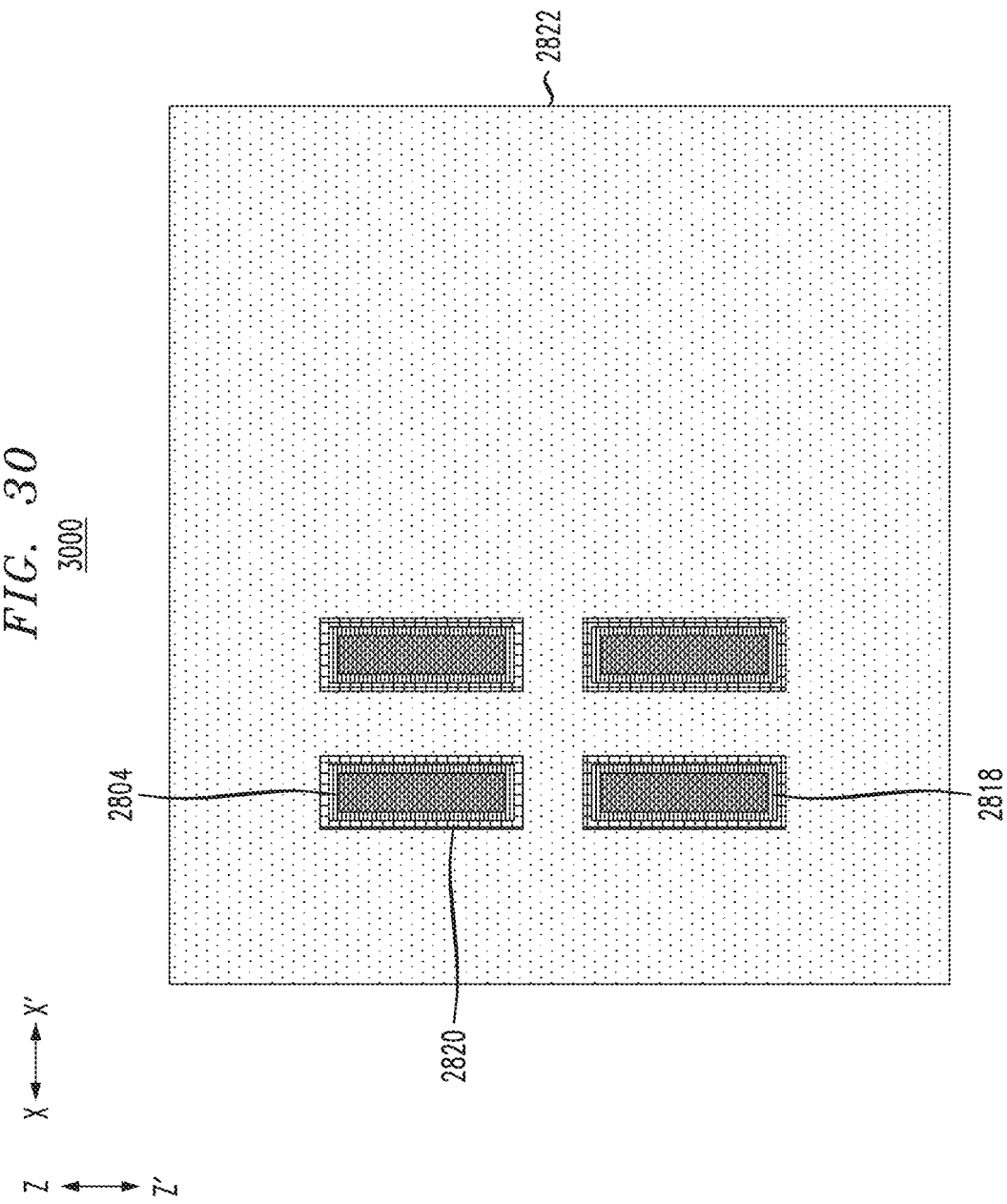

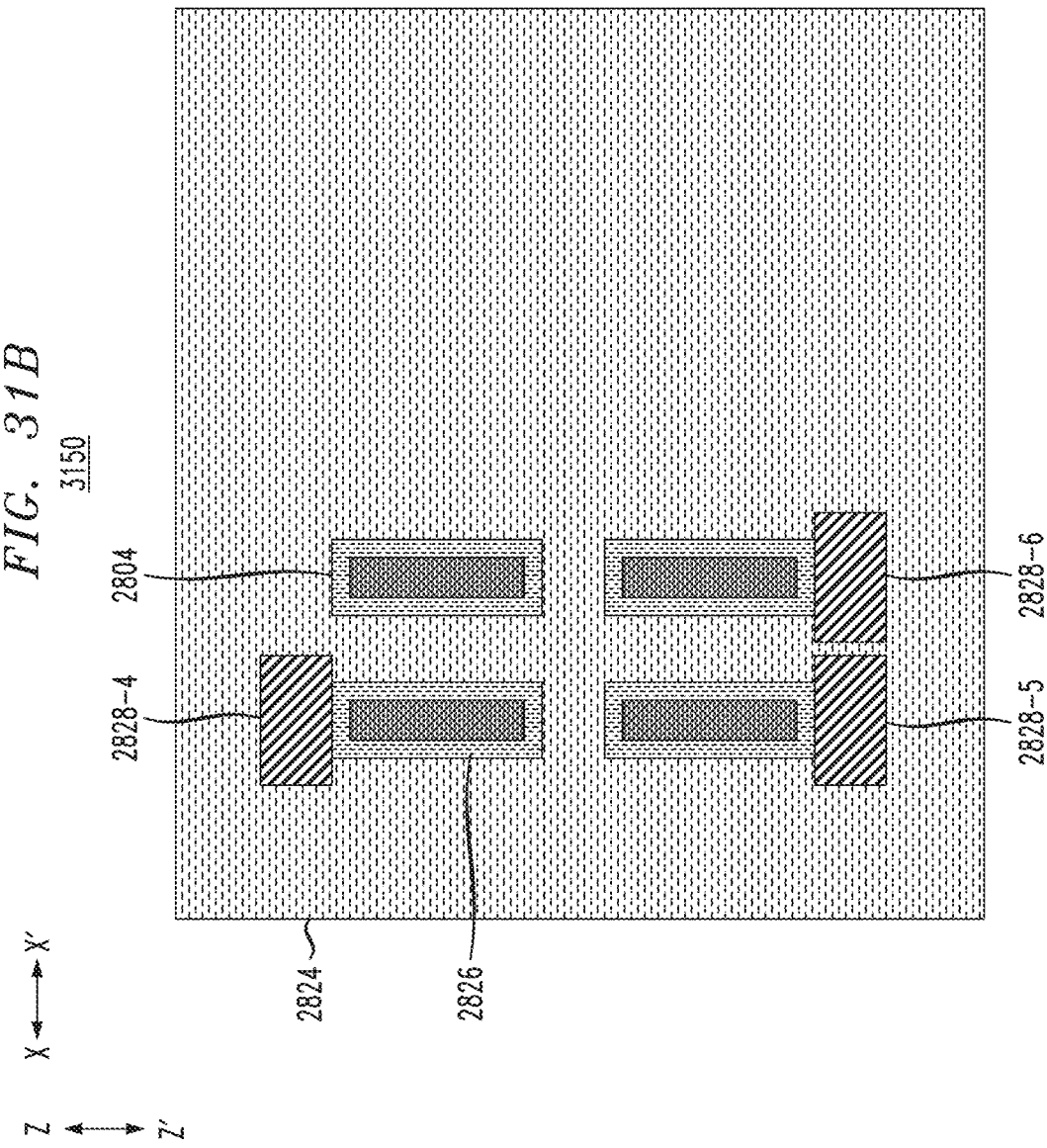

3200

3400

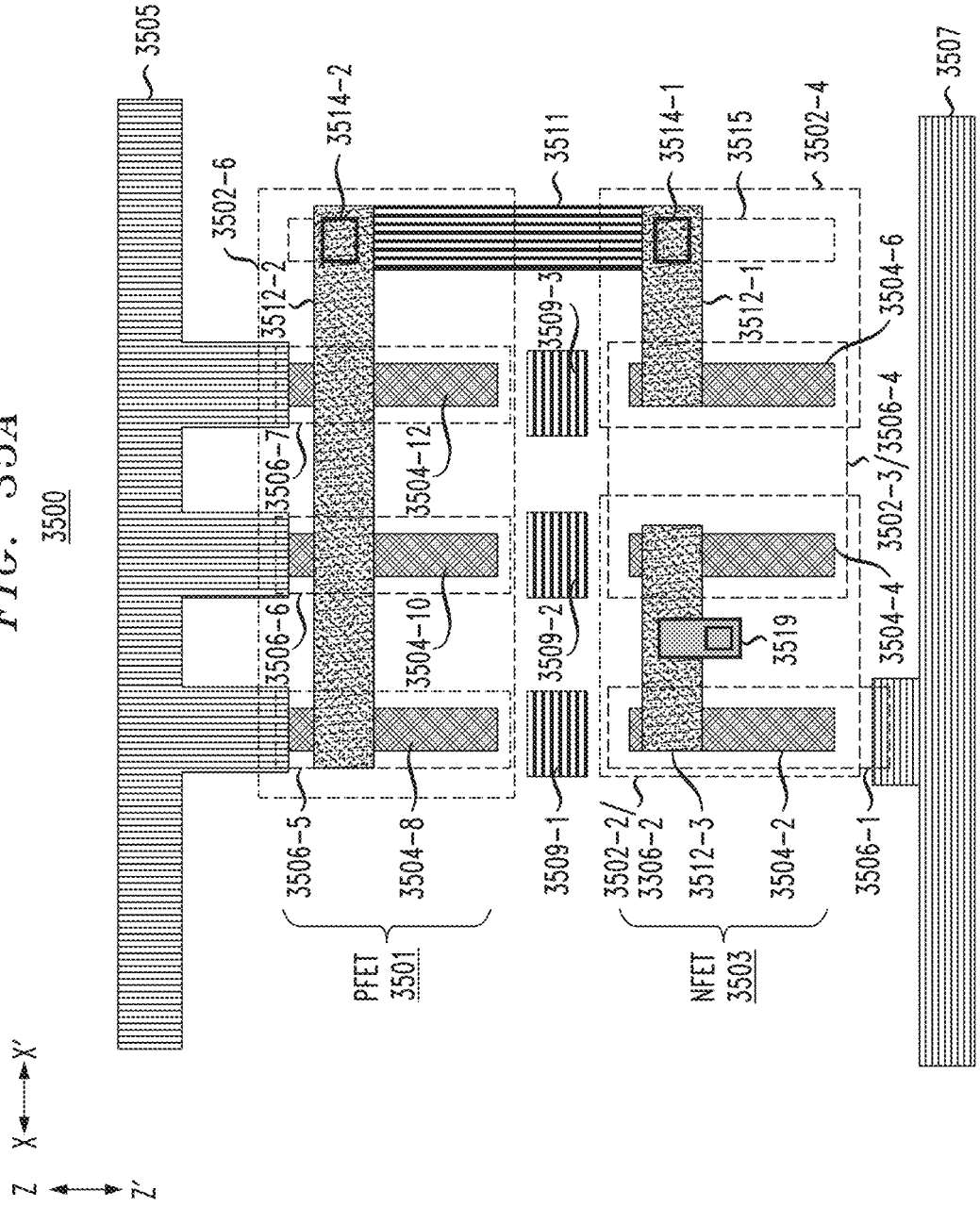

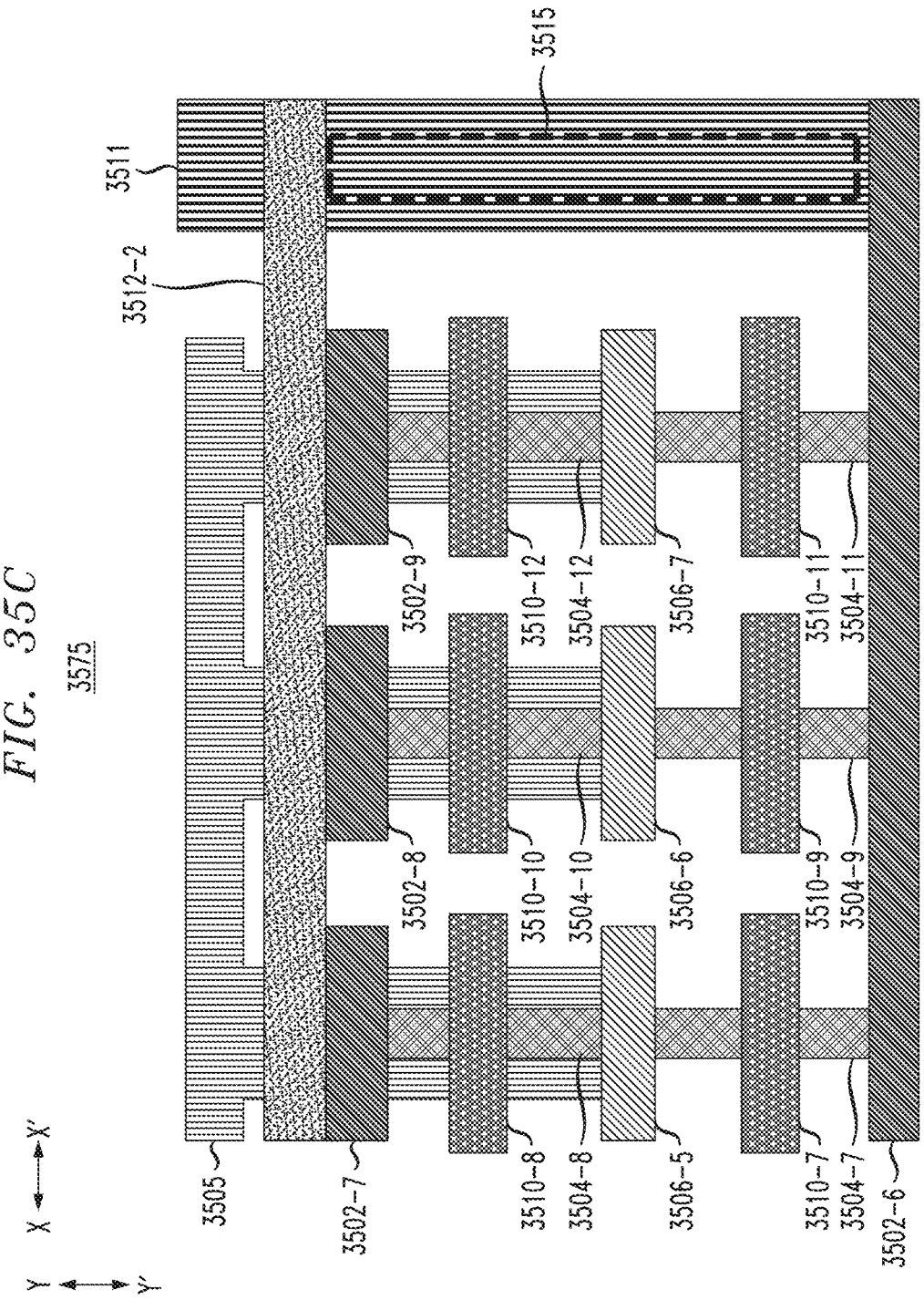

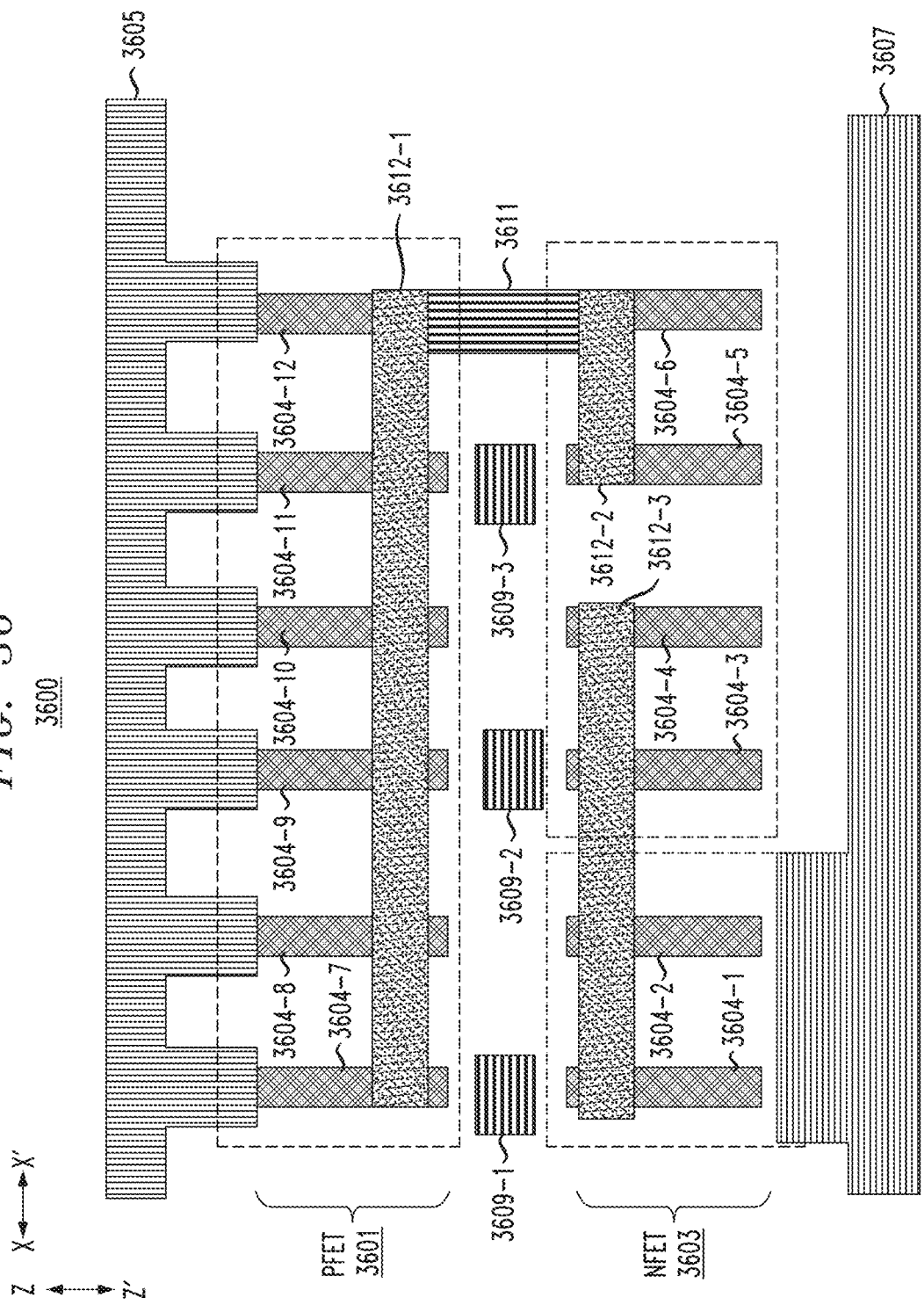

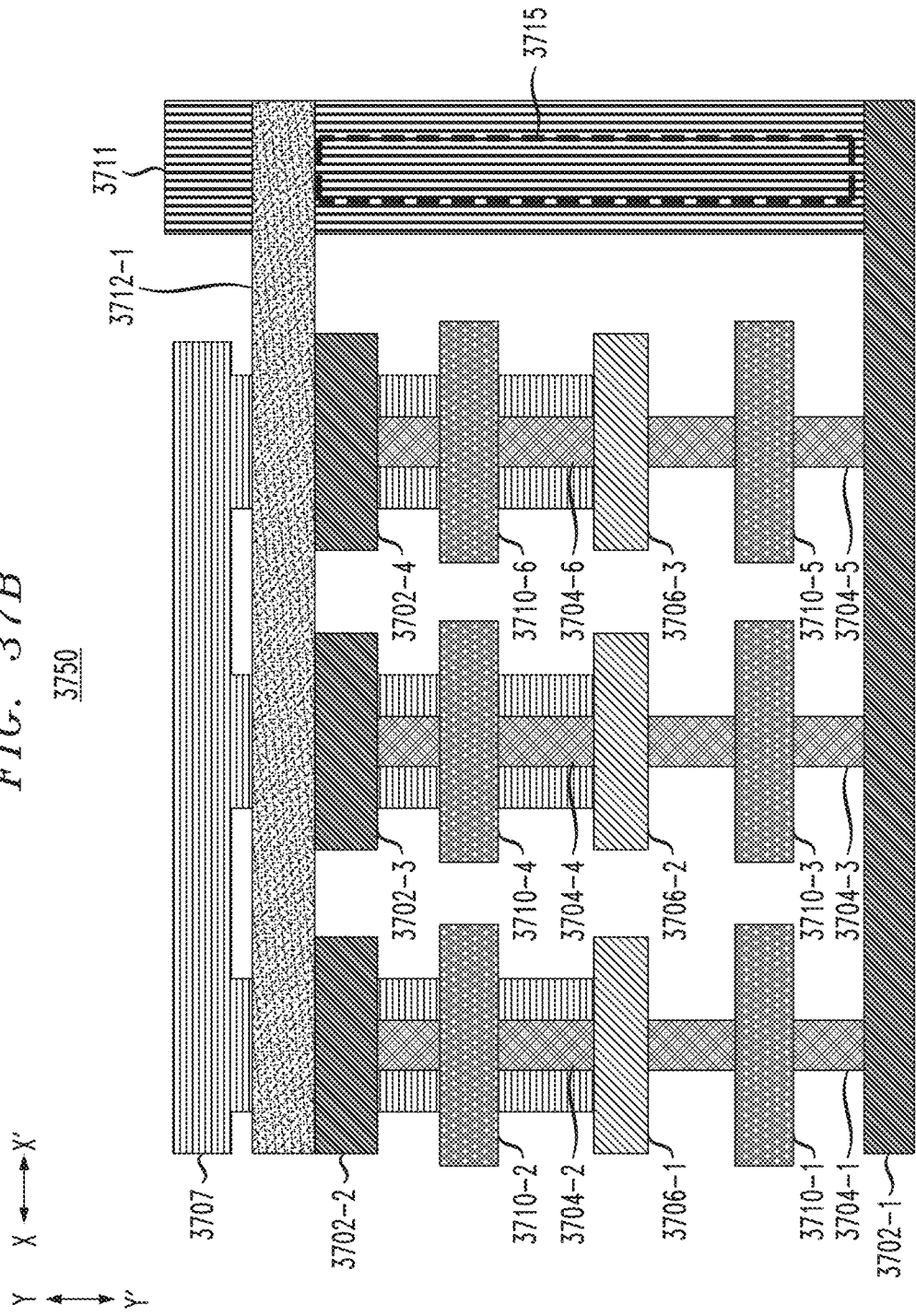

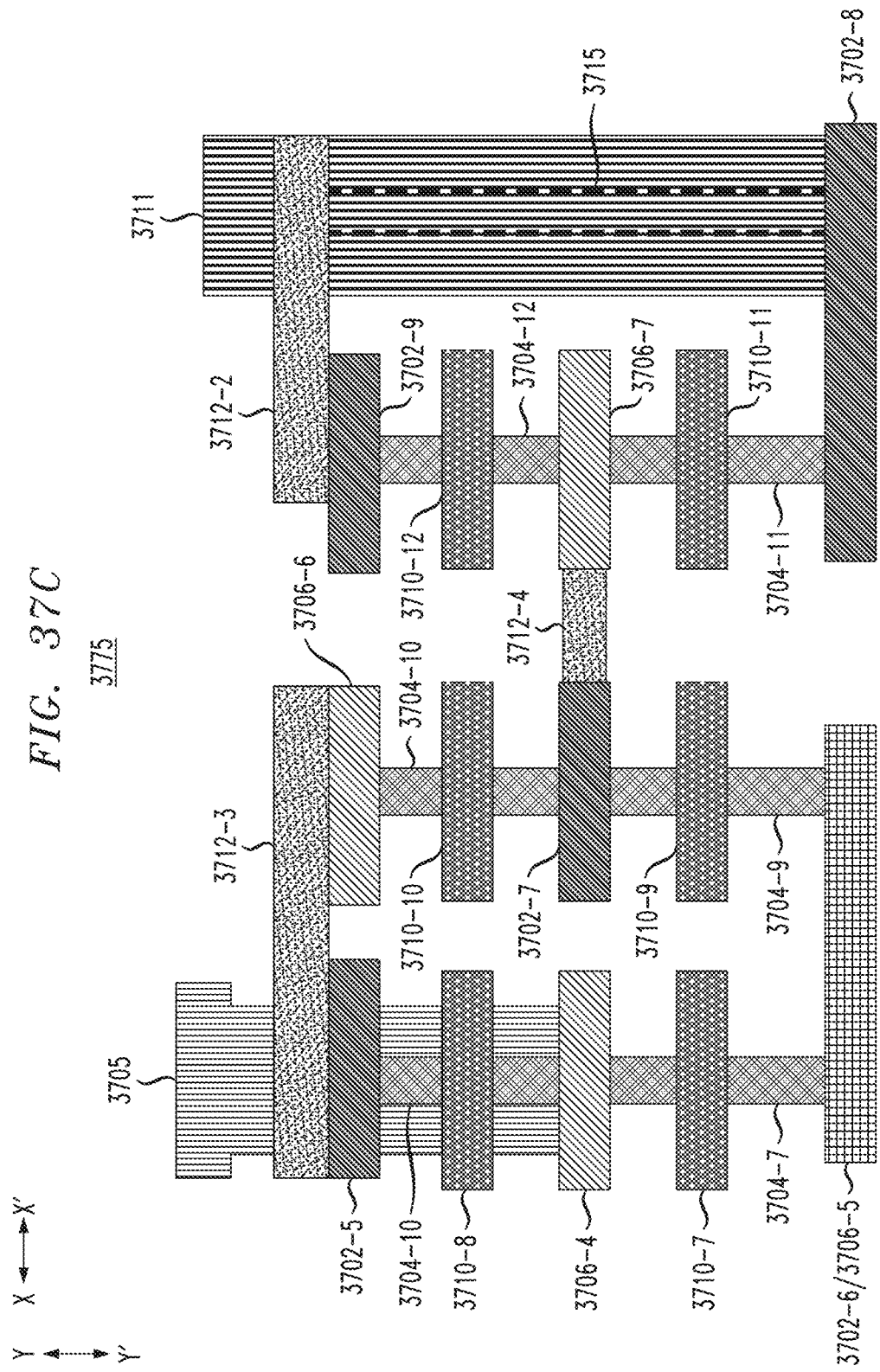

4000

4100

4300

4500

4550

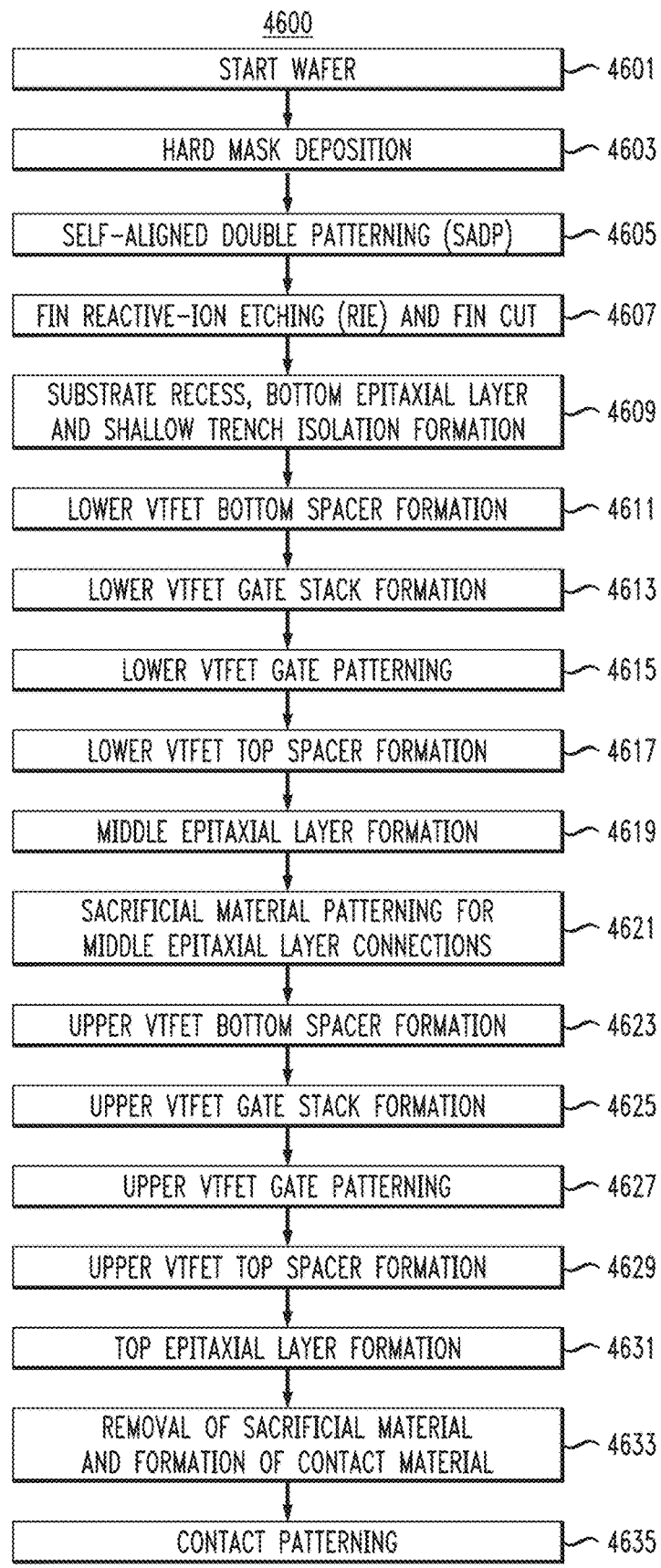

STACKED VERTICAL TRANSPORT FIELD-EFFECT TRANSISTOR LOGIC GATE STRUCTURES WITH SHARED EPITAXIAL LAYERS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming stacked vertical transport field-effect transistor (VT-FET) logic gate structures with shared epitaxial layers.

In one embodiment, a semiconductor structure comprises two or more vertical fins, a bottom epitaxial layer surrounding a bottom portion of a given one of the two or more vertical fins, a top epitaxial layer surrounding a top portion of the given one of the two or more vertical fins, a shared epitaxial layer surrounding a middle portion of the given one of the two or more vertical fins, and a connecting layer contacting the bottom epitaxial layer and the top epitaxial layer, the connecting layer being disposed to a lateral side of the two or more vertical fins.

In another embodiment, a method of forming a semiconductor structure comprises forming two or more vertical fins, forming a bottom epitaxial layer surrounding a bottom portion of a given one of the two or more vertical fins, forming a top epitaxial layer surrounding a top portion of the given one of the two or more vertical fins, forming a shared epitaxial layer surrounding a middle portion of the given one of the two or more vertical fins, and forming a connecting layer contacting the bottom epitaxial layer and the top epitaxial layer, the connecting layer being disposed to a lateral side of the two or more vertical fins.

In another embodiment, an inverter logic gate comprises a four-channel n-type field-effect transistor and a four-channel p-type field-effect transistor. The four-channel n-type field-effect transistor comprises two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The four-channel p-type field-effect transistor comprises two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The inverter logic gate also comprises a connecting layer contacting the bottom epitaxial layers and the top epitaxial layers of the four-channel n-type field-effect transistor and the four-channel p-type field-effect transistor.

In another embodiment, a two-input logic gate comprises two two-channel n-type field-effect transistors and two two-channel p-type field-effect transistors. The two two-channel n-type field-effect transistors comprise two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The two two-channel p-type field-effect transistors comprise two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The two-input logic gate also comprises a connecting layer contacting the bottom epitaxial layers and the top epitaxial layers of one of (i) the two two-channel n-type field-effect transistors and (ii) the two two-channel p-type field effect transistors.

In another embodiment, a three-input logic gate comprises three n-type field-effect transistors and three p-type field effect transistors. The three n-type field-effect transistors comprise a first set of one or more vertical fins, at least one vertical fin in the first set of one or more vertical fins comprising a bottom epitaxial layer surrounding a bottom portion of the at least one vertical fin in the first set of one or more vertical fins, a top epitaxial layer surrounding a top portion of the at least one vertical fin in the first set of one or more vertical fins, and a shared epitaxial layer surrounding a middle portion of the at least one vertical fin in the first set of one or more vertical fins. The three p-type field-effect transistors comprise a second set of one or more vertical fins, at least one vertical fin in the second set of one or more vertical fins comprising a bottom epitaxial layer surrounding a bottom portion of the at least one vertical fin in the second set of one or more vertical fins, a top epitaxial layer surrounding a top portion of the at least one vertical fin in the first set of one or more vertical fins, and a shared epitaxial layer surrounding a middle portion of the at least one vertical fin in the second set of one or more vertical fins. The three-input logic gate also comprises a connecting layer contacting the bottom epitaxial layer and the top epitaxial layer of one of the at least one vertical fins in one of the first and second sets of one or more vertical fins.

BRIEF DESCRIPTION OF THE DRAWINGS

FIG. 2B shows a cross-sectional view of the FIG. 2A vertical transport field-effect transistor inverter structure, according to an embodiment of the invention.

FIG. 3 shows a cross-sectional view of a semiconductor structure following formation of top portions of vertical fins, according to an embodiment of the invention.

FIG. 4 shows a cross-sectional view of the FIG. 3 structure following formation of bottom portions of the vertical fins, according to an embodiment of the invention.

FIG. 7A shows a cross-sectional view of the FIG. 6 structure following formation of a shared epitaxial layer and spacers for lower and upper vertical transport field-effect transistors, according to an embodiment of the invention.

FIG. 9 shows a cross-sectional view of the FIG. 8 structure following removal of a sacrificial layer surrounding the shared epitaxial layer, according to an embodiment of the invention.

FIG. 10B shows a top-down view of the FIG. 10A structure, according to an embodiment of the invention.

FIG. 11B shows a top-down view of the FIG. 11A structure, according to an embodiment of the invention.

FIG. 13A shows a top-down view of a stacked vertical transport field-effect transistor NAND2 structure using two two-channel n-type field-effect transistors and two two-channel p-type field-effect transistors, according to an embodiment of the invention.

FIG. 13B shows a circuit diagram and logic table for a NAND2 gate, according to an embodiment of the invention.

FIG. 13F shows another cross-sectional view taken across the fins of the stacked vertical transport field-effect transistor NAND2 structure of FIG. 13A, according to an embodiment of the invention.

FIG. 14B shows a cross-sectional view of the FIG. 14A vertical transport field-effect transistor NAND2 structure, according to an embodiment of the invention.

FIG. 15B shows a circuit diagram and logic table for a NOR2 gate, according to an embodiment of the invention.

FIG. 17 shows a cross-sectional view of the FIG. 5 structure following formation of a bottom epitaxial layer and shallow trench isolation regions, according to an embodiment of the invention.

FIG. 18B shows a top cross-sectional view of the FIG. 18A structure, according to an embodiment of the invention.

FIG. 20A shows a cross-sectional view of the FIG. 19 structure following formation of a sacrificial layer around the shared epitaxial layer, according to an embodiment of the invention.

FIG. 20B shows another cross-sectional view of the FIG. 19 structure following formation of the sacrificial layer around the shared epitaxial layer, according to an embodiment of the invention

FIG. 20D shows a top cross-sectional view of the structure of FIGS. 20A and 20B for a stacked vertical transport field-effect transistor NOR2 structure, according to an embodiment of the invention.

FIG. 21A shows a cross-sectional view of the FIG. 20A structure following formation the gate stack for the upper vertical transport field-effect transistors, according to an embodiment of the invention.

FIG. 23C shows another cross-sectional view of the FIG. 22A structure following formation of contacts for the stacked vertical transport field-effect transistor NAND2 structure, according to an embodiment of the invention.

FIG. 25 shows a top-down view of a vertical transport field-effect transistor NAND3 structure using three one-channel n-type field-effect transistors and three one-channel p-type field-effect transistors, according to an embodiment of the invention.

FIG. 27 shows a top-down view of a vertical transport field-effect transistor NOR3 structure using three one-channel n-type field-effect transistors and three one-channel p-type field-effect transistors, according to an embodiment of the invention.

FIG. 28 shows a top-down view of a substrate following fin formation, according to an embodiment of the invention.

FIG. 30 shows a top-down view of the FIG. 29 structure following formation of an interlayer dielectric layer, according to an embodiment of the invention.

FIG. 31B shows a top-down view of the FIG. 30 structure following formation of a shared middle epitaxial layer and sacrificial material for contact patterning to the shared middle epitaxial layer for a stacked vertical transport field-effect transistor NOR3 structure, according to an embodiment of the invention.

FIG. 35A shows a top-down view of a stacked vertical transport field-effect transistor NAND3 structure using three two-channel n-type field-effect transistors and three two-channel p-type field-effect transistors, according to an embodiment of the invention

FIG. 35C shows another cross-sectional view of the FIG. 35A stacked vertical transport field-effect transistor NAND3 structure, according to an embodiment of the invention.

FIG. 36 shows a top-down view of a vertical transport field-effect transistor NAND3 structure using three two-channel n-type field-effect transistors and three two-channel p-type field-effect transistors, according to an embodiment of the invention.

FIG. 37B shows a cross-sectional view of the FIG. 37A stacked vertical transport field-effect transistor NOR3 structure, according to an embodiment of the invention.

FIG. 37C shows another cross-sectional view of the FIG. 37A stacked vertical transport field-effect transistor NOR3 structure, according to an embodiment of the invention.

FIG. 46 shows a process flow for forming a stacked vertical transport field-effect transistor structure with a shared epitaxial layer between upper and lower vertical transport field-effect transistors in vertical fins thereof, according to an embodiment of the invention.

DETAILED DESCRIPTION

Figure 1A:
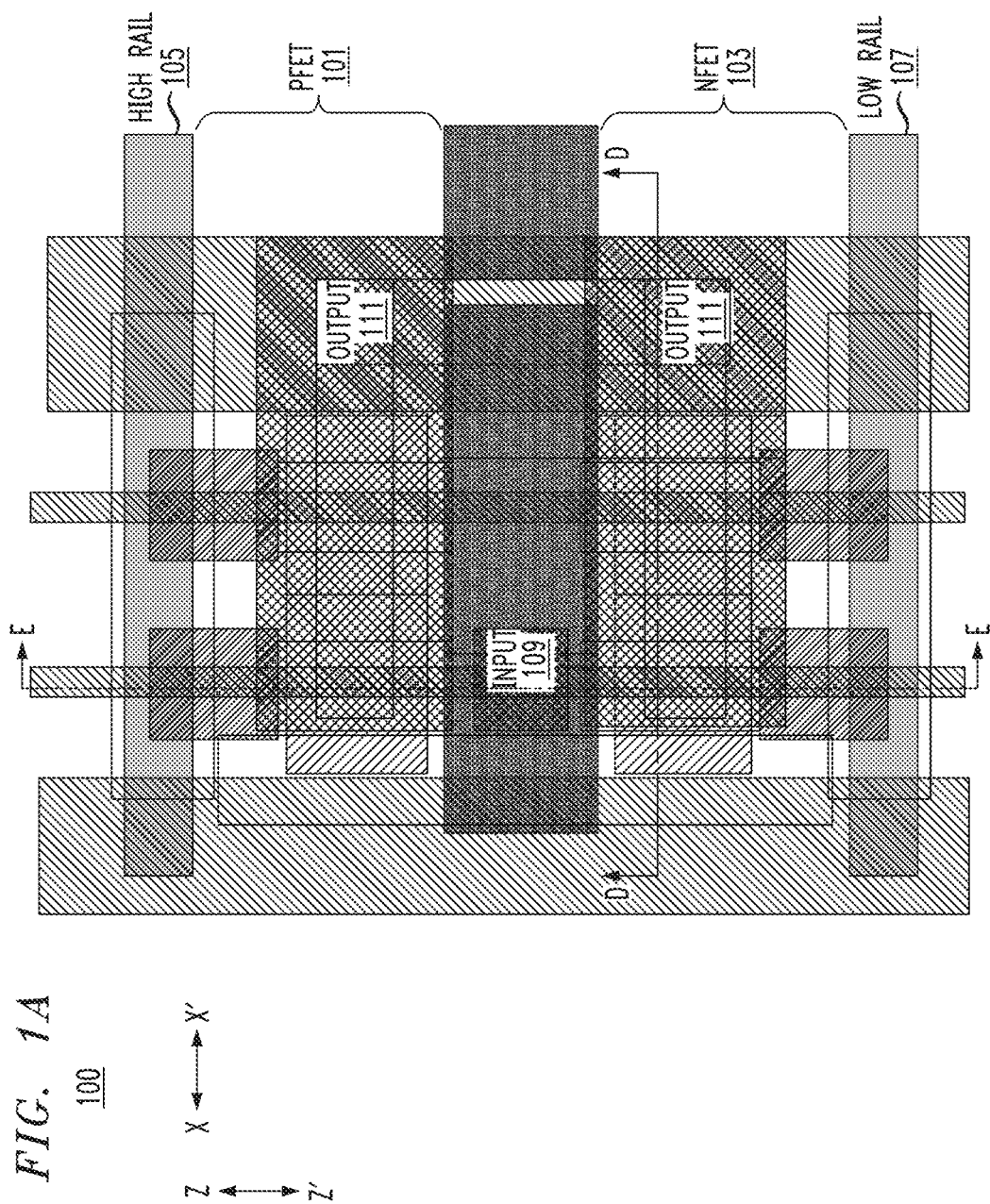
FIG. 1A shows a top-down view of a stacked vertical transport field-effect transistor inverter structure using two two-channel n-type field-effect transistors and two two-channel p-type field-effect transistors, according to an embodiment of the invention.

Illustrative embodiments of the invention may be described herein in the context of illustrative methods for forming stacked vertical transport field-effect transistor logic gate structures with shared epitaxial layers, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (NFET and PFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Stacking FETs in a vertical direction gives an additional dimension for CMOS area scaling. It is difficult, however, to stack planar FETs. Vertical transport FETs (VTFETs) are being pursued as viable CMOS architectures for scaling to 7 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration. VTFETs may further provide advantages in stacking FETs.

Illustrative embodiments provide techniques for forming stacked VTFET structures, including stacked VTFET structures for various types of logic gates including inverters, NAND gates, NOR gates, etc. In some embodiments, the stacked VTFET structures utilize shared source/drains between the "upper" and "lower" VTFETs in a stacked VTFET structure.

For current VTFETs, one method of increasing drive current is to increase the contact area between epitaxial layers providing source/drains to the channels. This, however, compromises area scaling for VTFETs as for this architecture area depends on active area size. Some embodiments provide techniques for an inverter logic gate design, where the inverter uses four-channel FETs, providing a 33% improvement in effective width (Weff) from a 3-channel VTFET with the same top-down area. With the increased number of FET channels, benefits above traditional VTFETs increase. The inverter design may also utilize a C-shaped connection between drain regions on the top fin channel and the bottom fin channel, providing a further opportunity for area scaling and track height reduction without sacrificing Weff.

The inverter structure in some embodiments uses stacked fin VTFETs with shared source/drain among same device types (e.g., between NFETs, between PFETs). The structure does not require insulation between the top fin channel and the bottom fin channel, as the top fin channel and the bottom fin channel share the same source/drain. In the stacked VTFET structure, the same device type (e.g., NFET, PFET) are stacked on top of each other (e.g., for a given fin, the upper and lower VTFETs are both NFET or both PFET). There are three epitaxial regions along the stacked fins. Depending on configuration, it can be: (i) two epitaxial layers providing drain regions and one epitaxial layer providing a shared source region; (ii) two epitaxial layers providing source regions and one epitaxial layer providing a shared drain region; or (iii) the shared epitaxial layer is the drain (or source) for the lower VTFET, while it is the source (or drain) for the upper VTFET.

For each fin, the structure may include: a bottom epitaxial layer for the fin channel of the lower VTFET; a bottom spacer for the lower VTFET; a gate stack for the lower VTFET; a top spacer for the lower VTFET; an epitaxial layer shared between the fin channels of the lower and upper VTFET; a bottom spacer for the upper VTFET; a gate stack for the upper VTFET; a top spacer for the upper VTFET; and a top epitaxial layer for the upper VTFET. The major carriers of the NFET and PFET devices (e.g., electrons and holes) may or may not flow in opposite directions between the fin channel for the upper and lower VTFETs. Such a structure advantageously provides a 33% reduction in top-down area from non-stacked VTFETs at the same Weff. For each fin, there is the same device type VTFET stacked on top of one another (e.g., for one fin, the upper and lower VTFETs are both NFET while for another fin, the upper and lower VTFETs are both PFET). In other words, the fin channels are n-type on top of another n-type channel for fins providing NFETs and the fin channels are p-type on top of another p-type channel for fins providing PFETs.

The stacked VTFET inverter design utilizes a C-shaped middle-of-line (MOL) connection between the two drain terminals on the same fin. There is an additional connection included between this C-shaped MOL connection for the two drain terminals on the same fin to the output of the inverter, as well as between two C-shaped MOL connections for the fins providing NFETs and PFETs. The stacked VTFET inverter design enables two channels per fin, without requiring use of a silicon-on-insulator (SOI) wafer. The stacked VTFET inverter design utilizes three epitaxial processes for the two-channel fin structure for each device type (e.g., three epitaxial processes for fins providing 2 p-type channels for stacked PFETs, three epitaxial processes for fins providing 2 n-type channels of stacked NFETs).

FIG. 1A shows a top-down view 100 of a stacked VTFET inverter structure. FIG. 1A shows a set of two two-channel PFETs 101, a set of two two-channel NFETs 103, a high power rail 105, a low power rail 107, an input 109 and an output 111.

Figure 1B:
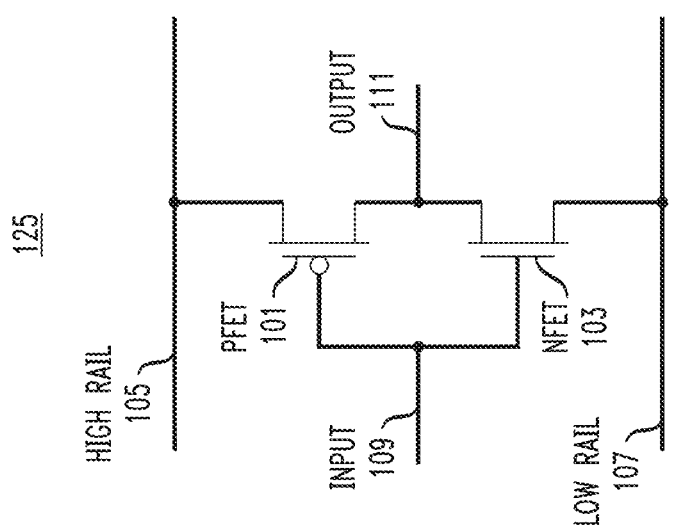
FIG. 1B shows a circuit diagram for an inverter, according to an embodiment of the invention.

FIG. 1B shows a circuit diagram 125, illustrating circuit connections for forming an inverter with the PFETs 101, NFETs 103, high power rail 105, low power rail 107, input 109 and output 111. The input 109 is coupled to the gates of the PFETs 101 and NFETs 103. The source regions of the PFETs 101 are connected to the high power rail 105, and the source regions of the NFETs 103 are connected to the low power rail 107. Drain regions for the PFETs 101 and the NFETs 103 are connected to the output 111. When the input 109 is low, the PFETs 101 are on and the NFETs 103 are off. Thus, the output 111 is high via the PFETs 101 connection to the high power rail 105. When the input 109 is high, the PFETs 101 are off and the NFETs 103 are on. Thus, the output 111 is low via the NFETs 103 connection to the low power rail 107.

Figure 1C:
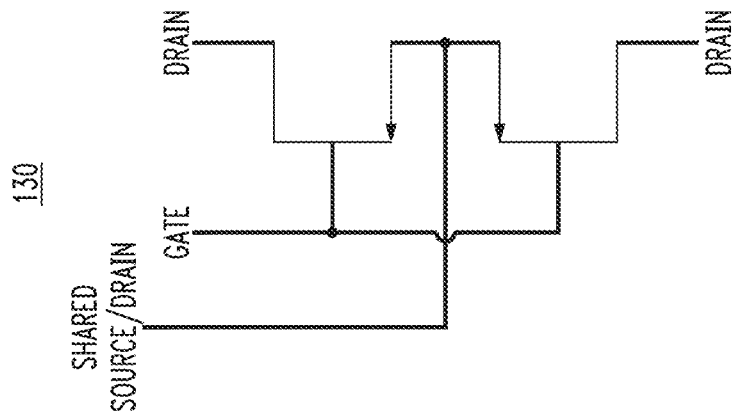
FIG. 1C shows a circuit diagram for a stacked vertical transport field-effect transistor using shared source/drain structures to connect upper and lower fin channels, according to an embodiment of the invention.

FIG. 1C shows a circuit diagram 130, illustrating connections between the stacked VTFETs of one of the fins. As illustrated, upper and lower FETs have common gate and shared source/drain connections and the carriers flow can have the flexibility to flow into or away from the top or the bottom fin channels depending on the design.

Figure 1D:
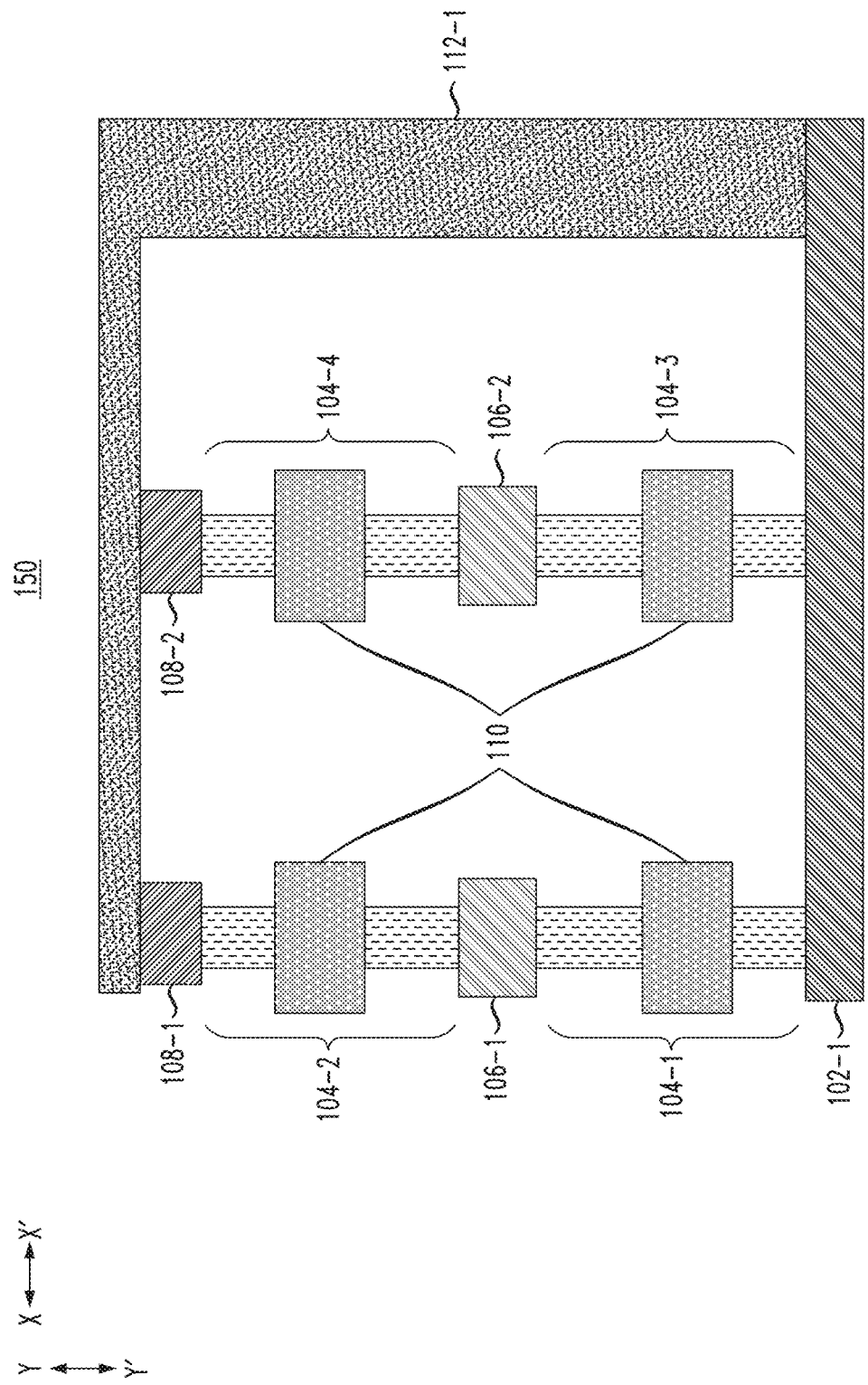
FIG. 1D shows a first cross-sectional view of the FIG. 1A stacked vertical transport field-effect transistor inverter structure, according to an embodiment of the invention.

FIG. 1D shows a cross-sectional view 150 taken along the line D-D shown in the top-down view 100 of FIG. 1A, across the two fins providing the NFETs 103 which include two two-channel NFETs. FIG. 1D shows a bottom drain region 102-1 for the NFETs 103, four NFET fin channels 104-1, 104-2, 104-3 and 104-4 for the NFETs 103, shared source regions 106-1 and 106-2 for the NFETs 103 (e.g., one for each fin), top drain regions 108-1 and 108-2 for the NFETs 103 (e.g., one for each fin), and gate stacks 110 (e.g., which may comprise a gate dielectric and a gate conductor, such as a work function metal (WFM)) for the NFETs 103. As illustrated, there is a C-shaped connection 112-1 connecting the bottom drain region 102-1 with the top drain regions 108-1 and 108-2 for the NFETs 103.

Figure 1E:
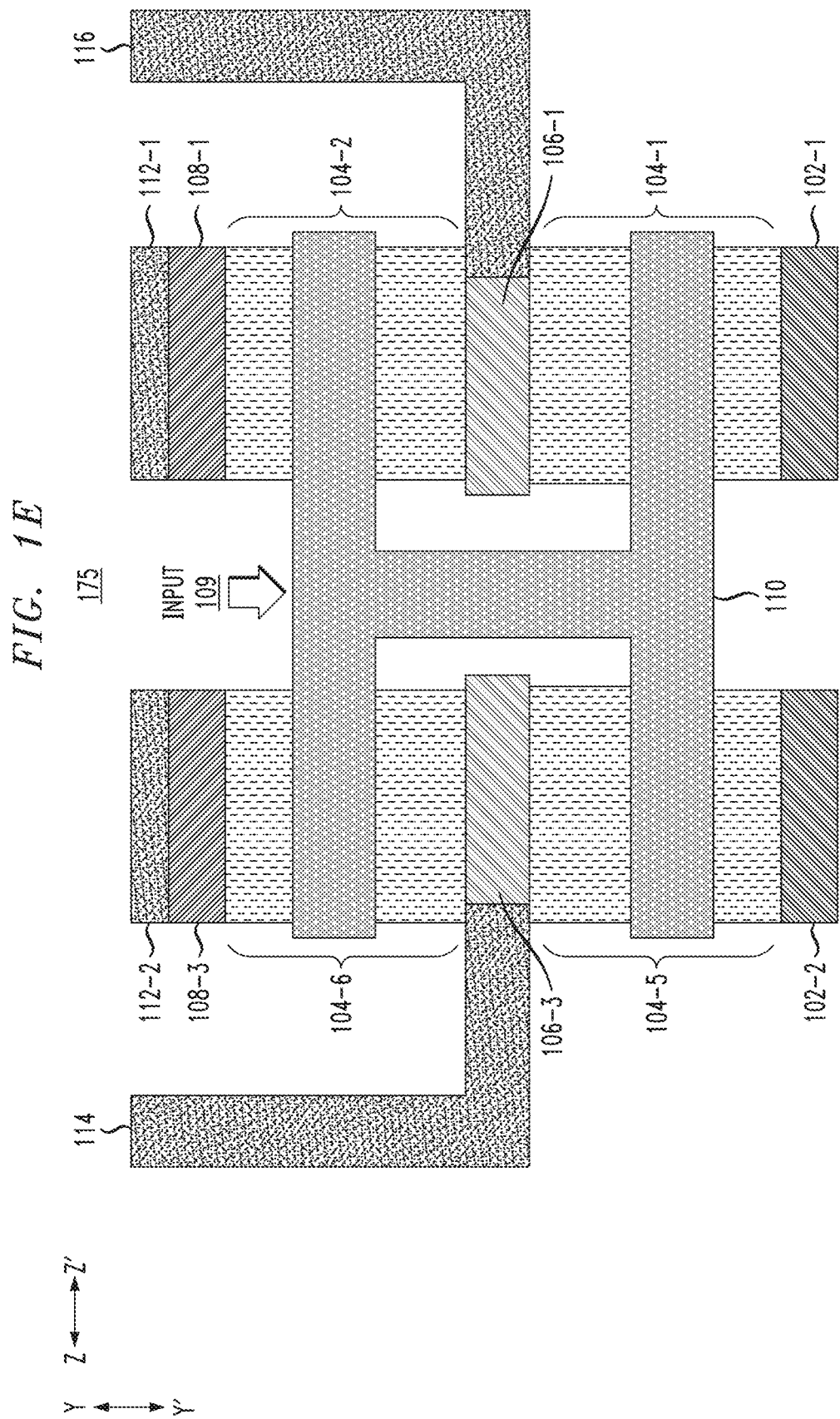
FIG. 1E shows a second cross-sectional view of the FIG. 1A stacked vertical transport field-effect transistor inverter structure, according to an embodiment of the invention.

FIG. 1E shows a cross-sectional view 175 taken along the line E-E shown in the top-down view 100 of FIG. 1A, along one of the fins providing two channels for the PFETs 101 and two channels for the NFETs 103. FIG. 1E shows the bottom drain region 102-1 for the NFETs 103, the bottom drain region 102-1 for the PFETs 101, two of the fin channels 104-1 and 104-2 for the NFETs 103, two of the fin channels 104-5 and 104-6 for the PFETs 101, the top drain region 108-1 for the NFETs 103, one of the shared source regions 106-1 for the NFETs 103, one of the shared source regions 106-3 for the PFETs 101, a top drain region 108-2 for the PFETs 101, and gate stacks 110 for the PFETs 101 and the NFETs 103. FIG. 1E shows the C-shaped connection 112-1 that connects the bottom drain region 102-1 with the top drain region 108-1 (as well as the top drain region 108-2, not shown) for the NFETs 103, as well as a C-shaped connection 112-2 that connects the bottom drain region 102-2 with the top drain region 108-3 (as well as another top drain region, not shown) for the PFETs 101. The gate stacks 110 are coupled to the input 109 of the inverter. FIG. 1E further shows a contact 114 from the high power rail 105 to the shared source region 106-3 for the PFETs 101 and a contact 116 from the lower power rail 107 to the shared source region 106-1 for the NFETs 103. Although not shown, the contacts 114 and 116 also connect to the other shared source regions for the PFETs 101 and the NFETs 103.

Figure 2A:
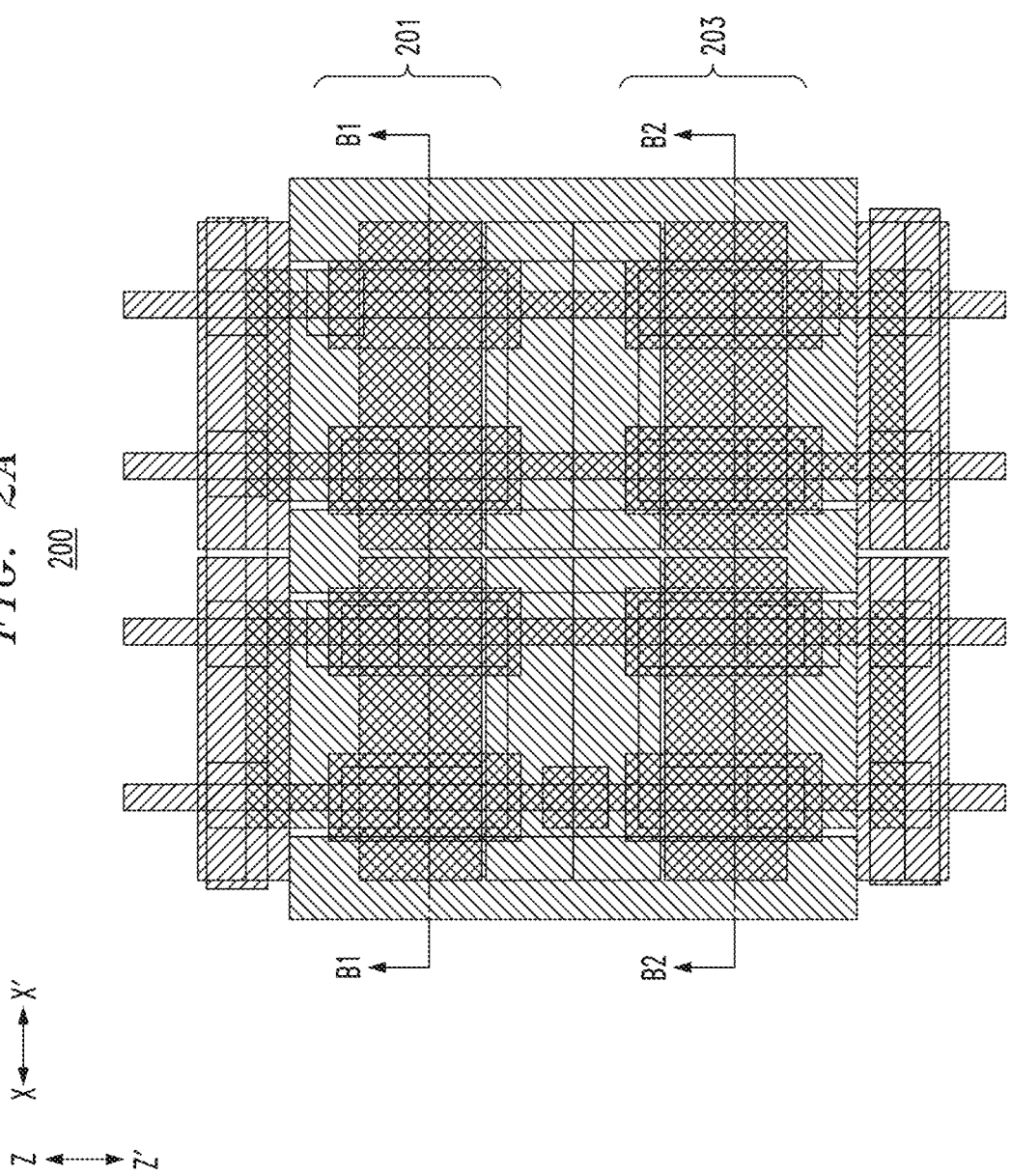
FIG. 2A shows a top-down view of a vertical transport field-effect transistor inverter structure using two two-channel n-type field-effect transistors and two two-channel p-type field-effect transistors, according to an embodiment of the invention.

The stacked VTFET inverter structure shown in FIGS. 1A-1E provides various advantages relative to non-stacked VTFET and other approaches. For example, the stacked VTFET inverter structure shown in FIGS. 1A-1E utilizes parallel channels for the PFETs 101 and the NFETs 103, having an "X" direction length of 2 contacted poly pitch (CPP) and a "Z" direction length of approximately 160 nanometers (nm). FIG. 2A shows a top-down view 200 of a non-stacked VTFET structure with PFETs 201 and NFETs 203, where the PFETs 201 include two two-channel PFETs and the NFETs 203 include two two-channel NFETs. FIG. 2B shows a cross-sectional view 250, which may be taken either along line B1-B1 for the PFETs 201 or the line B2-B2 for the NFETs 203. The cross-sectional view 250 illustrates the four channels 204-1, 204-2, 204-3 and 204-4 (which are p-type channels for the PFETs 201 and n-type channels for the NFETs 203). The non-stacked VTFET structure of FIGS. 2A and 2B has an "X" direction length of 3CPP, and "Z" direction length of about 160 nm, with an area scaling of 1 as compared to an area scaling of 0.7 for the stacked VTFET inverter structure of FIGS. 1A-1E. Tables 1 and 2 below illustrate area scaling, cell height, fin length (Lfin), Weff and Weff/sqrt (area) for the stacked VTFET inverter of FIGS. 1A-1E and the non-stacked VTFET inverter of FIGS. 2A and 2B, respectively, and Table 3 below illustrates the improvement ratio of Weff/sqrt (area) for the stacked VTFET inverter of FIGS. 1A-1E as compared with the non-stacked VTFET inverter of FIGS. 2A and 2B:

TABLE 1

STACKED VTFET INVERTER

| Area Scaling | Cell Height (nm) | Lfin (nm) | Weff | Weff/sqrt (area) |
|---|---|---|---|---|
| 1.00 | 210.0 | 120.0 | 504.0 | 504.0000000 |
| 0.95 | 199.5 | 109.5 | 462.0 | 474.0019987 |
| 0.90 | 189.0 | 99.0 | 420.0 | 442.7188724 |
| 0.85 | 178.5 | 88.5 | 378.0 | 409.9985653 |
| 0.80 | 168.0 | 78.0 | 336.0 | 375.6594202 |
| 0.75 | 157.5 | 67.5 | 294.0 | 339.4819583 |
| 0.70 | 147.0 | 57.0 | 252.0 | 301.1976096 |
| 0.65 | 136.5 | 48.7 | 218.8 | 271.3879993 |
| 0.60 | 126.0 | 40.0 | 184.0 | 237.5429786 |

TABLE 2

VTFET INVERTER

| Area Scaling | Cell Height (nm) | Lfin (nm) | Weff | Weff/sqrt (area) |
|---|---|---|---|---|
| 1.00 | 210.0 | 60.00 | 264.0 | 264.0000000 |
| 0.95 | 199.5 | 54.75 | 243.0 | 249.3127396 |
| 0.90 | 189.0 | 49.50 | 222.0 | 234.0085469 |
| 0.85 | 178.5 | 44.25 | 201.0 | 218.0151101 |
| 0.80 | 168.0 | 39.00 | 180.0 | 201.2461180 |
| 0.75 | 157.5 | 33.75 | 159.0 | 183.5973856 |
| 0.70 | 147.0 | 28.50 | 138.0 | 164.9415481 |
| 0.65 | 136.5 | 24.35 | 121.4 | 150.5781678 |
| 0.60 | 126.0 | 20.00 | 104.0 | 134.2634227 |

TABLE 3

COMPARISON OF VTFET INVERTER AND STACKED VTFET INVERTER

| Cell Height (nm) | Weff/sqrt (area) | Weff/sqrt (area) | Ratio |
|---|---|---|---|
| 210.0 | 264.0000000 | 504.0000000 | 1.91 |
| 199.5 | 249.3127396 | 474.0019987 | 1.90 |
| 189.0 | 234.0085469 | 442.7188724 | 1.89 |
| 178.5 | 218.0151101 | 409.9985653 | 1.88 |
| 168.0 | 201.2461180 | 375.6594202 | 1.87 |
| 157.5 | 183.5973856 | 339.4819583 | 1.85 |
| 147.0 | 164.9415481 | 301.1976096 | 1.83 |
| 136.5 | 150.5781678 | 271.3879993 | 1.80 |
| 126.0 | 134.2634227 | 237.5429786 | 1.77 |

To summarize, for the same Weff, the area occupied is 33% less using the stacked VTFET inverter structure of FIGS. 1A-1E relative to the non-stacked VTFET inverter structure of FIGS. 2A and 2B. For the same Y-direction length of 160 nm, the non-stacked VTFET inverter structure of FIGS. 2A and 2B has an X-direction length of 3CPP and area scaling of 1 whereas the stacked VTFET inverter structure of FIGS. 1A-1E has an X-direction length of 2CPP and area scaling of 0.7. It should be noted that this considers the space occupied by the C-shaped connection, which takes up 1CPP.

Illustrative processes for forming stacked VTFET inverter structures will now be described with respect to FIGS. 3-12.

FIG. 3 shows a cross-sectional view 300 of a substrate or wafer 302 following self-aligned double patterning (SADP) and fin etching to form top fin portions 306-1 and 306-2 below patterned hard mask layer 304. The top fin portion 306-1, as will be described in further detail below, provides a fin channel for an upper VTFET in a first fin, and the top fin portion 306-2 provides a fin channel for an upper VTFET in a second fin. FIG. 3 also illustrates formation of a liner spacer layer 308 over the top surface of the substrate 302 and surrounding the top fin portions 306-1 and 306-2 and the hard mask layer 304.

The bulk substrate 302 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The horizontal thickness or width (in direction X-X') of the substrate 302 may vary, such as based on the number of fins that are to be formed, spacing required for contacts of VTFETs formed from the structure, etc. The vertical thickness or height (in direction Y-Y') of the substrate 302 may be in the range of 200 micrometers (μm) to 300 μm.

The hard mask layer 304 may be formed of a nitride such as silicon nitride (SiN), although other suitable materials may be used. The hard mask layer 304, in some embodiments, may be formed as a multi-layer, such as a multi-layer of two layers including a nitride and oxide (e.g., SiN and silicon dioxide ($SiO_2$)), a multi-layer of three layers including one or more nitride and one or more oxide layers (e.g., $SiN/SiO_2/SiN$, $SiO_2/SiN/SiO_2$), etc. The hard mask layer 304 may have a height or vertical thickness (in direction Y-Y') in the range of 10 nm to 100 nm.

The top fin portions 306-1 and 306-2 may be formed using sidewall image transfer (SIT) or other suitable techniques such as lithography and etching including reactive-ion etching (RIE), etc. Each of the top fin portions 306-1 and 306-2 may have a width or horizontal thickness (in direction X-X') in the range of 6 nm to 10 nm.

Although FIG. 3 shows formation of top fin portions for two vertical fins, it should be appreciated that more or fewer vertical fins may be formed depending on the desired number of stacked VTFET structures.

The liner layer 308 protects the top vertical fin portions 306-1 and 306-2 during downstream processing described in further detail below. The liner layer 308 may be formed from a very hard material, such as a high-k dielectric material such as hafnium oxide ($HfO_2$), high-k/SiN multilayers, etc. The liner layer 308 may be formed via atomic layer deposition (ALD). The liner layer 308 may have a thickness (in direction X-X') in the range of 3 nm to 6 nm.

FIG. 4 shows a cross-sectional view 400 of the FIG. 3 structure, following extending the vertical fins by additional fin etching (e.g., using RIE or other suitable etch processing) to form bottom fin portions 306-3 and 306-4. An additional liner layer 310 is then formed over the structure on sidewalls of the top and bottom fin portions 306-1, 306-2, 306-3 and 306-4, as well as the hard mask layer 304. The bottom fin portions 306-3 and 306-4 provide fin channels for lower VTFET devices formed in the resulting structure. The bottom fin portions 306-3 and 306-4 of the vertical fins may have a height or vertical thickness (in direction Y-Y') in the range of 5 nm to 8 nm.

The additional liner layer 310 is a protective liner, which may be formed of silicon boron carbide nitride (SiBCN). The additional liner layer 310 may be formed using selective ALD. The additional liner layer 310 may have a thickness (in direction X-X') in the range of 2 nm to 4 nm.

Figure 5:
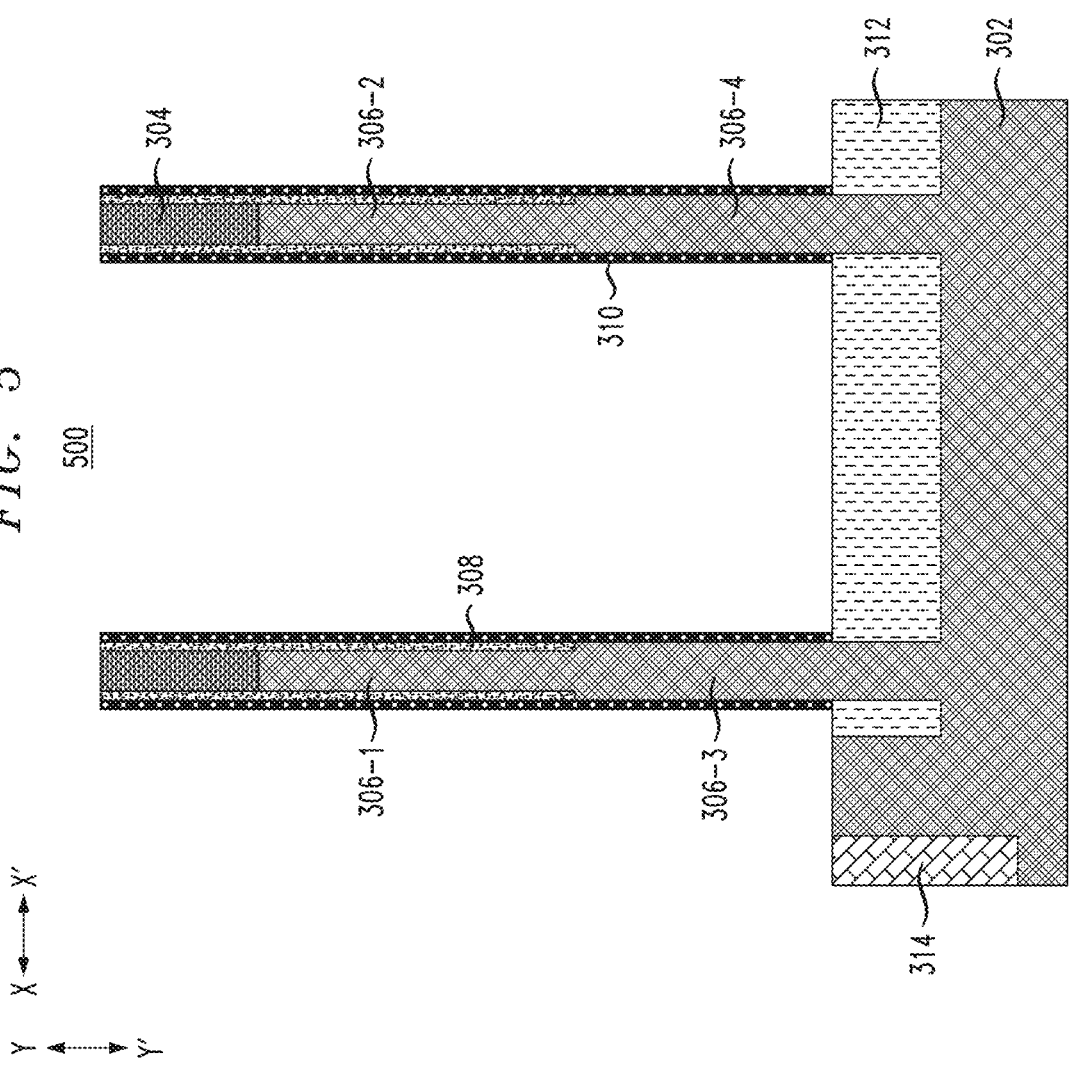
FIG. 5 shows a cross-sectional view of the FIG. 4 structure following formation of a bottom epitaxial layer, according to an embodiment of the invention.
Figure 6:
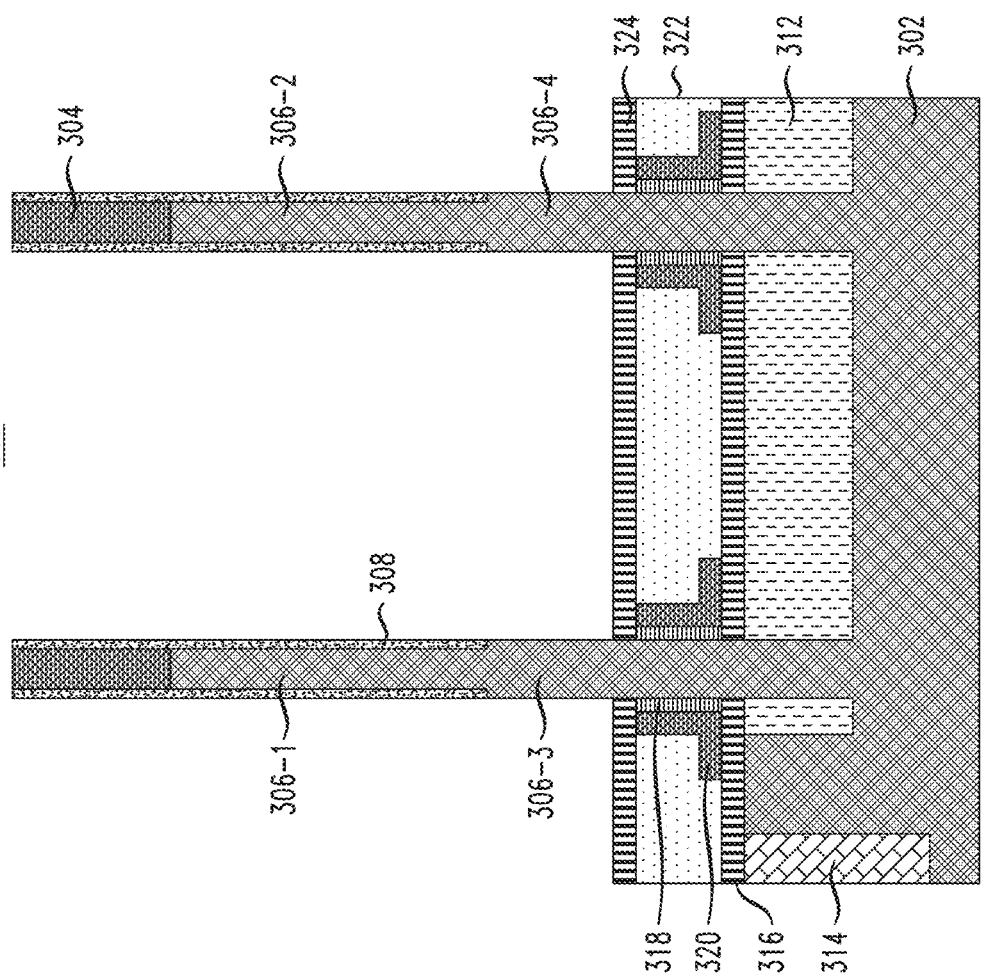
FIG. 6 shows a cross-sectional view of the FIG. 5 structure following formation of a gate stack for lower vertical transport field-effect transistors, according to an embodiment of the invention.

FIG. 6 shows a cross-sectional view 600 of the FIG. 5 structure, following formation of a bottom epitaxial layer 312 and a shallow trench isolation (STI) region 314. This may be achieved through recess of the substrate 302 and epitaxial growth of the bottom epitaxial layer 312. The bottom epitaxial layer 312 may provide a bottom drain region when forming a stacked VTFET inverter. The bottom epitaxial layer 312, also referred to herein as a bottom drain region 312, may have a height or vertical thickness (in direction Y-Y') in the range of 15 to 30 nm. The bottom drain region 312 surrounds both of the fins, providing two channels (e.g., either two n-type channels for NFETs 103 or two p-type channels for PFETs 101 in the stacked VTFET inverter structure of FIGS. 1A-1E).

The bottom drain region 312 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom drain region 312 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

The STI region 314 is formed surrounding the bottom drain region 312 to provide device isolation. The STI region 314 may have a height or vertical thickness (in direction Y-Y') in the range of 50 to 400 nm. The STI region 314 may be formed from any suitable isolating material.

FIG. 7A shows a cross-sectional view 700 of the FIG. 6 structure, following formation of a gate stack for the lower VTFETs as well as formation of an epitaxial layer shared between the upper and lower VTFETs. FIG. 7A shows a bottom spacer layer 316 for the lower VTFETs, which is formed surrounding part of the bottom portions 306-3 and 306-4 of the vertical fins above the bottom drain region 312 and STI region 314. The bottom spacer layer 316 may be formed using various processing, such as non-conformal deposition and etch-back processing (e.g., physical vapor deposition (PVD), high density plasma (HDP) deposition, etc.). The bottom spacer layer 316 may be formed of a dielectric material such as $SiO_2$, SiN, silicon carbide oxide (SiCO), SiBCN, etc. The bottom spacer layer 316 may have a height or vertical thickness (in direction Y-Y') in the range of 3 to 10 nm.

After formation of the bottom spacer layer 316, gate stack materials including a gate dielectric layer 318 and a gate conductor layer 320 are deposited. The gate dielectric layer 318 may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer 120 may have a uniform thickness in the range of 1 nm to 3 nm.

The gate conductor layer 320 may include a metal gate or work function metal (WFM). In some embodiments, the gate conductor layer 320 is formed using ALD or another suitable process. For NFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For PFET devices, the WFM for the gate conductor may be TiN, tantalum nitride (TaN), or another suitable material. In some embodiments, the PFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layer 320 as desired. The gate conductor layer 320 may have a thickness in the range of 5 to 20 nm.

An interlayer dielectric (ILD) layer 322 is formed, and then the gate stack materials are recessed to the level illustrated in FIG. 7A. The material of the ILD layer 322 may initially be formed to fill the structure (e.g., with formation of a liner first, where the liner may be SiN), followed by chemical mechanical planarization (CMP) and etch-back. Alternatively, the material of the ILD layer 322 may be formed using HDP and etch-back processing to result in the ILD layer 322 as shown in FIG. 7A. The ILD layer 322 may be formed of any suitable isolation material, including but not limited to $SiO_2$, SiOC, SiON, etc.

After formation of the ILD layer 322, the gate stack materials (e.g., gate dielectric layer 318 and gate conductor layer 320) are recessed, such that the gate stack materials have a height that matches that of the ILD layer 322. The ILD layer 322 may have a height or vertical thickness (in direction Y-Y') in the range of 10 to 30 nm. The recessed gate stack materials provide the gate for the lower VTFETs.

A top spacer layer 324 for the lower VTFETs is formed surrounding part of the bottom portions 306-3 and 306-4 of the vertical fins above the ILD layer 322. The top spacer layer 324 may be formed of similar materials and with similar sizing as that described above with respect to bottom spacer layer 316.

A shared epitaxial layer 326 is formed over the top spacer layer 324 surrounding part of the bottom portions 306-3 and 306-4 of the vertical fins. The epitaxial layer 326 is shared between the upper and lower VTFETs. The shared epitaxial layer 326 may be formed of similar materials and with similar processing as that described above with respect to the epitaxial layer 312. For the stacked VTFET inverter structure, the shared epitaxial layer 326 provides a shared source for the upper and lower VTFETs, and may also be referred to as a shared source region 326. The shared source region 326 may have a height or vertical thickness (in direction Y-Y') in the range of 10 to 30 nm, and may have a width or horizontal thickness (in direction X-X') in the range of 5 to 15 nm.

A sacrificial layer 328 is formed surrounding the shared source region 326. The sacrificial layer 328 may be formed of a spin-on oxide, such as silicon oxide ($SiO_x$) or other suitable material. The sacrificial layer 328, as will be described in further detail below, is later removed and replaced with a metal material to form contacts to power rails (e.g., a high power rail for PFETs, a low power rail for NFETs). The sacrificial layer 328 may have a height or vertical thickness (in direction Y-Y') that matches that of the shared source region 326, and may have a width or horizontal thickness (in direction X-X') that varies based on the type of connections required for the middle epitaxial layer.

Figure 7B:
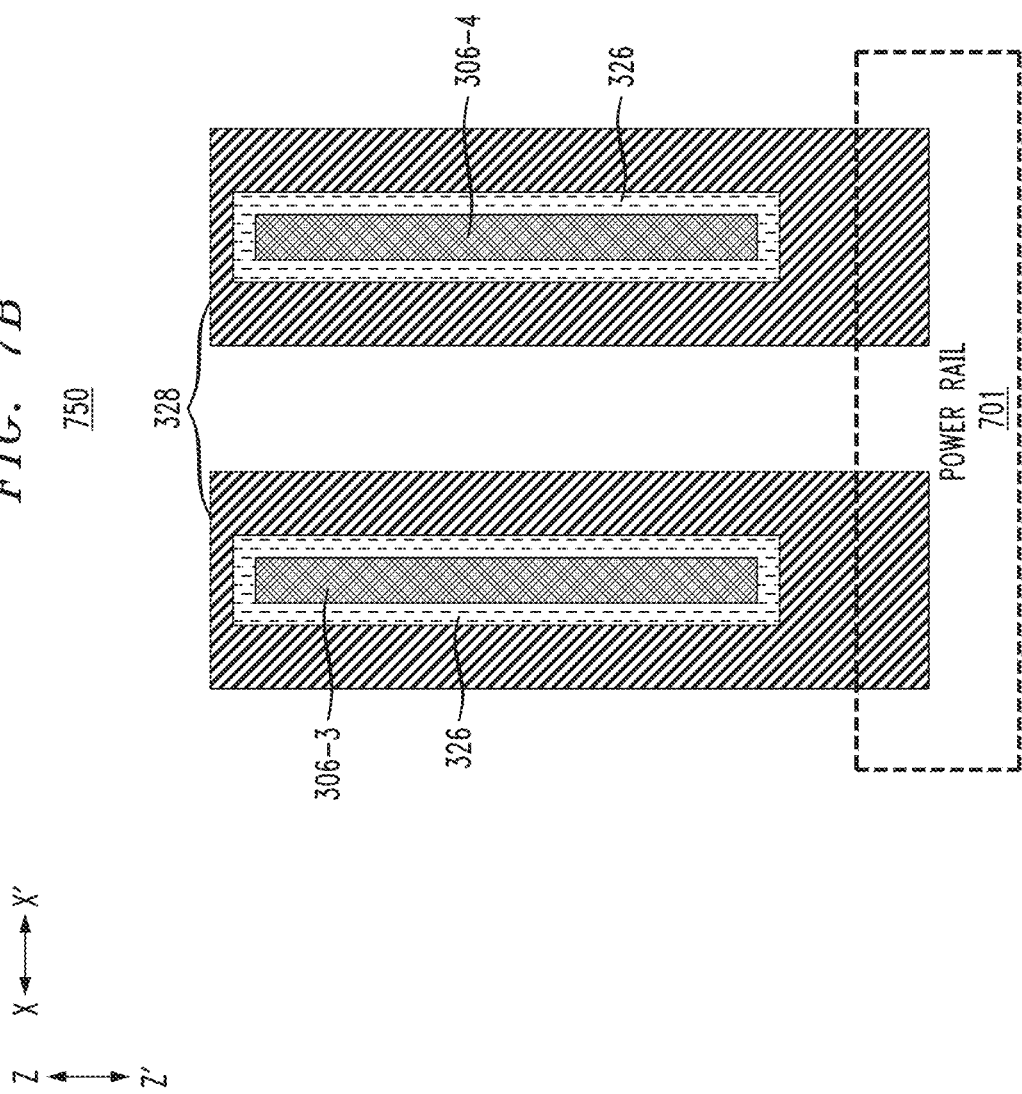
FIG. 7B shows a top-down view of the FIG. 7A structure, according to an embodiment of the invention.

FIG. 7B shows a top cross-sectional view 750 taken along the line B-B in the cross-sectional view 700 of FIG. 7A, illustrating the shared source region 326 surrounding parts of the bottom portions 306-3 and 306-4 of the vertical fins, along with the sacrificial layer 328 which extends along direction Z-Z' to provide a connection to power rail 701.

Figure 8:
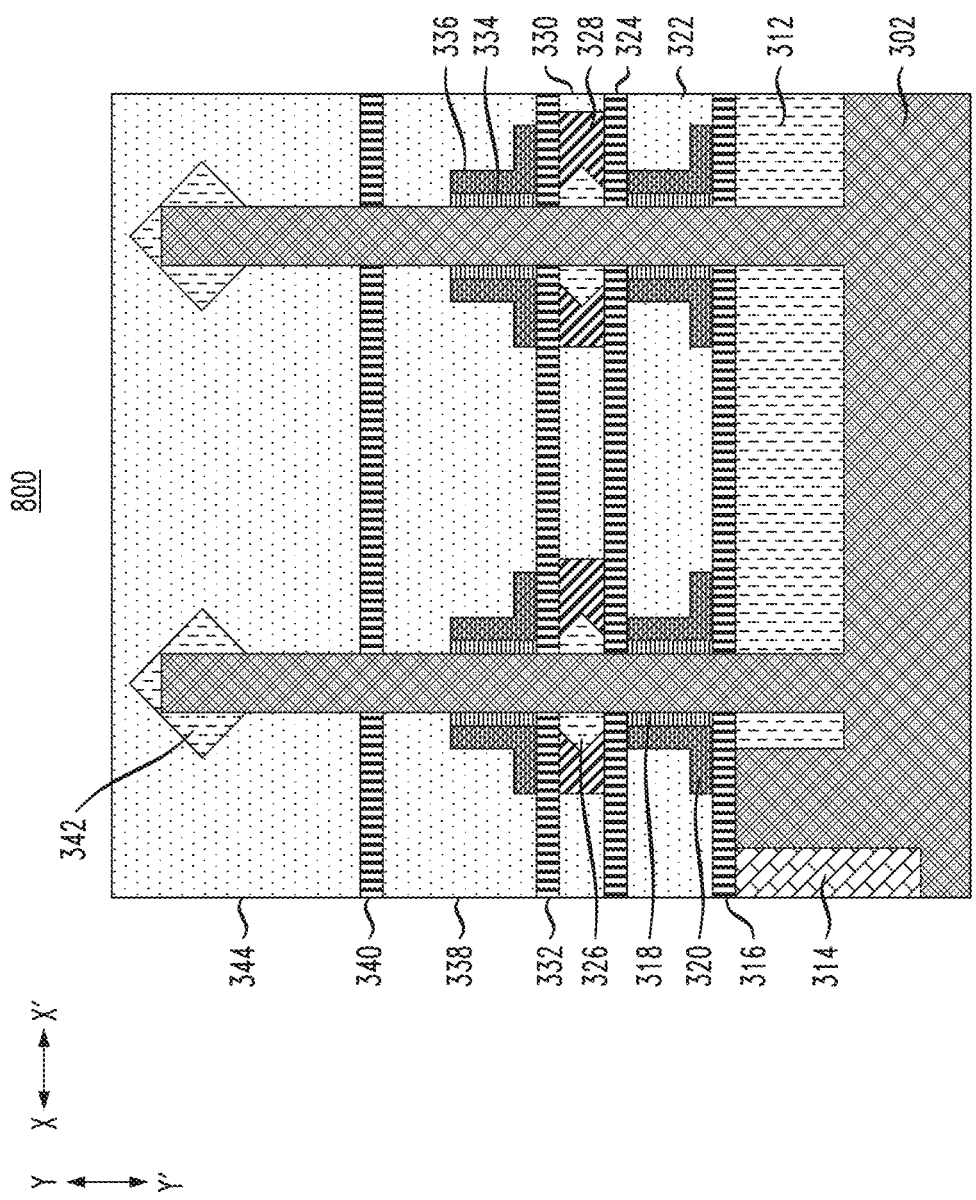
FIG. 8 shows a cross-sectional view of the FIG. 7A structure following formation of a gate stack and top epitaxial layer for the upper vertical transport field-effect transistors, according to an embodiment of the invention.

FIG. 8 shows a cross-sectional view 800 of the FIG. 7A structure following formation of a gate stack and top epitaxial layer for the upper VTFETs. An ILD layer 330 is formed surrounding the sacrificial layer 328. The ILD layer 330 may be formed using similar materials and processing as that described above with respect to ILD layer 322. A bottom spacer layer 332 for the upper VTFETs is formed over the ILD layer 330. The bottom spacer layer 332 may be formed using similar materials, processing and sizing as that described above with respect to bottom spacer layer 316.

The gate stack for the upper VTFETs is then formed after the removal of the liner 308. The gate stack for the upper VTFETs includes a gate dielectric layer 334 and a gate conductor layer 336. The gate dielectric layer 334 and gate conductor layer 336 may be formed using similar materials, processing and sizing as that described above with respect to the gate dielectric layer 318 and gate conductor layer 320 of the gate stack for the lower VTFETs. Although not shown, an interfacial layer may be formed between the gate stacks of the upper and lower VTFETs and the sidewalls of the bottom portions 306-3 and 306-4 and the top portions 306-1 and 306-2 of the vertical fins on which the gate stacks are formed. The interfacial layer may be formed of $SiO_2$ or another suitable material such as silicon oxynitride ($Si_xN_y$). The interfacial layer may have a width or horizontal thickness (in direction X-X') ranging from 0.5 nm to 1.5 nm.

The ILD layer 338 is deposited surrounding the gate stack for the upper VTFETs, where the ILD layer 338 is formed using similar materials and processing as that described with respect to ILD layer 322. A top spacer layer 340 for the upper VTFETs is formed over the ILD layer 338, where the top spacer layer 340 may be formed using similar materials, processing and sizing as that described above with respect to the bottom spacer layer 316.

The HM layer 304 is then removed, using selective wet etching or other suitable processing to expose parts of the top portions 306-1 and 306-2 of the vertical fins. Top epitaxial layers 342 are then formed surrounding parts of the top portions 306-1 and 306-2 of the vertical fins. The top epitaxial layers 342 may have a height or vertical thickness (in direction Y-Y') in the range of 10 to 30 nm, and may have a width or horizontal thickness (in direction X-X') in the range of 10 to 30 nm. For the stacked VTFET inverter, the top epitaxial layers 342 provide top drains and are thus also referred to as top drain regions 342. Another ILD layer 344 is then formed over the top spacer layer 340 and surrounding the remainder of the top portions 306-1 and 306-2 of the fins and the top drain regions 342. The ILD layer 344 may be formed using similar materials and processing as that described above with respect to ILD layer 322.

FIG. 9 shows a cross-sectional view 900 of the FIG. 8 structure, following removal of the sacrificial layer 328 surrounding the shared source region 326. The sacrificial layer 328 may be removed using any suitable processing, such as a hydrogen fluoride (HF) etch.

Figure 10A:
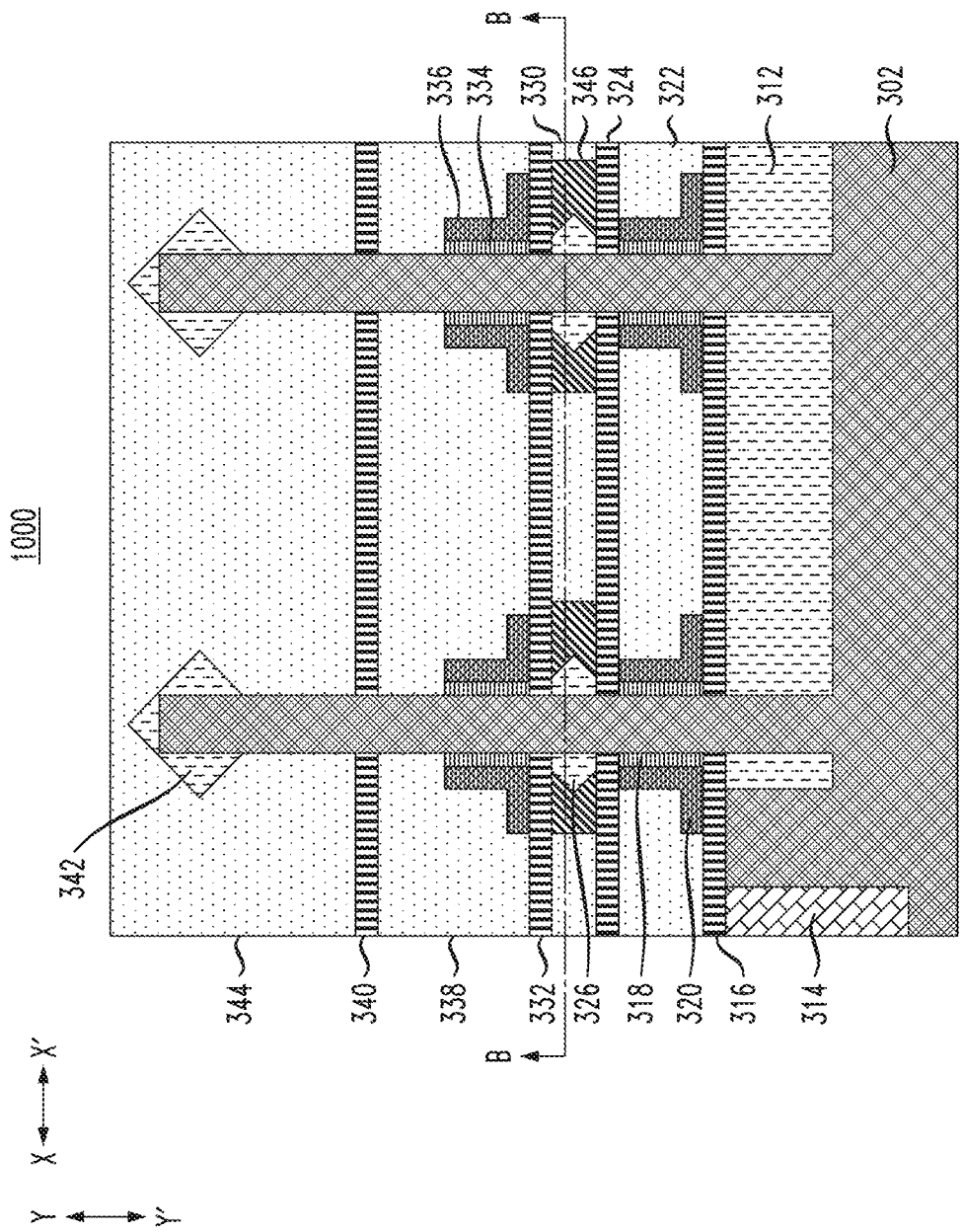
FIG. 10A shows a cross-sectional view of the FIG. 9 structure following formation of a contact layer surrounding the shared epitaxial layer, according to an embodiment of the invention.

FIG. 10A shows a cross-sectional view 1000 of the FIG. 9 structure, following formation of a metal connection layer 346 in the space formed by removal of the sacrificial layer 328. The metal connection layer 346 may be formed using ALD or other suitable processing. The metal connection layer 346 may comprise silicon (Si), TiN or another suitable material. FIG. 10B shows a top cross-sectional view 1050 taken along the line B-B in the cross-sectional view 1000 of FIG. 10A. The top cross-sectional view 1050 illustrates the fin portions 306-3 and 306-4, the shared source region 326, and the metal connection layer 346 which contacts the power rail 701 as described above.

Figure 11A:
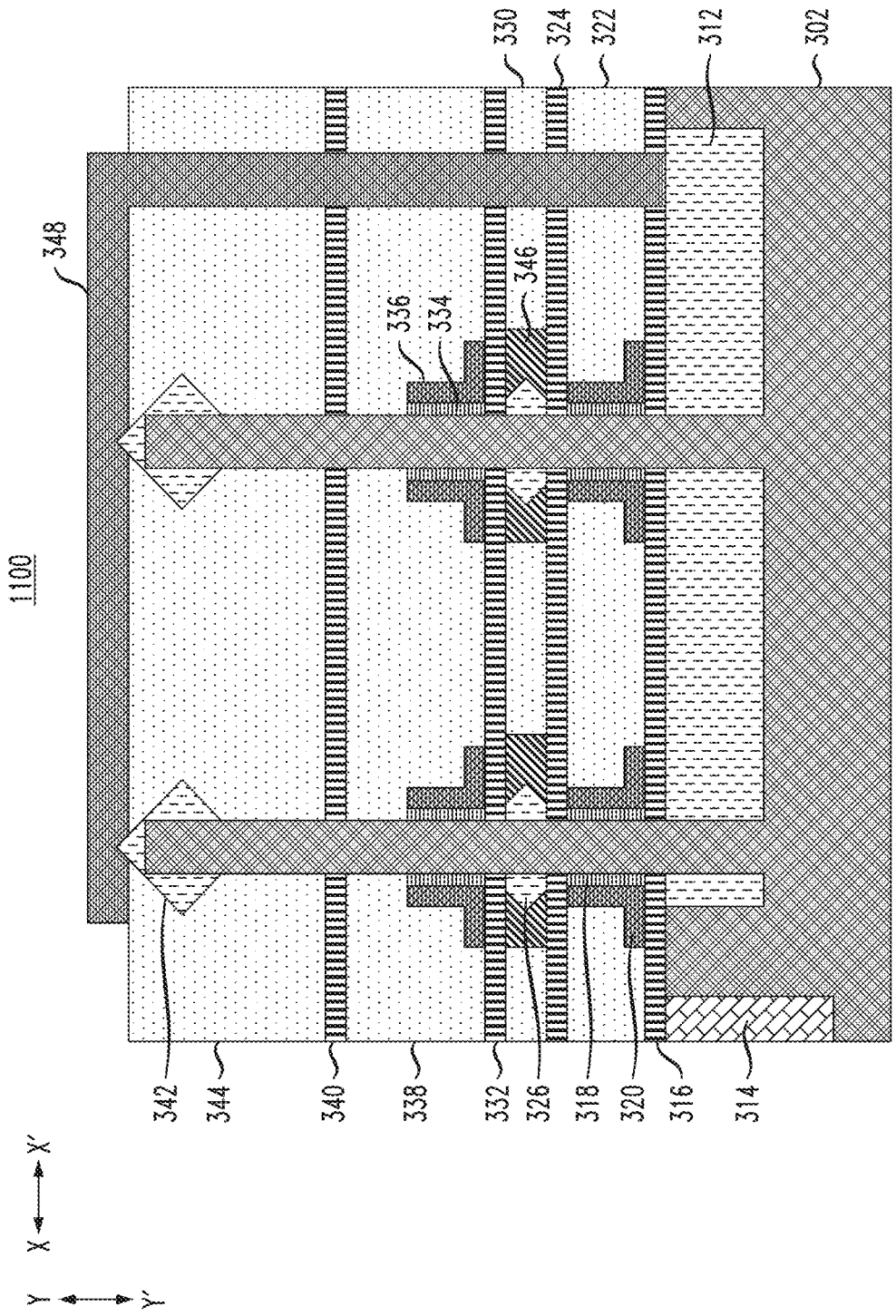
FIG. 11A shows a cross-sectional view of the FIG. 10A structure following formation of a shared contact to the bottom and top epitaxial layers and a shared contact to the gate stacks, according to an embodiment of the invention.

FIG. 11A shows a cross sectional view 1100 of the FIG. 10A structure, following formation of a C-shaped contact 348 that connects the bottom drain region 312 and top drain regions 342. The C-shaped contact 348 ultimately connects to an output of the stacked VTFET inverter structure. As noted above, the C-shaped contact 348 for the four-channel FET shown in the cross-sectional view 1100 is also connected to another C-shaped contact for another four-channel FET. For example, the cross-sectional view 1100 may illustrate the NFETs 103 of the stacked VTFET inverter structure of FIGS. 1A-1E, with another similar structure formed using similar processing as that described above with respect to FIGS. 3-11 being used to form the PFETs 101 of the stacked VTFET inverter structure of FIGS. 1A-1E with another C-shaped contact that connects to the C-shaped contact 348.

Figure 11C:
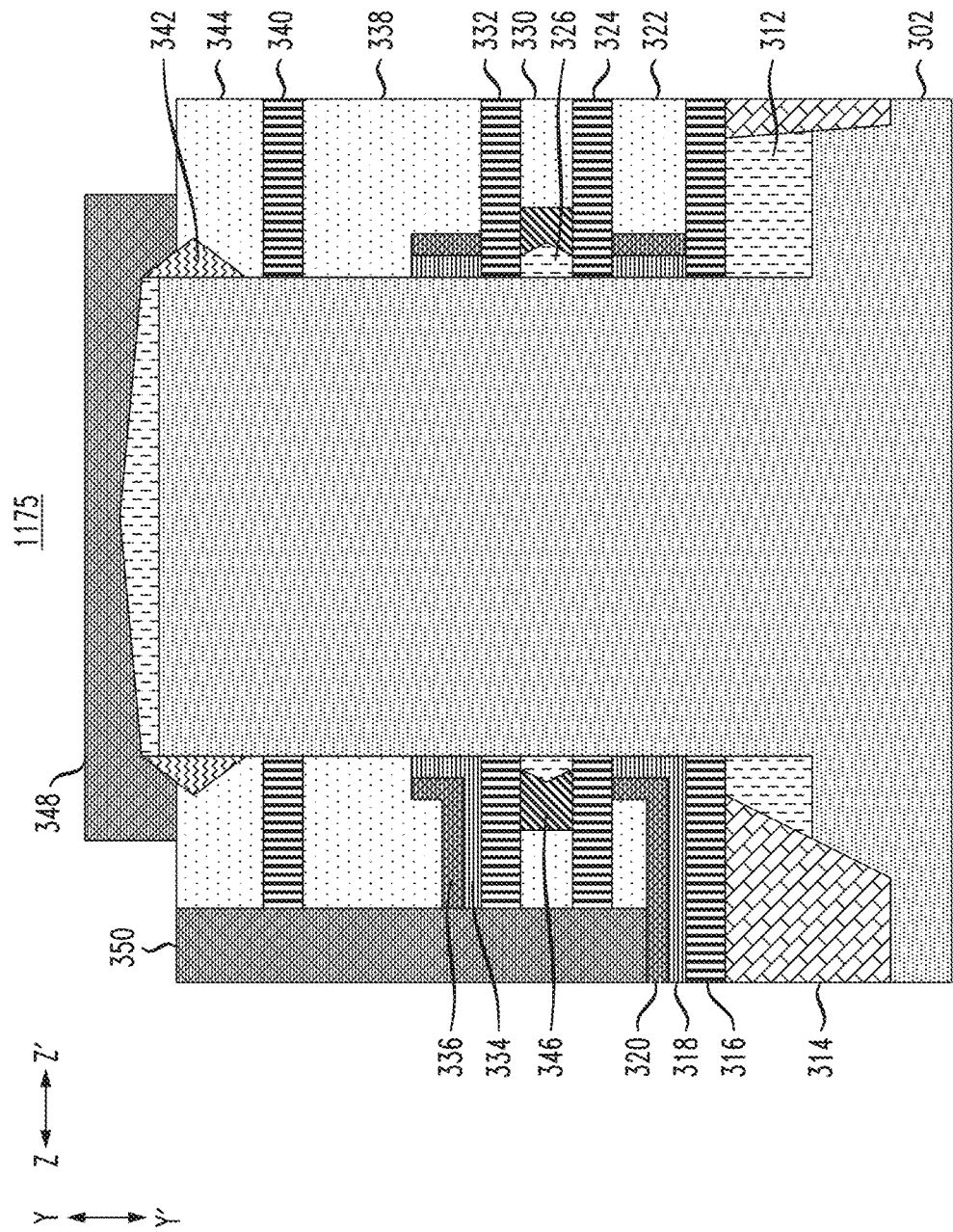
FIG. 11C shows another cross-sectional view of the FIG. 10A structure along a fin length following formation of the shared contact to the bottom and top epitaxial layers and the shared contact to the gate stacks, according to an embodiment of the invention.

To form the C-shaped contact 348, a mask may be patterned over the ILD layer 344 to open a via 1101 down to the bottom drain region 312 to one side of the vertical fins. The cross-sectional view 1100, similar to the cross-sectional views 300, 400, 500, 600, 700, 800, 900 and 1000 of FIGS. 3, 4, 5, 6, 7A, 8, 9 and 10A, are taken "across" the two vertical fins. FIG. 11B shows a top-down view 1150 of the structure shown in FIG. 11A, showing the top drain regions 342, the metal connection layer 346 from the shared source region 326 to the power rail 701, and the top of the C-shaped contact 348 along with the via 1101 down to the bottom drain region 312. FIG. 11C shows another cross-sectional view 1175 that is taken along the "length" of one of the vertical fins (in direction Z-Z'). The cross-sectional view 1175 shows the contact 350 to the gate stacks of the upper and lower VTFETs. The contact 350 may be formed by patterning a mask layer over the ILD layer 344 down to the gate conductor layer 320 that is between the two vertical fins providing two two-channel FETs (e.g., two two-channel NFETs 103 in the stacked VTFET inverter structure of FIGS. 1A-1E) and another set of two vertical fins providing two two-channel FETs (e.g., two two-channel PFETs 101 in the stacked VTFET inverter structure of FIGS. 1A-1E).

Figure 12:
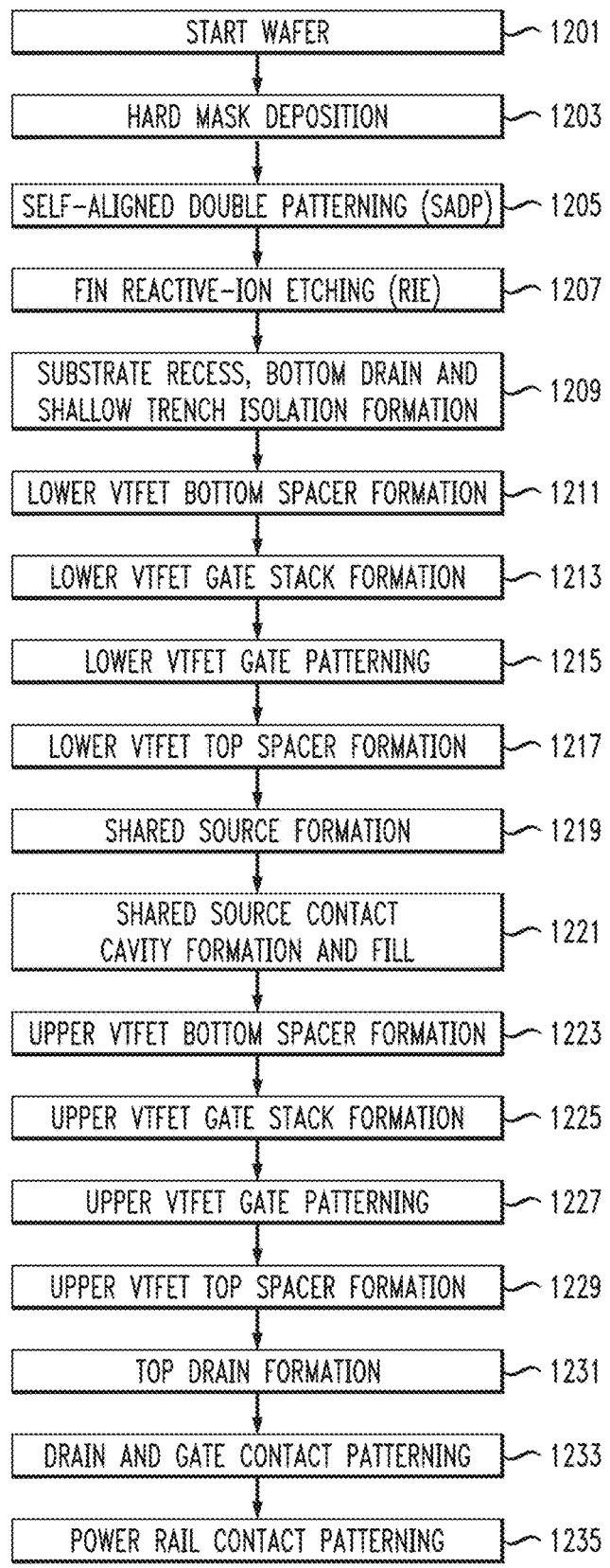
FIG. 12 shows a process flow for forming a stacked vertical transport field-effect transistor structure with a shared epitaxial layer between upper and lower vertical transport field-effect transistors in vertical fins thereof, according to an embodiment of the invention.

FIG. 12 shows a process flow 1200 for forming a stacked VTFET inverter. The process flow 1200 begins in step 1201 with a starting wafer or substrate (e.g., substrate 302). In step 1203, a hard mask layer (e.g., hard mask layer 304) is deposited, followed by SADP in step 1205. Fin RIE is performed in step 1207 to form top and bottom portions of vertical fins (e.g., top portions 306-1 and 306-2, bottom portions 306-3 and 306-4) which provide fin channels for upper VTFETs and lower VTFETs in a stacked VTFET inverter. Liner layers (e.g., liner layers 308 and 310) may be formed to protect portions of the vertical fins during additional processing.

In step 1209, the substrate (e.g., substrate 302) is recessed, followed by formation of a bottom drain region (e.g., bottom epitaxial layer 312) and STI regions (e.g., STI region 314). A bottom spacer (e.g., bottom spacer 316) for the lower VTFETs is formed in step 1211, followed by gate stack (e.g., gate dielectric layer 318 and gate conductor layer 320) formation in step 1213 for the lower VTFETs.

In step 1215, litho-etch litho-etch (LELE) gate patterning is performed for the lower VTFETs. A top spacer (e.g., top spacer layer 324) for the lower VTFETs is then formed in step 1217. Shared sources (e.g., shared epitaxial layer 326) are formed in step 1219, followed by shared source contact cavity formation (e.g., formation of sacrificial layer 328) and fill with an ILD (e.g., ILD layer 330). Next, a bottom spacer (e.g., bottom spacer layer 332) for the upper VTFETs is formed in step 1223 followed by gate stack (e.g., gate dielectric layer 334 and gate conductor layer 336) for the upper VTFETs in step 1225.

In step 1227, LELE gate patterning is performed for the upper VTFETs. A top spacer (e.g., top spacer layer 340) for the upper VTFETs is formed in step 1229. Top drains (e.g., top epitaxial layers 342) are formed in step 1231. Drain and gate contacts (e.g., drain contact 348, gate contact 350) are patterned in step 1233. Power rail contacts to the shared sources are then patterned in step 1235. For the NFETs 103 in the stacked VTFET inverter structure of FIGS. 1A-1E, the shared source contacts to the low power rail. For the PFETs 101 in the stacked VTFET inverter structure of FIGS. 1A-1E, the shared source contacts to the high power rail.

The stacked VTFET inverter described above with respect to FIGS. 1A-1E and 3-12 is one example of a logic gate that may be formed using stacked VTFETs using the techniques described herein. NAND and NOR logic gates may also be formed using the techniques described herein. Various embodiments will now be described with respect structures for forming 2-input and 3-input NAND (NAND2 and NAND3) and 2-input and 3-input NOR logic gates (e.g., NOR2, NOR3).

NAND2 logic gates may be formed using two-channel PFETs and NFETs (e.g., a total of four two-channel FETs—two two-channel NFETs and two two-channel PFETs), and is thus referred to as a NAND2 logic gate structure. The two-channel PFETs and two-channel NFETs are formed using stacked VTFET structures, where for the two-channel NFETs the upper and lower fin channels of each fin connect in series, and there is a shared epitaxial layer between the upper and lower fin channels. The shared epitaxial layer is a drain region for the upper fin channel and is a source region for the lower fin channel of the two-channel NFETs. The shared epitaxial layer is also connected between two fins, such that the upper fin channels of each of the two fins are in parallel and form a single one of the two two-channel NFETs. Similarly, the lower fin channels of each of the two fins are connected in parallel forming another one of the two two-channel NFETs. The two-channel NFET formed by the upper fin channels of the two fins is connected in series with the two-channel NFET formed by the lower fin channels of the two fins.

The NAND2 logic gate structure, as noted above, includes a shared source/drain and shared source-source for upper and lower fin channels of stacked VTFETs. One fin includes upper and lower fin channels for NFETs, where the shared source/drain includes a drain for the upper fin channel and a source for the lower fin channel. Another fin includes upper and lower fin channels for PFETs, where there is a shared source for the upper and lower fin channels. For each NFET stacked fin, the very top epitaxial layer connects to a ground or low power rail, while the very bottom epitaxial layer connects to an output, or vice versa. Gate contacts are formed with different depths to control separate gates for the stacked VTFETs in order to form two inputs for the NAND circuit. Advantageously, the stacked VTFET NAND2 structure provides a 33% reduction in top-down area as compared with a non-stacked VTFET NAND2 structure at the same Weff. Further, insulation is not needed between the upper and lower fin channels because the upper and lower fin channels share an epitaxial layer (e.g., a shared source/drain for NFETs, a shared source for PFETs).

The stacked VTFET NAND2 structure utilizes an interconnect structure with vertical and lateral trenches patterned at the same lithography level, with metallization in a single step. This is achieved using an embedded sacrificial dielectric material that surrounds the shared epitaxial layers. Top spacers or fin liners preserve upper fin channel surface quality before gate dielectric deposition for gate stacks of the upper fin channels.

Figure 13C:
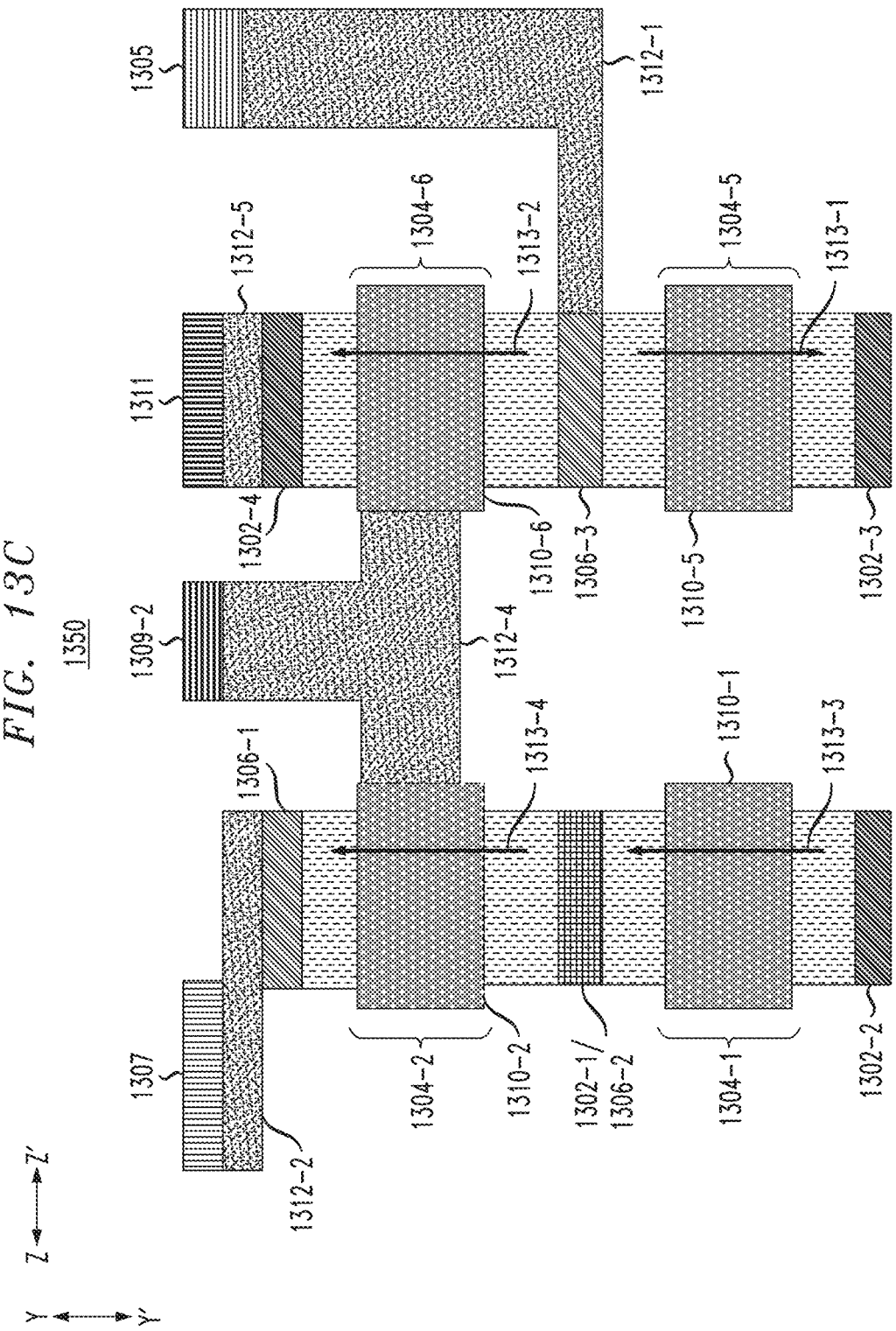
FIG. 13C shows a cross-sectional view taken along a first one of the fins of the stacked vertical transport field-effect transistor NAND2 structure of FIG. 13A, according to an embodiment of the invention.

FIGS. 13A-13F illustrate a stacked VTFET NAND2 structure, including two two-channel PFETs 1301 and two two-channel NFETs 1303 formed using stacked VTFETs in two fins. FIG. 13A shows a top-down view 1300 of the stacked VTFET NAND2 structure, showing the two-channel PFETs 1301, the two-channel NFETs 1303, a high power rail 1305, a low power rail 1307, first and second inputs 1309-1 and 1309-2, and output 1311.

FIG. 13B shows a circuit diagram 1325 for a NAND2 logic gate, along with a logic table 1330 for the NAND2 logic gate. As illustrated in the circuit diagram 1325, the PFETs 1301 are connected in parallel, with their sources connected to the high power rail 1305 and their drains connected to the output 1311. The NFETs 1303 are connected in series, with a first one of the NFETs 1303 having its source connected to ground or the low power rail 1307 and its drain connected to the source of a second one of the NFETs 1303. The drain of the second one of the NFETs 1303 is connected to the output 1311. Gates of the PFETs 1301 and NFETs 1303 are connected to the first and second inputs 1309-1 and 1309-2. When input 1309-1 and 1309-2 are both high or 1, then both NFETs 1303 are turned on and the output 1311 is 0 (e.g., it is pulled to the low power rail 1307). If at least one of the inputs 1309-1 and 1309-2 is low or 0, then at least one of the NFETs 1303 is off and the output 1311 will not be pulled to the low power rail 1307. Instead, with at least one of the inputs 1309-1 and 1309-2 being low, at least one of the PFETs 1301 will be on and the output 1311 is 1 (e.g., it is pulled to the high power rail 1305).

Figure 13D:
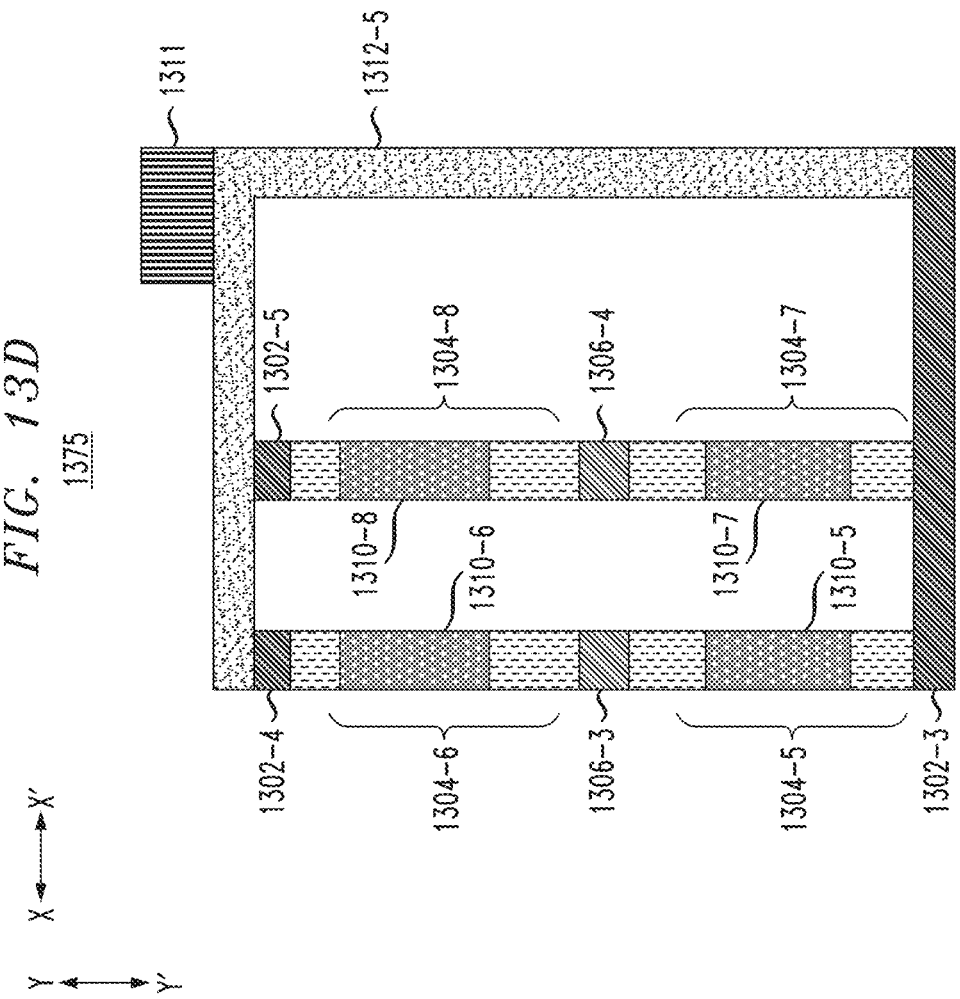
FIG. 13D shows a cross-sectional view taken across the fins of the stacked vertical transport field-effect transistor NAND2 structure of FIG. 13A, according to an embodiment of the invention.
Figure 13E:
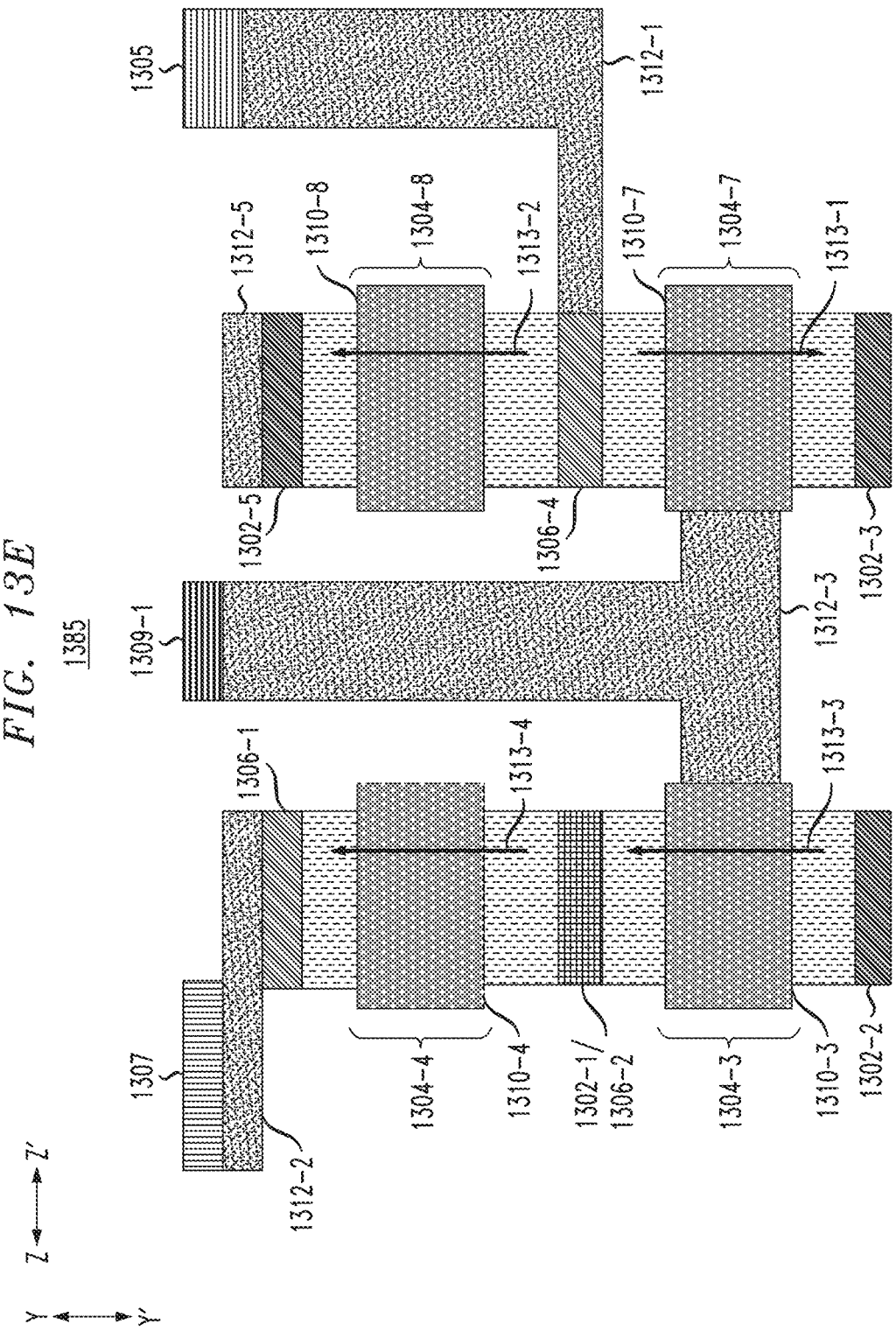
FIG. 13E shows a cross-sectional view taken along a second one of the fins of the stacked vertical transport field-effect transistor NAND2 structure of FIG. 13A, according to an embodiment of the invention.

FIG. 13C shows a cross-sectional view 1350 taken along the line C-C shown in the top-down view 1300 of FIG. 13A, FIG. 13D shows a cross-sectional view 1375 taken along the line D-D shown in the top-down view 1300 of FIG. 13A, FIG. 13E shows a cross-sectional view 1385 taken along the line E-E in the top-down view 1300 of FIG. 13A, and FIG. 13F shows a cross-sectional view 1390 taken along the line F-F in the top-down view 1300 of FIG. 13A. The cross-sectional views 1350 and 1385 are taken along the length of the first and second fins, respectively, in direction Z-Z'. The cross-sectional views 1375 and 1390 are taken across the first and second fins showing the PFET fin channels 1304-5 through 1304-8 and the NFET fin channels 1304-1 through 1304-4, respectively. The NFET lower fin channel 1304-1 and the NFET lower fin channel 1304-3 provide the lower one of the two-channel NFETs 1303. The NFET upper fin channel 1304-2 and the NFET upper fin channel 1304-4 provide the upper one of the two-channel NFETs 1303. The PFET lower fin channel 1304-5 and the PFET upper fin channel 1304-6 provide one of the two-channel PFETs 1301, with the PFET lower fin channel 1304-7 and the PFET upper fin channel 1304-8 providing the other one of the two-channel PFETs 1301.

Epitaxial layers providing source and drain regions for the two-channel PFETs 1301 and the two-channel NFETs 1303 will now be described. The top epitaxial layer for the upper fin channels 1304-2 and 1304-4 of a first one of the two two-channel NFETs 1303 provides a source region 1306-1 that is coupled to the low power rail 1307 via contact 1312-2. The middle epitaxial layer shared between (i) the upper fin channels 1304-2 and 1304-4 providing the first one of the two two-channel NFETs 1303 and (ii) the lower fin channels 1304-1 and 1304-3 providing the second one of the two two-channel NFETs 1303 provides a drain region 1302-1 for the first two-channel NFET (e.g., for the upper VTFETs) and a source region 1306-2 for the second two-channel NFET (e.g., the lower VTFETs). The bottom epitaxial layer for the lower fin channels 1304-1 and 1304-3 for the second one of the two two-channel NFETs 1303 provides drain region 1302-2, which is coupled to the output 1311 via contact 1312-5. The middle epitaxial layers shared between the PFET lower fin channels 1304-5 and 1304-7 and the PFET upper fin channels 1304-6 and 1304-8 provide respective shared source regions 1306-3 and 1306-4. The PFET lower fin channels 1304-5 and 1304-7 have a shared drain region 1302-3, and the PFET upper fin channels 1304-6 and 1304-8 have respective drain regions 1302-4 and 1302-5. Gate stacks 1310-1 through 1310-8 are formed for the fin channels 1304-1 through 1304-8, respectively.

Contacts for the stacked VTFET NAND2 structure of FIGS. 13A-13F will now be described. Contact 1312-1 connects the source regions 1306-3 and 1306-4 of the first and second two-channel PFETs 1301 to the high power rail 1305. Contact 1312-2 connects the source 1306-1 of the upper one of the two-channel NFETs 1303 to the lower power rail 1307. Contact 1312-3 connects the gate stacks 1310-3 and 1310-7 to the first input 1309-1. Contact 1312-4 connects the gate stacks 1310-2 and 1310-6 to the second input 1309-2. Contact 1312-5 connects the drains 1302-3, 1302-4 and 1302-5 of the two-channel PFETs 1301 and the drain 1302-2 of the lower one of the two-channel NFETs 1303 to the output 1311.

Current flow in the stacked VTFET NAND2 structure of FIGS. 13A-13F will now be described. Current flows from the high power rail 1305 to the source regions 1306-3 and 1306-4 of the two two-channel PFETs 1301, and then flows 1313-1 to the drain region 1302-3 and 1313-2 to the drain regions 1302-4 and 1302-5. Current then flows from the drain regions 1302-3, 1302-4 and 1302-5 to the drain region 1302-2 of the lower one of the two two-channel NFETs 1303. From there, current flows to the middle epitaxial layer which is the source region 1306-1 for the lower one of the two two-channel NFETs 1303 and the drain region 1302-1 of the upper one of the two two-channel NFETs 1303. Current flow continues 1313-4 to the source region 1306-1 of the upper one of the two two-channel NFETs 1303, which is coupled to the low power rail 1307 via contact 1312-2.

The stacked VTFET NAND2 structure shown in FIGS. 13A-13F provides various advantages relative to non-stacked VTFET NAND2 structures and other approaches. For example, the stacked VTFET NAND2 structure shown in FIGS. 13A-13F has an "X" direction length of 2 CPP and a "Z" direction length of approximately 230 nm.

Figure 14A:
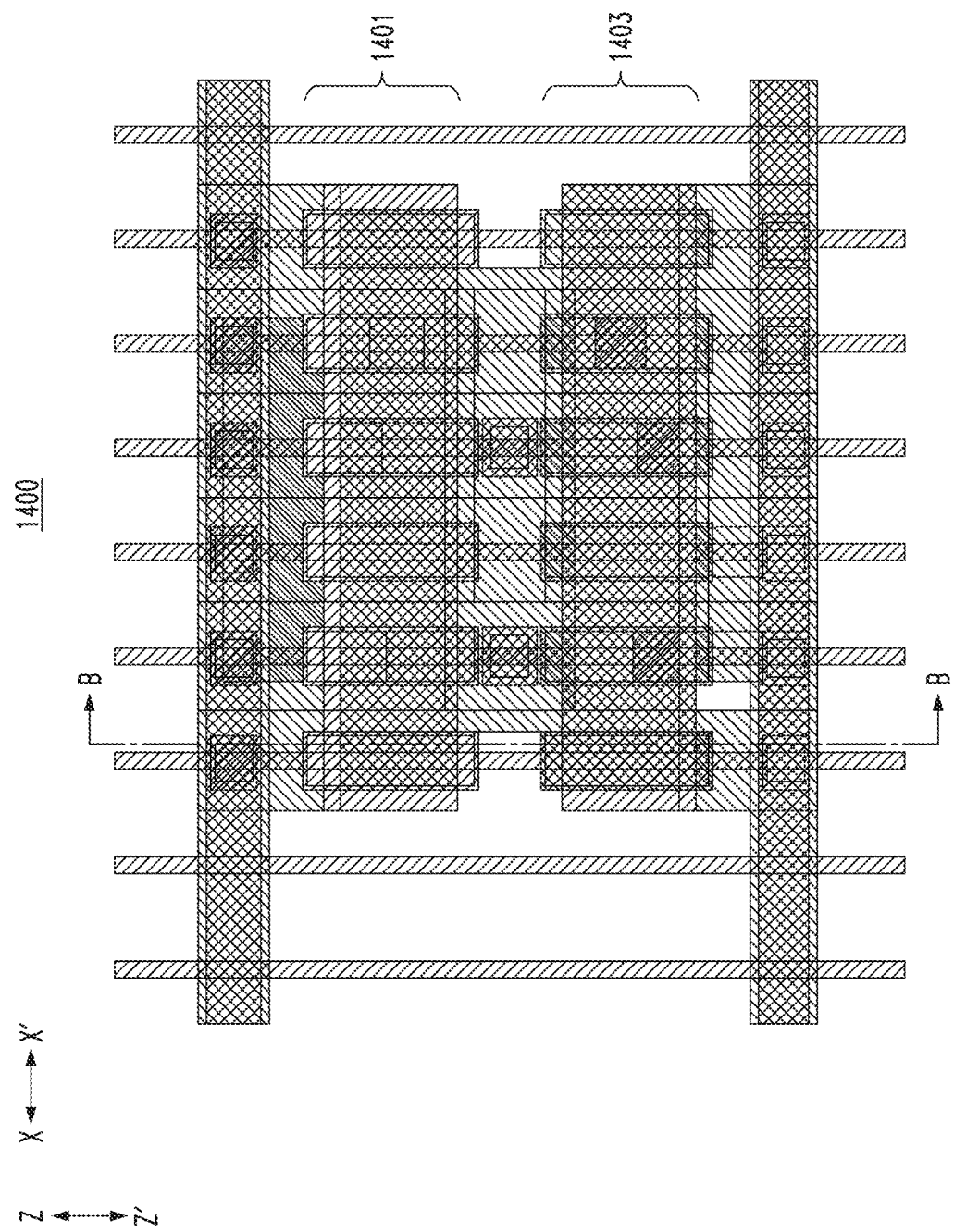
FIG. 14A shows a top-down view of a vertical transport field-effect transistor NAND2 structure using two two-channel n-type field-effect transistors and two two-channel p-type field-effect transistors, according to an embodiment of the invention.

FIG. 14A shows a top-down view 1400 of a non-stacked VTFET NAND2 structure with four PFET channels 1401 and four NFET channels 1403. FIG. 14B shows a cross-sectional view 1450 taken along the line B-B (e.g., along a length of one of the fins) in the top-down view 1400 of FIG. 14A. FIG. 14B shows NFET drain region 1402-1, NFET channel 1404-1, NFET source region 1406-1, NFET gate stack 1410-1, PFET drain 1402-2, PFET channel 1404-2, PFET source region 1406-2, and PFET gate region 1410-2. Contact 1412-1 connects PFET source region 1406-2 to the high power rail 1405, contact 1412-2 connects the NFET source region 1406-1 to the low power rail 1407, contact 1412-3 connects the gate stacks 1410-1 and 1410-2 to an input 1409, and contact 1412-4 connects the PFET drain region 1402-2 to output 1411. The non-stacked VTFET NAND2 structure of FIGS. 14A and 14B has an "X" direction length of 3CPP and a "Z" direction length of 230 nm, with an area scaling of 1 as compared to an area scaling of 0.67 for the stacked VTFET NAND2 structure of FIGS. 13A-13F.

NOR2 logic gates may also be formed using two-channel PFETs and NFETs (e.g., a total of four two-channel FETs—two two-channel NFETs and two two-channel PFETs), and is thus referred to as a NOR2 logic gate structure. The two-channel PFETs and two-channel NFETs are formed using stacked VTFET structures, where for the two-channel NFETs the upper and lower fin channels of each fin connect in parallel, and connections between first and second fins is also in parallel. There is a shared epitaxial layer for the bottom of the lower NFET fin channels of the first and second fins. The two-channel PFETs are composed of the upper and lower fin channels along the same fin. There is a shared epitaxial layer for the bottom of the lower PFET fin channels of the first and second fins, where for the first fin the shared epitaxial layer serves as a source region and for the second fin the shared epitaxial layer serves as a drain region.

The NOR2 logic gate structure includes shared epitaxial layers between the upper and lower fin channels of the first and second fins. For the NFET upper and lower fin channels, the shared epitaxial layer of the first and second fins provides a source region for the NFET upper and lower fin channels. For the PFET upper and lower fin channels, the shared epitaxial layer of the first fin provides a source region and the shared epitaxial layer of the second fin provides a drain region. Each of the fins provides one two-channel NFET and one two-channel PFET, for a total of four two-channel FETs (two two-channel NFETs and two two-channel PFETs). The epitaxial layer between the upper and lower fin channels is shared by the stacked VTFETs, and thus advantageously there is no need for insulation between the upper and lower fin channels. For the two-channel PFETs, the shared epitaxial layer serves as a source region for a first fin and serves as a drain region for the second fin. For the first fin, the top and bottom epitaxial layers serve as source regions for the two-channel PFETs. For the second fin, the top and bottom epitaxial layers serve as drain regions for the two-channel PFETs. For the two-channel PFETs, the shared epitaxial layer of one fin connects to a high power rail while that shared epitaxial layer of the other fin connects to an output of the stacked VTFET NOR2 structure. For the two-channel NFETs, both the first and second fin use the shared epitaxial layer as a source region that connects to ground or a low power rail. The output of the stacked VTFET NOR2 structure connects to both the top and bottom epitaxial layers of the first and second fins for the two-channel NFETs. The output connection from the drain terminal of one of the two-channel PFETs is at the level that has the same height of its shared epitaxial layer, while for the two-channel NFETs it is at the same height as the bottom epitaxial layer for the lower fin channels. The gate contacts for the stacked VTFET NOR2 structure can, but do not have to be, at different depths to control separate gates for the stacked VTFETs in order to form two inputs for the NOR circuit. The stacked VTFET NOR2 structure illustratively provides a 33% increase in Weff/area relative to a non-stacked VTFET NOR2 structure.

The stacked VTFET NOR2 structure utilizes an interconnect structure with vertical and lateral trenches patterned at the same lithography level, with metallization in a single step. This is achieved using an embedded sacrificial dielectric material that surrounds the shared epitaxial layers. Top spacers or fin liners preserve upper fin channel surface quality before gate dielectric deposition for gate stacks of the upper fin channels.

Figure 15A:
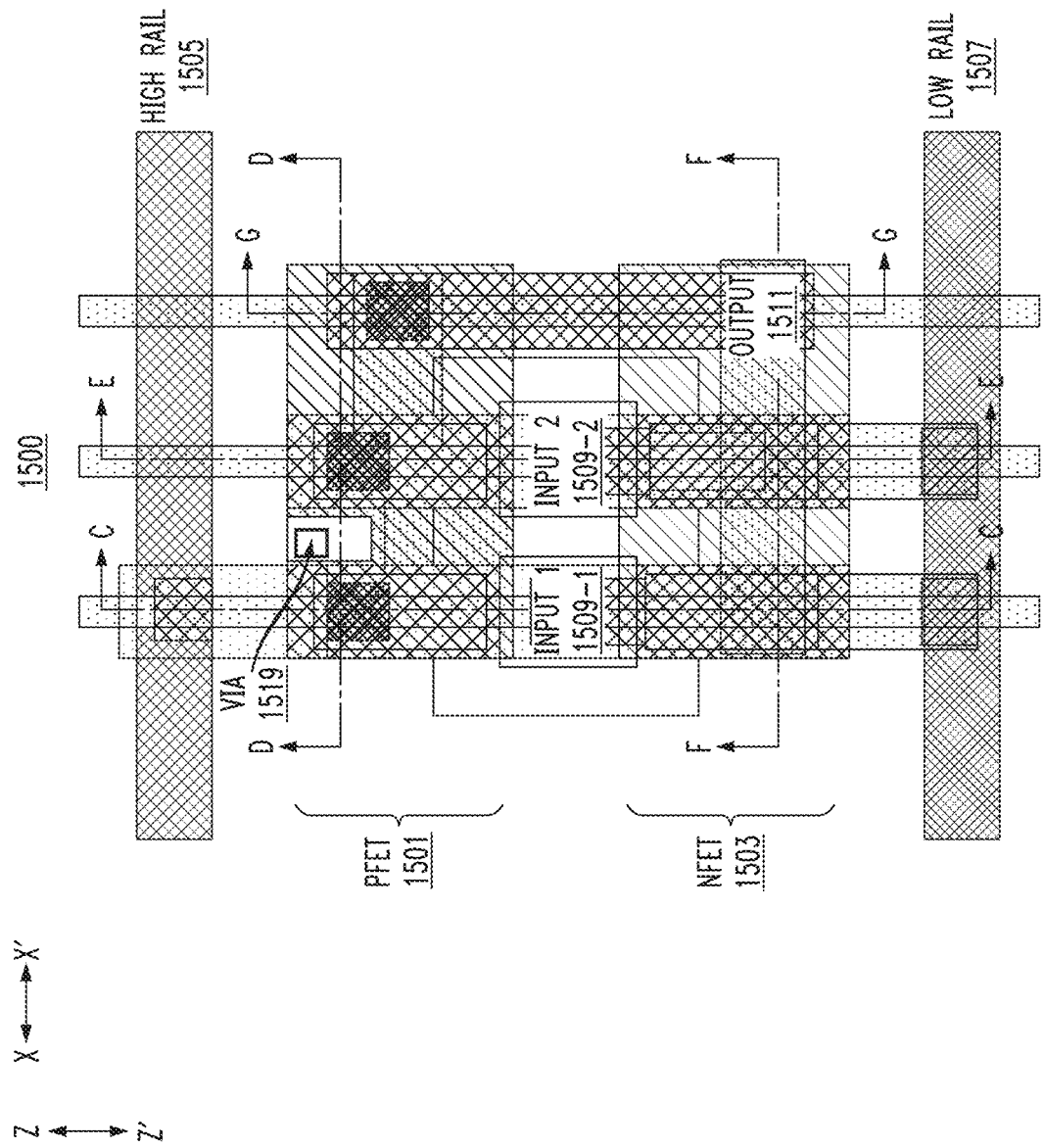
FIG. 15A shows a top-down view of a stacked vertical transport field-effect transistor NOR2 structure using two two-channel n-type field-effect transistors and two two-channel p-type field-effect transistors, according to an embodiment of the invention.

FIGS. 15A-15G illustrate a stacked VTFET NOR2 structure, including two two-channel PFETs 1501 and two two-channel NFETs 1503 formed using stacked VTFETs in two fins. FIG. 15A shows a top-down view 1500 of the stacked VTFET NOR2 structure, showing the two-channel PFETs 1501, the two-channel NFETs 1503, a high power rail 1505, a low power rail 1507, first and second inputs 1509-1 and 1509-2, output 1511, and a via 1519 that provides an interconnection between top epitaxial layers providing drain region 1502-5 and source region 1506-5 and bottom epitaxial layers providing source region 1506-3 and drain region 1502-4, which will be described in further detail below.

FIG. 15B shows a circuit diagram 1525 for a NOR2 logic gate, along with a logic table 1530 for the NOR2 logic gate. As illustrated in the circuit diagram 1525, the PFETs 1501 are connected in series, with a source of a first one of the PFETs 1501 being connected to the high power rail 1505 and the drain of the first one of the PFETs 1501 being connected to a source of a second one of the PFETs 1501. The NFETs 1503 are connected in parallel, with their sources connected to the low power rail 1507 and their drains connected to the output 1511. The drain of the second one of the PFETs 1501 also connects to the output 1511. Gates of the PFETs 1501 and NFETs 1503 are connected to the first and second inputs 1509-1 and 1509-2. When inputs 1509-1 and 1509-2 are both low or 0, then both PFETs 1501 are turned on the output 1511 is 1 (e.g., it is pulled to the high power rail 1505). If at least one of the inputs 1509-1 and 1509-2 is high or 1, then at least one of the NFETs 1503 is on and the output 1511 will be 0 as it is pulled to the low power rail 1507.

Figure 15C:
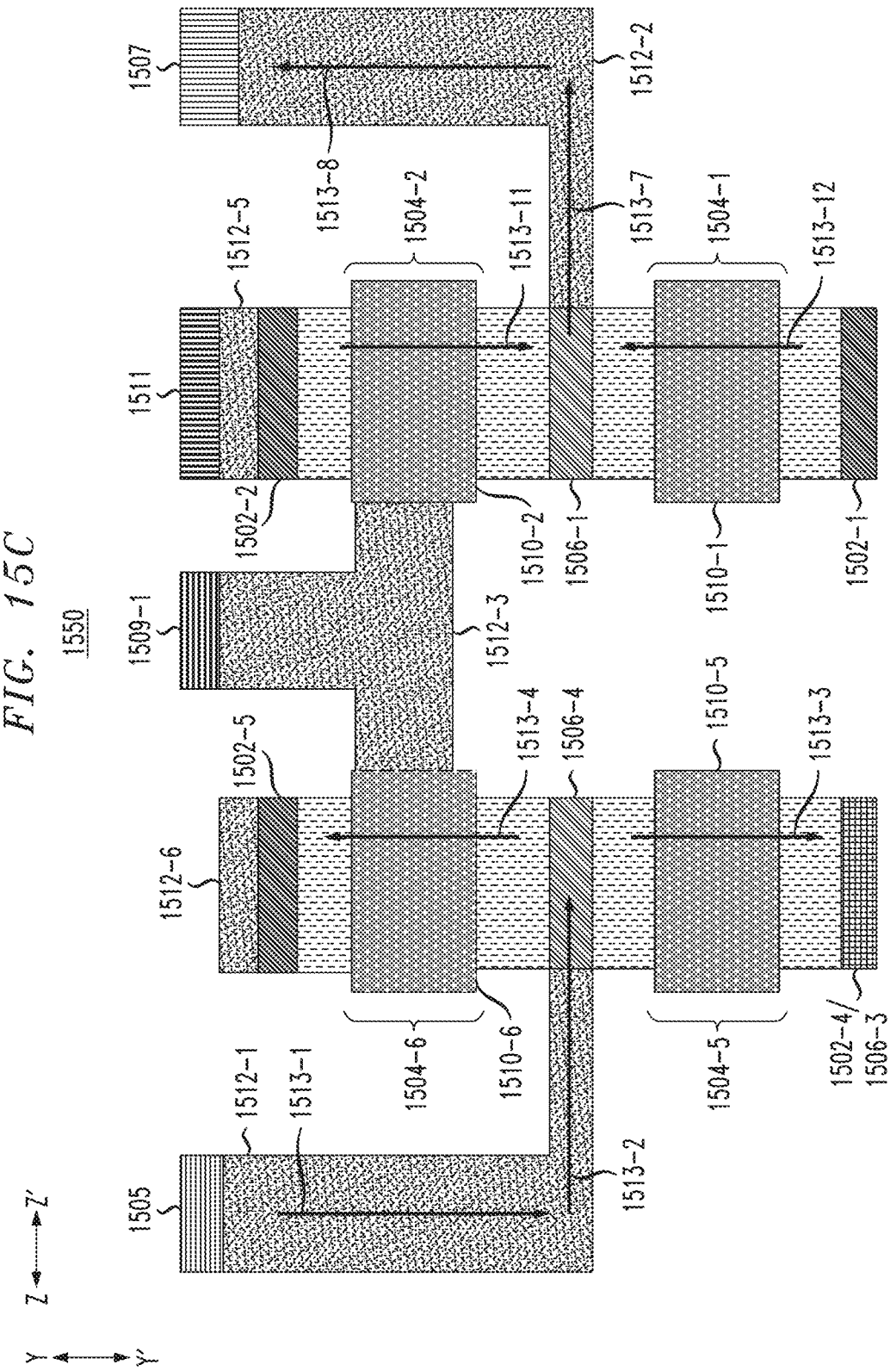
FIG. 15C shows a cross-sectional view taken along a first one of the fins of the stacked vertical transport field-effect transistor NOR2 structure of FIG. 15A, according to an embodiment of the invention.
Figure 15D:
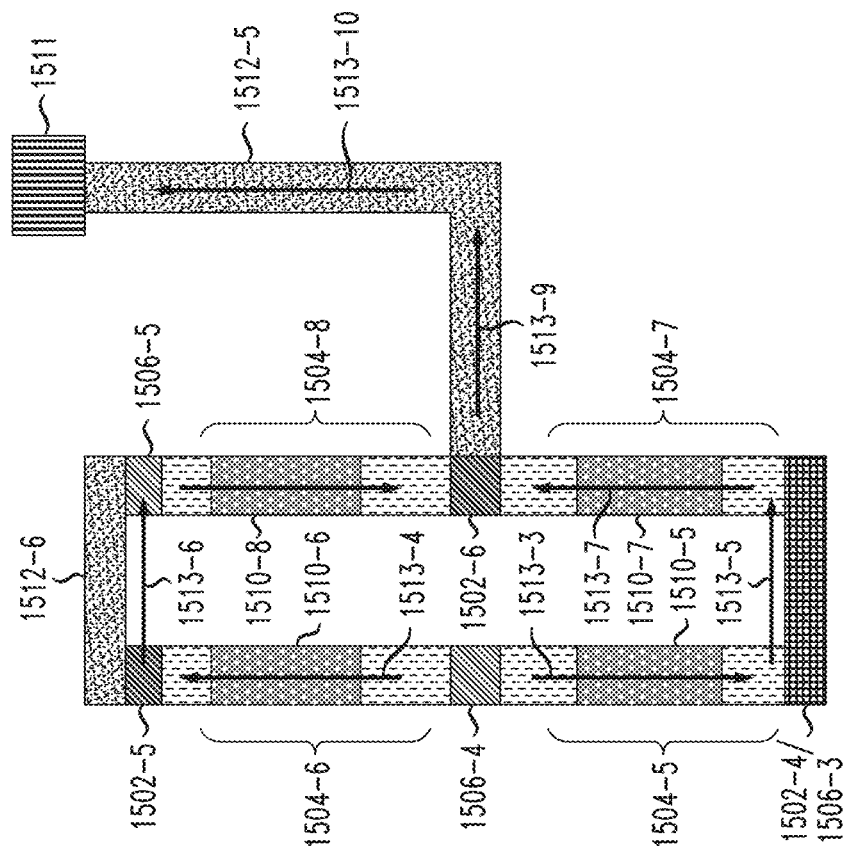
FIG. 15D shows a cross-sectional view taken across the fins of the stacked vertical transport field-effect transistor NOR2 structure of FIG. 15A, according to an embodiment of the invention.
Figure 15E:
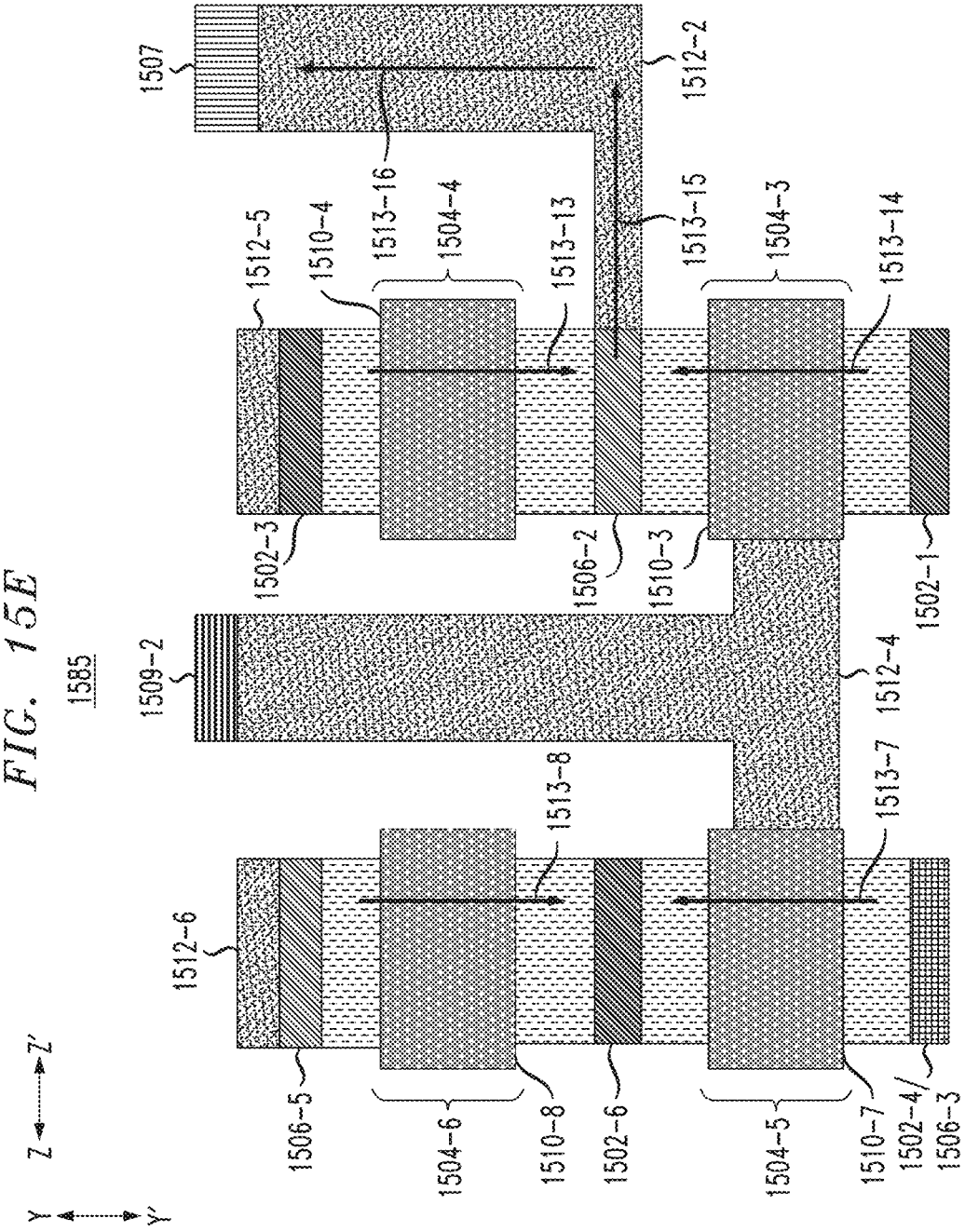
FIG. 15E shows a cross-sectional view taken along a second one of the fins of the stacked vertical transport field-effect transistor NOR2 structure of FIG. 15A, according to an embodiment of the invention.
Figure 15F:
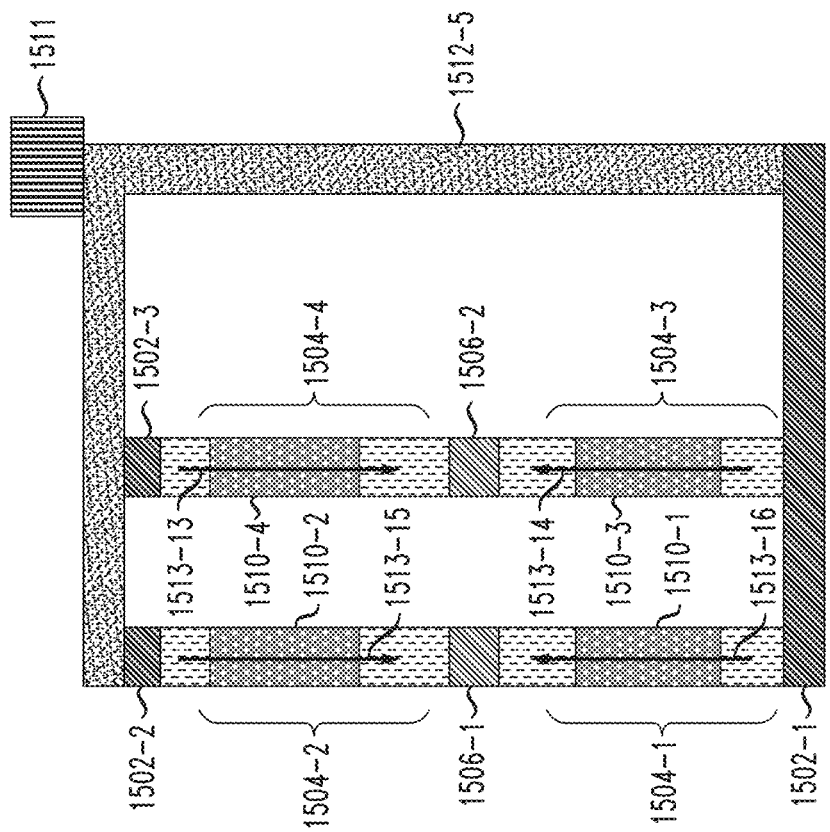
FIG. 15F shows another cross-sectional view taken across the fins of the stacked vertical transport field-effect transistor NOR2 structure of FIG. 15A, according to an embodiment of the invention.
Figure 15G:
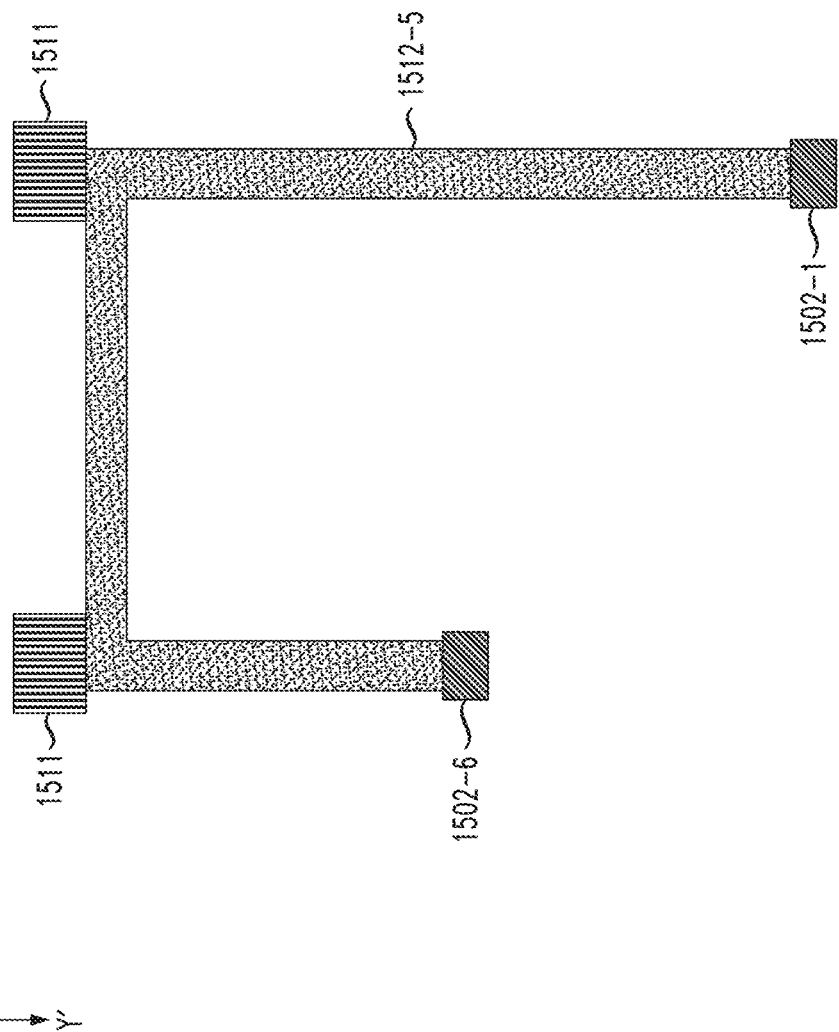
FIG. 15G shows a cross-sectional view taken along an output of the stacked vertical transport field-effect transistor NOR2 structure of FIG. 15A, according to an embodiment of the invention.

FIG. 15C shows a cross-sectional view 1550 taken along the line C-C shown in the top-down view 1500 of FIG. 15A, FIG. 15D shows a cross-sectional view 1575 taken along the line D-D shown in the top-down view 1500 of FIG. 15A, FIG. 15E shows a cross-sectional view 1585 taken along the line E-E in the top-down view 1500 of FIG. 15A, FIG. 15F shows a cross-sectional view 1590 taken along the line F-F in the top-down view 1500 of FIG. 15A, and FIG. 15G shows a cross-sectional view 1595 taken along the line G-G in the top-down view 1500 of FIG. 15A. The cross-sectional views 1550 and 1585 are taken along the length of the first and second fins, respectively, in direction Z-Z'. The cross-sectional views 1575 and 1590 are taken across the first and second fins showing the PFET fin channels 1504-5 through 1504-8 and the NFET fin channels 1504-1 through 1504-4, respectively. The cross-sectional view 1595 is taken along the output in direction Z-Z'. The NFET lower fin channel 1504-1 and the NFET upper fin channel 1504-2 of a first one of the fins provides one of the two two-channel NFETs 1503, and the NFET lower fin channel 1504-3 and the NFET upper fin channel 1504-4 of a second one of the fins provides the other one of the two two-channel NFETs 1503. The PFET lower fin channel 1504-5 and the PFET upper fin channel 1504-6 of the first fin provide one of the two two-channel PFETs 1501, with the PFET lower fin channel 1504-7 and the PFET upper fin channel 1504-8 of the second fin providing the other one of the two two-channel PFETs 1501.

Epitaxial layers providing source and drain regions for the two-channel PFETs 1501 and the two-channel NFETs 1503 will now be described. The middle epitaxial layer shared between the NFET lower fin channel 1504-1 and the NFET upper fin channel 1504-2 provides a shared source region 1506-1, and the middle epitaxial layer shared between the NFET lower fin channel 1504-3 and the NFET upper fin channel 1504-4 provides a shared source region 1506-2. The bottom epitaxial layer of the first and second fins provides a drain region 1502-1 for the NFET lower fin channels 1504-1 and 1504-3. The top epitaxial layers of the first and second fins provide respective drain regions 1502-2 and 1502-3 for the NFET upper fin channel 1504-2 and 1504-4. The NFET lower fin channel 1504-1 and the NFET upper fin channel 1504-2 provide one of the two two-channel NFETs 1503, while the NFET lower fin channel 1504-3 and the NFET upper fin channel 1504-4 provide the other one of the two two-channel NFETs 1503. The middle epitaxial layer shared between the PFET lower fin channel 1504-5 and the PFET upper fin channel 1504-6 provides a shared source region 1506-4, while the middle epitaxial layer shared between the PFET lower fin channel 1504-7 and the PFET upper fin channel 1504-8 provides a shared drain region 1502-6. The bottom epitaxial layer of the first and second fins provides a source region 1506-3 for the PFET lower fin channel 1504-7 and provides a drain region 1502-4 for the PFET lower fin channel 1504-5. The top epitaxial layer for the PFET upper fin channel 1504-6 provides a drain region 1502-5, and the top epitaxial layer for the PFET upper fin channel 1504-8 provides a source region 1506-5. Gate stacks 1510-1 through 1510-8 are formed for the fin channels 1504-1 through 1504-8, respectively.

Contacts for the stacked VTFET NOR2 structure of FIGS. 15A-15G will now be described. Contact 1512-1 connects the shared source region 1506-4 to the high power rail 1505. Contact 1512-2 connects the shared source regions 1506-1 and 1506-2 to the low power rail 1507. Contact 1512-3 connects the gate stacks 1510-2 and 1510-6 to the first input 1509-1. Contact 1512-4 connects the gate stacks 1510-3 and 1510-7 to the second input 1509-2. Contact 1512-5 connects the drain regions 1502-1, 1502-2, 1502-3 and 1502-6 together and to the output 1511. Contact 1512-6 connects the source region 1506-5 and the drain region 1502-5.

Current flow in the stacked VTFET NOR2 structure of FIGS. 15A-15G will now be described. For the PFETs 1501, current flows 1513-1 and 1503-2 from the high power rail 1505 to the source region 1506-4, and then flows 1513-3 and 1513-4 from the source region 1506-4 to the drain regions 1502-4 and 1502-5. Current then flows from the drain region 1502-5 to the source region 1506-5, and from the drain region 1502-4 to the source region 1506-3. From there, the current flows 1513-5 from the drain region 1502-4 to the source region 1506-3 (which is a shared epitaxial layer), and flow 1513-6 from the drain region 1502-5 to the source region 1506-5. Current flow continues 1513-7 from the source region 1506-3 to the drain region 1502-6 and continues 1513-8 from the source region 1506-5 to the drain region 1502-6. The current then continues flowing 1513-9 and 1513-10 to the output 1511. For the NFETs 1503, current flows 1513-11 form the drain region 1502-2 to the shared source 1506-1, flows 1513-12 from the shared drain region 1502-1 to the shared source region 1506-1, flows 1513-13 from the drain region 1502-3 to the shared source region 1506-2, and flows 1513-14 from the shared drain region 1502-1 to the shared source region 1506-2. Current flow continues 1513-15 and 1513-16 from the shared source regions 1506-1 and 1506-2 to the low power rail 1507.

The stacked VTFET NOR2 structure shown in FIGS. 15A-15G provides various advantages relative to non-stacked VTFET NOR2 structures and other approaches. For example, the stacked VTFET NOR2 structure shown in FIGS. 15A-15G has an "X" direction length of 2 CPP and a "Z" direction length of approximately 230 nm.

Figure 16A:
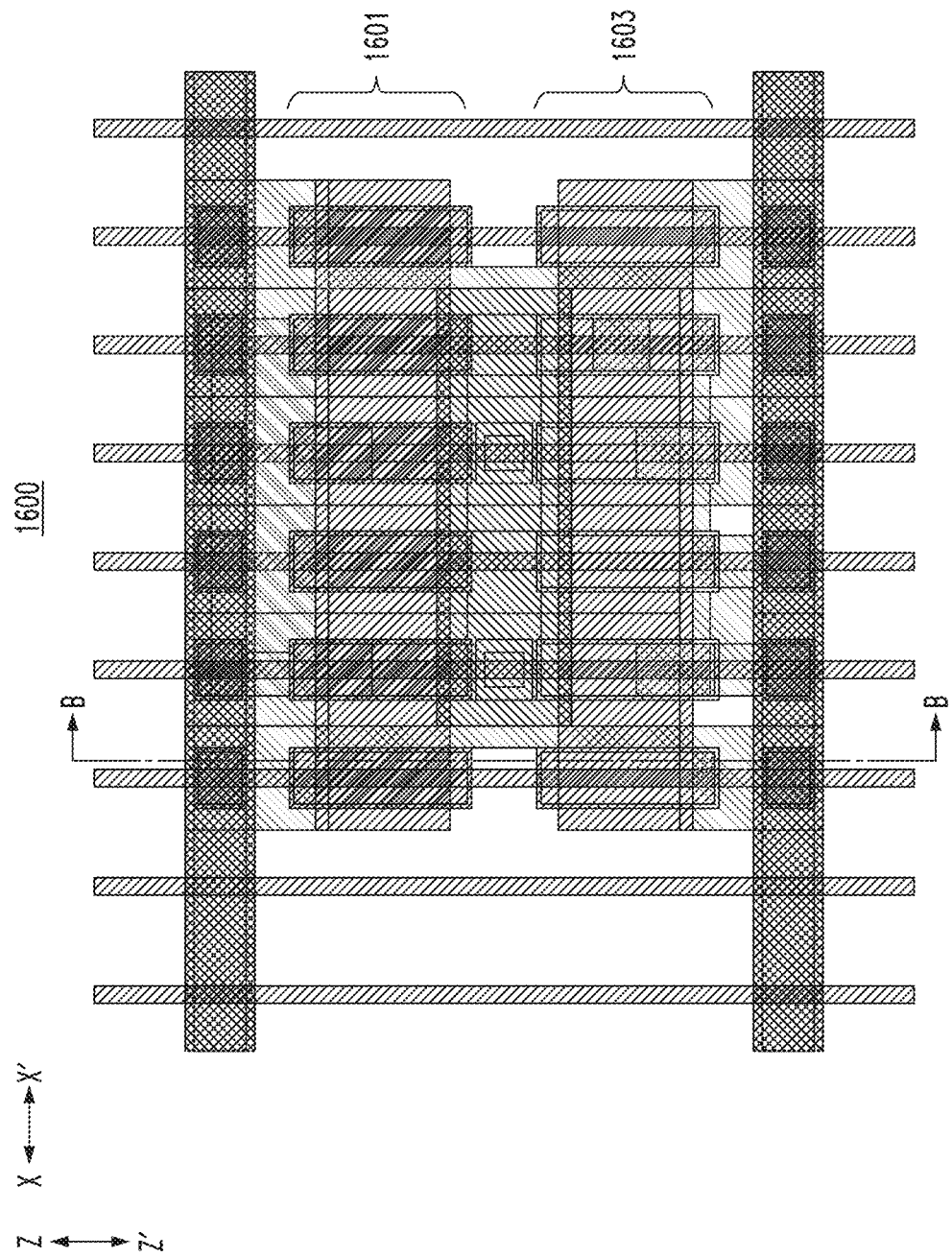
FIG. 16A shows a top-down view of a vertical transport field-effect transistor NOR2 structure using two two-channel n-type field-effect transistors and two two-channel p-type field-effect transistors, according to an embodiment of the invention.
Figure 16B:
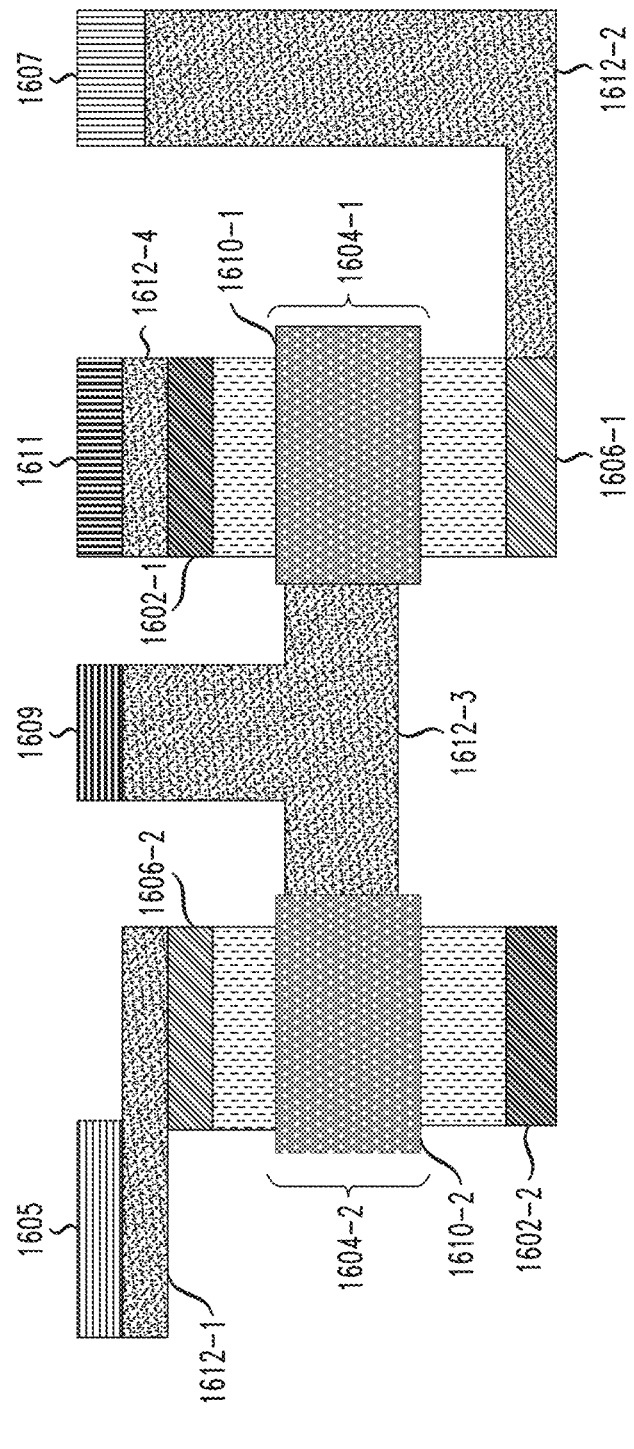
FIG. 16B shows a cross-sectional view of the FIG. 16A vertical transport field-effect transistor NOR2 structure, according to an embodiment of the invention.

FIG. 16A shows a top-down view 1600 of a non-stacked VTFET NOR2 structure with four PFET channels 1601 and four NFET channels 1603. FIG. 16B shows a cross-sectional view 1650 taken along the line B-B (e.g., along a length of one of the fins) in the top-down view 1600 of FIG. 16A. FIG. 16B shows NFET drain region 1602-1, NFET channel 1604-1, NFET source region 1606-1, NFET gate stack 1610-1, PFET drain 1602-2, PFET channel 1604-2, PFET source region 1606-2, and PFET gate region 1610-2. Contact 1612-1 connects PFET source region 1606-2 to the high power rail 1605, contact 1612-2 connects the NFET source region 1606-1 to the low power rail 1607, contact 1612-3 connects the gate stacks 1610-1 and 1610-2 to an input 1609, and contact 1612-4 connects the NFET drain region 1602-2 to output 1611. The non-stacked VTFET NOR2 structure of FIGS. 16A and 16B has an "X" direction length of 3CPP and a "Z" direction length of 230 nm, with an area scaling of 1 as compared to an area scaling of 0.67 for the stacked VTFET NOR2 structure of FIGS. 16A-16G.

Illustrative processes for forming stacked VTFET NAND2 and NOR2 structures will now be described with respect to FIGS. 3-5 and 17-23C. FIGS. 3-5, as described above, detail formation of upper and lower fin channels 306-1 through 306-4 and formation of the liner layers 308 and 310.

FIG. 17 shows a cross-sectional view 1700 of the FIG. 5 structure, following formation of a bottom epitaxial layer 1712 and STI regions 1714. The bottom epitaxial layer 1712 and STI regions 1714 may be formed of similar materials and with similar sizing and processing as that described above with respect to bottom epitaxial layer 312 and STI regions 314.

Figure 18A:
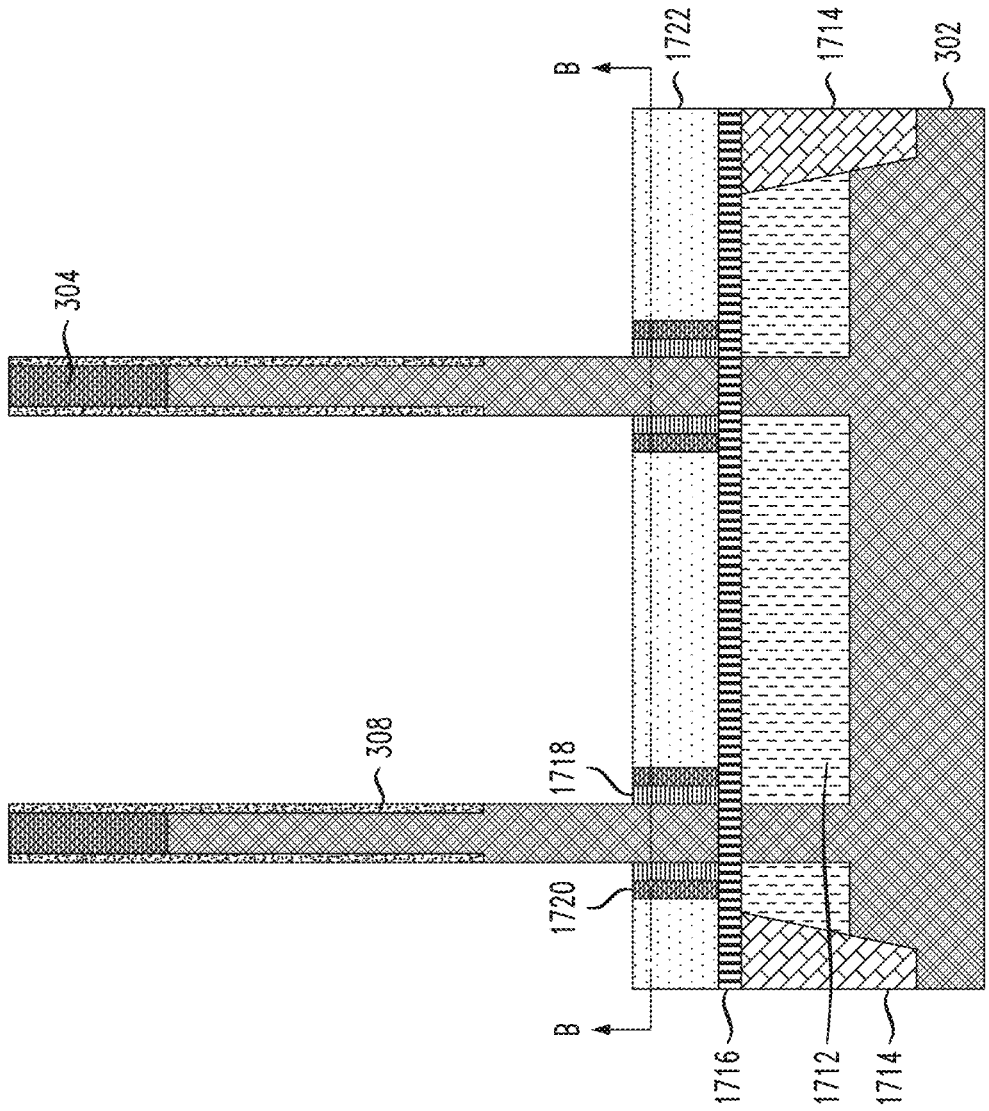
FIG. 18A shows a cross-sectional view of the FIG. 17 structure following formation of a gate stack for lower vertical transport field-effect transistors, according to an embodiment of the invention.

FIG. 18A shows a cross-sectional view 1800 of the FIG. 17 structure, following removal of the liner 310, and formation of a gate stack for the lower VTFETs. FIG. 18A shows a bottom spacer layer 1716 for the lower VTFETs, which is formed surrounding part of the bottom portions 306-3 and 306-4 of the vertical fins above the bottom epitaxial layer 1712 and STI regions 1714. The bottom spacer layer 1716 may be formed of similar materials and with similar sizing and processing as that described above with respect to bottom spacer layer 316.

After formation of the bottom spacer layer 1716, gate stack materials including a gate dielectric layer 1718 and a gate conductor layer 1720, which are surrounding by ILD layer 1722. The gate dielectric layer 1718, gate conductor layer 1720 and ILD layer 1722 may be formed of similar materials and with similar sizing and processing as that described above with respect to the gate dielectric layer 318, gate conductor layer 320 and ILD layer 322.

FIG. 18B shows a top cross-sectional view 1850 taken along the line B-B in the cross-sectional view 1800 of FIG. 18A. The top cross-sectional view 1850 illustrates that gate conductor 1720 surrounding lower fin channel 306-2 (for one of the two-channel NFETs) also surrounds the lower fin channel 306-6 (for one of the two-channel PFETs). For a stacked VTFET NAND2 structure, the gate conductor 1720 surrounding the lower fin channels 306-2 and 306-6 connects to the first input 1309-1. For a stacked VTFET NOR2 structure, the gate conductor 1720 surrounding the lower fin channels 306-2 and 306-6 connects to the second input 1509-2.

Figure 19:
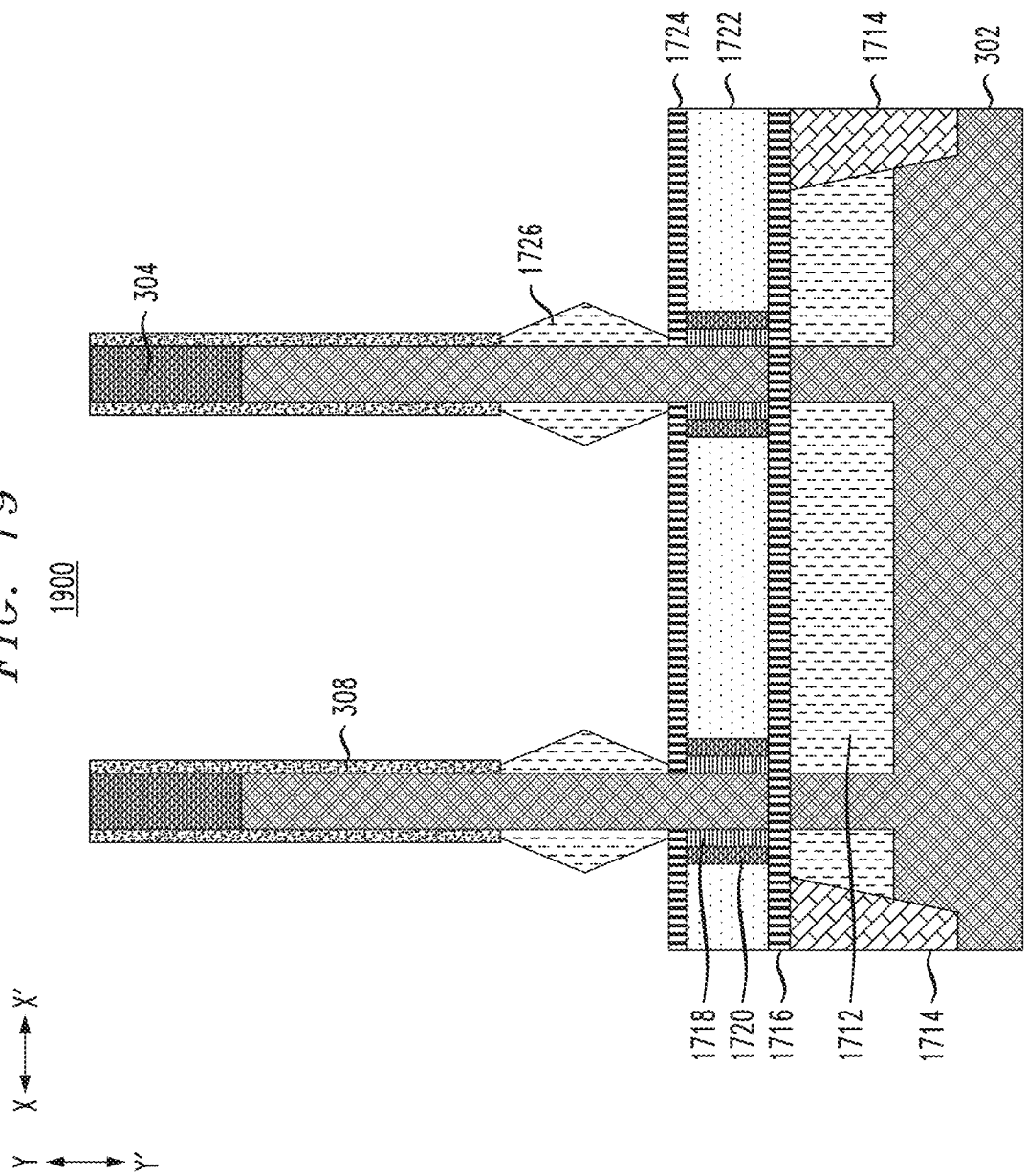
FIG. 19 shows a cross-sectional view of the FIG. 18A structure following formation of a shared epitaxial layer, according to an embodiment of the invention.

FIG. 19 shows a cross-sectional view 1900 of the FIG. 18A structure following formation of top spacer layer 1724 for the lower VTFETs and following formation of shared epitaxial layer 1726. The top spacer layer 1724 and shared epitaxial layer 1726 may be formed of similar materials and with similar sizing and processing as that described above with respect to top spacer layer 324 and shared epitaxial layer 326.

FIG. 20A shows a cross-sectional view 2000 of the FIG. 19 structure following formation of a sacrificial layer 1728 surrounding the shared epitaxial layer 1726. FIG. 20A shows that the sacrificial layer 1728 does not connect the shared epitaxial layer 1726 for the lower fin channels.

FIG. 20B shows another cross-sectional view 2050 following formation of the sacrificial layer 1728 surrounding the shared epitaxial layer. FIG. 20B shows that the sacrificial layer 1728 does connect the shared epitaxial layer 1726 for the lower fin channels.

For the stacked VTFET NAND2 structure (e.g., of FIGS. 13A-13F), FIG. 20A illustrates the sacrificial layer 1728 not connecting the shared epitaxial layer 1726 for the PFETs (e.g., 1301) and FIG. 20B illustrates the sacrificial layer 1728 connecting the shared epitaxial layer 1726 for the NFETs (e.g., 1303). For the stacked VTFET NOR2 structure (e.g., of FIGS. 15A-15G), FIG. 20A illustrates the sacrificial layer 1728 not connecting the shared epitaxial layer 1726 for both the NFETs (e.g., 1503) and the PFETs (e.g., 1501). The sacrificial layer 1728 may comprise a FCVD oxide that is deposited then etched back.

Figure 20C:
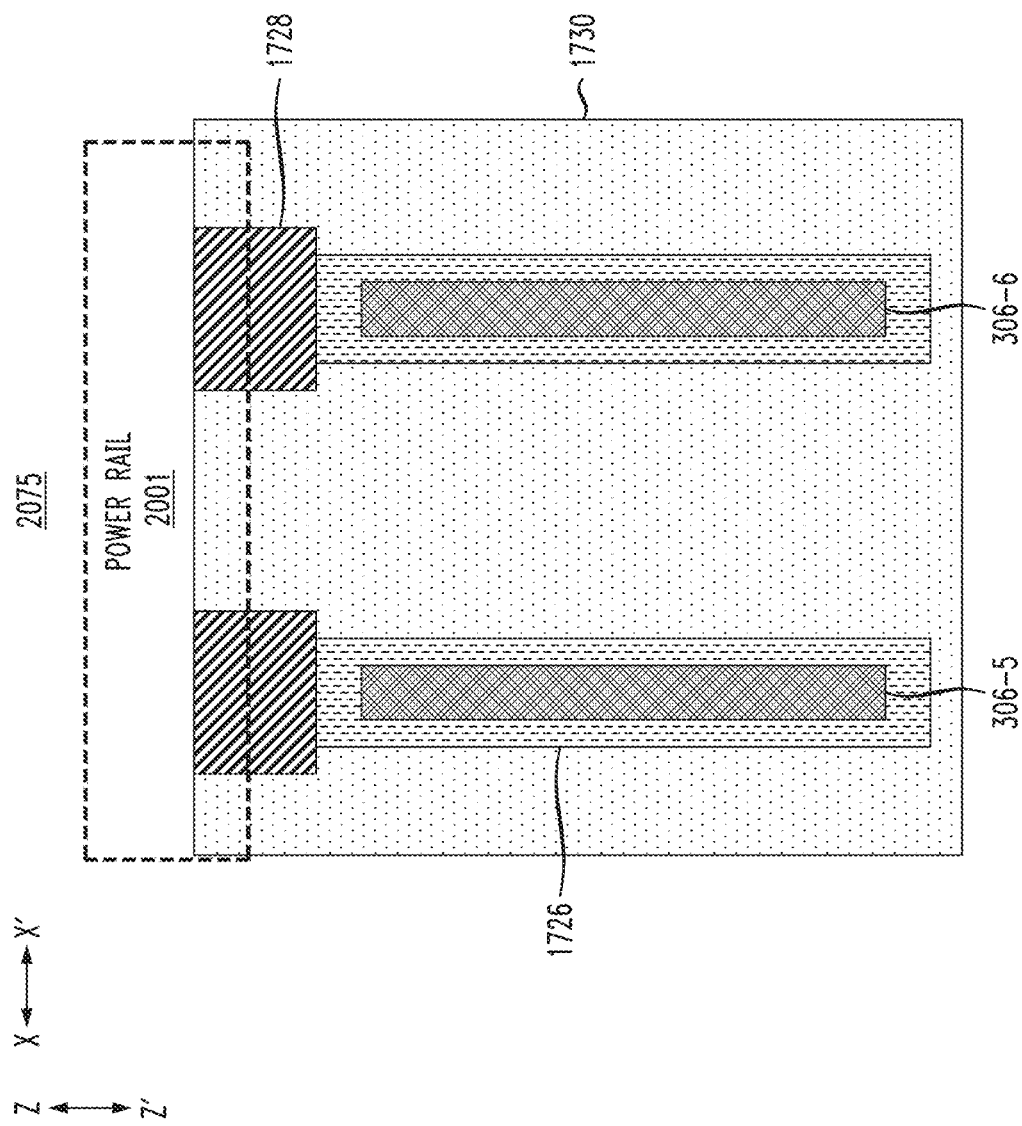
FIG. 20C shows a top cross-sectional view of the structure of FIGS. 20A and 20B for a stacked vertical transport field-effect transistor NAND2 structure, according to an embodiment of the invention.

FIG. 20C shows a top cross-sectional view 2075 illustrating how the sacrificial layer 1728 connects the shared epitaxial layer 1726 to power rail 2001 for the PFETs of the stacked VTFET NAND2 structure of FIGS. 13A-13F. In the stacked VTFET NAND2 structure of FIGS. 13A-13F, the power rail 2001 is the high power rail 1305 connecting to the shared epitaxial layer 1726 which is the shared source regions 1306-3 and 1306-4.

FIG. 20D shows a top cross-sectional view 2085 illustrating how the sacrificial layer 1728 connects the shared epitaxial layer 1726 to power rail 2001 and output 2003 for the PFETs of the stacked VTFET NOR2 structure of FIGS. 15A-15G. In the stacked VTFET NOR2 structure of FIGS. 15A-15G, the power rail 2001 is the high power rail 1505 connecting to the shared epitaxial layer 1726 which is the shared source region 1506-4. The output 2003 is the output 1511 connecting to the shared epitaxial layer 1726 which is the shared drain region 1502-6.

FIG. 21A shows a cross-sectional view 2100 of the FIG. 20A structure following formation of ILD layer 1730, bottom spacer layer 1732, the gate stack for the upper VTFETs including gate dielectric layer 1734 and gate conductor layer 1736, and ILD layer 1738. The ILD layer 1730, bottom spacer layer 1732, gate dielectric layer 1734, gate conductor layer 1736 and ILD layer 1738 may be formed of similar materials and with similar sizing and processing as that described above with respect to ILD layer 330, bottom spacer layer 332, gate dielectric layer 334, gate conductor layer 336 and ILD layer 338.

Figure 21B:
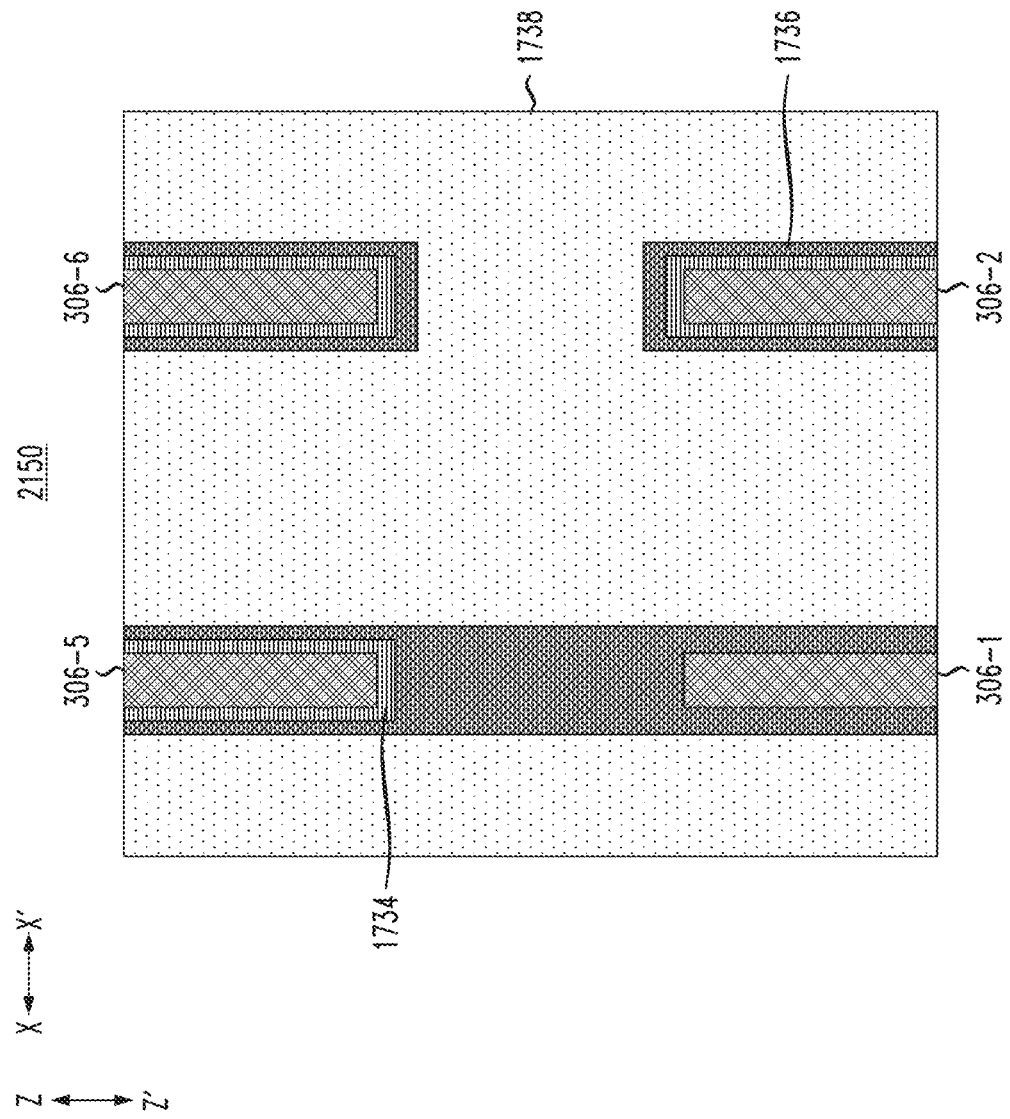
FIG. 21B shows a top cross-sectional view of the FIG. 21A structure, according to an embodiment of the invention.

FIG. 21B shows a top cross-sectional view 2150 taken along the line B-B in the cross-sectional view 2100 of FIG. 21A. The top cross-sectional view 2150 illustrates that gate conductor layer 1736 surrounding upper fin channel 306-1 (for one of the two-channel NFETs) also surrounds the upper fin channel 306-5 (for one of the two-channel PFETs). For a stacked VTFET NAND2 structure, the gate conductor 1736 surrounding the upper fin channels 306-1 and 306-5 connects to the second input 1309-2. For a stacked VTFET NOR2 structure, the gate conductor 1736 surrounding the upper fin channels 306-1 and 306-5 connects to the first input 1509-1.

Figure 22A:
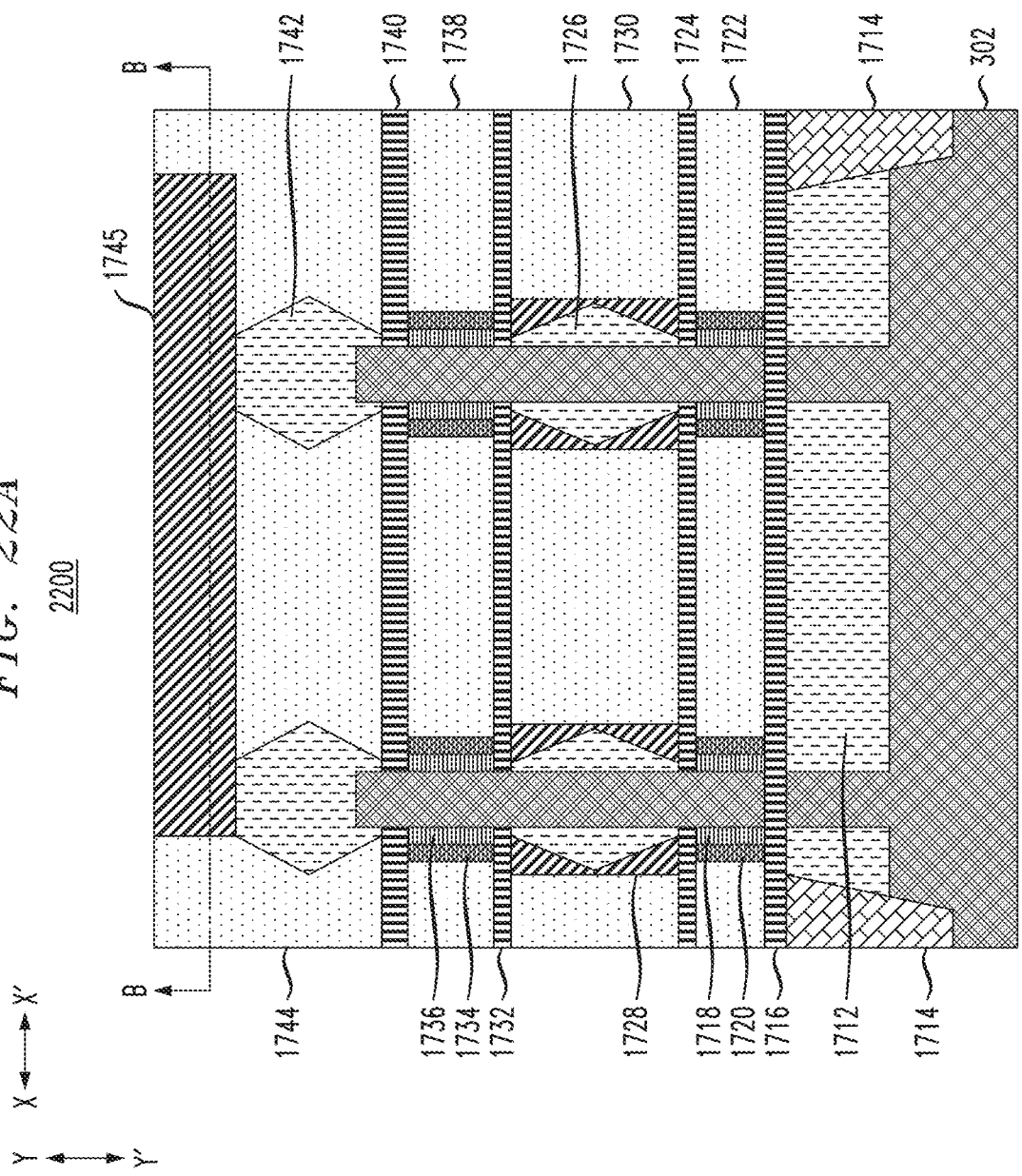
FIG. 22A shows a cross-sectional view of the FIG. 21A structure following formation of a top epitaxial layer, according to an embodiment of the invention.

FIG. 22A shows a cross-sectional view 2200 of the FIG. 21A structure, following formation of a top spacer layer 1740, top epitaxial layers 1742, and ILD layer 1744. The top spacer layer, top epitaxial layers 1742 and ILD layer 1744 may be formed of similar materials and with similar sizing and processing as that described above with respect to top spacer layer 340, top epitaxial layers 342 and ILD layer 344. FIG. 22A also shows formation of a sacrificial layer 1745 that connects the top epitaxial layers 1742. The sacrificial layer 1745 may be formed using similar materials and processing as that described with respect to sacrificial layer 328.

Figure 22B:
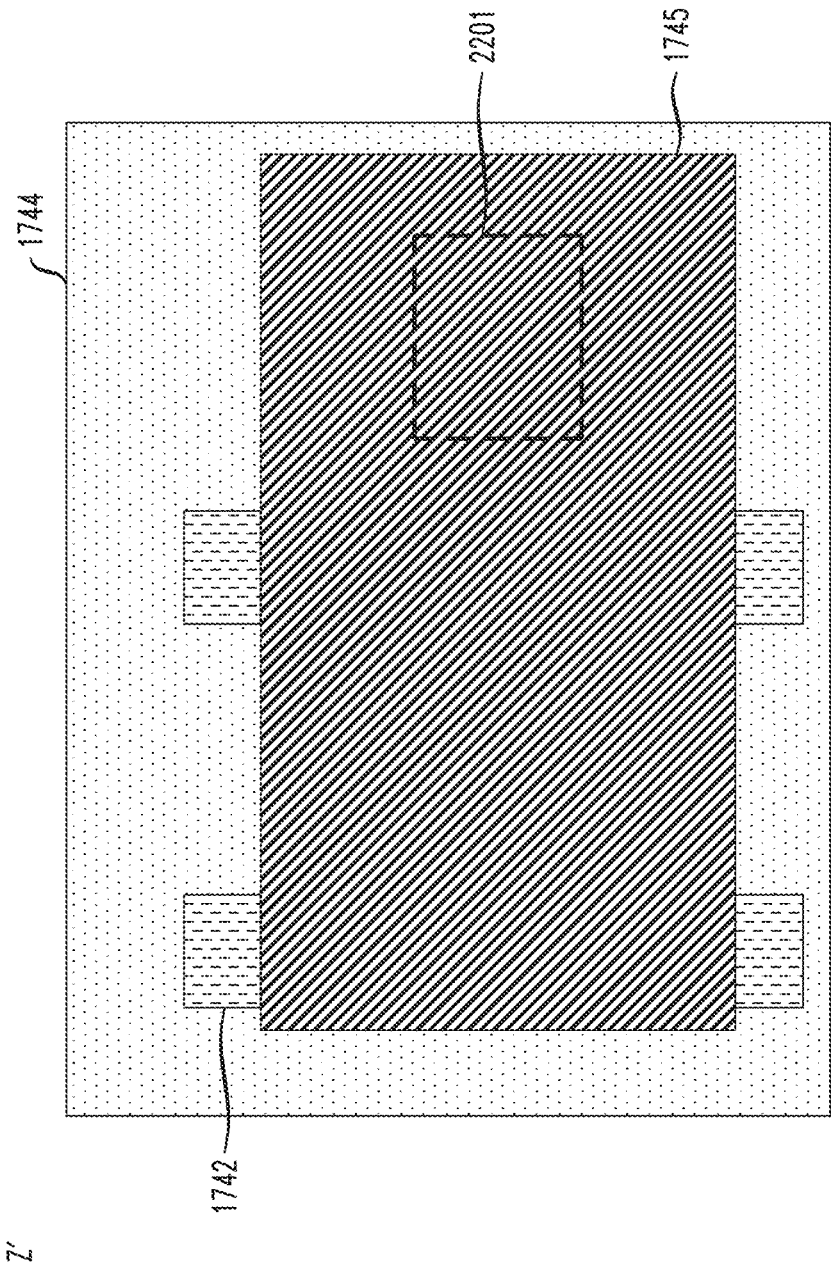
FIG. 22B shows a top cross-sectional view of the FIG. 22A structure, according to an embodiment of the invention.

FIG. 22B shows a top cross-sectional view 2250 taken along the line B-B in the cross-sectional view 2200 of FIG. 22A, illustrating how the sacrificial layer 1745 connects the top epitaxial layers 1742 to a via 2201 down to the bottom epitaxial layer 1712. For the stacked VTFET NAND2 structure, the sacrificial layer 1745 connects the PFET drain region 1302-4 to PFET drain regions 1302-5 and 1302-6 using via 2201, and then to output 1311. For the stacked VTFET NOR2 structure, the sacrificial layer 1745 connects the NFET drain regions 1502-1 to the NFET drain regions 1502-2 and 1502-3 using via 2201, and then to output 1511.

Figure 23A:
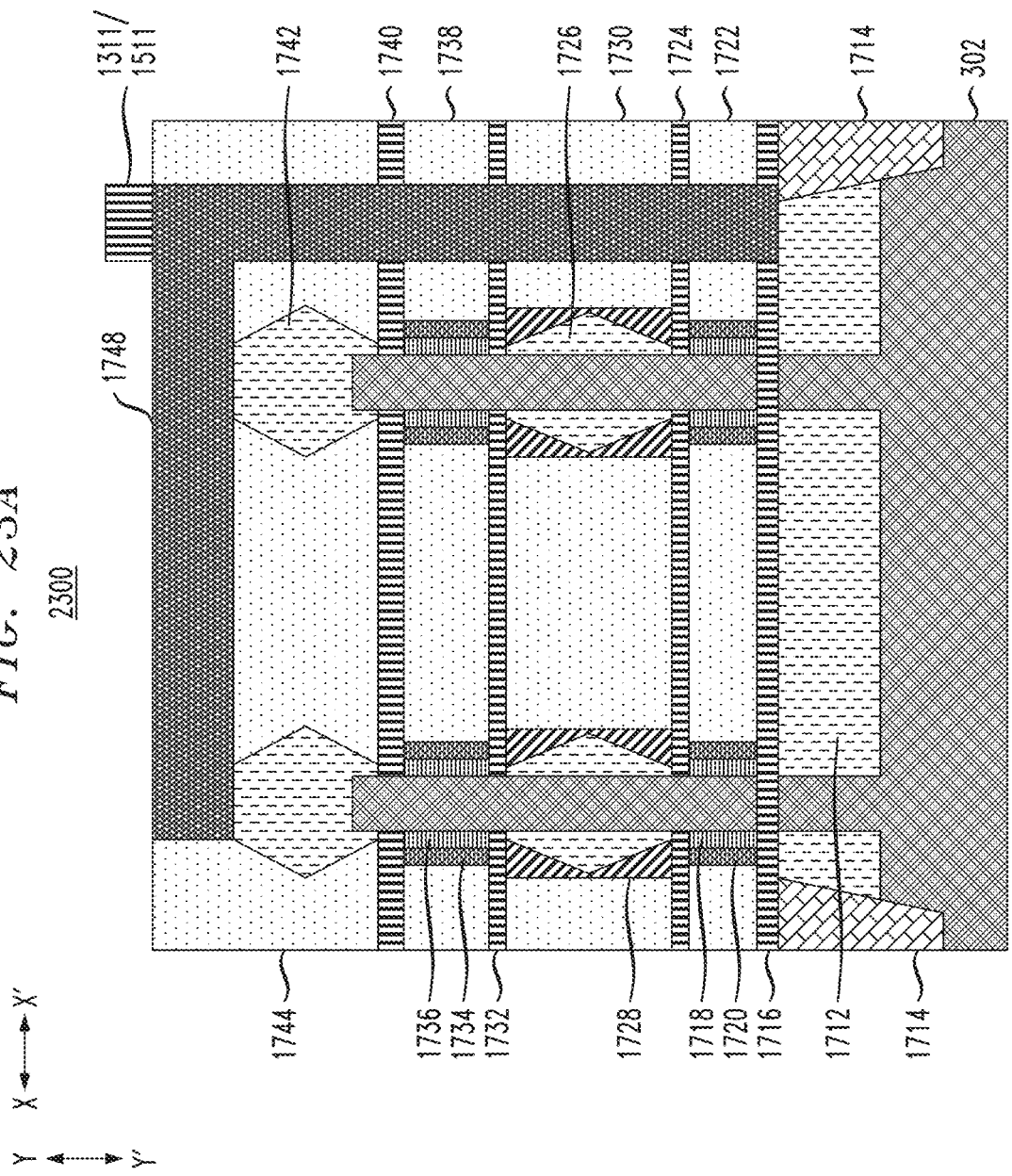
FIG. 23A shows a cross-sectional view of the FIG. 22A structure following formation of contacts, according to an embodiment of the invention.

FIG. 23A shows a cross-sectional view 2300 of the FIG. 22A structure, following replacement of the sacrificial layer 1745 with contact 1748 to output 1311 for the stacked VTFET NAND2 structure or output 1511 for the stacked VTFET NOR2 structure. For the stacked VTFET NAND2 structure, the cross-sectional view 2300 is taken along the line D-D in the top-down view 1300 of FIG. 13A (e.g., across the PFETs 1301). For the stacked VTFET NOR2 structure, the cross-sectional view 2300 is taken along the line F-F in the top-down view 1500 of FIG. 15A (e.g., across the NFETs 1503).

Figure 23B:
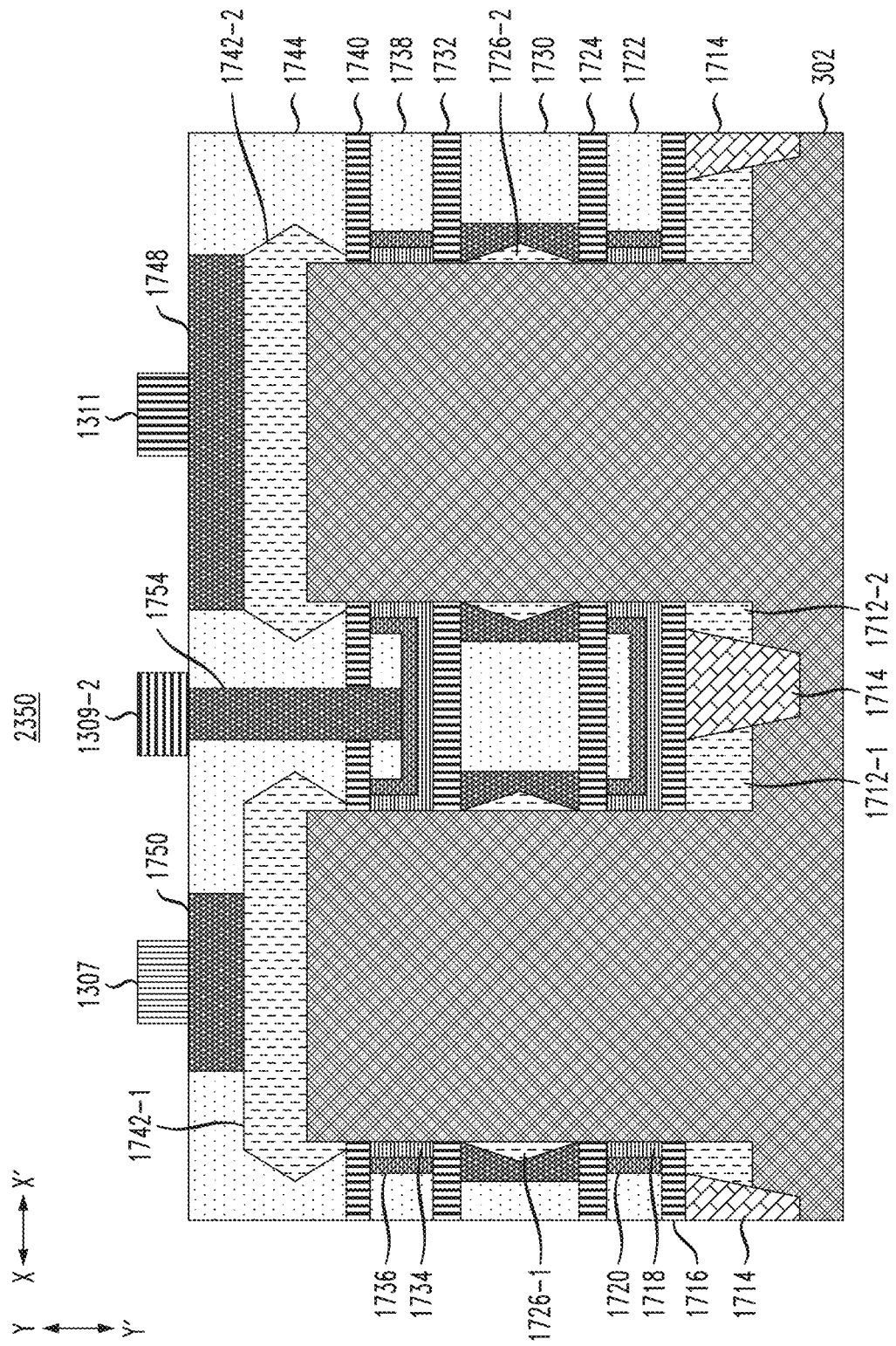
FIG. 23B shows another cross-sectional view of the FIG. 22A structure following formation of contacts for a stacked vertical transport field-effect transistor NAND2 structure, according to an embodiment of the invention.

FIG. 23B shows a cross-sectional view 2350 of the FIG. 23A structure that is taken along the first fin along line C-C in the top-down view 1300 of FIG. 13A for the stacked VTFET NAND2 structure. FIG. 23C shows a cross-sectional view 2375 of the FIG. 23A structure that is taken along the second fin along line E-E in the top down view 1300 of FIG. 13A for the stacked VTFET NAND2 structure.

In the views of FIGS. 23B and 23C, connections to the middle epitaxial layers 1726-1 through 1726-4 are not shown for clarity of illustration. For FIG. 23B, the bottom epitaxial layer 1712-1 is the drain region 1302-2, the shared middle epitaxial layer 1726-1 is the drain region 1302-1/source region 1306-2, the top epitaxial layer 1742-1 is the source region 1306-1, the bottom epitaxial layer 1712-2 is the drain region 1302-3, the shared middle epitaxial layer 1726-2 is the source region 1306-3, and the top epitaxial layer 1742-2 is the drain region 1302-4. For FIG. 23C, the bottom epitaxial layer 1712-3 is the drain region 1302-2, the shared middle epitaxial layer 1726-3 is the drain region 1302-1/source region 1306-2, the top epitaxial layer 1742-1 is the source region 1306-1, the bottom epitaxial layer 1712-2 is the drain region 1302-3, the shared middle epitaxial layer 1726-2 is the source region 1306-4, and the top epitaxial layer 1742-2 is the drain region 1302-5.

Figure 23D:
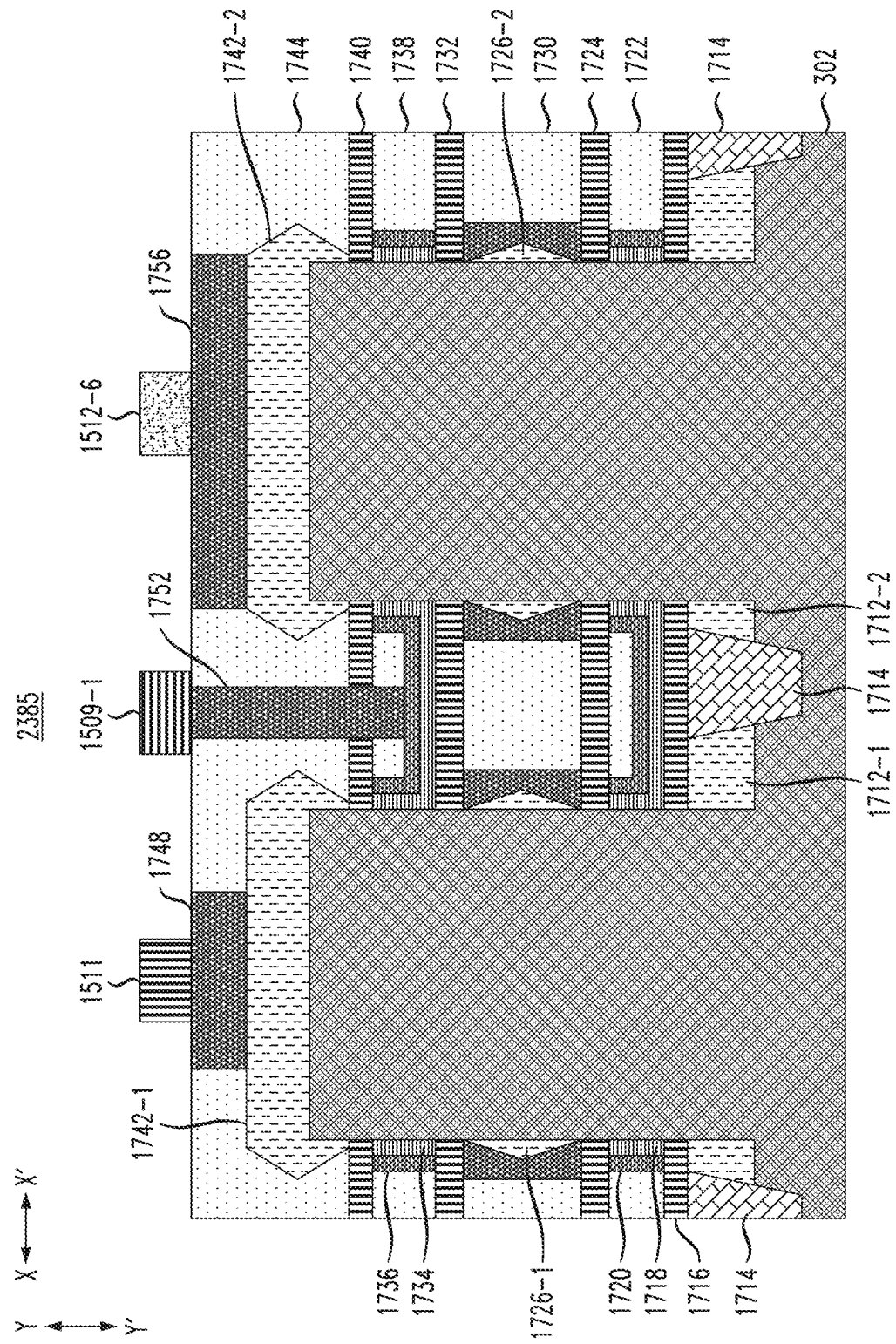
FIG. 23D shows another cross-sectional view of the FIG. 22A structure following formation of contacts for a stacked vertical transport field-effect transistor NOR2 structure, according to an embodiment of the invention.
Figure 23E:
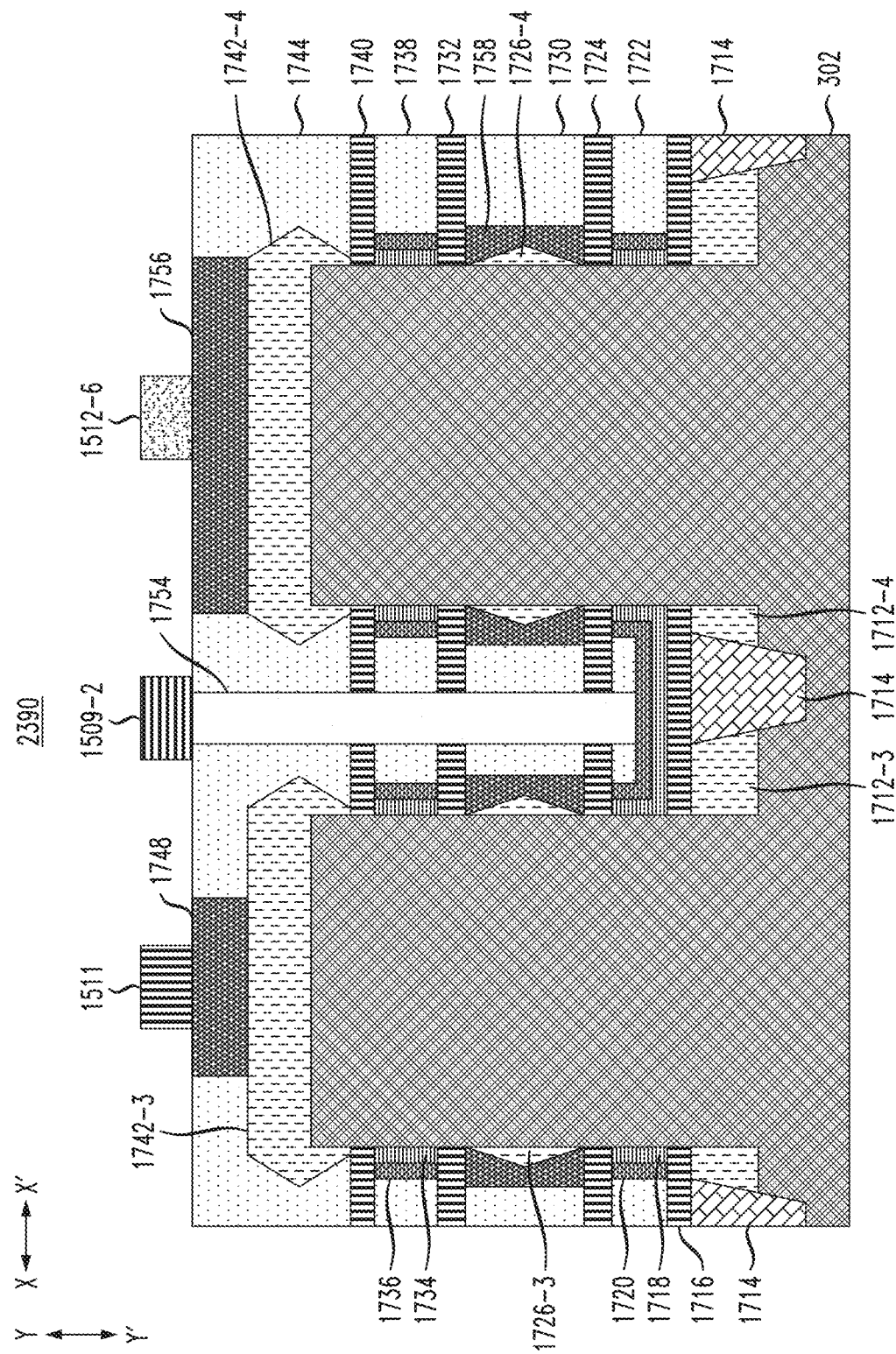
FIG. 23E shows another cross-sectional view of the FIG. 22A structure following formation of contacts for the stacked vertical transport field-effect transistor NOR2 structure, according to an embodiment of the invention.

FIG. 23D shows a cross-sectional view 2385 of the FIG. 23A structure that is taken along the first fin along line C-C in the top-down view 1500 of FIG. 15A for the stacked VTFET NOR2 structure. FIG. 23E shows a cross-sectional view 2390 of the FIG. 23A structure that is taken along the second fin along line E-E in the top down view 1500 of FIG. 15A for the stacked VTFET NOR2 structure. In the views of FIGS. 23D and 23E, connections to the middle epitaxial layers 1726-1 through 1726-4 are not shown for clarity of illustration. For FIG. 23D, the bottom epitaxial layer 1712-1 is the drain region 1502-1, the shared middle epitaxial layer 1726-1 is the source region 1506-1, the top epitaxial layer 1742-1 is the drain region 1502-2, the bottom epitaxial layer 1712-2 is the drain region 1502-4 and source region 1506-3, the shared middle epitaxial layer 1726-2 is the source region 1506-4, and the top epitaxial layer 1742-2 is the drain region 1502-5. For FIG. 23E, the bottom epitaxial layer 1712-3 is the drain region 1502-1, the shared middle epitaxial layer 1526-3 is the source region 1506-2, the top epitaxial layer 1742-3 is the drain region 1502-3, the bottom epitaxial layer 1712-4 is the drain region 1502-4 and the source region 1506-3, the shared middle epitaxial layer 1726-4 is the drain region 1502-6, and the top epitaxial layer 1742-4 is the source region 1506-5.

FIGS. 23A-23E further illustrate contacts 1748, 1750, 1752, 1754 and 1756. Contact 1748 connects to the output 1311 for the stacked VTFET NAND2 structure of FIGS. 13A-13F and output 1511 for the stacked VTFET NOR2 structure of FIGS. 15A-15G. Contact 1750 connects to the lower power rail 1307 for the stacked VTFET NAND2 structure of FIGS. 13A-13F. Contact 1752 connects to the first input 1309-1 of the stacked VTFET NAND2 structure of FIGS. 13A-13F and the first input 1509-1 of the stacked VTFET NOR2 structure of FIGS. 15A-15G. Contact 1754 connects to the second input 1309-2 of the stacked VTFET NAND2 structure of FIGS. 13A-13F and the second input 1509-2 of the stacked VTFET NOR2 structure of FIGS. 15A-15G. Contact 1756 connects the top epitaxial layers of the PFETs 1501 of the VTFET NOR2 structure of FIGS. 15A-15G.

The contacts 1748, 1750, 1752, 1754 and 1756 may be formed of any suitable metal connection, similar to the material of metal connection layer 346 described above. Some of the contacts are at least partially formed in areas where the sacrificial layers 1728 and 1745 were previously formed. The sacrificial layers 1728 and 1745 may be removed using any suitable processing, such as an HF etch.

NAND3 and NOR3 logic gates may also be formed using stacked VTFETs. Stacked VTFET NAND3 and NOR3 structures may include three one-channel NFETs and three one-channel PFETs, or may include three two-channel NFETs and three two-channel PFETs, using shared middle epitaxial layers. For the stacked VTFET NAND3 or NOR3 structure with three one-channel NFETs and three one-channel PFETs, a dummy fin channel is formed on top of an active fin channel. Three-dimensional (3D) parallel connection for pull-down utilizes shared epitaxial layer connections, and the pull-up connections uses shared epitaxial layer and epitaxial interconnects for series connection. For pull-down, some embodiments utilize a "pearl-chain" concept where drain regions of the PFETs are in parallel and their connections merge to form a series connection at a source of one of the NFETs, and is then split again for parallel fin connection and merges back again. A dummy fin area is used to form super via connections between the NFETs and PFETs.

Figure 24A:
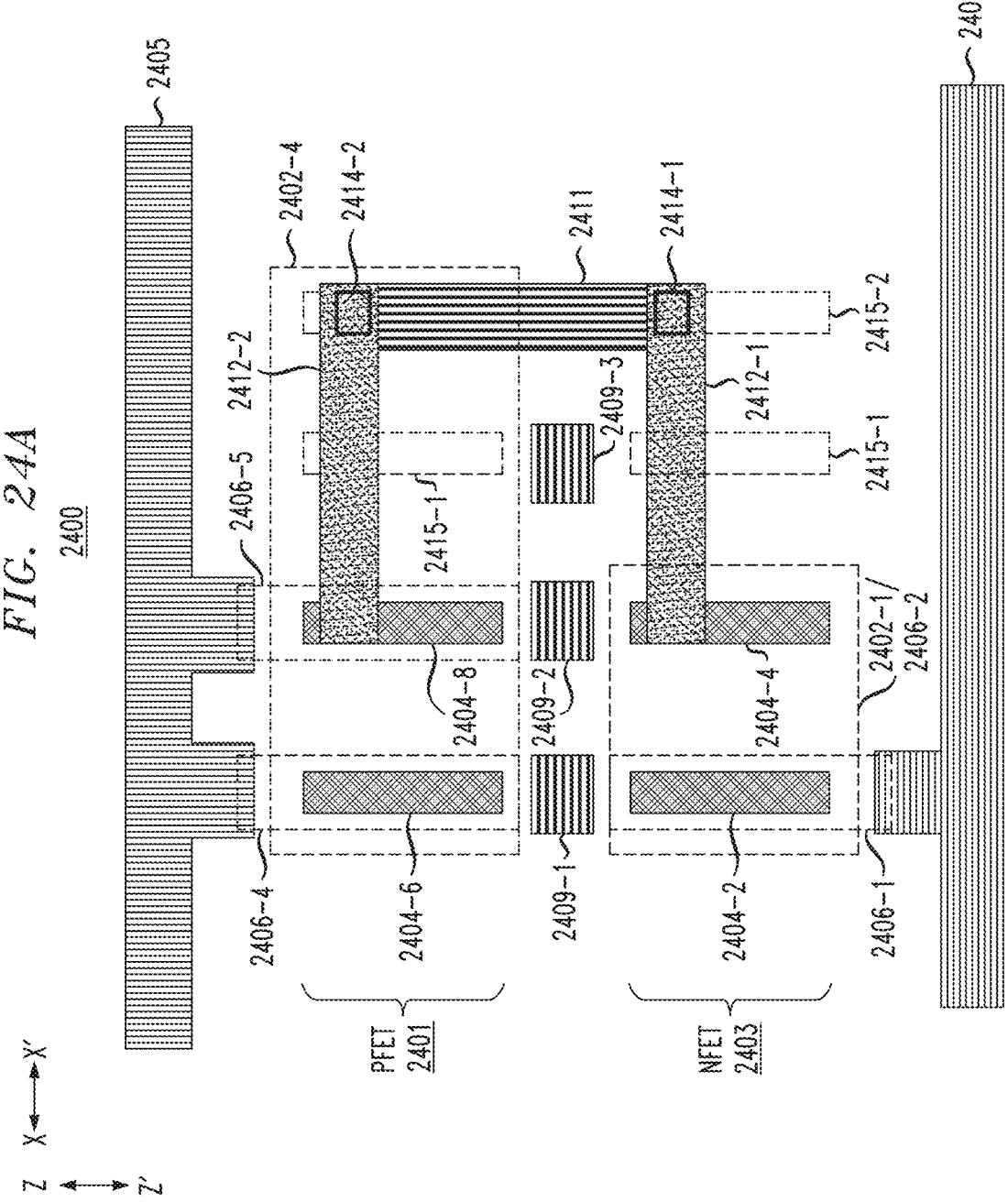
FIG. 24A shows a top-down view of a stacked vertical transport field-effect transistor NAND3 structure using three one-channel n-type field-effect transistors and three one-channel p-type field-effect transistors, according to an embodiment of the invention
Figure 24B:
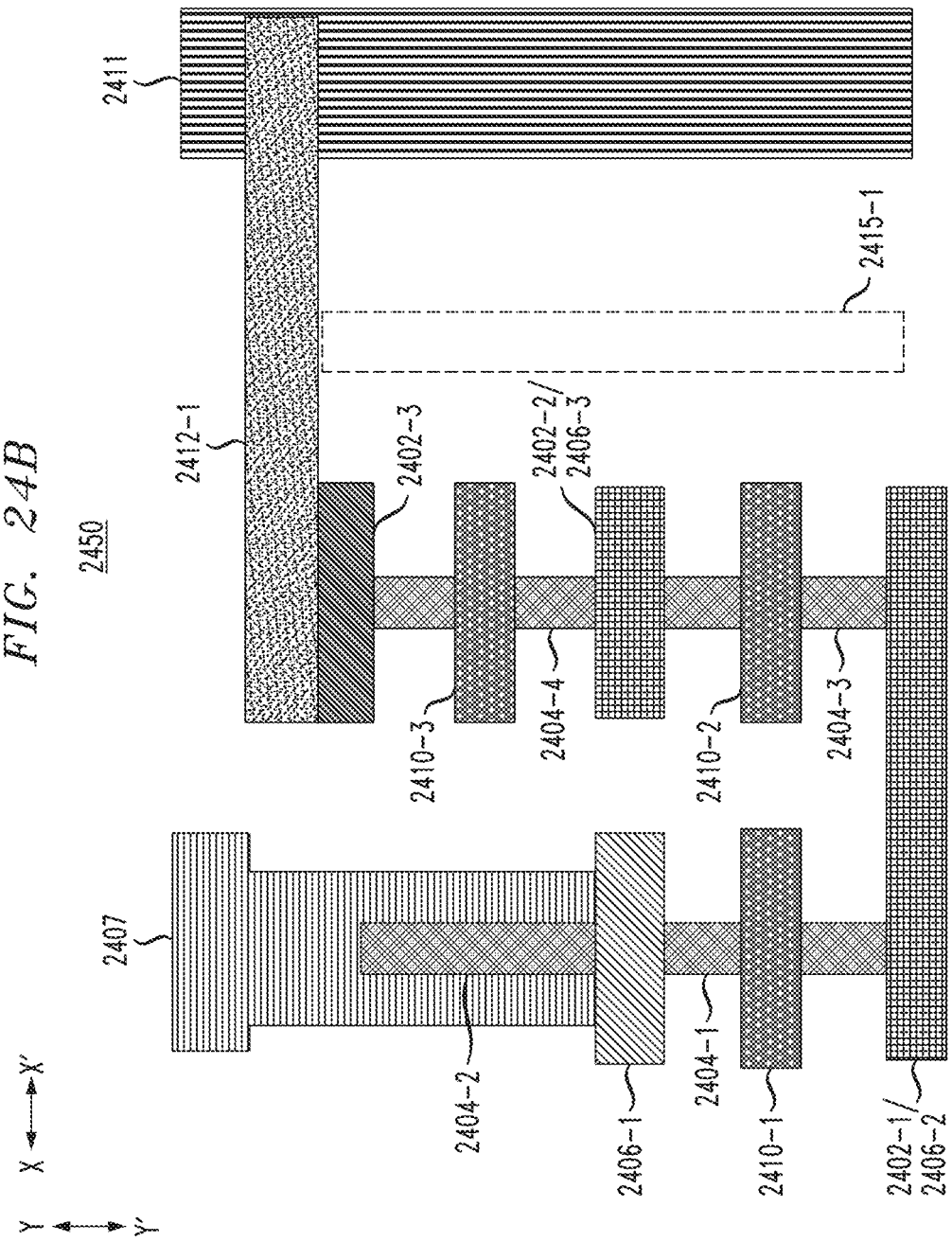
FIG. 24B shows a cross-sectional view of the FIG. 24A stacked vertical transport field-effect transistor NAND3 structure, according to an embodiment of the invention.

FIG. 24A shows a top-down view 2400 of stacked VTFET NAND3 structure using three one-channel PFETs 2401 and three one-channel NFETs 2403. FIG. 24B shows a cross-sectional view 2450 taken across the fins for the NFETs 2403, and FIG. 24C shows a cross-sectional view 2475 taken across the fins for the PFETs 2401.

Figure 24C:
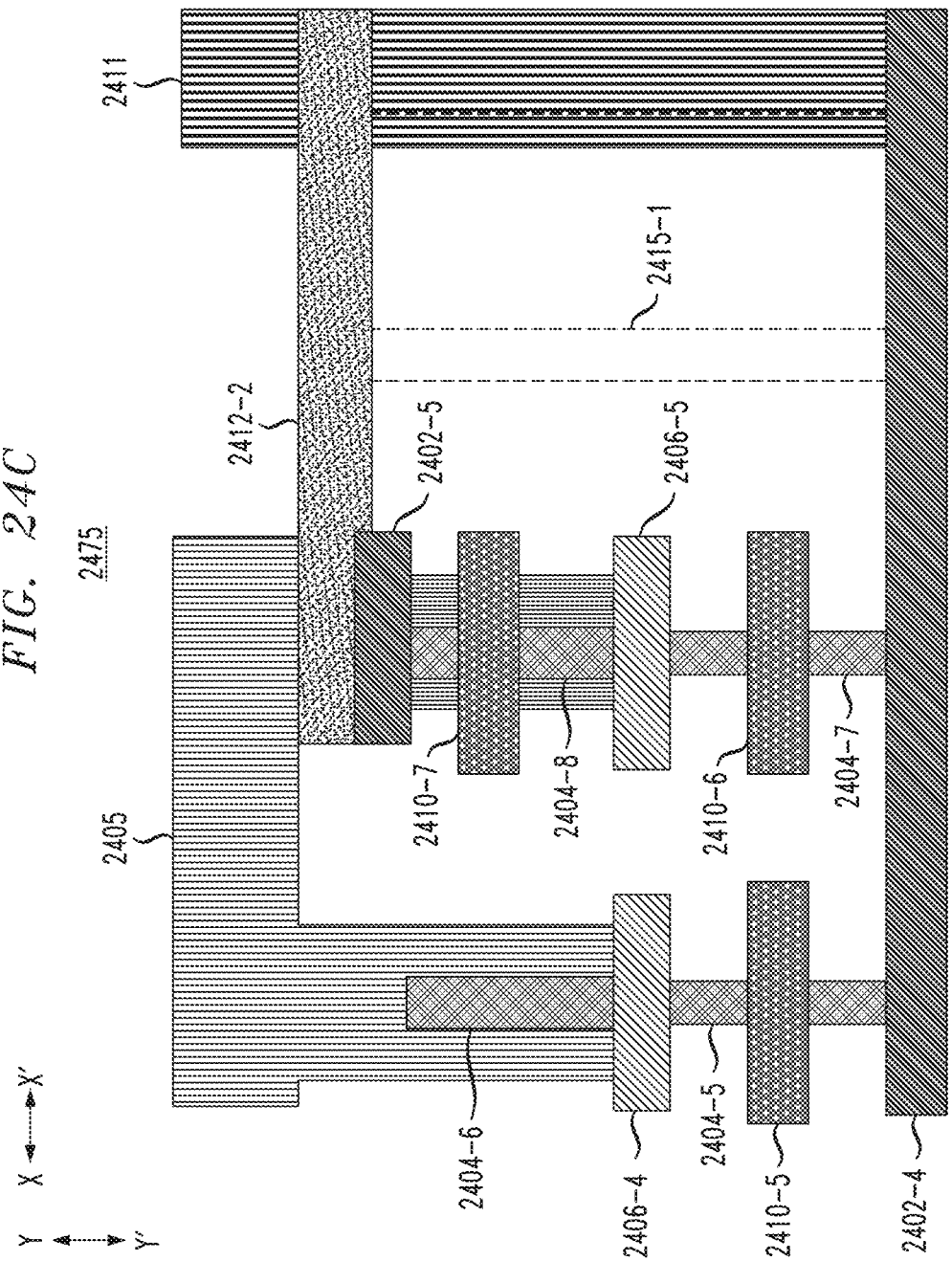
FIG. 24C shows another cross-sectional view of the FIG. 24A stacked vertical transport field-effect transistor NAND3 structure, according to an embodiment of the invention.

The stacked VTFET NAND3 structure of FIGS. 24A-24C includes fin channels 2404-1 through 2404-8. Fin channel 2404-1 provides an NFET fin channel for a first one of the NFETs 2403, fin channel 2404-2 is a dummy fin that may be removed, fin channel 2404-3 provides an NFET fin channel for a second one of the NFETs 2403, and fin channel 2404-4 provides an NFET fin channel for a third one of the NFETs 2403. The NFET fin channels 2404-3 and 2404-4 are stacked as illustrated. Fin channel 2404-5 provides a PFET fin channel for a first one of the PFETs 2401, fin channel 2404-6 is a dummy fin that may be removed, fin channel 2404-7 provides a PFET fin channel for a second one of the PFETs 2401, and fin channel 2404-8 provides a PFET fin channel for a third one of the PFETs 2401. The PFET fin channels 2404-7 and 2404-8 are stacked as illustrated. Dummy fins 2415-1 and 2415-2 are also formed.

Epitaxial layers providing source and drain regions for the PFETs 2401 and NFETs 2403 will now be described. A middle epitaxial layer for a first fin provides a source region 2406-1 for the first one of the NFETs 2403, a bottom epitaxial layer provides a drain region 2402-1 for the first one of the NFETs 2403 and a drain region 2406-2 for the second one of the NFETs 2403, a middle epitaxial layer for a second fin provides a drain region 2402-2 for the second one of the NFETs 2403 and a source region 2406-3 for the third one of the NFETs 2403, and a top epitaxial layer for the second fin provides a drain region 2402-3 for the third one of the NFETs 2403. Another middle epitaxial layer for the first fin provides a source region 2406-6 for the first one of the PFETs 2401, another bottom epitaxial layer provides a drain region 2402-2 for the first and second ones of the PFETs 2401, another middle epitaxial layer for the second fin provides a source region 2406-5 for the second and third ones of the PFETs 2401, and another top epitaxial layer for the second fin provides a drain region 2402-5 for the third one of the PFETs 2401. Gate stacks 2410-1 through 2410-6 are formed for the fin channels 2404-1, 2404-3, 2404-4, 2404-5, 2404-7 and 2404-8, respectively. The NFETs 2403 connect in series, while the PFETs 2401 connect in parallel.

Contacts for the stacked VTFET NAND3 structure of FIGS. 24A-24C will now be described. Contact 2412-1 connects the drain region 2402-3 for the third one of the NFETs 2403 to the output 2411, and contact 2412-2 connects the drain regions 2402-4 and 2402-5 for the PFETs 2401 to the output 2411. The high power rail 2405 connects to the source regions 2406-4 and 2406-5 for the PFETs 2401. The low power rail 2507 connects to the source region 2406-1 for the first one of the NFETs 2403. Input 2409-1 connects to the gate stack 2410-1 for the first one of the NFETs 2403 and the gate stack 2410-4 for the first one of the PFETs 2401, input 2409-2 connects to the gate stack 2410-2 for the second one of the NFETs 2403 and the gate stack 2410-5 for the second one of the PFETs 2401, and input 2409-3 connects to the gate stack 2410-3 for the third one of the NFETs 2403 and the gate stack 2410-6 for the third one of the PFETs 2401. The input 2409-3 may be connected in an area of the dummy fin 2415-1. Vias 2414-1 and 2414-2 connect contacts 2412-1 and 2412-2 to the output 2411.

Figure 24D:
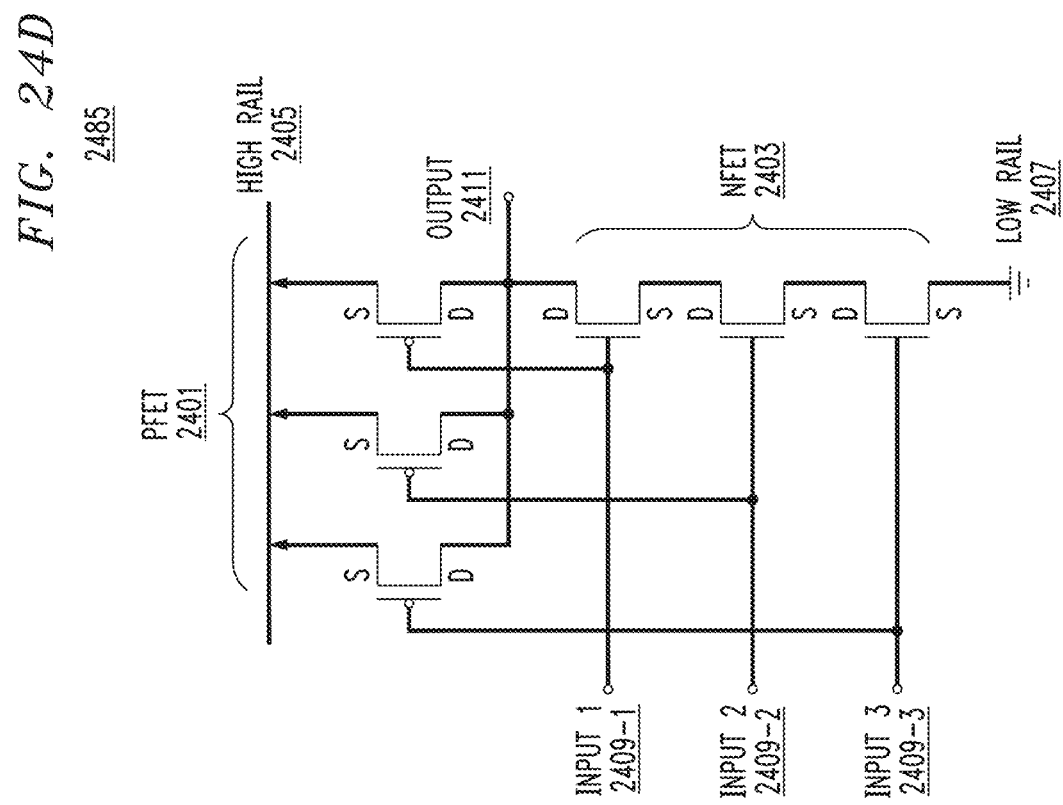
FIG. 24D shows a circuit diagram and logic table for a NAND3 logic gate, according to an embodiment of the invention.

FIG. 24D shows a circuit diagram 2485 for a NAND3 logic gate, along with a logic table 2490 for the NAND3 logic gate. As illustrated in the circuit diagram 2485, the PFETs 2401 are connected in parallel, with their sources connected to the high power rail 2405 and their drains connected to the output 2411. The NFETs 2403 are connected in series, with a first one of the NFETs 2403 having its source connected to ground or the low power rail 2407 and its drain connected to the source of a second one of the NFETs 2403. The drain of the second one of the NFETs 2403 is connected to a source of a third one of the NFETs 2403, and a drain of the third one of the NFETs 2403 is connected to the output 2411. Gates of the PFETs 2401 and NFETs 2403 are connected to the first, second and third inputs 2409-1, 2409-2 and 2409-3. When inputs 2409-1, 2409-2 and 2409-3 are all high or 1, then all of the NFETs 2403 are turned on and the output 2411 is 0 (e.g., it is pulled to the low power rail 2407). If at least one of the inputs 2409-1, 2409-2 and 2409-3 is low or 0, then at least one of the NFETs 2403 is off and the output 2411 will not be pulled to the low power rail 2407. Instead, with at least one of the inputs 2409-1, 2409-2 and 2409-3 being low, at least one of the PFETs 2401 will be on and the output 2411 is 1 (e.g., it is pulled to the high power rail 2405).

FIG. 25 shows a top-down view 2500 of a non-stacked VTFET NAND3 structure formed using three one-channel PFETs 2501 and three one-channel NFETs 2503. The non-stacked VTFET NAND3 structure of FIG. 25 includes NFET fin channels 2504-1, 2504-2 and 2504-3, and PFET fin channels 2504-4, 2504-5 and 2504-6. A bottom epitaxial layer provides a source region 2506-1 for a first one of the NFETs 2503, which connects to the low power rail 2507. A top epitaxial layer connects the NFET fin channels 2504-1 and 2504-2, providing a drain region 2502-1 for the NFET fin channel 2504-1 and a source region 2506-2 for the NFET fin channel 2504-2. A bottom epitaxial layer connect the NFET fin channels 2504-2 and 2504-3, providing a drain region 2502-2 for the NFET fin channel 2504-2 and a source region 2506-3 for the NFET fin channel 2504-3. A top epitaxial layer for the NFET fin channel 2504-3 provides a drain region 2502-3 that connects to the output 2511. A bottom epitaxial layer provides a drain region 2506-4 for the PFETs 2501 that connects to the high power rail 2505. Top epitaxial layers for the PFET fin channels 2504-4, 2504-5 and 2504-6 provide drain regions 2502-4 that connect to the output 2511. Input 2509-1 connects to gate stacks of the NFET fin channel 2504-1 and the PFET fin channel 2504-4, input 2509-2 connects to gate stacks of the NFET fin channel 2504-2 and the PFET fin channel 2504-5, and input 2509-3 connects to gate stacks of the NFET fin channel 2504-3 and the PFET fin channel 2504-6.

The stacked VTFET NAND3 structure shown in FIGS. 24A-24C has an "X" direction length of 3CPP and a "Y" direction height of 191 nm, with an area scaling of 1. The non-stacked VTFET NAND3 structure shown in FIG. 25 also has an "X" direction length of 3CPP and a "Y" direction height of 191 nm, with an area scaling of 1.

Figure 26A:
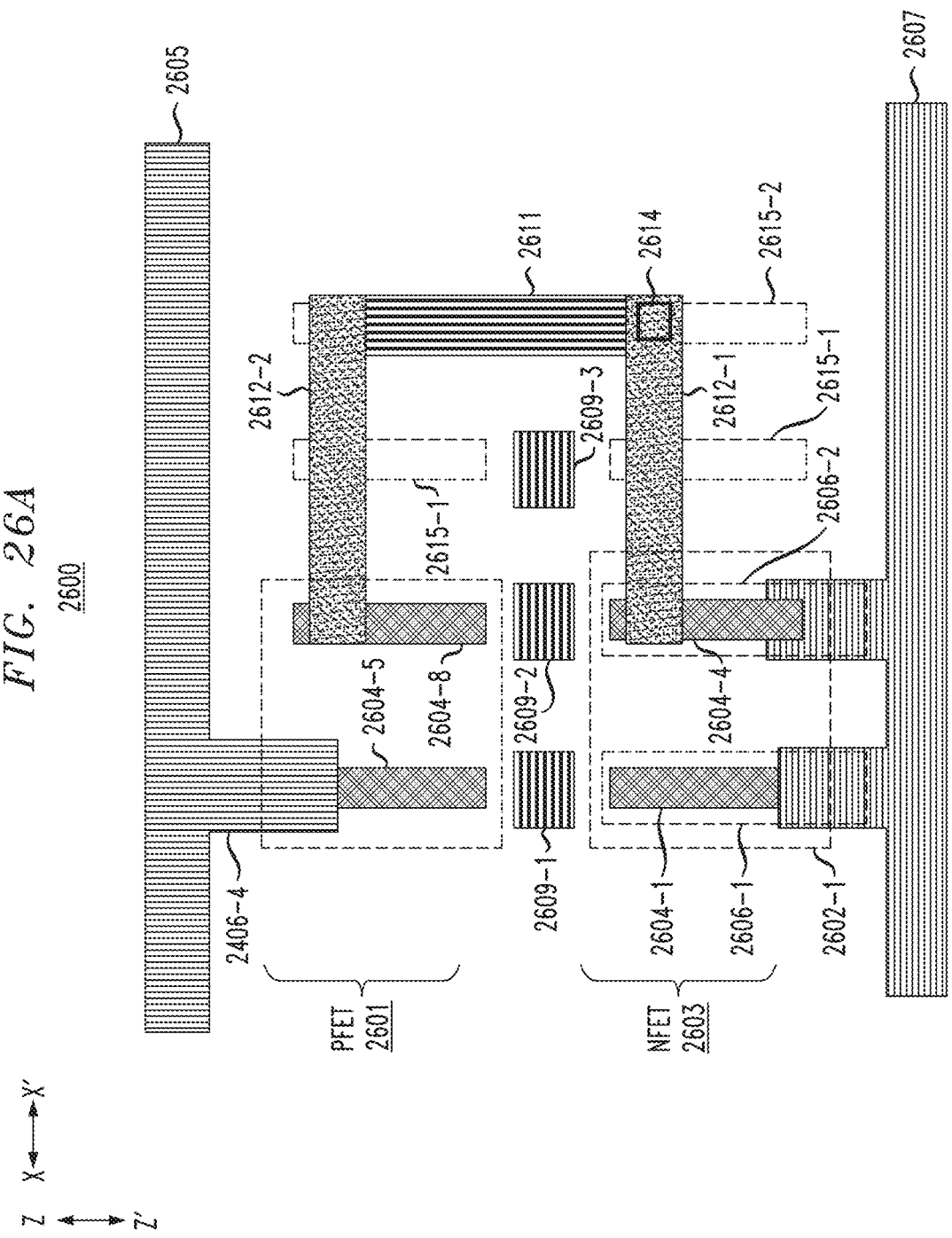
FIG. 26A shows a top-down view of a stacked vertical transport field-effect transistor NOR3 structure using three one-channel n-type field-effect transistors and three one-channel p-type field-effect transistors, according to an embodiment of the invention
Figure 26B:
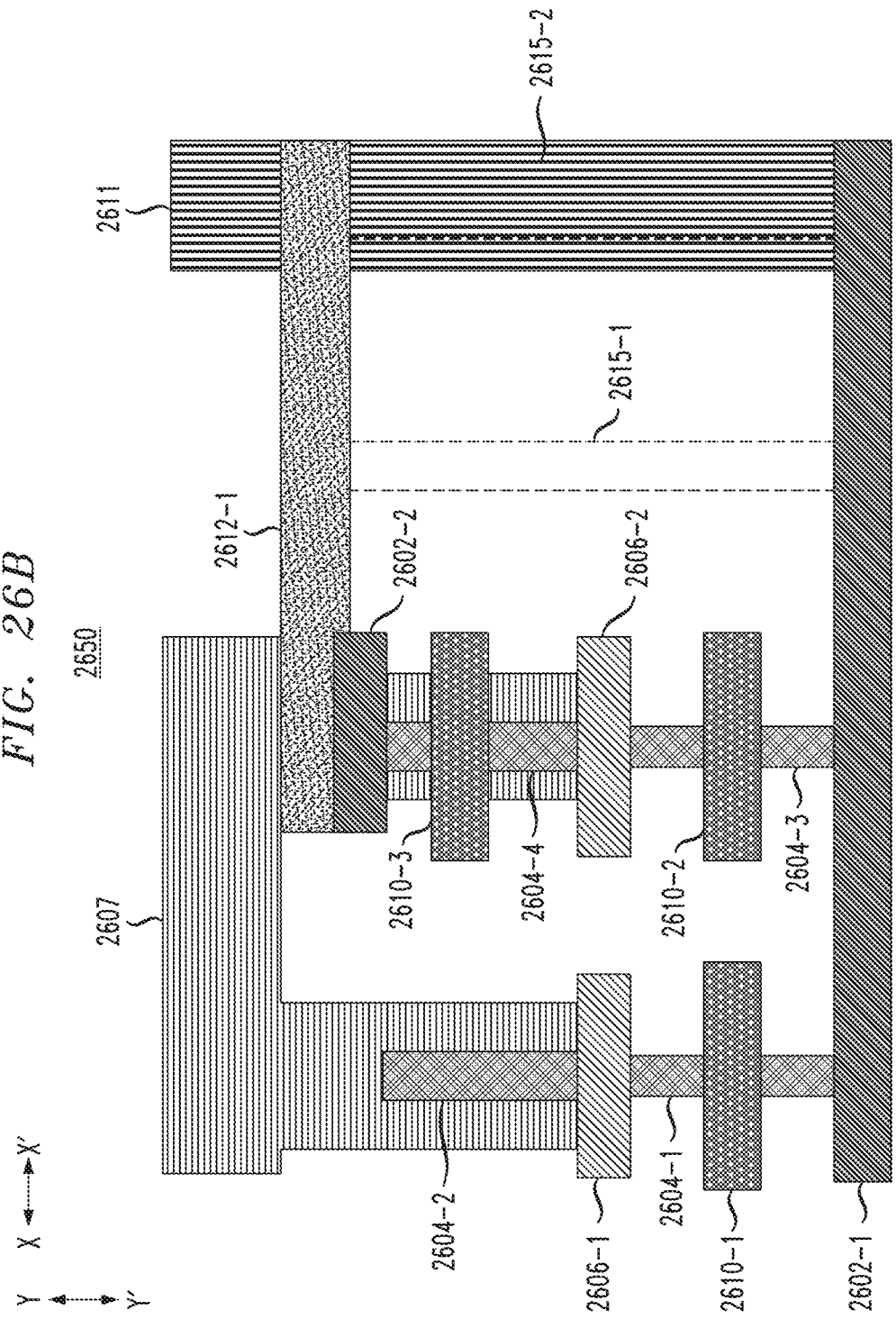
FIG. 26B shows a cross-sectional view of the FIG. 26A stacked vertical transport field-effect transistor NOR3 structure, according to an embodiment of the invention.

FIG. 26A shows a top-down view 2600 of stacked VTFET NOR3 structure using three one-channel PFETs 2601 and three one-channel NFETs 2603. FIG. 26B shows a cross-sectional view 2650 taken across the fins for the NFETs 2603, and FIG. 26C shows a cross-sectional view 2675 taken across the fins for the PFETs 2601.

Figure 26C:
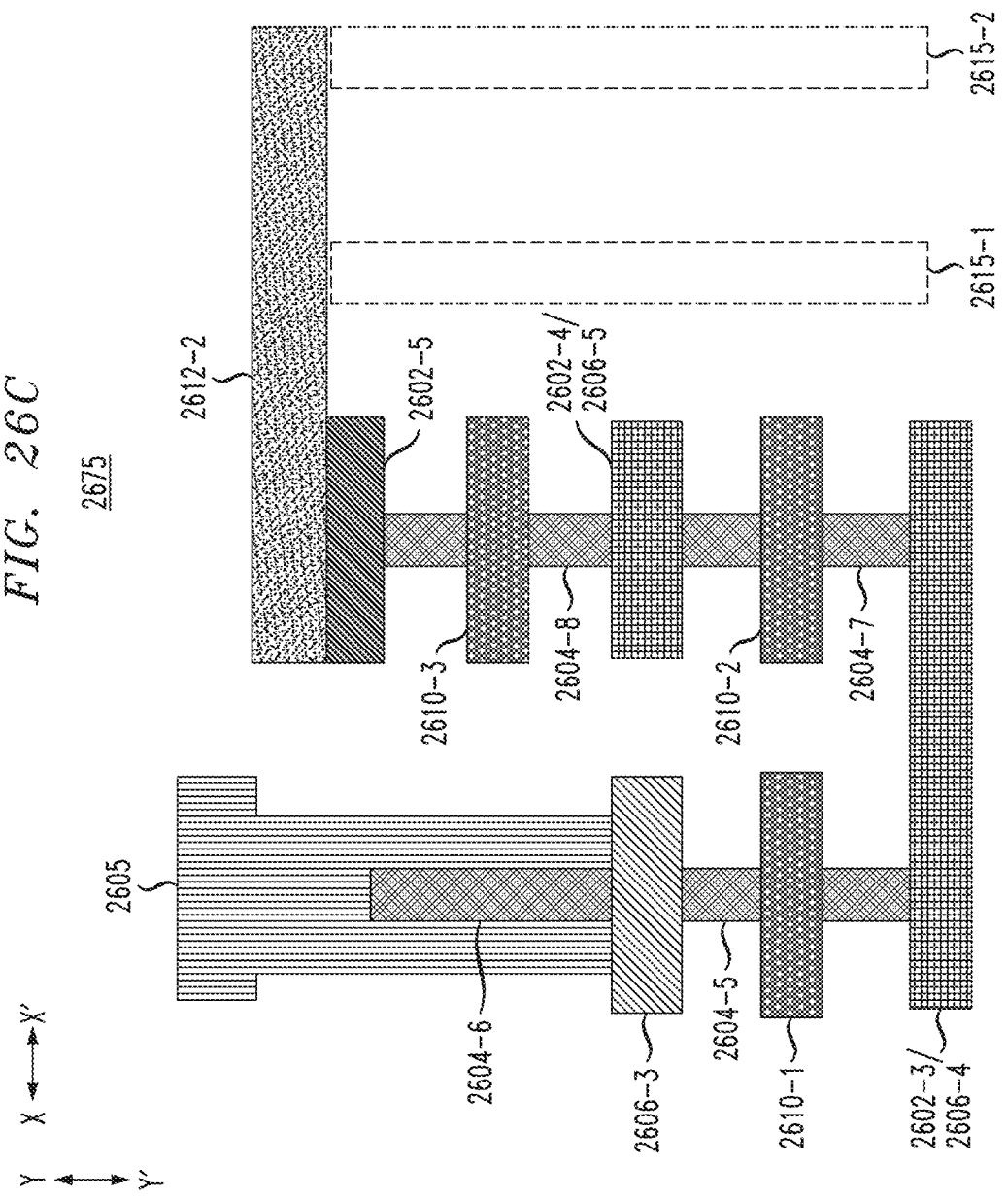
FIG. 26C shows another cross-sectional view of the FIG. 26A stacked vertical transport field-effect transistor NOR3 structure, according to an embodiment of the invention.

The stacked VTFET NOR3 structure of FIGS. 26A-26C includes fin channels 2604-1 through 2604-8. Fin channel 2604-1 provides an NFET fin channel for a first one of the NFETs 2603, fin channel 2604-2 is a dummy fin that may be removed, fin channel 2604-3 provides an NFET fin channel for a second one of the NFETs 2603, and fin channel 2604-4 provides an NFET fin channel for a third one of the NFETS 2603. The NFET fin channels 2604-3 and 2604-4 are stacked as illustrated. Fin channel 2604-5 provides a PFET fin channel for a first one of the PFETs 2601, fin channel 2604-6 is a dummy fin that may be removed, fin channel 2604-7 provides a PFET fin channel for a second one of the PFETs 2601, and fin channel 2604-8 provides a PFET fin channel for a third one of the PFETs 2601. The PFET fin channels 2604-7 and 2604-8 are stacked as illustrated. Dummy fins 2615-1 and 2615-2 are also formed.

Epitaxial layers providing source and drain regions for the PFETs 2601 and NFETs 2603 will now be described. A middle epitaxial layer for the first fin provides a source region 2606-1 for the first one of the NFETs 2603, a bottom epitaxial layer provides a drain region 2602-1 for the first and second ones of the NFETs 2603, a middle epitaxial layer for the second fin provides a source region 2606-2 for the second and third ones of the NFETs 2603, and a top epitaxial layer for the second fin provides a drain region 2602-2 for the third one of the NFETs 2603. Another middle epitaxial layer for the first fin provides a source region 2606-3 for the first one of the PFETs 2601, another bottom epitaxial layer provides a drain region 2602-3 for the first one of the PFETs 2601 and a source region 2606-4 for the second one of the PFETs 2601, a middle epitaxial layer for the second fin provides a drain region 2602-4 for the second one of the PFETs 2601 and a source region 2606-5 for the third one of the PFETs 2601, and a top epitaxial layer for the second fin provides a drain region 2602-5 for the third one of the PFETs 2601. Gate stacks 2610-1 through 2610-6 are formed for the fin channels 2604-1, 2604-3, 2604-4, 2604-5, 2604-7 and 2604-8, respectively. The PFETs 2601 connect in series, and the NFETs 2603 connect in parallel.

Contacts for the stacked VTFET NOR3 structure of FIGS. 26A-26C will now be described. Contact 2612-1 connects the drain region 2602-2 for the third one of the NFETs 2603 to the output 2611, and contact 2612-2 connects the drain regions 2602-5 for the third one of the PFETs 2601 to the output 2611. The high power rail 2605 connects to the source region 2606-3 for the first one of the PFETs 2601. The low power rail 2607 connects to the source regions 2606-1 and 2606-2 for the NFETs 2603. Input 2609-1 connects to the gate stack 2610-1 for the first one of the NFETs 2603 and the gate stack 2610-4 for the first one of the PFETs 2601, input 2609-2 connects to the gate stack 2610-2 for the second one of the NFETs 2603 and the gate stack 2610-5 for the second one of the PFETs 2601, and input 2609-3 connects to the gate stack 2610-3 for the third one of the NFETs 2603 and the gate stack 2610-6 for the third one of the PFETs 2601. The input 2609-3 may be connected in an area of the dummy fin 2615-1. Via 2614 connects contacts 2612-1 to the output 2611.

Figure 26D:
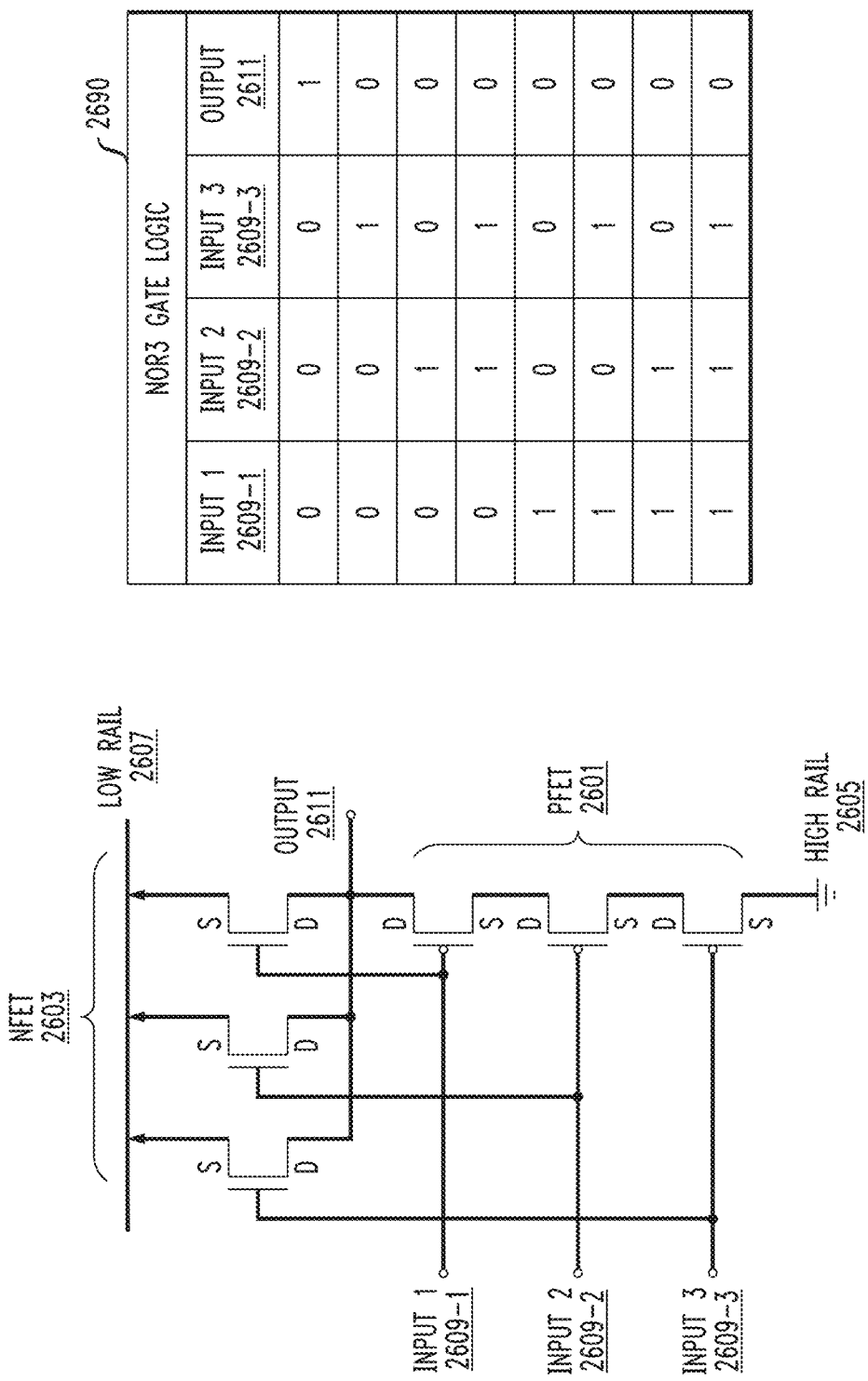
FIG. 26D shows a circuit diagram and logic table for a NOR3 logic gate, according to an embodiment of the invention.

FIG. 26D shows a circuit diagram 2685 for a NOR3 logic gate, along with a logic table 2690 for the NOR3 logic gate. As illustrated in the circuit diagram 2685, the NFETs 2603 are connected in parallel, with their sources connected to the low power rail 2607 and their drains connected to the output 2611. The PFETs 2601 are connected in series, with a first one of the PFETs 2601 having its source connected to high power rail 2605 and its drain connected to the source of a second one of the PFETs 2601. The drain of the second one of the PFETs 2601 is connected to a source of a third one of the PFETs 2601, and a drain of the third one of the PFETs 2601 is connected to the output 2611. Gates of the PFETs 2601 and NFETs 2603 are connected to the first, second and third inputs 2609-1, 2609-2 and 2609-3. When inputs 2609-1, 2609-2 and 2609-3 are all low or 0, then all of the PFETs 2601 are turned on and the output 2611 is 1 (e.g., it is pulled to the high power rail 2605). If at least one of the inputs 2609-1, 2609-2 and 2609-3 is high or 1, then at least one of the PFETs 2601 is off and the output 2611 will not be pulled to the high power rail 2605. Instead, with at least one of the inputs 2609-1, 2609-2 and 2609-3 being high, at least one of the NFETs 2603 will be on and the output 2611 is 0 (e.g., it is pulled to the low power rail 2607).

FIG. 27 shows a top-down view 2700 of a non-stacked VTFET NOR3 structure formed using three one-channel PFETs 2701 and three one-channel NFETs 2703. The non-stacked VTFET NOR3 structure of FIG. 27 includes NFET fin channels 2704-1, 2704-2 and 2704-3, and PFET fin channels 2704-4, 2704-5 and 2704-6. A bottom epitaxial layer provides a source region 2706-1 for the NFETs 2703, which connects to the low power rail 2707. A top epitaxial layer connects the NFET fin channels 2504-1, 2504-2 2504-3 to a drain region that contacts 2712-1 output 2711. A bottom epitaxial layer provides a source region for PFET fin channel 2704-4 that connects to high power rail 2705. A top epitaxial layer for PFET fin channel 2704-4 connects to a top epitaxial layer for PFET fin channel 2704-5 and provides drain regions. A bottom epitaxial layer for PFET fin channel 2705-5 and 2704-6 provides source regions, and a top epitaxial layer for PFET fin channel 2704-6 provides a drain region that connects to output 2711 through contact 2712-2. Input 2709-1 connects to gate stacks of the NFET fin channel 2704-1 and the PFET fin channel 2704-4, input 2709-2 connects to gate stacks of the NFET fin channel 2704-2 and the PFET fin channel 2704-5, and input 2709-3 connects to gate stacks of the NFET fin channel 2704-3 and the PFET fin channel 2704-6.

The stacked VTFET NOR3 structure shown in FIGS. 26A-26C has an "X" direction length of 3CPP and a "Y" direction height of 191 nm, with an area scaling of 1. The non-stacked VTFET NOR3 structure shown in FIG. 27 also has an "X" direction length of 3CPP and a "Y" direction height of 191 nm, with an area scaling of 1.

Processes for forming the stacked VTFET NAND3 structure of FIGS. 24A-24C and the stacked VTFET NOR3 structure of FIGS. 26A-26C will now be described with respect to FIGS. 28-34.

FIG. 28 shows a top-down view 2800, illustrating a substrate 2802 on which a set of fins are formed using a patterned hard mask layer 2804. The fin formation may utilize SADP or other suitable processing. The substrate 2802 and hard mask layer 2804 may be formed of similar materials and with similar sizing and processing as that described above with respect to substrate 302 and hard mask layer 304. FIG. 28 shows eight fins that are formed, though some of the fins are "dummy" fins that will be removed using a fin cut process.

Figure 29:
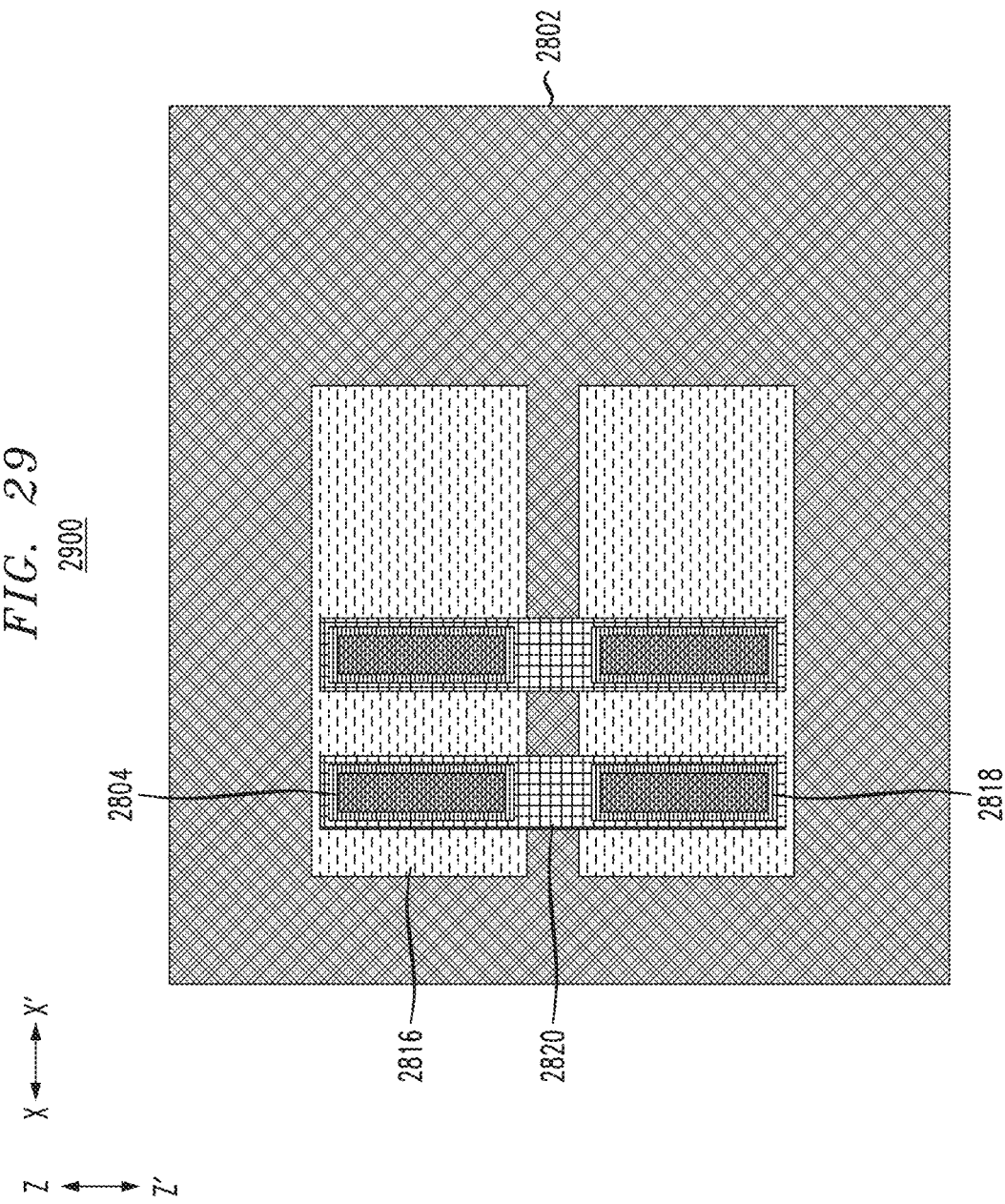
FIG. 29 shows a top-down view of the FIG. 28 structure following formation of a bottom epitaxial layer, bottom spacer for lower vertical transport field-effect transistors, and gate stack patterning for the lower vertical transport field-effect transistors, according to an embodiment of the invention.

FIG. 29 shows a top-down view 2900 of the FIG. 28 structure following formation of a bottom epitaxial layer (not shown) and STI regions (not shown), and following formation of a bottom spacer layer 2816 for lower VTFETs as well as gate stack patterning for the lower VTFETs. The gate stack patterning includes forming gate dielectric layer 2818 and gate conductor layer 2820. As illustrated the gate conductor layer 2820 connects sets of the fins to form contacts for the first and second inputs 2409-1 and 2409-2 of the stacked VTFET NAND3 structure of FIGS. 24A-24C or the first and second inputs 2609-1 and 2609-2 of the stacked VTFET NOR3 structure of FIGS. 26A-26C. The bottom epitaxial layer, STI regions, bottom spacer layer 2816, gate dielectric layer 2818 and gate conductor layer 2820 may be formed of similar materials and with similar sizing and processing as that described above with respect to bottom epitaxial layer 312, STI regions 314, bottom spacer layer 316, gate dielectric layer 318 and gate conductor layer 320.

FIG. 30 shows a top-down view 3000 of the FIG. 29 structure following formation of an ILD layer 2822. The ILD layer 2822 may be formed of similar materials and with similar sizing and processing as that described above with respect to ILD layer 322.

Figure 31A:
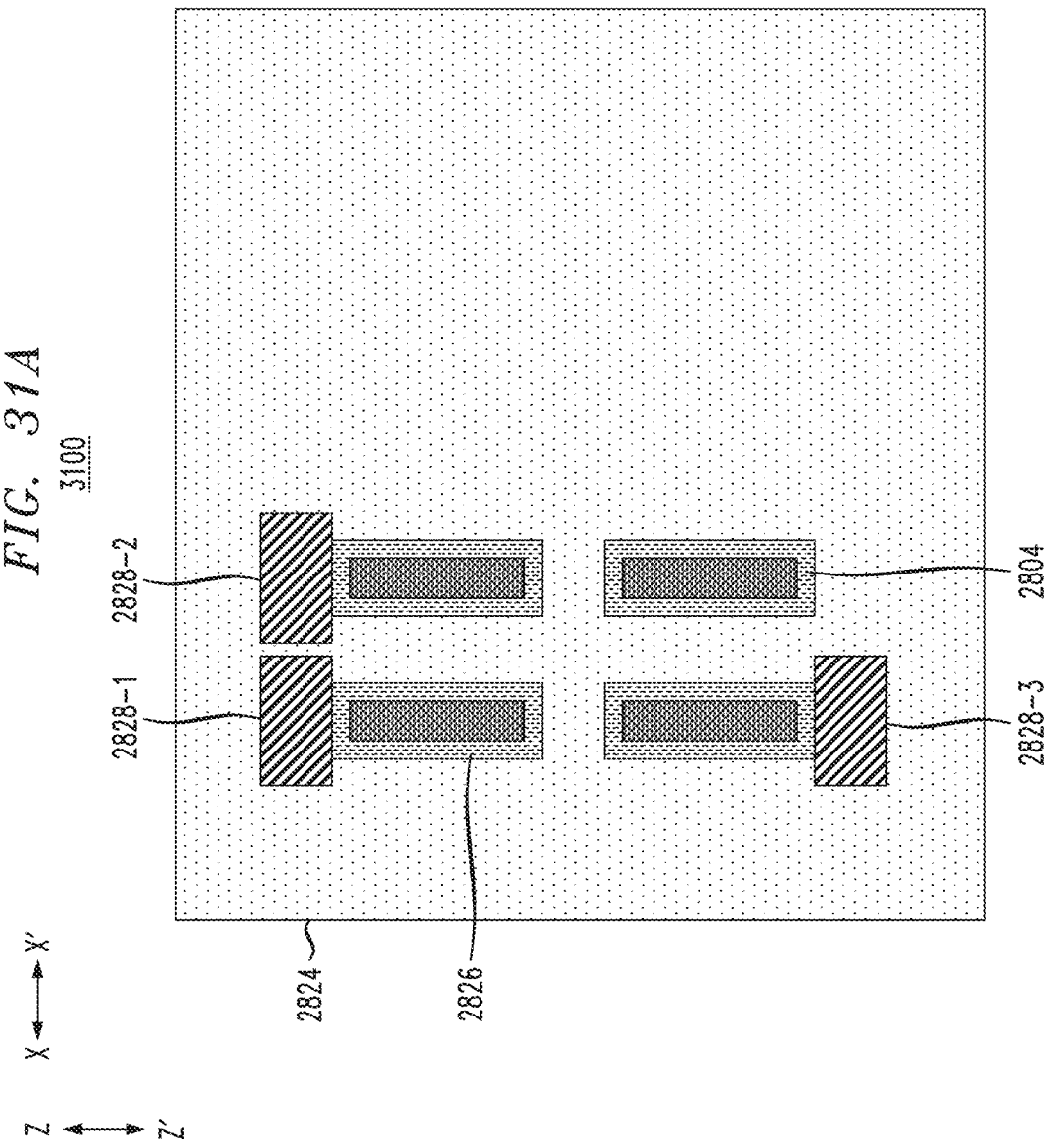
FIG. 31A shows a top-down view of the FIG. 30 structure following formation of a shared middle epitaxial layer and sacrificial material for contact patterning to the shared middle epitaxial layer for a stacked vertical transport field-effect transistor NAND3 structure, according to an embodiment of the invention.

FIG. 31A shows a top-down view 3100 of the FIG. 30 structure following formation of a top spacer layer 2824 for the lower VTFETs, a shared middle epitaxial layer 2826, and sacrificial material 2828. The sacrificial material 2828 in FIG. 31A is used for patterning contacts to the shared middle epitaxial layer 2826 of the different fin channels for the stacked VTFET NAND3 structure of FIGS. 24A-24C. More particularly, sacrificial material 2828-1 and 2828-2 is used for patterning contacts of the middle epitaxial layer 2826 (e.g., providing source regions 2406-4 and 2406-5 for the PFETs 2401) to the high power rail 2405. The sacrificial material 2828-3 is used for patterning a contact of the middle epitaxial layer 2826 (e.g., providing source region 2406-1 for the first one of the NFETs 2403) to the low power rail 2407.

FIG. 31B shows a top-down view 3150 of the FIG. 30 structure following formation of the top spacer layer 2824 for the lower VTFETs, the shared middle epitaxial layer 2826, and the sacrificial material 2828. The sacrificial material 2828 in FIG. 31B is used for patterning contacts to the shared middle epitaxial layer 2826 of the different fin channels for the stacked VTFET NOR3 structure of FIGS. 26A-26C. More particularly, sacrificial material 2828-1 is used for patterning a contact of the middle epitaxial layer 2826 (e.g., providing source region 2606-3 for the first one of the PFETs 2601) to the high power rail 2605. The sacrificial material 2828-2 and 2828-3 is used for patterning contacts of the middle epitaxial layer 2826 (e.g., providing source regions 2606-1 and 2606-2 for the NFETs 2603) to the low power rail 2607.

The top spacer layer 2824, shared middle epitaxial layer 2826 and sacrificial material 2828 may be formed of similar materials and with similar sizing and processing as that described above with respect to the top spacer layer 324, shared middle epitaxial layer 326 and sacrificial material 328.

Figure 32:
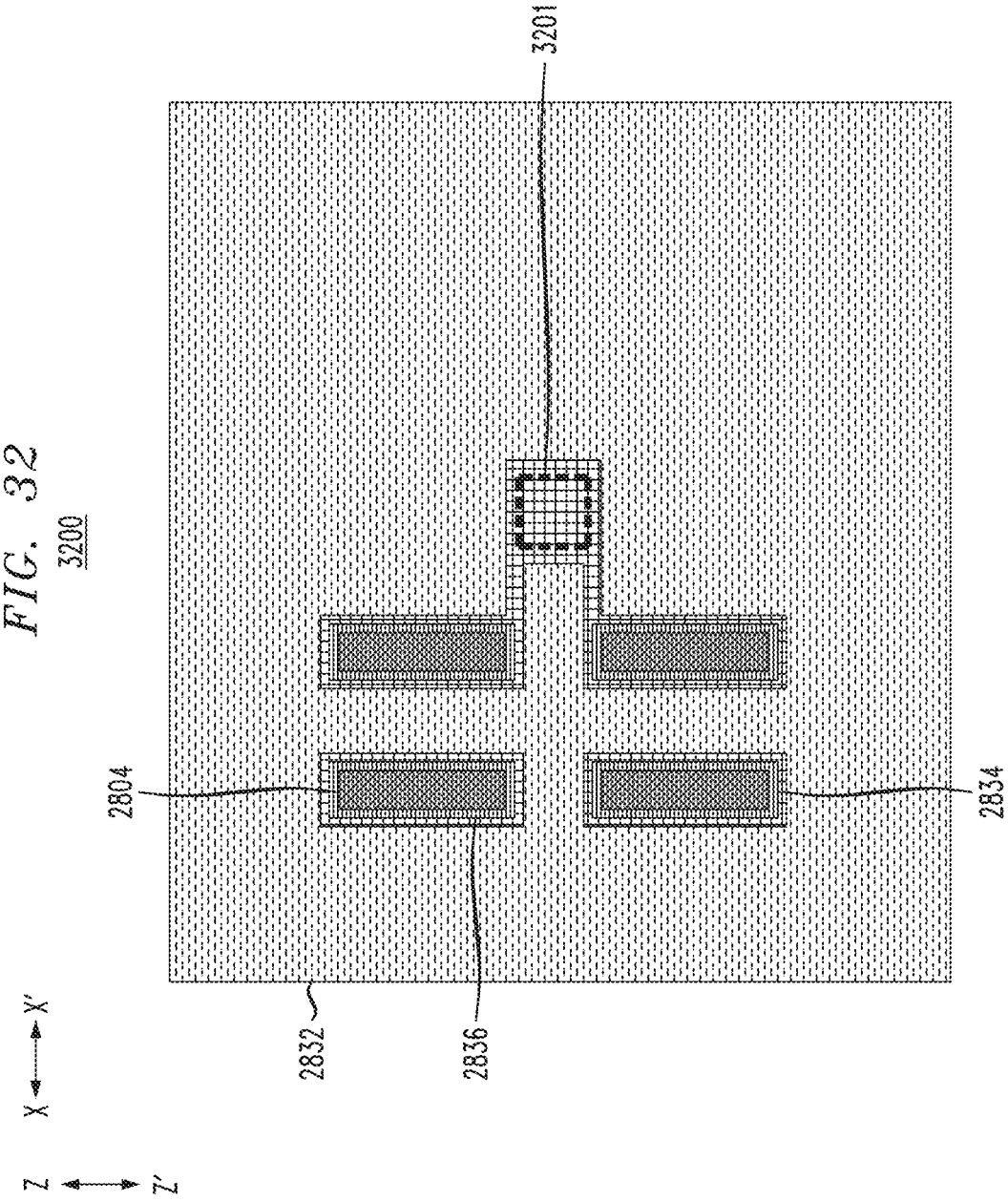
FIG. 32 shows a top-down view of the FIG. 31A or FIG. 31B structure following formation of a bottom spacer for upper vertical transport field-effect transistors and gate stack patterning for the upper vertical transport field-effect transistors, according to an embodiment of the invention.

FIG. 32 shows a top-down view 3200 of the FIG. 31A or FIG. 31B structure following formation of another ILD layer (not shown), a bottom spacer layer 2832 for the upper VTFETs and a gate stack including gate dielectric layer 2834 and gate conductor layer 2836 for the upper VTFETs. As illustrated, the gate conductor layer 2836 connects the second fins to an area in the region of one of the dummy fins (e.g., 2414-1, 2514-1) where a via 3201 will be formed for a contact to a third input (e.g., input 2409-3 for the stacked VTFET NAND3 structure of FIGS. 24A-24C, input 2609-3 for the stacked VTFET NOR3 structure of FIGS. 26A-26C). The ILD layer, bottom spacer layer 2832, gate dielectric layer 2834 and gate conductor layer 2836 may be formed of similar materials and with similar sizing and processing as that described above with respect to ILD layer 330, bottom spacer layer 332, gate dielectric layer 334 and gate conductor layer 336.

Figure 33:
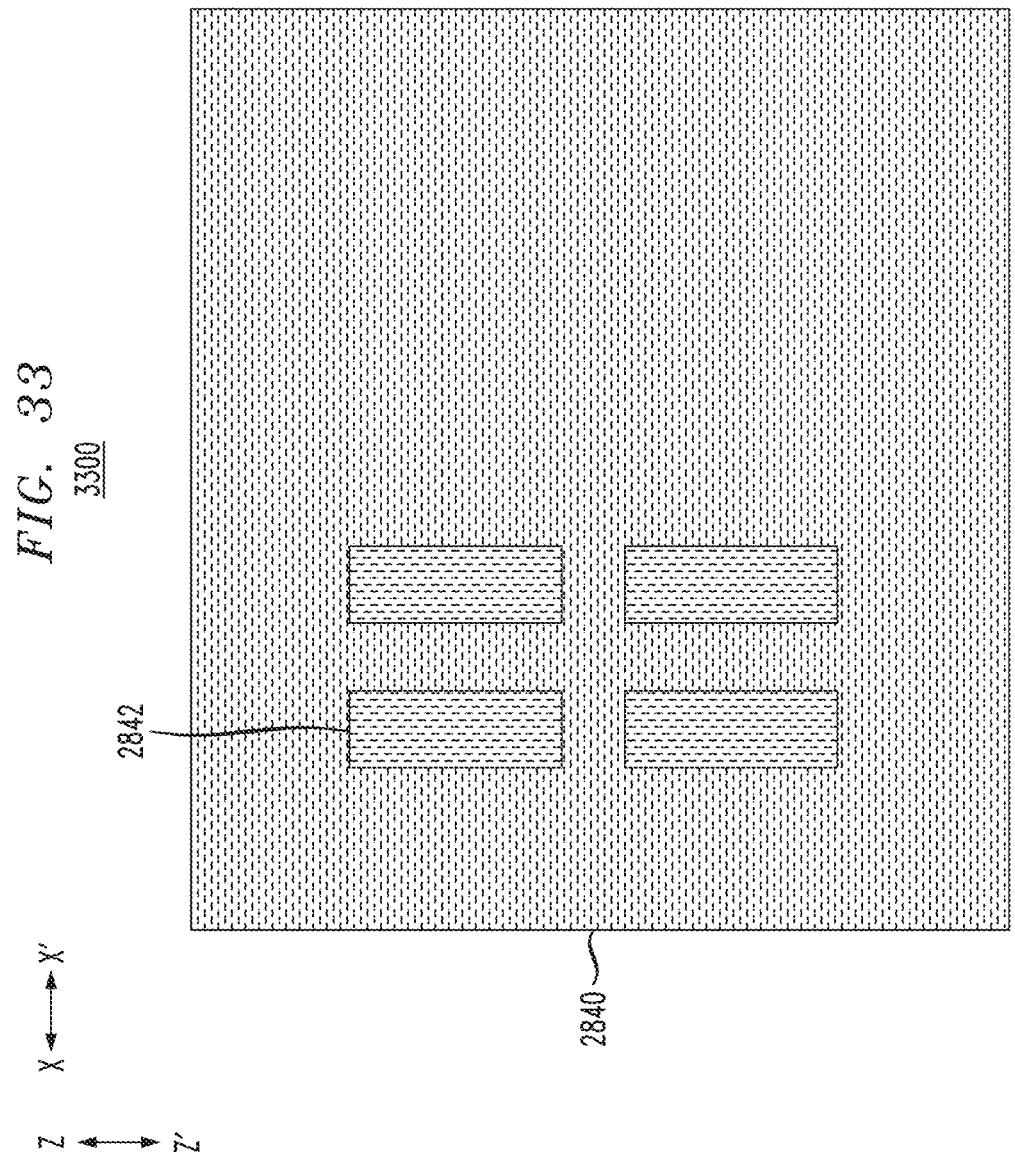
FIG. 33 shows a top-down view of the FIG. 32 structure following formation of a top spacer for the upper vertical transport field-effect transistors and formation of a top epitaxial layer, according to an embodiment of the invention.

FIG. 33 shows a top-down view 3300 of the FIG. 32 structure following formation another ILD layer (not shown), a top spacer layer 2840 for the upper VTFETs, and a top epitaxial layer 2842. The ILD layer, top spacer layer 2840 and top epitaxial layer 2842 may be formed of similar materials and with similar sizing and processing as that described above with respect to ILD layer 338, top spacer layer 340 and top epitaxial layer 342.

Figure 34:
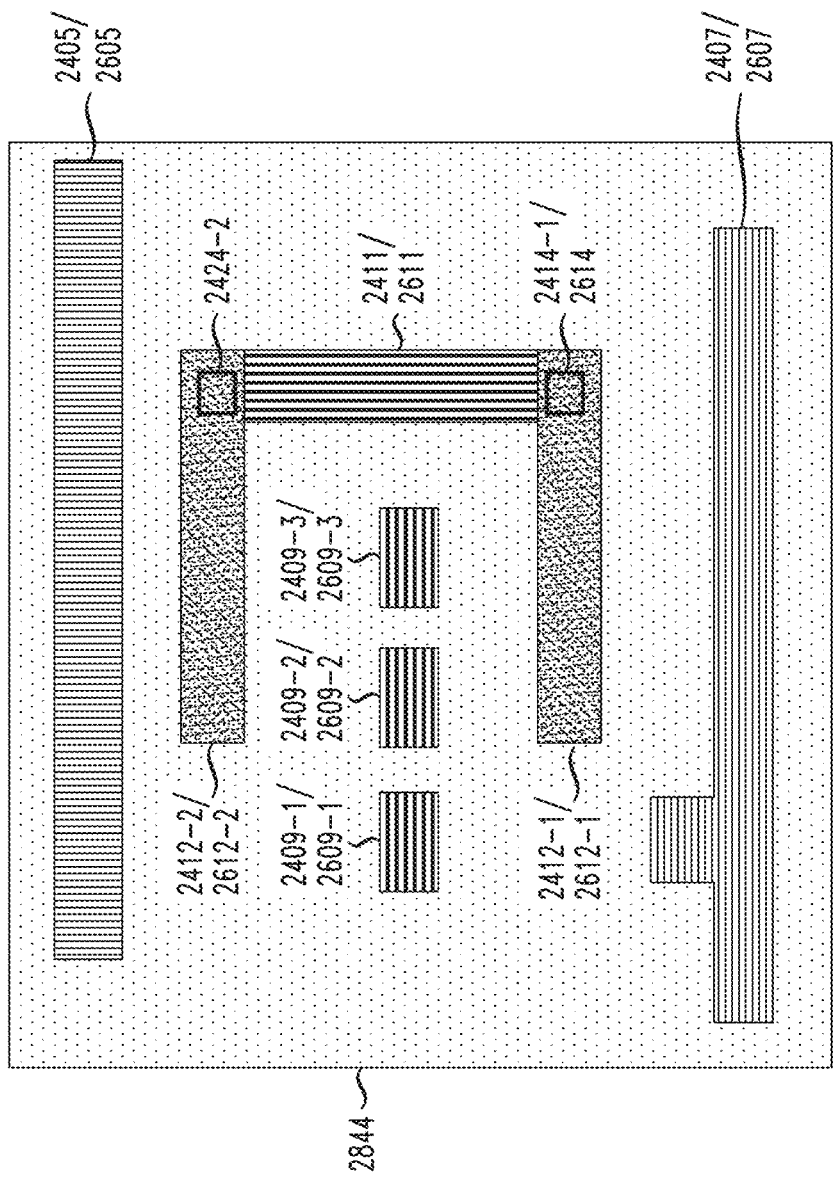
FIG. 34 shows a top-down view of the FIG. 33 structure following formation of contacts, according to an embodiment of the invention.

FIG. 34 shows a top-down view 3400 of the FIG. 33 structure following formation of an ILD layer 2844 for the upper VTFETs. The ILD layer 2844 may be formed of similar materials and with similar sizing and processing as that described above with respect to ILD layer 344. FIG. 34 also illustrates contact patterning for the high power rail (e.g., 2405 for the stacked VTFET NAND3 structure of FIGS. 24A-24C, 2605 for the stacked VTFET NOR3 structure of FIGS. 26A-26C), the low power rail (e.g., 2407 for the stacked VTFET NAND3 structure of FIGS. 24A-24C, 2607 for the stacked VTFET NOR3 structure of FIGS. 26A-26C), the inputs (e.g., 2409-1, 2409-2 and 2409-3 for the stacked VTFET NAND3 structure of FIGS. 24A-24C, 2609-1, 2609-2 and 2609-3 for the stacked VTFET NOR3 structure of FIGS. 26A-26C), and the output (e.g., 2411 for the stacked VTFET NAND3 structure of FIGS. 24A-24C, 2611 for the stacked VTFET NOR3 structure of FIGS. 26A-26C). FIG. 34 also illustrates contacts (e.g., 2412-1 and 2412-2 for the stacked VTFET NAND3 structure of FIGS. 24A-24C, 2612-1 and 2612-2 for the stacked VTFET NOR3 structure of FIGS. 26A-26C) as well as vias (e.g., 2414-1 and 2414-2 for the stacked VTFET NAND3 structure of FIGS. 24A-24C, 2614 for the stacked VTFET NOR3 structure of FIGS. 26A-26C).

Figure 35B:
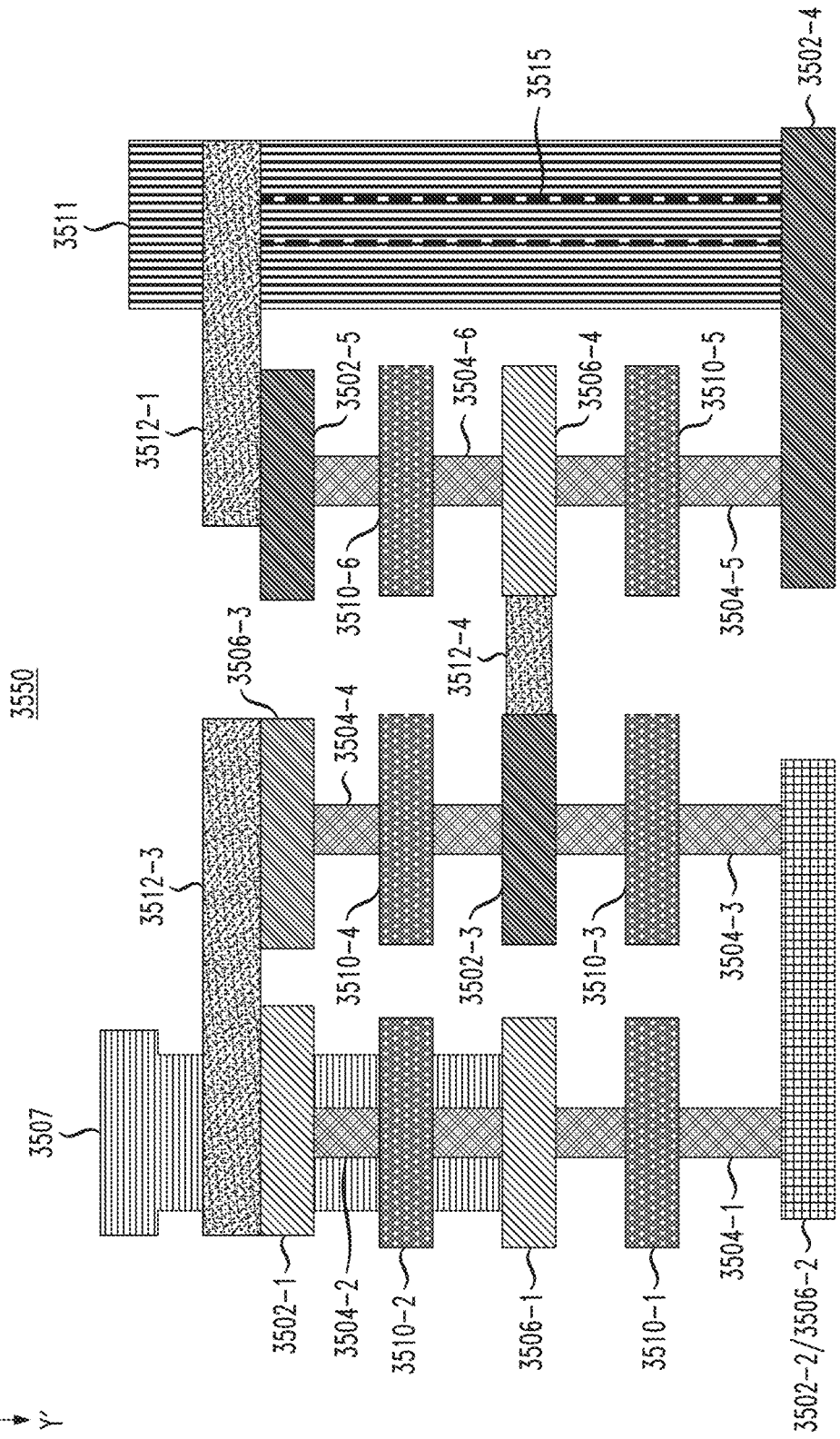
FIG. 35B shows a cross-sectional view of the FIG. 35A stacked vertical transport field-effect transistor NAND3 structure, according to an embodiment of the invention.

FIG. 35A shows a top-down view 3500 of stacked VTFET NAND3 structure using three two-channel PFETs 3501 and three two-channel NFETs 3503. FIG. 35B shows a cross-sectional view 3550 taken across the fins for the NFETs 3503, and FIG. 35C shows a cross-sectional view 3575 taken across the fins for the PFETs 3501.

The stacked VTFET NAND3 structure of FIGS. 35A-35C includes fin channels 3504-1 through 3504-12. Fin channels 3504-1 and 3504-2 provide lower and upper NFET fin channels for a first one of the two-channel NFETs 3503, fin channels 3504-3 and 3504-4 provide lower and upper NFET fin channels for a second one of the two-channel NFETs 3503, and fin channels 3504-5 and 3504-6 provide lower and upper NFET fin channels for a third one of the two-channel NFETs 3503. Fin channels 3504-7 and 3504-8 provide lower and upper PFET fin channels for a first one of the two-channel PFETs 3501, fin channels 3504-9 and 3504-10 provide lower and upper PFET fin channels for a second one of the two-channel PFETs 3501, and fin channels 3504-11 and 3504-12 provide lower and upper PFET fin channels for a third one of the two-channel PFETs 3501. The fin channels 3504-1 through 3504-12 are stacked as illustrated.

Epitaxial layers providing source and drain regions for the PFETs 3501 and NFETs 3503 will now be described. For the NFETs 3503, a middle epitaxial layer for the first fin provides a source region 3506-1 for the first one of the two-channel NFETs 3503, a top epitaxial layer for the first fin provides a drain region 3502-1 for the first one of the two-channel NFETs 303, a bottom epitaxial layer of the first and second fins provide a drain region 3502-1 for the first one of the two-channel NFETs 3503 and a source region 3506-2 for the second one of the two-channel NFETs 3503, a middle epitaxial layer for the second fin provides a drain region 3502-3 for the second one of the two-channel NFETs 3503, a top epitaxial layer for the second fin provides a source region 3506-3 for the second one of the two-channel NFETs 3503, a middle epitaxial layer for the third fin provides a source region 3504-6 for the third one of the two-channel NFETs 3503, and bottom and top epitaxial layers of the third fin provide drain regions 3502-4 and 3502-5 for the third one of the two-channel NFETs 3503. For the PFETs 3501, the middle epitaxial layers of the first, second and third fins provide source regions 3506-5, 3506-6 and 3506-7 for the first, second and third ones of the two-channel PFETs 3501. The bottom epitaxial layer and top epitaxial layers provide drain regions 3502-6, 3502-7, 3502-8 and 3502-9 for the two-channel PFETs 3501. Gate stacks 3510-1 through 3510-12 are formed for the fin channels 3504-1 through 3504-12, respectively. The NFETs 3503 connect in series, while the PFETs 3501 connect in parallel.

Contacts for the stacked VTFET NAND3 structure of FIGS. 35A-35C will now be described. Contact 3512-1 connects the drain region 3502-5 for the third one of the two-channel NFETs 3503 to the output 3511, and contact 3512-2 connects the drain regions 3502-6, 3502-7, 3502-8 and 3502-9 of the PFETs 3501 to the output 3511. The high power rail 3505 connects to the source regions 3506-5, 3506-6 and 3506-7 of the PFETs 3501. The low power rail 3507 connects to the source region 3506-1 for the first one of the two-channel NFETs 3503. Input 3509-1 connects to the gate stacks 3510-1 and 3510-2 of the first one of the two-channel NFETs 3503 and to the gate stacks 3510-7 and 3510-8 of the first one of the two-channel PFETs 3501. Input 3509-2 connects to the gate stacks 3510-3 and 3510-4 of the second one of the two-channel NFETs 3503 and to the gate stacks 3510-9 and 3510-10 of the second one of the two-channel PFETs 3501. Input 3509-3 connects to the gate stacks 3510-5 and 3510-6 of the third one of the two-channel NFETs 3503 and to the gate stacks 3510-11 and 3510-12 of the first one of the two-channel PFETs 3501. Vias 3514-1 and 3514-2 connect contacts 3512-1 and 3512-2 to the output 3511. Contact 3512-3 connects the top epitaxial layers of the first and second fins for the NFETs 3503 (e.g., drain region 3502-1 and source region 3506-3). The contact 3512-3 can be at the area between the first and second fins, or in the area between the fins and the power rail (e.g., low power rail 3507). The top-down view 3500 of FIG. 35A also shows a via 3519 that connects the top and bottom epitaxial layers.

FIG. 36 shows a top-down view 3600 of a non-stacked VTFET NAND3 structure formed using three two-channel PFETs 3601 and three two-channel NFETs 3603. The non-stacked VTFET NAND3 structure of FIG. 36 includes NFET fin channels 3604-1 through 3604-6, and PFET fin channels 3604-7 through 3604-12.

NFET fin channels 3604-1 and 3604-2 provide a first one of the two-channel NFETs 3603, and have a bottom epitaxial layer that connects to the low power rail 3607. Top epitaxial layers of the NFET fin channels 3604-1 and 3604-2 provide drain regions that are connected to top epitaxial layers of NFET fin channels 3604-3 and 3604-3 providing a second one of the two-channel NFETs 3603. The top epitaxial layers of the NFET fin channels 3604-3 and 3604-4 provide source regions for the second one of the two-channel NFETs 3603, and bottom epitaxial layers of the NFET fin channels 3604-3 and 3604-4 provide drain regions for the second one of the two-channel NFETs 3603. The bottom epitaxial layer of the NFET fin channels 3604-3 and 3604-4 connect with the bottom epitaxial layer of the NFET fin channels 3604-5 and 3604-6 providing a third one of the two-channel NFETs 3603. The bottom epitaxial layer of the NFET fin channels 3604-5 and 3604-6 provide source regions for the third one of the two-channel NFETs 3603, and top epitaxial layers of the NFET fin channels 3604-5 and 3604-6 provide drain regions of the third one of the two-channel NFETs 3603, which connects to output 3611 via contact 3612-2.

Bottom epitaxial layers of the PFET fin channels 3604-7 through 3604-12 provide source regions for the PFETs 3501 that connect to the high power rail 3605, and top epitaxial layers of the PFET fin channels 3604-7 through 3604-12 provide drain regions of the PFETs 3501, which connect to output 3611 via contact 3612-1. The PFET fin channels 3604-7 and 3604-8 provide a first one of the two-channel PFETs 3601, the PFET fin channels 3604-9 and 3604-10 provide a second one of the two-channel PFETs 3601, and the PFET fin channels 3604-11 and 3604-12 provide a third one of the two-channel PFETs 3601.

Input 3609-1 connects to gate stacks of the NFET fin channels 3604-1 and 3604-2 and gate stacks of the PFET fin channels 3604-7 and 3604-8, input 3609-2 connects to gate stacks of the NFET fin channels 3604-3 and 3604-4 and gate stacks of the PFET fin channels 3604-9 and 3604-10, and input 3609-3 connects to gate stacks of the NFET fin channels 3604-5 and 3604-6 and gate stacks of the PFET fin channels 3604-11 and 3604-12.

The stacked VTFET NAND3 structure shown in FIGS. 35A-35C has an "X" direction length of 3CPP and a "Y" direction height of 191 nm, with an area scaling of 0.6. The non-stacked VTFET NAND3 structure shown in FIG. 36 has an "X" direction length of 5CPP and a "Y" direction height of 191 nm, with an area scaling of 1. Thus, the stacked VTFET NAND3 structure shown in FIGS. 35A-35C provides significant space savings relative to the non-stacked VTFET NAND3 structure of FIG. 36.

Figure 37A:
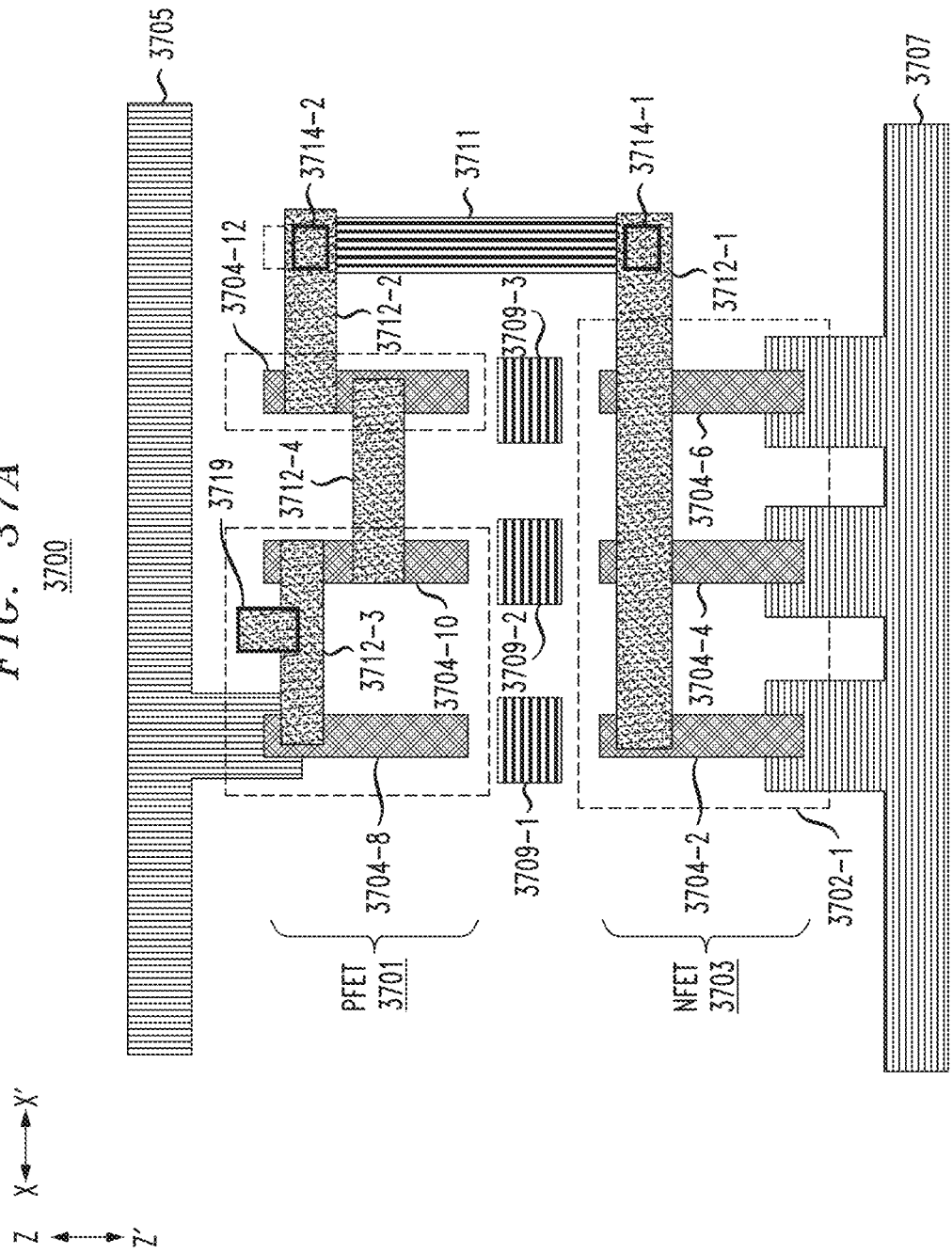
FIG. 37A shows a top-down view of a stacked vertical transport field-effect transistor NOR3 structure using three two-channel n-type field-effect transistors and three two-channel p-type field-effect transistors, according to an embodiment of the invention

FIG. 37A shows a top-down view 3700 of stacked VTFET NOR3 structure using three two-channel PFETs 3701 and three two-channel NFETs 3703. FIG. 37B shows a cross-sectional view 3750 taken across the fins for the NFETs 3703, and FIG. 37C shows a cross-sectional view 3775 taken across the fins for the PFETs 3701.

The stacked VTFET NOR3 structure of FIGS. 37A-37C includes fin channels 3704-1 through 3704-12. Fin channels 3704-1 and 3704-2 provide lower and upper NFET fin channels for a first one of the two-channel NFETs 3703, fin channels 3704-3 and 3704-4 provide lower and upper NFET fin channels for a second one of the two-channel NFETs 3703, and fin channels 3704-5 and 3704-6 provide lower and upper NFET fin channels for a third one of the two-channel NFETs 3703. Fin channels 3704-7 and 3704-8 provide lower and upper PFET fin channels for a first one of the two-channel PFETs 3701, fin channels 3704-9 and 3704-10 provide lower and upper PFET fin channels for a second one of the two-channel PFETs 3701, and fin channels 3704-11 and 3704-12 provide lower and upper PFET fin channels for a third one of the two-channel PFETs 3701. The fin channels 3704-1 through 3704-12 are stacked as illustrated.

Epitaxial layers providing source and drain regions for the PFETs 3701 and NFETs 3703 will now be described. For the NFETs 3703, the middle epitaxial layers of the first, second and third fins provide source regions 3706-1, 3706-2 and 3706-3 for the first, second and third ones of the two-channel NFETs 3703. The bottom epitaxial layer and top epitaxial layers provide drain regions 3702-1, 3702-2, 3702-3 and 3702-4 for the two-channel NFETs 3703. For the PFETs 3501, a middle epitaxial layer for the first fin provides a source region 3706-4 for the first one of the two-channel PFETs 3701, a top epitaxial layer of the first fin provides a drain region 3702-5 for the first one of the two-channel PFETs 3701, a bottom epitaxial layer of the first and second fins provides a drain region 3702-6 for the first one of the two-channel PFETs 3701 and a source region 3706-5 for the second one of the two-channel PFETs 3701, a middle epitaxial layer for the second fin provides a drain region 3702-7 for the second one of the two-channel PFETs 3701, a top epitaxial layer for the second fin provides a source region 3706-6 for the second one of the two-channel PFETs 3701, a middle epitaxial layer for the third fin provides a source region 3706-7 for the third one of the two-channel PFETs 3701, and bottom and top epitaxial layers of the third fin provide drain regions 3702-8 and 3702-9 for the third one of the two-channel PFETs 3701. Gate stacks 3710-1 through 3710-12 are formed for the fin channels 3704-1 through 3704-12, respectively. The PFETs 3701 connect in series, while the NFETs 3703 connect in parallel.

Contacts for the stacked VTFET NOR3 structure of FIGS. 37A-37C will now be described. Contact 3712-1 connects the drain regions 3702-1 through 3702-4 of the NFETs 3703 to the output 3711, and contact 3712-2 connects the drain regions 3702-8 and 3702-9 for the third one of the two-channel PFETs 3701 to the output 3711. The high power rail 3705 connects to the source region 3706-4 of the first one of the two-channel PFETs 3701. The low power rail 3707 connects to the source regions 3706-1, 3706-2 and 3706-3 of the NFETs 3703

Input 3709-1 connects to the gate stacks 3710-1 and 3710-2 of the first one of the two-channel NFETs 3703 and to the gate stacks 3710-7 and 3710-8 of the first one of the two-channel PFETs 3701. Input 3709-2 connects to the gate stacks 3710-3 and 3710-4 of the second one of the two-channel NFETs 3703 and to the gate stacks 3710-9 and 3710-10 of the second one of the two-channel PFETs 3701. Input 3709-3 connects to the gate stacks 3710-5 and 3710-6 of the third one of the two-channel NFETs 3703 and to the gate stacks 3710-11 and 3710-12 of the first one of the two-channel PFETs 3701. Vias 3714-1 and 3714-2 connect contacts 3712-1 and 3712-2 to the output 3711. Contact 3712-3 connects the top epitaxial layers of the first and second fins for the PFETs 3701 (e.g., drain region 3702-5 and source region 3706-6). Via 3719 provides an interconnection between top epitaxial layers providing drain region 3702-5 and source region 3706-5 and bottom epitaxial layers providing source region 3706-5 and drain region 3702-6.

Figure 38:
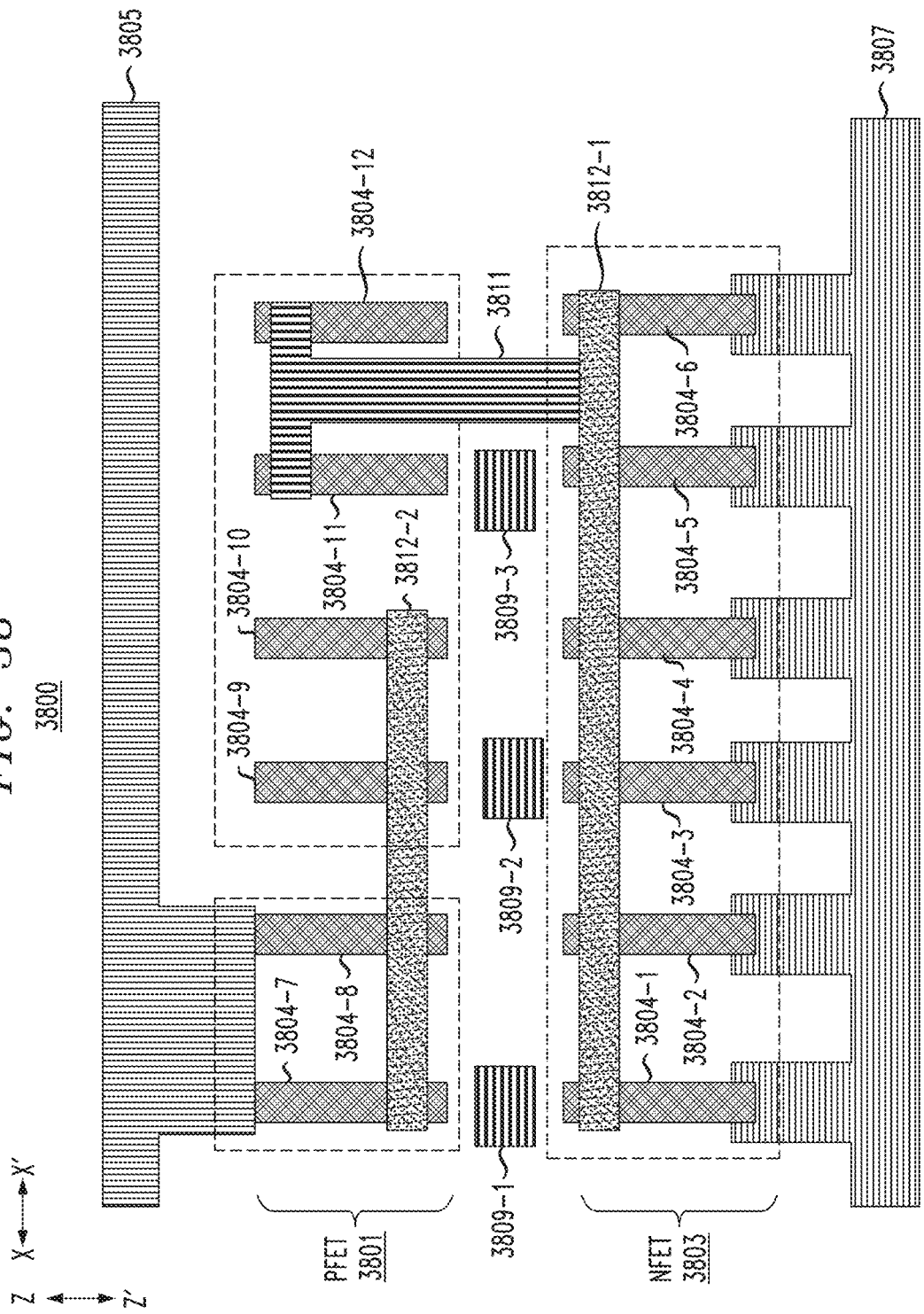
FIG. 38 shows a top-down view of a vertical transport field-effect transistor NOR3 structure using three two-channel n-type field-effect transistors and three two-channel p-type field-effect transistors, according to an embodiment of the invention.

FIG. 38 shows a top-down view 3800 of a non-stacked VTFET NOR3 structure formed using three two-channel PFETs 3801 and three two-channel NFETs 3803. The non-stacked VTFET NOR3 structure of FIG. 38 includes NFET fin channels 3804-1 through 3804-6, and PFET fin channels 3804-7 through 3804-12.

Bottom epitaxial layers of the NFET fin channels 3804-1 through 3804-6 provide source regions for the NFETs 3803 that connect to low power rail 3807, and top epitaxial layers of the NFET fin channels 3804-1 through 3804-6 provide drain regions of the NFETs 3803, which connect to output 3811 via contact 3812-1. The NFET fin channels 3804-1 and 3804-2 provide a first one of the two-channel NFETs 3803, the NFET fin channels 3804-3 and 3804-4 provide a second one of the two-channel NFETs 3803, and the NFET fin channels 3804-5 and 3804-6 provide a third one of the two-channel NFETs 3803.

PFET fin channels 3804-7 and 3804-8 provide a first one of the two-channel PFETs 3801, and have a bottom epitaxial layer that connects to the high power rail 3805. Top epitaxial layers of the PFET fin channels 3804-7 and 3804-8 provide drain regions that are connected via contact 3812-2 to top epitaxial layers of PFET fin channels 3804-9 and 3804-10 providing a second one of the two-channel PFETs 3801. The top epitaxial layers of the PFET fin channels 3804-9 and 3804-10 provide source regions for the second one of the two-channel PFETs 3801, and bottom epitaxial layers of the PFET fin channels 3804-9 and 3804-10 provide drain regions for the second one of the two-channel PFETs 3801. The bottom epitaxial layers of the PFET fin channels 3804-9 and 3804-10 connect with the bottom epitaxial layers of the PFET fin channels 3804-11 and 3804-12 providing a third one of the two-channel PFETs 3801. The bottom epitaxial layers of the PFET fin channels 3804-11 and 3804-12 provide source regions for the third one of the two-channel PFETs 3801, and top epitaxial layers of the PFET fin channels 3804-11 and 3804-12 provide drain regions of the third one of the two-channel PFETs 3801, which connect to output 3811.

Input 3809-1 connects to gate stacks of the NFET fin channels 3804-1 and 3804-2 and gate stacks of the PFET fin channels 3804-7 and 3804-8, input 3809-2 connects to gate stacks of the NFET fin channels 3804-3 and 3804-4 and gate stacks of the PFET fin channels 3804-9 and 3804-10, and input 3809-3 connects to gate stacks of the NFET fin channels 3804-5 and 3804-6 and gate stacks of the PFET fin channels 3804-11 and 3804-12.

The stacked VTFET NOR3 structure shown in FIGS. 37A-37C has an "X" direction length of 3CPP and a "Y" direction height of 191 nm, with an area scaling of 0.6. The non-stacked VTFET NOR3 structure shown in FIG. 38 has an "X" direction length of 5CPP and a "Y" direction height of 191 nm, with an area scaling of 1. Thus, the stacked VTFET NOR3 structure shown in FIGS. 37A-37C provides significant space savings relative to the non-stacked VTFET NOR3 structure of FIG. 38.

Processes for forming the stacked VTFET NAND3 structure of FIGS. 35A-35C and the stacked VTFET NOR3 structure of FIGS. 37A-37C will now be described with respect to FIGS. 39-44.

Figure 39:
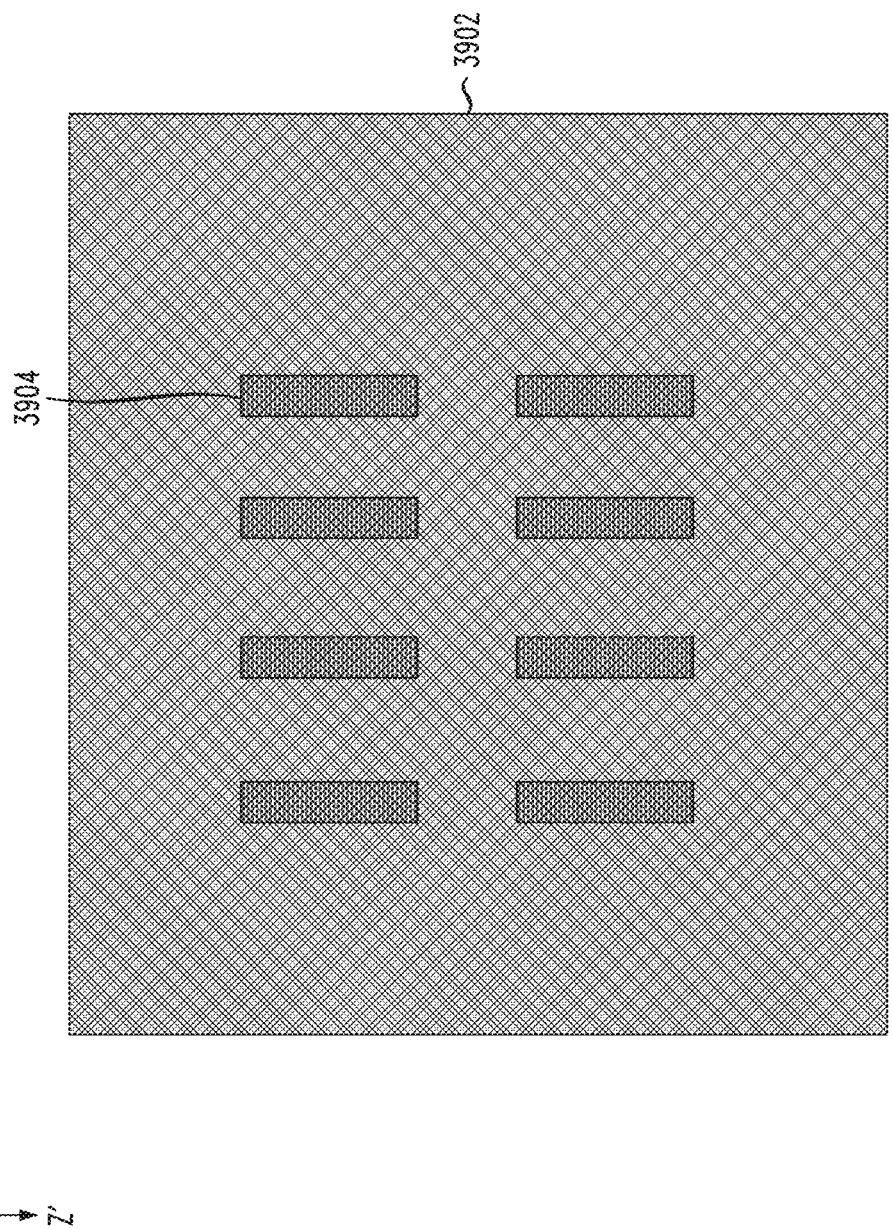
FIG. 39 shows a top-down view of a substrate following fin formation, according to an embodiment of the invention.

FIG. 39 shows a top-down view 3900, illustrating a substrate 3902 on which a set of fins are formed using a patterned hard mask layer 3904. The fin formation may utilize SADP or other suitable processing. The substrate 3902 and hard mask layer 3904 may be formed of similar materials and with similar sizing and processing as that described above with respect to substrate 302 and hard mask layer 304. FIG. 39 shows eight fins that are formed, though some of the fins are "dummy" fins that will be removed using a fin cut process.

Figure 40:
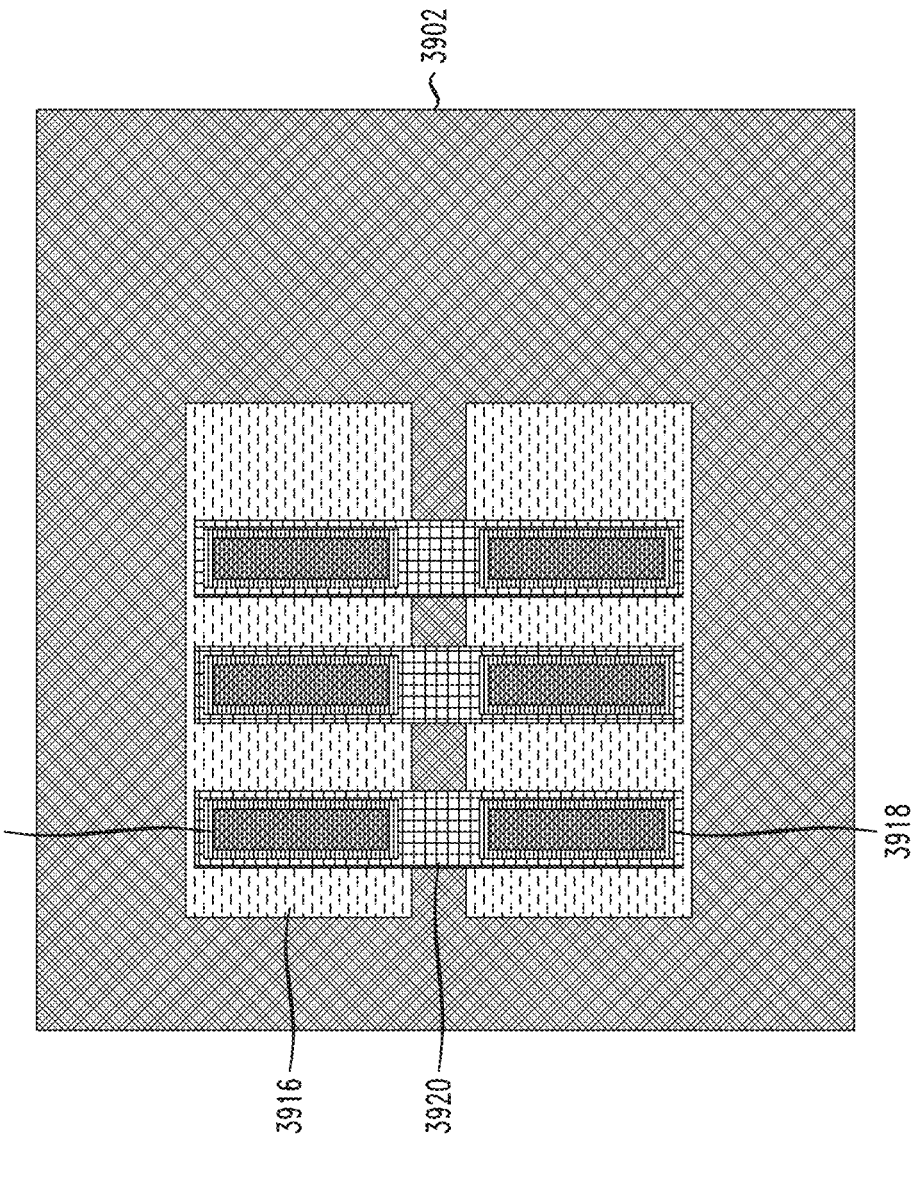
FIG. 40 shows a top-down view of the FIG. 39 structure following formation of a bottom epitaxial layer, bottom spacer for lower vertical transport field-effect transistors, and gate stack patterning for the lower vertical transport field-effect transistors, according to an embodiment of the invention.

FIG. 40 shows a top-down view 4000 of the FIG. 39 structure following formation of a bottom epitaxial layer (not shown) and STI regions (not shown), and following formation of a bottom spacer layer 3916 for lower VTFETs as well as gate stack patterning for the lower VTFETs. The gate stack patterning includes forming gate dielectric layer 3918 and gate conductor layer 3920. As illustrated the gate conductor layer 3920 connects sets of the fins to form contacts for the first, second and third inputs 3509-1, 3509-2 and 3509-3 of the stacked VTFET NAND3 structure of FIGS. 35A-35C or the first, second and third inputs 3709-1, 3709-2 and 3709-3 of the stacked VTFET NOR3 structure of FIGS. 37A-37C. The bottom epitaxial layer, STI regions, bottom spacer layer 3916, gate dielectric layer 3918 and gate conductor layer 3920 may be formed of similar materials and with similar sizing and processing as that described above with respect to bottom epitaxial layer 312, STI regions 314, bottom spacer layer 316, gate dielectric layer 318 and gate conductor layer 320.

Figure 41:
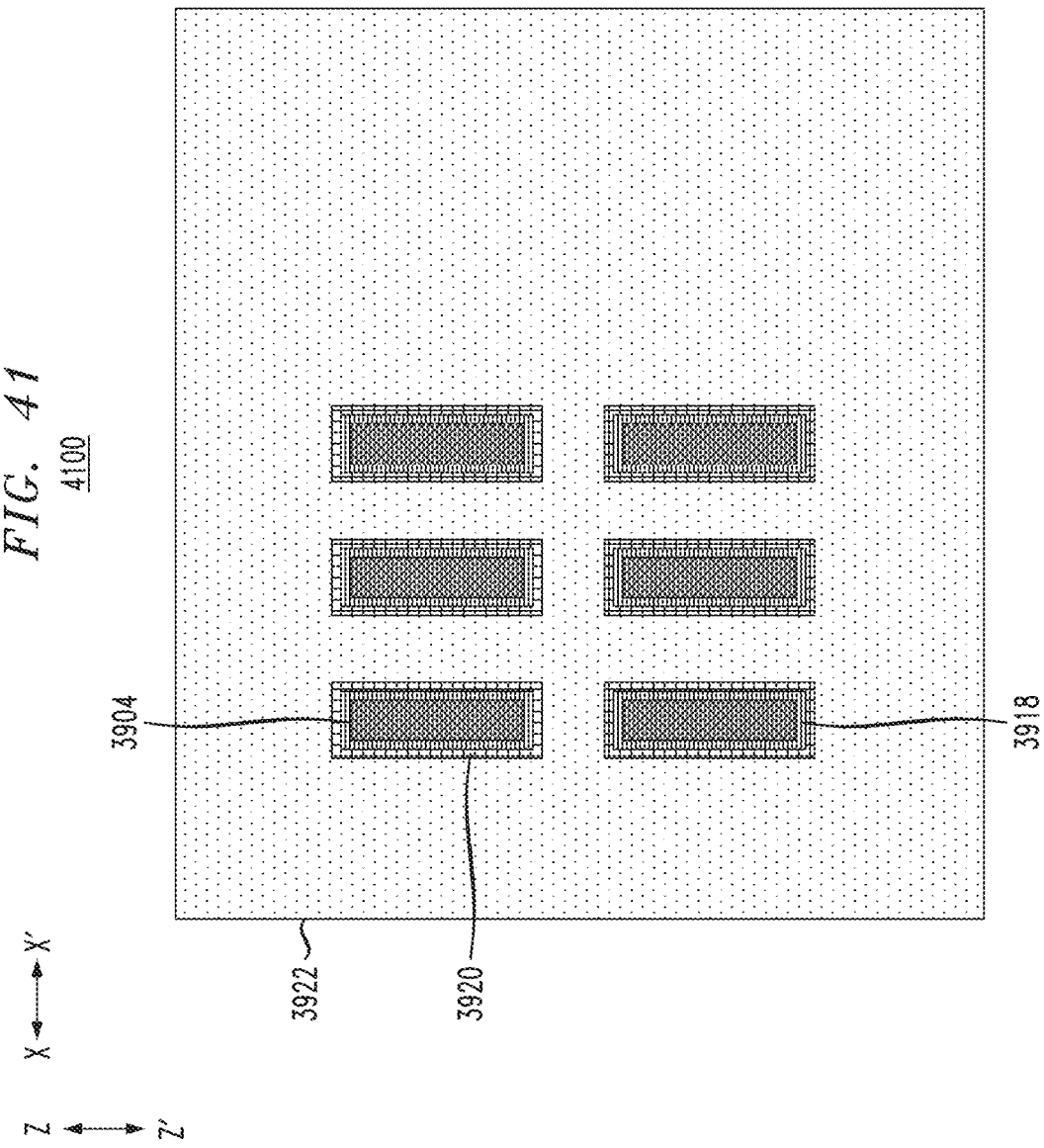
FIG. 41 shows a top-down view of the FIG. 29 structure following formation of an interlayer dielectric layer, according to an embodiment of the invention.

FIG. 41 shows a top-down view 4100 of the FIG. 40 structure following formation of an ILD layer 3922. The ILD layer 3922 may be formed of similar materials and with similar sizing and processing as that described above with respect to ILD layer 322.

Figure 42A:
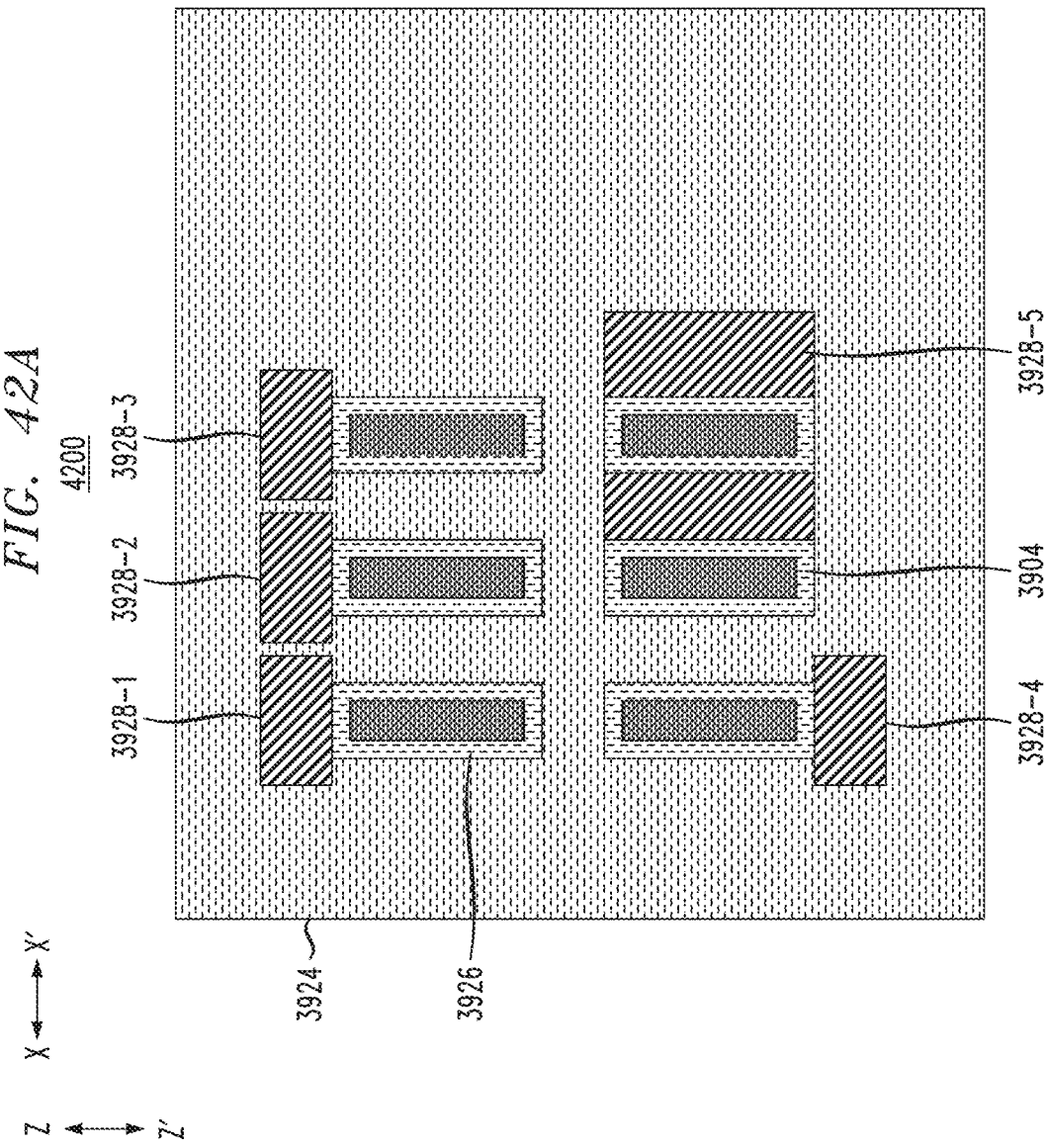
FIG. 42A shows a top-down view of the FIG. 41 structure following formation of a shared middle epitaxial layer and sacrificial material for contact patterning to the shared middle epitaxial layer for a stacked vertical transport field-effect transistor NAND3 structure, according to an embodiment of the invention.

FIG. 42A shows a top-down view 4200 of the FIG. 41 structure following formation of a top spacer layer 3924 for the lower VTFETs, a shared middle epitaxial layer 3926, and sacrificial material 3928. The sacrificial material 3928 in FIG. 31A is used for patterning contacts to the shared middle epitaxial layer 3926 of the different fin channels for the stacked VTFET NAND3 structure of FIGS. 35A-35C. More particularly, sacrificial material 3928-1, 3928-2 and 3928-3 is used for patterning contacts of the middle epitaxial layer 3926 (e.g., providing source regions 3506-5, 3506-6 and 3506-7 for the PFETs 3501) to the high power rail 3505. The sacrificial material 3928-4 is used for patterning a contact of the middle epitaxial layer 3926 (e.g., providing source region 3506-1 for the first one of the two-channel NFETs 3503) to the low power rail 3507. The sacrificial material 3928-5 is used for connecting the middle epitaxial layers of the second and third fins (e.g., providing drain region 3502-3 for the second one of the two-channel NFETs 3503 and source region 3506-4 for the third one of the two-channel NFETs 3503).

Figure 42B:
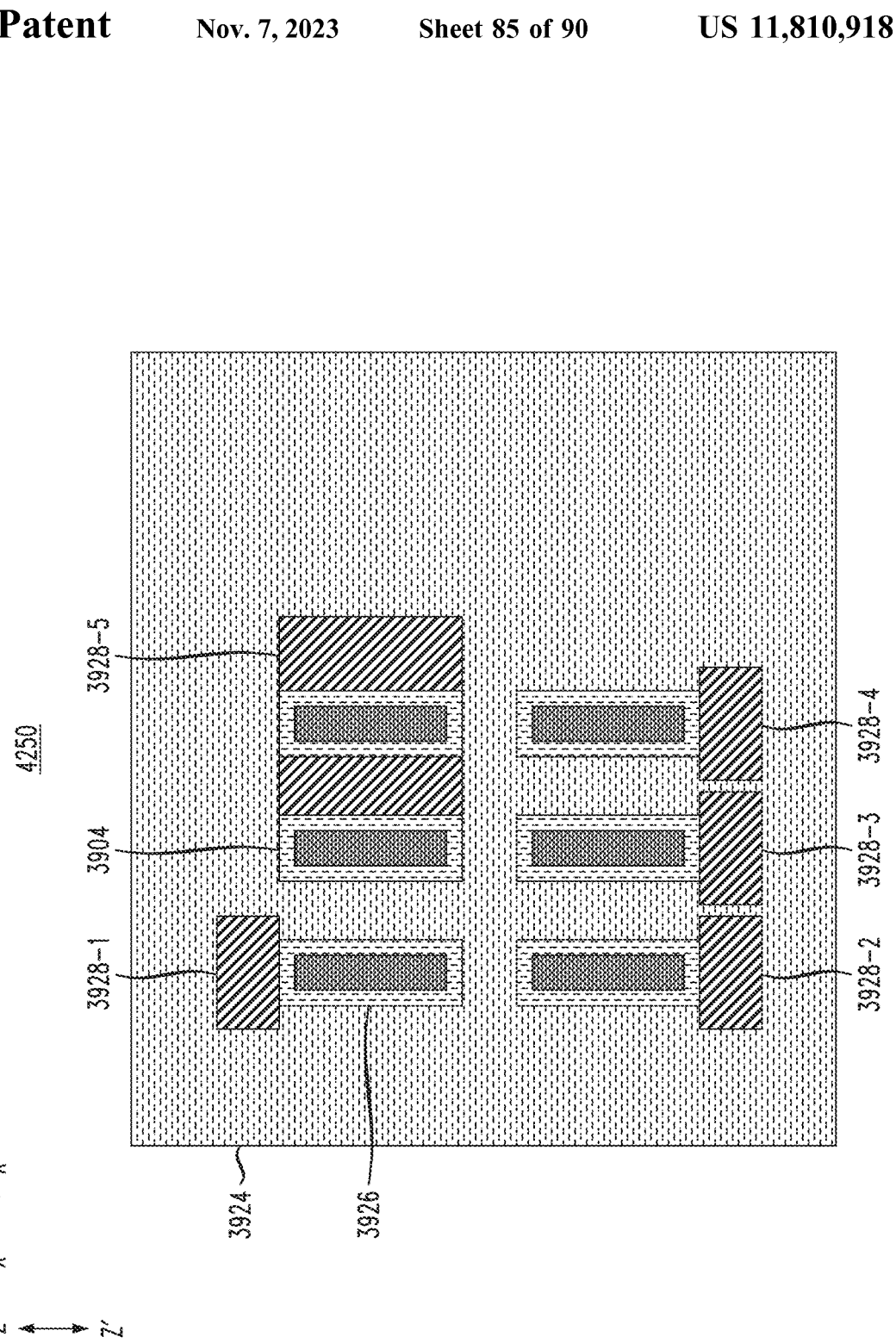
FIG. 42B shows a top-down view of the FIG. 41 structure following formation of a shared middle epitaxial layer and sacrificial material for contact patterning to the shared middle epitaxial layer for a stacked vertical transport field-effect transistor NOR3 structure, according to an embodiment of the invention.

FIG. 42B shows a top-down view 4250 of the FIG. 41 structure following formation of the top spacer layer 3924 for the lower VTFETs, the shared middle epitaxial layer 3926, and the sacrificial material 3928. The sacrificial material 3928 in FIG. 42B is used for patterning contacts to the shared middle epitaxial layer 3926 of the different fin channels for the stacked VTFET NOR3 structure of FIGS. 37A-37C. More particularly, sacrificial material 3928-1 is used for patterning a contact of the middle epitaxial layer 3926 (e.g., providing source region 3706-4 for the first one of the two-channel PFETs 3701) to the high power rail 3705. The sacrificial material 3928-2, 3928-3 and 3928-4 is used for patterning contacts of the middle epitaxial layer 2926 (e.g., providing source regions 3706-1, 3706-2 and 3706-3 for the NFETs 3703) to the low power rail 3707. The sacrificial material 3928-5 is used for connecting the middle epitaxial layers of the second and third fins (e.g., providing drain region 3702-7 for the second one of the two-channel PFETs 3701 and source region 3706-7 for the third one of the two-channel PFETs 3701).

The top spacer layer 3924, shared middle epitaxial layer 3926 and sacrificial material 3928 may be formed of similar materials and with similar sizing and processing as that described above with respect to the top spacer layer 324, shared middle epitaxial layer 326 and sacrificial material 328.

Figure 43:
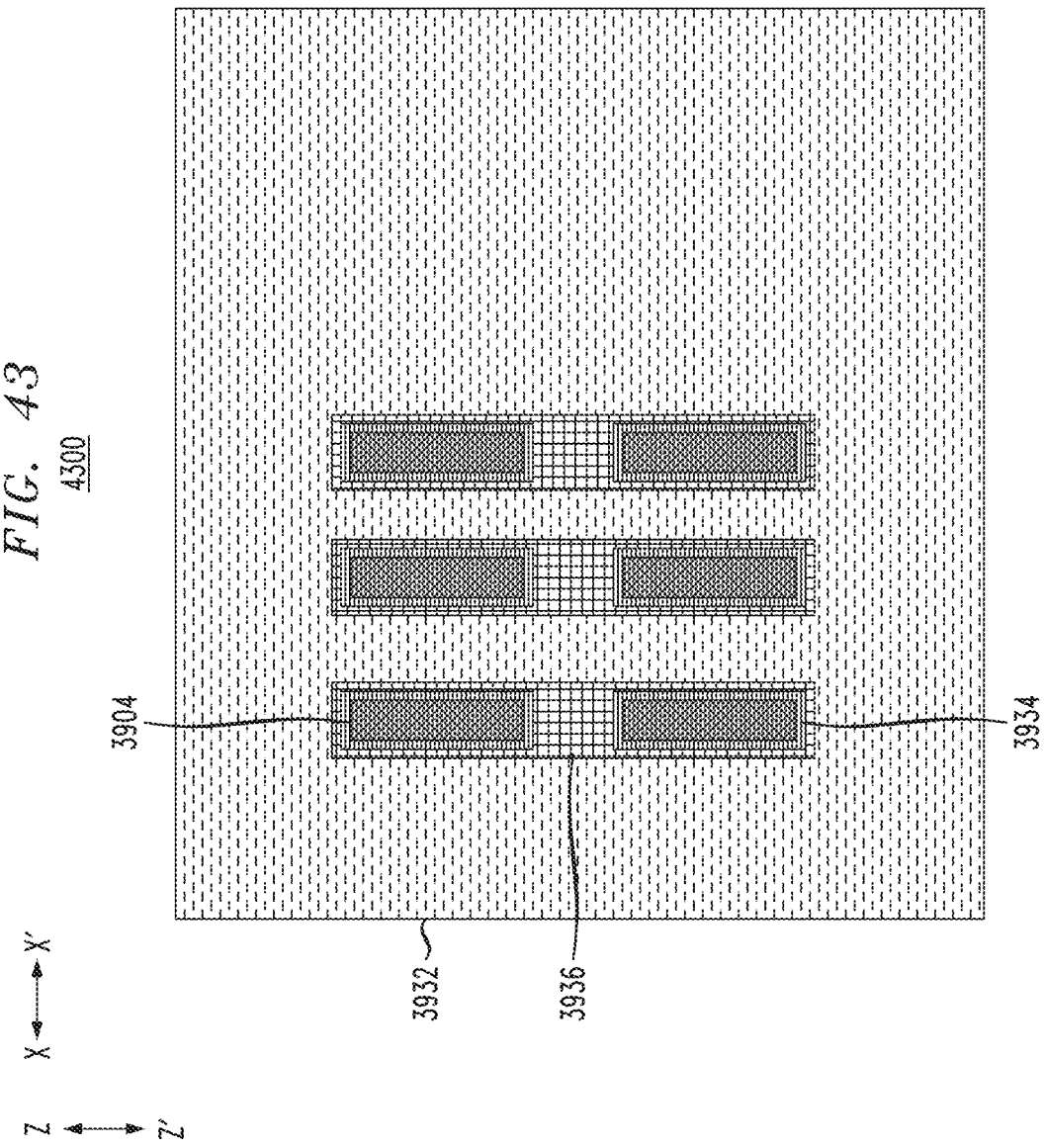
FIG. 43 shows a top-down view of the FIG. 42A or FIG. 42B structure following formation of a bottom spacer for upper vertical transport field-effect transistors and gate stack patterning for the upper vertical transport field-effect transistors, according to an embodiment of the invention.

FIG. 43 shows a top-down view 4300 of the FIG. 42A or FIG. 42B structure following formation of another ILD layer (not shown), a bottom spacer layer 3932 for the upper VTFETs and a gate stack including gate dielectric layer 3934 and gate conductor layer 3936 for the upper VTFETs. The ILD layer, bottom spacer layer 3932, gate dielectric layer 3934 and gate conductor layer 3936 may be formed of similar materials and with similar sizing and processing as that described above with respect to ILD layer 330, bottom spacer layer 332, gate dielectric layer 334 and gate conductor layer 336.

Figure 44:
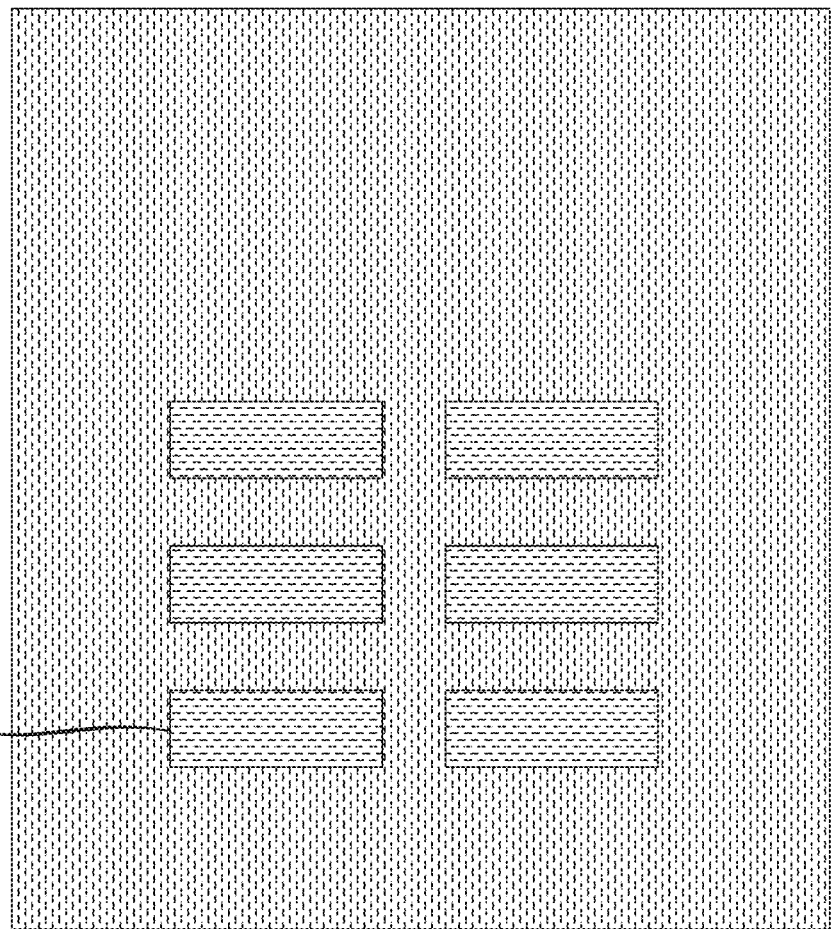
FIG. 44 shows a top-down view of the FIG. 32 structure following formation of a top spacer for the upper vertical transport field-effect transistors and formation of a top epitaxial layer, according to an embodiment of the invention.

FIG. 44 shows a top-down view 4400 of the FIG. 43 structure following formation another ILD layer (not shown), a top spacer layer 3940 for the upper VTFETs, and a top epitaxial layer 3942. The ILD layer, top spacer layer 3940 and top epitaxial layer 3942 may be formed of similar materials and with similar sizing and processing as that described above with respect to ILD layer 338, top spacer layer 340 and top epitaxial layer 342.

Figure 45A:
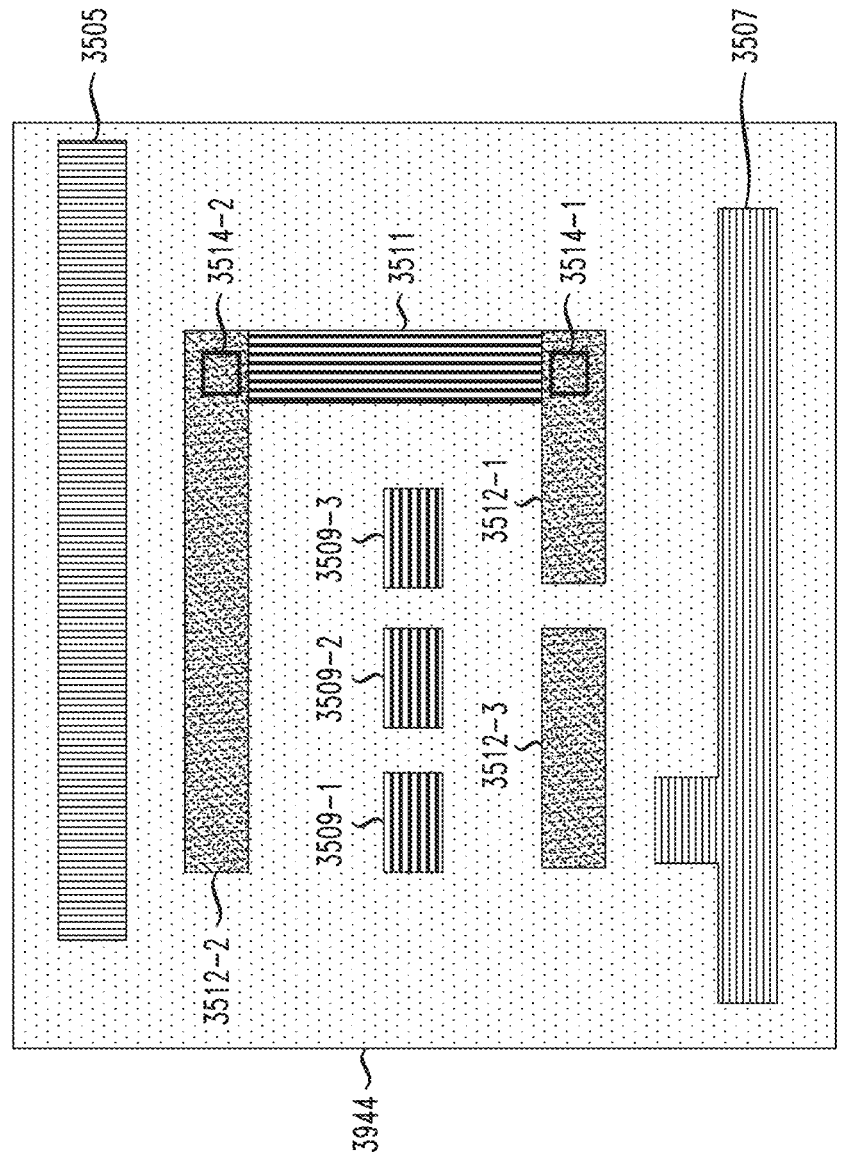
FIG. 45A shows a top-down view of the FIG. 44 structure following formation of contacts for a stacked vertical transport field-effect transistor NAND3 structure, according to an embodiment of the invention.
Figure 45B:
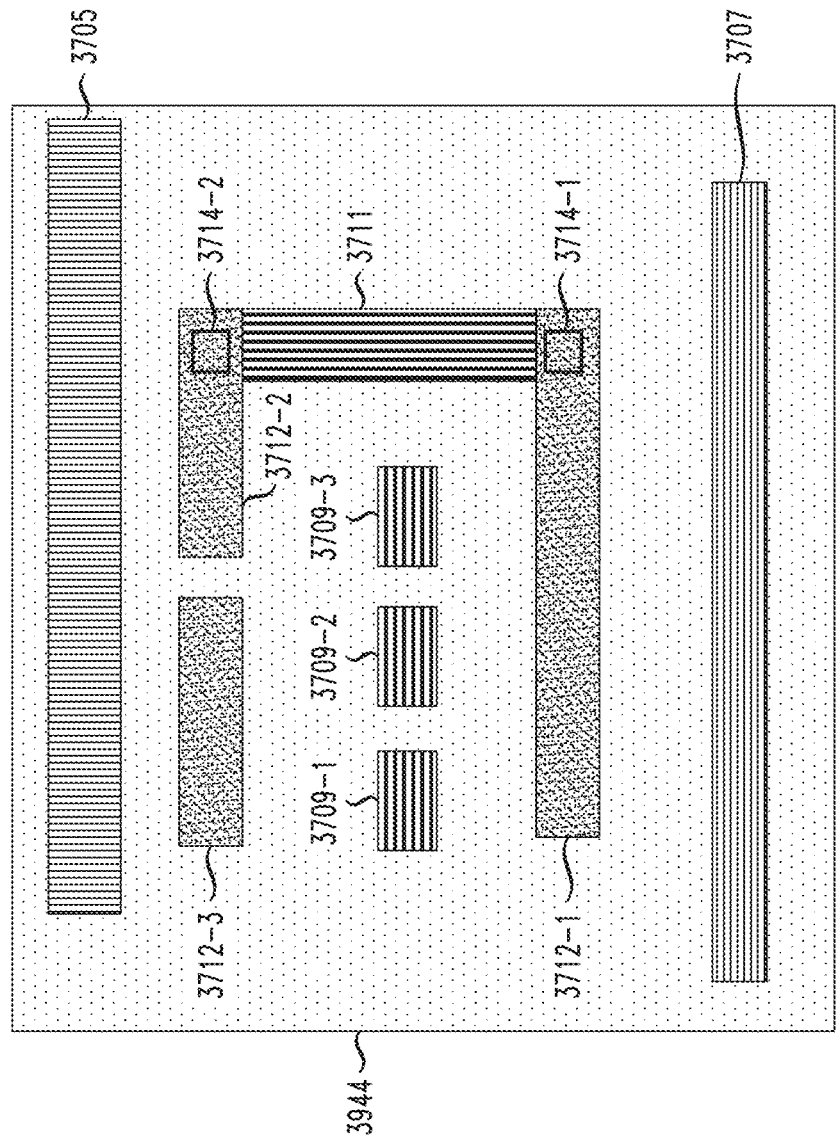
FIG. 45B shows a top-down view of the FIG. 44 structure following formation of contacts for a stacked vertical transport field-effect transistor NOR3 structure, according to an embodiment of the invention.

FIGS. 45A and 45B show respective top-down views 4500 and 4550 of the FIG. 44 structure following formation of an ILD layer 3944 for the upper VTFETs. The ILD layer 3944 may be formed of similar materials and with similar sizing and processing as that described above with respect to ILD layer 344.

FIG. 45A also illustrates contact patterning for the stacked VTFET NAND3 structure of FIGS. 35A-35C, while FIG. 45B also illustrates contact patterning for the stacked VTFET NOR3 structure of FIGS. 37A-37C. Such contact patterning includes patterning for the high power rail (e.g., 3505 for the stacked VTFET NAND3 structure of FIGS. 35A-35C, 3705 for the stacked VTFET NOR3 structure of FIGS. 37A-37C), the low power rail (e.g., 3507 for the stacked VTFET NAND3 structure of FIGS. 35A-35C, 3707 for the stacked VTFET NOR3 structure of FIGS. 37A-37C), the inputs (e.g., 3509-1, 3509-2 and 3509-3 for the stacked VTFET NAND3 structure of FIGS. 35A-35C, 3709-1, 3709-2 and 3709-3 for the stacked VTFET NOR3 structure of FIGS. 37A-37C), and the output (e.g., 3511 for the stacked VTFET NAND3 structure of FIGS. 35A-35C, 3711 for the stacked VTFET NOR3 structure of FIGS. 37A-37C). FIGS. 45A and 45B also illustrate contacts (e.g., 3512-1 and 3512-2 for the stacked VTFET NAND3 structure of FIGS. 35A-35C, 3712-1 and 3712-2 for the stacked VTFET NOR3 structure of FIGS. 37A-37C) as well as vias (e.g., 3514-1 and 3514-2 for the stacked VTFET NAND3 structure of FIGS. 35A-35C, 3714 for the stacked VTFET NOR3 structure of FIGS. 37A-37C).

FIG. 46 shows a process flow 4600 for forming a stacked VTFET inverter, NAND2, NOR2, NAND3 or NOR3 structure. The process flow 4600 is similar to the process flow 1200 described above. The process flow 4600 begins in step 4601 with a starting wafer or substrate (e.g., substrate 302, 2802, 3902). In step 4603, a hard mask layer (e.g., hard mask layer 304, 2804, 3904) is deposited, followed by SADP in step 4605. Fin RIE is performed in step 4607 to form top and bottom portions of vertical fins (e.g., upper and lower fin channels for upper and lower VTFETs). Step 4607 also includes optional fin cut processing, used when forming NAND3 and NOR3 structures as described above. Liner layers (e.g., liner layers 308 and 310) may be formed to protect portions of the vertical fins during additional processing.

In step 4609, the substrate (e.g., substrate 302, 2802, 3902) is recessed, followed by formation of a bottom epitaxial layers (e.g., bottom epitaxial layer 312, 1712) and STI regions (e.g., STI region 314, 1714). A bottom spacer (e.g., bottom spacer 316, 1716, 2816, 3916) for the lower VTFETs is formed in step 4611, followed by gate stack (e.g., gate dielectric layer 318, 1718, 2818, 3918, gate conductor layer 320, 2820, 3920) formation in step 4613 for the lower VTFETs.

In step 4615, litho-etch litho-etch (LELE) gate patterning is performed for the lower VTFETs. A top spacer (e.g., top spacer layer 324, 1724, 2824, 3924) for the lower VTFETs is then forms in step 4617. Middle epitaxial layers (e.g., shared epitaxial layer 326, 1726, 2826, 3926) are formed in step 4619, followed by sacrificial material (e.g., sacrificial material 328, 1728, 2828, 3928) patterning for middle epitaxial layer connections and fill with an ILD (e.g., ILD layer 330, 1730). Next, a bottom spacer (e.g., bottom spacer layer 332, 1732, 2832, 3932) for the upper VTFETs is formed in step 4623 followed by gate stack (e.g., gate dielectric layer 334, 1734, 2834, 3934 and gate conductor layer 336, 1736, 2836, 3936) for the upper VTFETs in step 4625.

In step 4627, LELE gate patterning is performed for the upper VTFETs. A top spacer (e.g., top spacer layer 340, 1740, 2840, 3940) for the upper VTFETs is formed in step 4629. Top epitaxial layers (e.g., top epitaxial layers 342, 1742, 2842, 3942) are formed in step 4631. The sacrificial material patterned in step 4621 is then removed and replaced with contact material in step 4633. Contact patterning is then performed in step 4635, including contacts to the bottom, middle and top epitaxial layers (e.g., for connection to high power rails, low power rails and outputs as described elsewhere herein) as well as contacts to gate stacks (e.g., for inputs as described elsewhere herein) and connections between different ones of the top, middle and bottom epitaxial layers as needed.

In some embodiments, a semiconductor structure comprises two or more vertical fins, a bottom epitaxial layer surrounding a bottom portion of a given one of the two or more vertical fins, a top epitaxial layer surrounding a top portion of the given one of the two or more vertical fins, a shared epitaxial layer surrounding a middle portion of the given one of the two or more vertical fins, and a connecting layer (e.g., a metal layer or MOL connection) contacting the bottom epitaxial layer and the top epitaxial layer, the connecting layer being disposed to a lateral side of the two or more vertical fins.

A first region of the given one of the two or more vertical fins between the bottom epitaxial layer and the shared epitaxial layer may comprise a first fin channel for a four-channel VTFET, a second region of the given one of the two or more vertical fins between the shared epitaxial layer and the top epitaxial layer may comprise a second fin channel for the four-channel VTFET, the shared epitaxial layer may comprise a shared source region for the first fin channel and the second fin channel of the four-channel VTFET, and the bottom epitaxial layer and the top epitaxial layer may comprise drain regions for the first fin channel and the second fin channel of the four-channel VTFET. The connecting layer contacts the drain regions for the first fin channel and the second fin channel to an output of an inverter logic gate.

A first region of the given one of the two or more vertical fins between the bottom epitaxial layer and the shared epitaxial layer may comprise a first fin channel for a two-channel VTFET, a second region of the given one of the two or more vertical fins between the shared epitaxial layer and the top epitaxial layer may comprise a second fin channel for the two-channel VTFET, the shared epitaxial layer may comprise a shared source region for the first fin channel and the second fin channel of the two-channel VTFET, and the bottom epitaxial layer and the top epitaxial layer may comprise drain regions for the first fin channel and the second fin channel of the two-channel VTFET. The two-channel VTFET may comprise a PFET, and the connecting layer may connect the drain regions for the first fin channel and the second fin channel to an output of a two input NAND logic gate. The two-channel VTFET may comprise an NFET, and the connecting layer may connect the drain regions for the first fin channel and the second fin channel to an output of a two input NOR logic gate.

A first region of the given one of the two or more vertical fins between the bottom epitaxial layer and the shared epitaxial layer may comprise a fin channel for a first one-channel VTFET, a second region of the given one of the two or more vertical fins between the shared epitaxial layer and the top epitaxial layer may comprise a fin channel for a second one-channel VTFET, the shared epitaxial layer may comprise a shared source region for the first one-channel VTFET and the second one-channel VTFET, the bottom epitaxial layer may comprise a drain region of the first one-channel VTFET, and the top epitaxial layer may comprise a drain region for the second one-channel VTFET. The first one-channel VTFET and the second one-channel VTFET may comprise PFETs, and the connecting layer may connect the drain region of the first one-channel VTFET and the drain region of the second one-channel VTFET to an output of a three input NAND logic gate. The first one-channel VTFET and the second one-channel VTFET may comprise NFETs, and the connecting layer may connect the drain region of the first one-channel VTFET and the drain region of the second one-channel VTFET to an output of a three input NOR logic gate.

A first region of the given one of the two or more vertical fins between the bottom epitaxial layer and the shared epitaxial layer may comprise a first fin channel for a two-channel VTFET, a second region of the given one of the two or more vertical fins between the shared epitaxial layer and the top epitaxial layer may comprise a second fin channel for the two-channel VTFET, the shared epitaxial layer may comprise a shared source region for the two-channel VTFET, and the bottom epitaxial layer and the top epitaxial layer may comprise drain regions of the two-channel VTFET. The two-channel VTFET may comprise a PFET, and the connecting layer may connect the drain regions of the two-channel VTFET to an output of a three input NAND logic gate. The two-channel VTFET may comprise an NFET, and the connecting layer may connect the drain regions of the two-channel VTFET to an output of a three input NOR logic gate.

In some embodiments, a method of forming a semiconductor structure comprises forming two or more vertical fins, forming a bottom epitaxial layer surrounding a bottom portion of a given one of the two or more vertical fins, forming a top epitaxial layer surrounding a top portion of the given one of the two or more vertical fins, forming a shared epitaxial layer surrounding a middle portion of the given one of the two or more vertical fins, and forming a connecting layer contacting the bottom epitaxial layer and the top epitaxial layer, the connecting layer being disposed to a lateral side of the two or more vertical fins.

The bottom epitaxial layer and the top epitaxial layer may comprise drain regions of at least one VTFET of a logic gate. The connecting layer may connect the drain regions of the at least one VTFET to an output of the logic gate.

In some embodiments, an inverter logic gate comprises a four-channel NFET and a four-channel PFET. The four-channel NFET comprises two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The four-channel PFET comprises two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The inverter logic gate also comprises a connecting layer (e.g., a MOL connection) contacting the bottom epitaxial layers and the top epitaxial layers of the four-channel NFET and the four-channel PFET.

The inverter logic gate may further comprise an input of the inverter logic gate connected to gate stacks of the four-channel NFET and the four-channel PFET surrounding portions of the two vertical fins between the bottom epitaxial layers and the shared epitaxial layers and between the shared epitaxial layers and the top epitaxial layers, an output of the inverter logic gate connected to the bottom epitaxial layers and the top epitaxial layers of the four-channel NFET and the four-channel PFET, a first contact connected to shared epitaxial layers of the four-channel PFET (e.g., connecting the shared epitaxial layers of the four-channel PFET to a high power rail), and a second contact connected to shared epitaxial layers of the four-channel NFET (e.g., connecting the shared epitaxial layers of the four-channel NFET to a low power rail).

In some embodiments, a two-input logic gate comprises two two-channel NFETs and two two-channel PFETs. The two two-channel NFETs comprise two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The two two-channel PFETs comprise two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins. The two-input logic gate also comprises a connecting layer (e.g., a MOL connection) contacting the bottom epitaxial layers and the top epitaxial layers of one of (i) the two two-channel NFETs and (ii) the two two-channel PFETs.

The two-input logic gate comprises a two-input NAND logic gate, and may further comprise a first input of the two-input NAND logic gate connected to gate stacks of a first one of the two two-channel NFETs and a first one of the two two-channel p-type field-effect transistors, a second input of the two-input NAND logic gate connected to gate stacks of a second one of the two two-channel NFETs and a second one of the two two-channel PFETs, an output of the two-input NAND logic gate connected to the bottom epitaxial layers and the top epitaxial layers of the two two-channel PFETs via the MOL connection, and to bottom epitaxial layers of the two vertical fins of a first one of the two two-channel NFETs, a first contact connected to shared epitaxial layers of the two two-channel PFETs (e.g., connecting the shared epitaxial layers of the two two-channel PFETs to a high power rail), and a second contact connected to the top epitaxial layers of the two vertical fins of a second one of the two two-channel NFETs (e.g., connecting the top epitaxial layers of the two vertical fins of the second one of the two two-channel NFETs to a low power rail).

The two-input logic gate may comprise a two-input NOR logic gate, and may further comprise a first input of the two-input NOR logic gate connected to gate stacks of a first one of the two two-channel NFETs and a first one of the two two-channel PFETs, a second input of the two-input NOR logic gate connected to gate stacks of a second one of the two two-channel NFETs and a second one of the two two-channel PFETs, an output of the two-input NOR logic gate connected to the bottom epitaxial layers and the top epitaxial layers of the two two-channel NFETs via the MOL connection, and to a first one of the shared epitaxial layers of a first one of the two vertical fins of a first one of the two two-channel PFETs, a first contact connected to a second one of the shared epitaxial layers of a second one of the two vertical fins of a second one of the two two-channel PFETs (e.g., connecting the second one of the shared epitaxial layers of the second one of the two vertical fins of the second one of the two two-channel PFETs to a high power rail), and a second contact connected to the shared epitaxial layers of the two vertical fins of the two two-channel NFETs (e.g., connecting the shared epitaxial layers of the two vertical fins of the two two-channel NFETs to a low power rail).

In some embodiments, a three-input logic gate comprises three NFETs and three PFETs. The three NFETs comprise a first set of one or more vertical fins, at least one vertical fin in the first set of one or more vertical fins comprising a bottom epitaxial layer surrounding a bottom portion of the at least one vertical fin in the first set of one or more vertical fins, a top epitaxial layer surrounding a top portion of the at least one vertical fin in the first set of one or more vertical fins, and a shared epitaxial layer surrounding a middle portion of the at least one vertical fin in the first set of one or more vertical fins. The three PFETs comprise a second set of one or more vertical fins, at least one vertical fin in the second set of one or more vertical fins comprising a bottom epitaxial layer surrounding a bottom portion of the at least one vertical fin in the second set of one or more vertical fins, a top epitaxial layer surrounding a top portion of the at least one vertical fin in the first set of one or more vertical fins, and a shared epitaxial layer surrounding a middle portion of the at least one vertical fin in the second set of one or more vertical fins. The three-input logic gate also comprises a connecting layer (e.g., a MOL connection) contacting the bottom epitaxial layer and the top epitaxial layer of one of the at least one vertical fins in one of the first and second sets of one or more vertical fins.

The three-input logic gate may comprise a three-input NAND logic gate, the three NFETs may comprise three one-channel NFETs, the three PFETs may comprise three one-channel PFETs, and the three-input logic gate may further comprise a first input of the three-input NAND logic gate connected to gate stacks of a first one of the three one-channel NFETs and a first one of the three two-channel PFETs, a second input of the three-input NAND logic gate connected to gate stacks of a second one of the three one-channel NFETs and a second one of the three one-channel PFETs, a third input of the three-input NAND logic gate connected to gate stacks of a third one of the three one-channel NFETs and a third one of the three one-channel PFETs, an output of the three-input NAND logic gate connected to the bottom epitaxial layer and the top epitaxial layer of the at least one vertical fin in the second set of one or more vertical fins via the MOL connection, and to the top epitaxial layer of the at least one vertical fin in the first set of one or more vertical fins, a first contact connected to the shared epitaxial layer of the at least one vertical fin in the second set of one or more vertical fins and a shared epitaxial layer in another vertical fin in the second set of one or more vertical fins (e.g., connecting the shared epitaxial layer of the at least one vertical fin in the second set of one or more vertical fins and the shared epitaxial layer in another vertical fin in the second set of one or more vertical fins to a high power rail), and a second contact connected to a shared epitaxial layer in another vertical fin in the first set of one or more vertical fins (e.g., connecting the shared epitaxial layer in the other vertical fin in the first set of one or more vertical fins to a low power rail).

The three-input logic gate may comprise a three-input NOR logic gate, the three NFETs may comprise three one-channel NFETs, the three PFETs may comprise three one-channel PFETs, and the three-input logic gate may further comprise a first input of the three-input NOR logic gate connected to gate stacks of a first one of the three one-channel NFETs and a first one of the three two-channel PFETs, a second input of the three-input NOR logic gate connected to gate stacks of a second one of the three one-channel NFETs and a second one of the three one-channel PFETs, a third input of the three-input NOR logic gate connected to gate stacks of a third one of the three one-channel NFETs and a third one of the three one-channel PFETs, an output of the three-input NOR logic gate connected to the bottom epitaxial layer and the top epitaxial layer of the at least one vertical fin in the first set of one or more vertical fins via the MOL connection, and to the top epitaxial layer of the at least one vertical fin in the second set of one or more vertical fins, a first contact connected to a shared epitaxial layer in another vertical fin in the second set of one or more vertical fins (e.g., connecting the shared epitaxial layer in the other vertical fin in the second set of one or more vertical fins to a high power rail), and a second contact connected to the shared epitaxial layer of the at least one vertical fin in the first set of one or more vertical fins and a shared epitaxial layer in another vertical fin in the first set of one or more vertical fins (e.g., connecting the shared epitaxial layer of the at least one vertical fin in the first set of one or more vertical fins and the shared epitaxial layer in another vertical fin in the first set of one or more vertical fins to a low power rail).

The three-input logic gate may comprise a three-input NAND logic gate, the three NFETs may comprise three two-channel NFETs, the three PFETs may comprise three two-channel PFETs, and the three-input logic gate may further comprise a first input of the three-input NAND logic gate connected to gate stacks of a first one of the three two-channel NFETs and a first one of the three two-channel PFETs, a second input of the three-input NAND logic gate connected to gate stacks of a second one of the three two-channel NFETs and a second one of the three two-channel PFETs, a third input of the three-input NAND logic gate connected to gate stacks of a third one of the three two-channel NFETs and a third one of the three two-channel PFETs, an output of the three-input NAND logic gate connected to bottom epitaxial layers and top epitaxial layers of vertical fins in the second set of one or more vertical fins via the MOL connection, and to the top epitaxial layer and the bottom epitaxial layer of one of the vertical fins in the first set of one or more vertical fins via another MOL connection, a first contact connected to shared epitaxial layers in the second set of one or more vertical fins (e.g., connecting the shared epitaxial layers in the second set of one or more vertical fins to a high power rail), and a second contact connected to a shared epitaxial layer of one of the vertical fins in the first set of one or more vertical fins (e.g., connecting the shared epitaxial layer of one of the vertical fins in the first set of one or more vertical fins to a low power rail).

The three-input logic gate may comprise a three-input NOR logic gate, the three NFETs may comprise three two-channel NFETs, the three PFETs may comprise three two-channel PFETs, and the three-input logic gate may further comprise a first input of the three-input NOR logic gate connected to gate stacks of a first one of the three two-channel NFETs and a first one of the three two-channel PFETs, a second input of the three-input NOR logic gate connected to gate stacks of a second one of the three two-channel NFETs and a second one of the three two-channel PFETs, a third input of the three-input NOR logic gate connected to gate stacks of a third one of the three two-channel NFETs and a third one of the three two-channel PFETs, an output of the three-input NOR logic gate connected to bottom epitaxial layers and top epitaxial layers of vertical fins in the first set of one or more vertical fins via the MOL connection, and to the top epitaxial layer and the bottom epitaxial layer of one vertical fin in the second set of one or more vertical fins via another MOL connection, a first contact connected to shared epitaxial layers in the vertical fins of the first set of one or more vertical fins (e.g., connecting the shared epitaxial layers in the vertical fins of the first set of one or more vertical fins to a high power rail), and a second contact connected to a shared epitaxial layer of one of the vertical fins in the second set of one or more vertical fins (e.g., connecting the shared epitaxial layer of one of the vertical fins in the second set of one or more vertical fins to a low power rail).

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   two or more vertical fins;
   a bottom epitaxial layer surrounding a bottom portion of at least a first one of the two or more vertical fins;
   a first top epitaxial layer surrounding a top portion of a first one of the two or more vertical fins;
   a second top epitaxial layer surrounding a top portion of a second one of the two or more vertical fins;
   a first shared epitaxial layer surrounding a middle portion of the first one of the two or more vertical fins;
   a second shared epitaxial layer surrounding a middle portion of the second one of the two or more vertical fins;
   a first metal layer surrounding the first shared epitaxial layer;
   a second metal layer surrounding the second shared epitaxial layer; and
   an interlayer dielectric layer between the first metal layer and the second metal layer; and
   a connecting layer contacting the bottom epitaxial layer and at least one of the first top epitaxial layer and the second top epitaxial layer, the connecting layer being disposed to a lateral side of the two or more vertical fins.

2. The semiconductor structure of claim 1, wherein:
   a first region of the first one of the two or more vertical fins between the bottom epitaxial layer and the first shared epitaxial layer comprises a first fin channel for a four-channel vertical transport field-effect transistor;
   a second region of the first one of the two or more vertical fins between the first shared epitaxial layer and the first top epitaxial layer comprises a second fin channel for the four-channel vertical transport field-effect transistor;
   the first shared epitaxial layer comprises a shared source region for the first fin channel and the second fin channel of the four-channel vertical transport field-effect transistor; and
   the bottom epitaxial layer and the first top epitaxial layer comprise drain regions for the first fin channel and the second fin channel of the four-channel vertical transport field-effect transistor.

3. The semiconductor structure of claim 2, wherein the connecting layer connects the drain regions for the first fin channel and the second fin channel to an output of an inverter logic gate.

4. The semiconductor structure of claim 1, wherein:
   a first region of the first one of the two or more vertical fins between the bottom epitaxial layer and the first shared epitaxial layer comprises a first fin channel for a two-channel vertical transport field-effect transistor;
   a second region of the first one of the two or more vertical fins between the first shared epitaxial layer and the first top epitaxial layer comprises a second fin channel for the two-channel vertical transport field-effect transistor;
   the first shared epitaxial layer comprises a shared source region for the first fin channel and the second fin channel of the two-channel vertical transport field-effect transistor; and
   the bottom epitaxial layer and the first top epitaxial layer comprise drain regions for the first fin channel and the second fin channel of the two-channel vertical transport field-effect transistor.

5. The semiconductor structure of claim 4, wherein the two-channel vertical transport field-effect transistor comprises a p-type field-effect transistor, and wherein the connecting layer connects the drain regions for the first fin channel and the second fin channel to an output of a two input NAND logic gate.

6. The semiconductor structure of claim 4, wherein the two-channel vertical transport field-effect transistor comprises an n-type field-effect transistor, and wherein the connecting layer connects the drain regions for the first fin channel and the second fin channel to an output of a two input NOR logic gate.

7. The semiconductor structure of claim 1, wherein:
   a first region of the first one of the two or more vertical fins between the bottom epitaxial layer and the first shared epitaxial layer comprises a fin channel for a first one-channel vertical transport field-effect transistor;
   a second region of the first one of the two or more vertical fins between the first shared epitaxial layer and the first top epitaxial layer comprises a fin channel for a second one-channel vertical transport field-effect transistor;
   the first shared epitaxial layer comprises a shared source region for the first one-channel vertical transport field-effect transistor and the second one-channel vertical transport field-effect transistor;
   the bottom epitaxial layer comprises a drain region of the first one-channel vertical transport field-effect transistor; and
   the first top epitaxial layer comprise a drain region for the second one-channel vertical transport field-effect transistor.

8. The semiconductor structure of claim 7, wherein the first one-channel vertical transport field-effect transistor and the second one-channel vertical transport field-effect transistor comprise p-type field-effect transistors, and wherein the connecting layer connects the drain region of the first one-channel vertical transport field-effect transistor and the drain region of the second one-channel vertical transport field-effect transistor to an output of a three input NAND logic gate.

9. The semiconductor structure of claim 7, wherein the first one-channel vertical transport field-effect transistor and the second one-channel vertical transport field-effect transistor comprise n-type field-effect transistors, and wherein the connecting layer connects the drain region of the first one-channel vertical transport field-effect transistor and the drain region of the second one-channel vertical transport field-effect transistor to an output of a three input NOR logic gate.

10. The semiconductor structure of claim 1, wherein:
    a first region of the first one of the two or more vertical fins between the bottom epitaxial layer and the first shared epitaxial layer comprises a first fin channel for a two-channel vertical transport field-effect transistor;
    a second region of the first one of the two or more vertical fins between the first shared epitaxial layer and the first top epitaxial layer comprises a second fin channel for the two-channel vertical transport field-effect transistor;
    the first shared epitaxial layer comprises a shared source region for the two-channel vertical transport field-effect transistor; and the bottom epitaxial layer and the first top epitaxial layer comprise drain regions of the two-channel vertical transport field-effect transistor.

11. The semiconductor structure of claim 10, wherein the two-channel vertical transport field-effect transistor comprises a p-type field-effect transistor, and wherein the connecting layer connects the drain regions of the two-channel vertical transport field-effect transistor to an output of a three input NAND logic gate.

12. The semiconductor structure of claim 10, wherein the two-channel vertical transport field-effect transistor comprises an n-type field-effect transistor, and wherein the connecting layer connects the drain regions of the two-channel vertical transport field-effect transistor to an output of a three input NOR logic gate.

13. The semiconductor structure of claim 2, wherein:
a first region of the second one of the two or more vertical fins between the bottom epitaxial layer and the second shared epitaxial layer comprises a third fin channel for the four-channel vertical transport field-effect transistor;
a second region of the second one of the two or more vertical fins between the second shared epitaxial layer and the second top epitaxial layer comprises a fourth fin channel for the four-channel vertical transport field-effect transistor;
the second shared epitaxial layer comprises a shared source region for the third fin channel and the fourth fin channel of the four-channel vertical transport field-effect transistor; and
the bottom epitaxial layer and the second top epitaxial layer comprise drain regions for the third fin channel and the fourth fin channel of the four-channel vertical transport field-effect transistor.

14. The semiconductor structure of claim 1, wherein the first metal layer and the second metal layer are connected to a power rail disposed at an end of the two or more vertical fins.

15. A method of forming a semiconductor structure, comprising:
forming two or more vertical fins;
forming a bottom epitaxial layer surrounding a bottom portion of at least one of the two or more vertical fins;
forming a first top epitaxial layer surrounding a top portion of a first one of the two or more vertical fins;
forming a second top epitaxial layer surrounding a top portion of a second one of the two or more vertical fins;
forming a first shared epitaxial layer surrounding a middle portion of the first one of the two or more vertical fins;
forming a second shared epitaxial layer surrounding a middle portion of the second one of the two or more vertical fins;
forming a first metal layer surrounding the first shared epitaxial layer;
forming a second metal layer surrounding the second shared epitaxial layer;
forming an interlayer dielectric layer between the first metal layer and the second metal layer; and
forming a connecting layer contacting the bottom epitaxial layer and at least one of the first top epitaxial layer and the second top epitaxial layer, the connecting layer being disposed to a lateral side of the two or more vertical fins.

16. The method of claim 15, wherein the bottom epitaxial layer, the first top epitaxial layer and the second top epitaxial layer comprise drain regions of at least one vertical transport field-effect transistor of a logic gate.

17. The method of claim 16, wherein the connecting layer connects the drain regions of the at least one vertical transport field-effect transistor to an output of the logic gate.

18. An inverter logic gate, comprising:
a four-channel n-type field-effect transistor, the four-channel n-type field-effect transistor comprising two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins;
a four-channel p-type field-effect transistor, the four-channel p-type field-effect transistor comprising two vertical fins each comprising a bottom epitaxial layer surrounding a bottom portion of the two vertical fins, a top epitaxial layer surrounding a top portion of the two vertical fins, and a shared epitaxial layer surrounding a middle portion of the two vertical fins; and
a connecting layer contacting the bottom epitaxial layers and the top epitaxial layers of the four-channel n-type field-effect transistor and the four-channel p-type field-effect transistor.

19. The inverter logic gate of claim 18, further comprising:
an input of the inverter logic gate connected to gate stacks of the four-channel n-type field-effect transistor and the four-channel p-type field-effect transistor surrounding portions of the two vertical fins between the bottom epitaxial layers and the shared epitaxial layers and between the shared epitaxial layers and the top epitaxial layers;
an output of the inverter logic gate connected to the bottom epitaxial layers and the top epitaxial layers of the four-channel n-type field-effect transistor and the four-channel p-type field effect transistor;
a first contact connected to shared epitaxial layers of the four-channel p-type field-effect transistor; and
a second contact connected to shared epitaxial layers of the four-channel n-type field-effect transistor.

20. The method of claim 15, wherein:
a first region of the first one of the two or more vertical fins between the bottom epitaxial layer and the first shared epitaxial layer comprises a first fin channel for a four-channel vertical transport field-effect transistor;
a second region of the first one of the two or more vertical fins between the first shared epitaxial layer and the first top epitaxial layer comprises a second fin channel for the four-channel vertical transport field-effect transistor;
the first shared epitaxial layer comprises a shared source region for the first fin channel and the second fin channel of the four-channel vertical transport field-effect transistor;
the bottom epitaxial layer and the first top epitaxial layer comprise drain regions for the first fin channel and the second fin channel of the four-channel vertical transport field-effect transistor;
a first region of the second one of the two or more vertical fins between the bottom epitaxial layer and the second shared epitaxial layer comprises a third fin channel for the four-channel vertical transport field-effect transistor;
a second region of the second one of the two or more vertical fins between the second shared epitaxial layer and the second top epitaxial layer comprises a fourth fin channel for the four-channel vertical transport field-effect transistor;

the second shared epitaxial layer comprises a shared source region for the third fin channel and the fourth fin channel of the four-channel vertical transport field-effect transistor; and the bottom epitaxial layer and the second top epitaxial layer comprise drain regions for the third fin channel and the fourth fin channel of the four-channel vertical transport field-effect transistor.

\* \* \* \* \*